United States Patent
Dokania et al.

(10) Patent No.: US 11,910,618 B1
(45) Date of Patent: Feb. 20, 2024

(54) MULTI-ELEMENT FERROELECTRIC GAIN MEMORY BIT-CELL HAVING STACKED AND FOLDED NON-PLANAR CAPACITORS

(71) Applicant: Kepler Computing Inc., San Francisco, CA (US)

(72) Inventors: Rajeev Kumar Dokania, Beaverton, OR (US); Amrita Mathuriya, Portland, OR (US); Debo Olaosebikan, San Francisco, CA (US); Tanay Gosavi, Portland, OR (US); Noriyuki Sato, Hillsboro, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 74 days.

(21) Appl. No.: 17/654,562

(22) Filed: Mar. 11, 2022

Related U.S. Application Data

(63) Continuation of application No. 17/653,811, filed on Mar. 7, 2022.

(51) Int. Cl.
  *H10B 53/30* (2023.01)
  *G11C 11/22* (2006.01)
  *H10B 53/10* (2023.01)

(52) U.S. Cl.
  CPC .......... *H10B 53/30* (2023.02); *G11C 11/221* (2013.01); *G11C 11/2255* (2013.01);
  (Continued)

(58) Field of Classification Search
  CPC .............. G11C 11/221; G11C 11/2255; G11C 11/2257; G11C 11/2273; G11C 11/2293; H10B 53/30
  See application file for complete search history.

(56) References Cited

U.S. PATENT DOCUMENTS

| | | |
|---|---|---|
| 4,809,225 A | 2/1989 | Dimmler et al. |
| 4,853,893 A | 8/1989 | Aton, Jr. et al. |
| (Continued) | | |

FOREIGN PATENT DOCUMENTS

| | | |
|---|---|---|
| JP | H10255484 A | 9/1998 |
| JP | 2003123465 A | 4/2003 |
| (Continued) | | |

OTHER PUBLICATIONS

1st Office Action dated Dec. 11, 2020 for Taiwan Patent Application No. 109106095.
(Continued)

*Primary Examiner* — Han Yang
(74) *Attorney, Agent, or Firm* — MUGHAL GAUDRY & FRANKLIN PC

(57) ABSTRACT

A configuration for efficiently placing a group of capacitors with one terminal connected to a common node is described. The capacitors are stacked and folded along the common node. In a stack and fold configuration, devices are stacked vertically (directly or with a horizontal offset) with one terminal of the devices being shared to a common node, and further the capacitors are placed along both sides of the common node. The common node is a point of fold. In one example, the devices are capacitors. N number of capacitors can be divided in L number of stack layers such that there are N/L capacitors in each stacked layer. The N/L capacitors are shorted together with an electrode (e.g., bottom electrode). The electrode can be metal, a conducting oxide, or a combination of a conducting oxide and a barrier material. The capacitors can be planar, non-planar or replaced by memory elements.

20 Claims, 83 Drawing Sheets

(52) U.S. Cl.
CPC ...... *G11C 11/2257* (2013.01); *G11C 11/2273* (2013.01); *G11C 11/2275* (2013.01); *G11C 11/2293* (2013.01); *H10B 53/10* (2023.02)

(56) References Cited

U.S. PATENT DOCUMENTS

| | | | |
|---|---|---|---|
| 5,086,412 | A | 2/1992 | Jaffe et al. |
| 5,218,566 | A | 6/1993 | Papaliolios |
| 5,270,967 | A | 12/1993 | Moazzami et al. |
| 5,381,364 | A | 1/1995 | Chern et al. |
| 5,383,150 | A | 1/1995 | Nakamura et al. |
| 5,539,279 | A | 7/1996 | Takeuchi et al. |
| 5,541,872 | A | 7/1996 | Lowrey et al. |
| 5,638,318 | A | 6/1997 | Seyyedy |
| 5,640,030 | A | 6/1997 | Kenney |
| 5,760,432 | A | 6/1998 | Abe et al. |
| 5,917,746 | A | 6/1999 | Seyyedy |
| 5,926,413 | A | 7/1999 | Yamada et al. |
| 5,969,380 | A | 10/1999 | Seyyedy |
| 6,002,608 | A | 12/1999 | Tanabe |
| 6,028,784 | A | 2/2000 | Mori et al. |
| 6,031,754 | A | 2/2000 | Derbenwick et al. |
| 6,043,526 | A | 3/2000 | Ochiai |
| 6,147,895 | A | 11/2000 | Kamp |
| 6,346,741 | B1 | 2/2002 | Buskirk et al. |
| 6,358,810 | B1 | 3/2002 | Dornfest et al. |
| 6,388,281 | B1 | 5/2002 | Jung et al. |
| 6,483,737 | B2 | 11/2002 | Takeuchi et al. |
| 6,500,678 | B1 | 12/2002 | Aggarwal et al. |
| 6,515,957 | B1 | 2/2003 | Newns et al. |
| 6,548,343 | B1 | 4/2003 | Summerfelt et al. |
| 6,587,367 | B1 | 7/2003 | Nishimura et al. |
| 6,590,245 | B2 | 7/2003 | Ashikaga |
| 6,610,549 | B1 | 8/2003 | Aggarwal et al. |
| 6,643,163 | B2 | 11/2003 | Takashima |
| 6,646,906 | B2 | 11/2003 | Salling |
| 6,656,301 | B2 | 12/2003 | Kirby |
| 6,656,748 | B2 | 12/2003 | Hall et al. |
| 6,713,342 | B2 | 3/2004 | Celii et al. |
| 6,717,838 | B2 | 4/2004 | Hosoi |
| 6,720,600 | B2 | 4/2004 | Okita |
| 6,728,128 | B2 | 4/2004 | Nishimura et al. |
| 6,734,477 | B2 | 5/2004 | Moise et al. |
| 6,795,331 | B2 | 9/2004 | Noro |
| 6,798,686 | B2 | 9/2004 | Takashima |
| 6,809,949 | B2 | 10/2004 | Ho |
| 6,819,584 | B2 | 11/2004 | Noh |
| 6,856,534 | B2 | 2/2005 | Rodriguez et al. |
| 6,873,536 | B2 | 3/2005 | Komatsuzaki |
| 6,906,944 | B2 | 6/2005 | Takeuchi et al. |
| 6,924,997 | B2 | 8/2005 | Chen et al. |
| 7,029,925 | B2 | 4/2006 | Celii et al. |
| 7,173,844 | B2 | 2/2007 | Lee et al. |
| 7,405,959 | B2 | 7/2008 | Koide et al. |
| 7,426,130 | B2 | 9/2008 | Jeon |
| 7,514,734 | B2 | 4/2009 | Aggarwal et al. |
| 7,642,099 | B2 | 1/2010 | Fukada et al. |
| 7,791,922 | B2 | 9/2010 | Doumae et al. |
| 7,812,385 | B2 | 10/2010 | Noda |
| 8,129,200 | B2 | 3/2012 | Kang |
| 8,177,995 | B2 | 5/2012 | Kobayashi et al. |
| 8,300,446 | B2 | 10/2012 | Qidwai |
| 8,508,974 | B2 | 8/2013 | Clinton et al. |
| 8,665,628 | B2 | 3/2014 | Kawashima |
| 8,717,800 | B2 | 5/2014 | Clinton et al. |
| 8,865,628 | B2 | 10/2014 | Manabe et al. |
| 9,472,560 | B2 | 10/2016 | Ramaswamy et al. |
| 9,786,348 | B1 | 10/2017 | Kawamura et al. |
| 9,818,468 | B2 | 11/2017 | Müller |
| 9,830,969 | B2 | 11/2017 | Slesazeck et al. |
| 10,043,567 | B2 | 8/2018 | Slesazeck et al. |
| 10,354,712 | B2 | 7/2019 | Derner et al. |
| 10,600,808 | B2 | 3/2020 | Schröder |
| 10,847,201 | B2 | 11/2020 | Manipatruni et al. |
| 10,872,905 | B2 | 12/2020 | Müller |
| 10,963,776 | B2 | 3/2021 | Mulaosmanovic et al. |
| 10,998,025 | B2 | 5/2021 | Manipatruni et al. |
| 11,482,270 | B1 | 10/2022 | Dokania et al. |
| 2002/0079520 | A1 | 6/2002 | Nishihara et al. |
| 2002/0153550 | A1 | 10/2002 | An et al. |
| 2003/0112650 | A1 | 6/2003 | Kang |
| 2003/0119211 | A1 | 6/2003 | Summerfelt et al. |
| 2003/0129847 | A1 | 7/2003 | Celii et al. |
| 2004/0027873 | A1 | 2/2004 | Nishihara |
| 2004/0104754 | A1 | 6/2004 | Bruchhaus et al. |
| 2004/0129961 | A1 | 7/2004 | Araujo et al. |
| 2004/0245547 | A1 | 12/2004 | Stipe |
| 2005/0012126 | A1 | 1/2005 | Udayakumar et al. |
| 2005/0214954 | A1 | 9/2005 | Maruyama et al. |
| 2005/0230725 | A1 | 10/2005 | Aggarwal et al. |
| 2005/0244988 | A1 | 11/2005 | Wang et al. |
| 2006/0001070 | A1 | 1/2006 | Park et al. |
| 2006/0002170 | A1 | 1/2006 | Kumura et al. |
| 2006/0006447 | A1 | 1/2006 | Kim et al. |
| 2006/0073613 | A1* | 4/2006 | Aggarwal ............. H10B 53/30 257/E21.664 |
| 2006/0073614 | A1 | 4/2006 | Hara |
| 2006/0134808 | A1 | 6/2006 | Summerfelt et al. |
| 2006/0258113 | A1 | 11/2006 | Sandhu et al. |
| 2007/0298521 | A1 | 12/2007 | Obeng et al. |
| 2008/0025063 | A1 | 1/2008 | Kang |
| 2008/0073680 | A1 | 3/2008 | Wang |
| 2008/0081380 | A1 | 4/2008 | Celii et al. |
| 2008/0107885 | A1 | 5/2008 | Alpay et al. |
| 2008/0191252 | A1 | 8/2008 | Nakamura et al. |
| 2009/0003042 | A1 | 1/2009 | Lee et al. |
| 2012/0127776 | A1 | 5/2012 | Kawashima |
| 2012/0307545 | A1 | 12/2012 | McAdams et al. |
| 2012/0313218 | A1 | 12/2012 | Fujimori et al. |
| 2013/0147295 | A1 | 6/2013 | Shimizu |
| 2014/0208041 | A1 | 7/2014 | Hyde et al. |
| 2015/0069481 | A1 | 3/2015 | Sun et al. |
| 2015/0294702 | A1 | 10/2015 | Lee et al. |
| 2017/0277459 | A1 | 9/2017 | Rodriguez et al. |
| 2017/0345831 | A1 | 11/2017 | Chavan et al. |
| 2018/0082981 | A1 | 3/2018 | Gowda |
| 2018/0286987 | A1 | 10/2018 | Lee et al. |
| 2018/0323309 | A1 | 11/2018 | Ando et al. |
| 2019/0051642 | A1 | 2/2019 | Hyde et al. |
| 2019/0051815 | A1 | 2/2019 | Kakinuma et al. |
| 2019/0115353 | A1 | 4/2019 | O'Brien et al. |
| 2019/0138893 | A1 | 5/2019 | Sharma et al. |
| 2020/0004583 | A1 | 1/2020 | Kelly et al. |
| 2020/0051607 | A1 | 2/2020 | Pan et al. |
| 2021/0111179 | A1 | 4/2021 | Shivaraman et al. |
| 2021/0398580 | A1 | 12/2021 | Yuh |
| 2022/0069131 | A1 | 3/2022 | Pesic |

FOREIGN PATENT DOCUMENTS

| | | |
|---|---|---|
| JP | 2005057103 A | 3/2005 |
| TW | 200718237 A | 5/2007 |
| TW | 200919705 A | 5/2009 |
| TW | 200935151 A | 8/2009 |
| TW | 201227879 A | 7/2012 |
| TW | 201725736 A | 7/2017 |
| WO | 20130147295 | 10/2013 |
| WO | 2015167887 A1 | 11/2015 |

OTHER PUBLICATIONS

1st Taiwan Office Action dated Mar. 3, 2022 for Taiwan Patent Application No. 110129115.
Advisory Action dated Nov. 16, 2021 for U.S. Appl. No. 16/287,953.
Advisory Action dated Nov. 16, 2021 for U.S. Appl. No. 16/288,004.
Advisory Action dated Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.
Final Office Action dated Oct. 7, 2021 for U.S. Appl. No. 16/287,953.
Final Office Action dated Oct. 7, 2021 for U.S. Appl. No. 16/288,004.

(56) References Cited

OTHER PUBLICATIONS

Final Office Action dated Oct. 7, 2021 for U.S. Appl. No. 16/288,006.
International Preliminary Report on Patentability dated Sep. 10, 2021 for PCT Patent Application No. PCT/US2020/018870.
International Preliminary Report on Patentability dated Sep. 10, 2021 for PCT Patent Application No. PCT/US2020/066963.
International Search Report & Written Opinion dated Jun. 19, 2020 for U.S. Patent Application No. PCT/US2020/018879.
International Search Report & Written Opinion dated Jun. 24, 2020 for PCT Patent Application No. PCT/US2020/018870.
International Search Report and Written Opinion dated Jun. 19, 2020 for PCT Patent Application No. PCT/US2020/066963.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Non-Final Office Action dated Aug. 5, 2020 for U.S. Appl. No. 16/287,953.
Non-Final Office Action dated Aug. 5, 2020 for U.S. Appl. No. 16/288,004.
Non-Final Office Action dated Aug. 5, 2020 for U.S. Appl. No. 16/288,006.
Non-Final Office Action dated Dec. 20, 2021 for U.S. Appl. No. 16/288,004.
Non-Final Office Action dated Jan. 18, 2022 for U.S. Appl. No. 16/287,953.
Non-Final Office Action dated Jan. 19, 2022 for U.S. Appl. No. 16/288,006.
Non-Final Office Action dated Jun. 26, 2020 for U.S. Appl. No. 16/287,876.
Non-Final Office Action dated Mar. 7, 2022 for U.S. Appl. No. 17/339,850.
Notice of Allowance dated Jan. 12, 2021 for U.S. Appl. No. 16/287,876.
Notice of Allowance dated Jul. 27, 2020 for U.S. Appl. No. 16/287,927.
Notice of Grant dated May 18, 2021 for Taiwan Patent Application No. 109106095.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Final Office Action dated Aug. 15, 2022 for U.S. Appl. No. 17/346,083.
Final Office Action dated Sep. 12, 2022 for U.S. Appl. No. 17/367,217.
Non-Final Office Action dated Aug. 16, 2022 for U.S. Appl. No. 17/367,217.
Non-Final Office Action dated Jun. 15, 2022 for U.S. Appl. No. 17/367,101.
Non-Final Office Action dated May 9, 2023 for U.S. Appl. No. 18/061,270.
Non-Final Office Action dated May 16, 2023 for U.S. Appl. No. 17/532,647.
Non-Final Office Action dated Nov. 4, 2022 for U.S. Appl. No. 17/530,362.
Non-Final Office Action dated Nov. 28, 2022 for U.S. Appl. No. 17/532,552.
Non-Final Office Action dated Oct. 12, 2022 for U.S. Appl. No. 17/530,365.
Non-Final Office Action dated Oct. 26, 2022 for U.S. Appl. No. 17/531,577.
Non-Final Office Action dated Sep. 1, 2022 for U.S. Appl. No. 17/339,850.
Non-Final Office Action dated Sep. 7, 2022 for U.S. Appl. No. 17/530,360.
Notice of Allowance dated Apr. 4, 2023 for U.S. Appl. No. 17/532,552.
Notice of Allowance dated Aug. 8, 2022 for U.S. Appl. No. 17/529,258.
Notice of Allowance dated Aug. 17, 2022 for U.S. Appl. No. 17/346,087.
Notice of Allowance dated Aug. 22, 2022 for U.S. Appl. No. 17/390,791.
Notice of Allowance dated Aug. 25, 2022 for U.S. Appl. No. 17/367,101.
Notice of Allowance dated Aug. 31, 2022 for U.S. Appl. No. 17/359,325.
Notice of Allowance dated Jan. 20, 2023 for U.S. Appl. No. 17/532,657.
Notice of Allowance dated Jan. 30, 2023 for U.S. Appl. No. 17/531,535.
Notice of Allowance dated Jun. 23, 2022 for U.S. Appl. No. 17/367,172.
Notice of Allowance dated Jun. 23, 2022 for U.S. Appl. No. 17/367,210.
Notice of Allowance dated Mar. 13, 2023 for U.S. Appl. No. 17/516,577.
Notice of Allowance dated Mar. 15, 2023 for U.S. Appl. No. 17/516,293.
Notice of Allowance dated Mar. 17, 2023 for U.S. Appl. No. 17/532,545.
Notice of Allowance dated Mar. 22, 2023 for U.S. Appl. No. 17/531,535.
Notice of Allowance dated May 2, 2023 for U.S. Appl. No. 17/532,556.
Notice of Allowance dated Nov. 17, 2022 for U.S. Appl. No. 17/530,363.
Notice of Allowance dated Nov. 22, 2022 for U.S. Appl. No. 17/530,362.
Notice of Allowance dated Nov. 25, 2022 for U.S. Appl. No. 17/531,577.
Notice of Allowance dated Oct. 31, 2022 for U.S. Appl. No. 17/390,796.
Notice of Allowance dated Sep. 13, 2022 for U.S. Appl. No. 17/530,364.
Notice of Allowance dated Sep. 14, 2022 for U.S. Appl. No. 17/530,360.
Notice of Allowance dated Sep. 21, 2022 for U.S. Appl. No. 17/530,366.
Notice of Allowance dated Sep. 23, 2022 for U.S. Appl. No. 17/339,850.
Notice of Allowance dated Sep. 26, 2022 for U.S. Appl. No. 17/367,217.
Notice of Allowance dated Sep. 27, 2022 for U.S. Appl. No. 17/346,083.
Restriction Requirement dated Aug. 5, 2022 for U.S. Appl. No. 17/359,325.

* cited by examiner

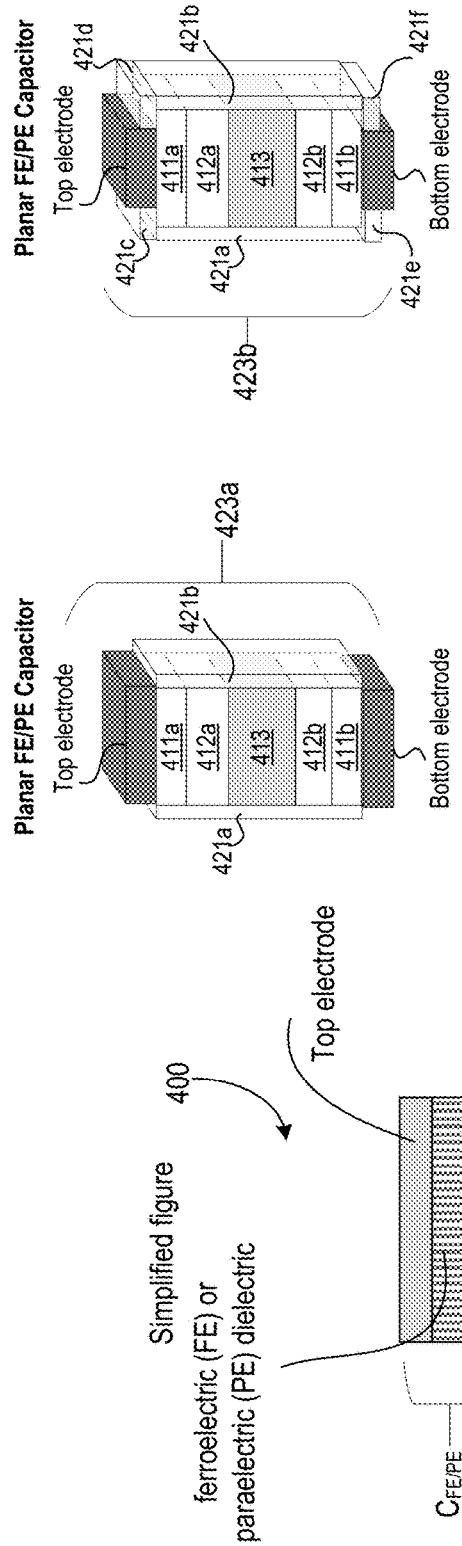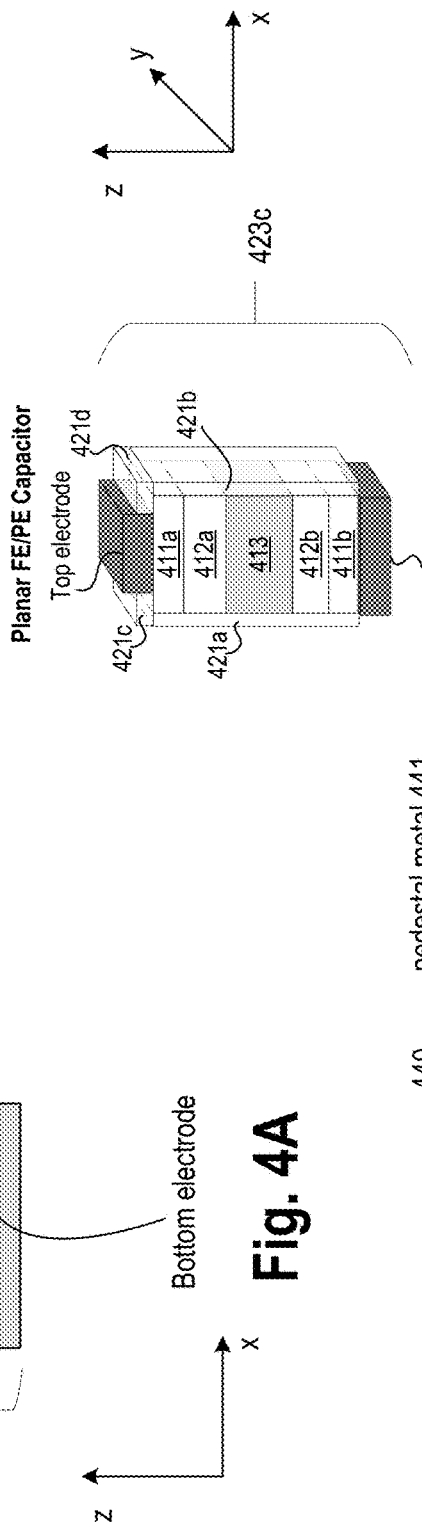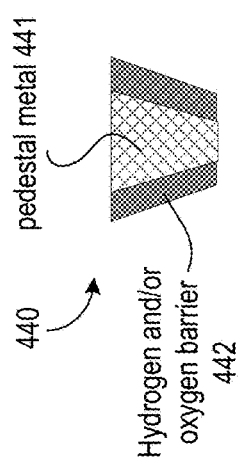
Fig. 4A
Fig. 4B
Fig. 4C

Plate-lines parallel to word-line
Read operation for multi-element FE gain bit-cells

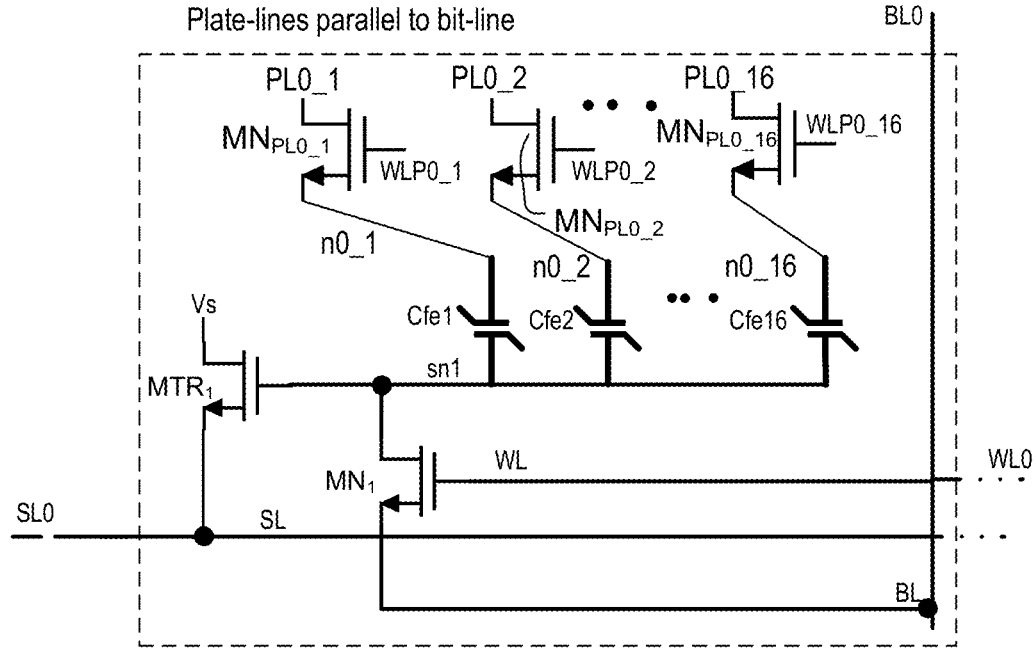
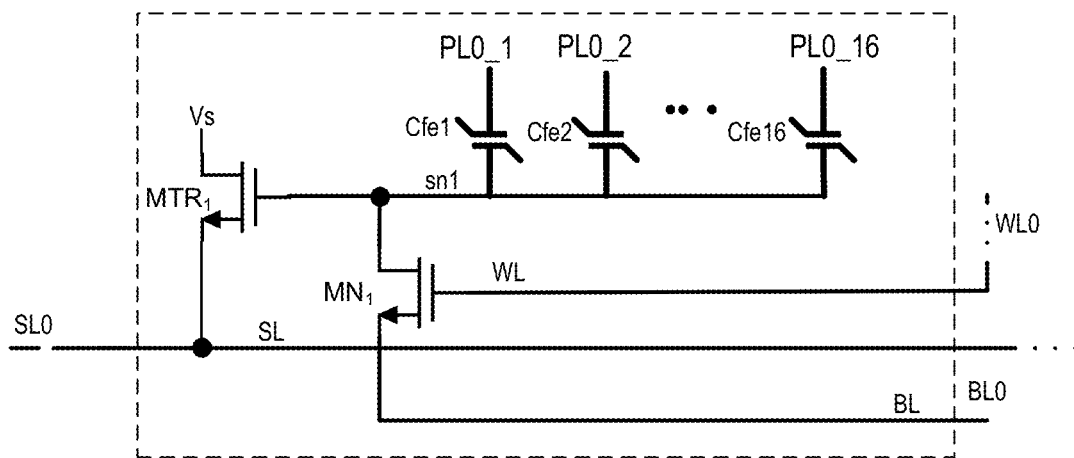
Fig. 16E

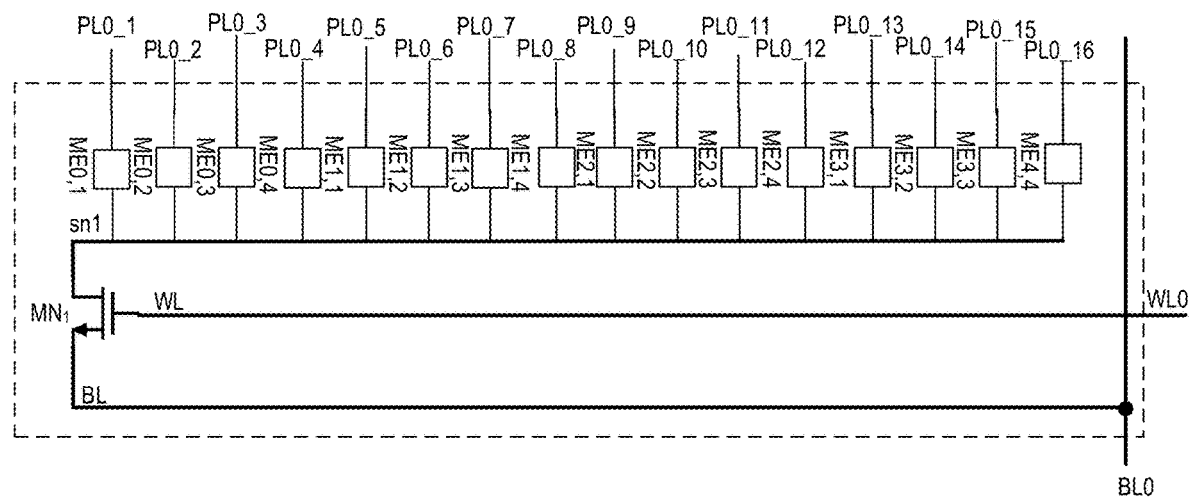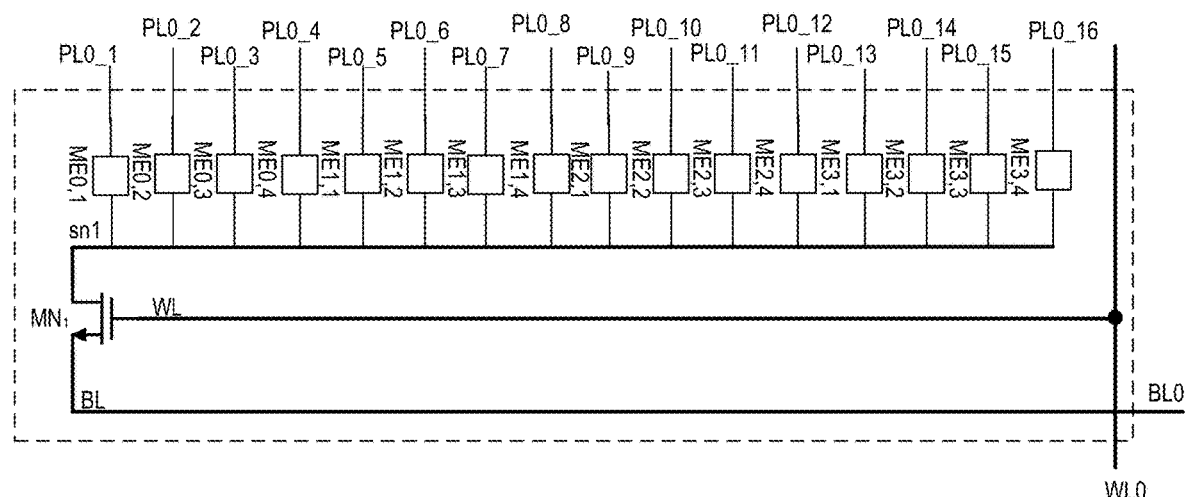
Fig. 20D

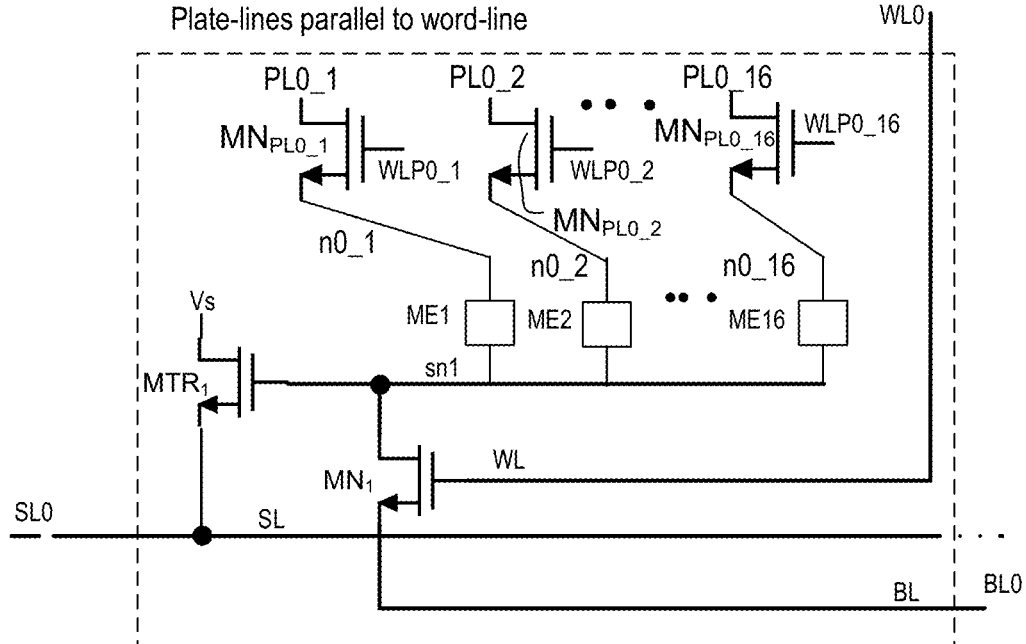
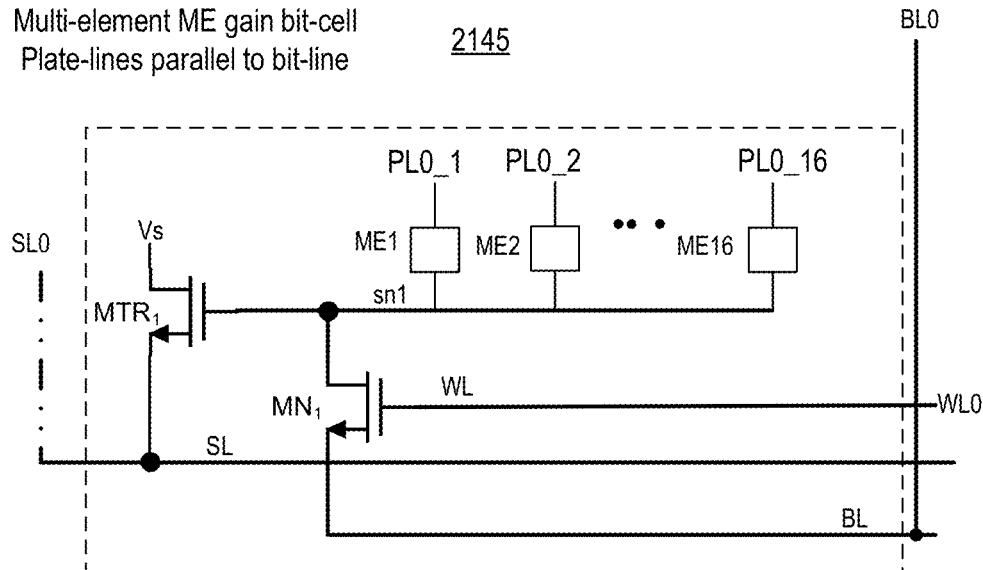
Fig. 21D

MULTI-ELEMENT FERROELECTRIC GAIN MEMORY BIT-CELL HAVING STACKED AND FOLDED NON-PLANAR CAPACITORS

CLAIM FOR PRIORITY

This application is a Continuation of, and claims the benefit of priority to U.S. patent application Ser. No. 17/653,811, filed Mar. 7, 2022, and which is incorporated by reference in its entirety.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

Some memories and/or circuits may use multiple capacitors. These capacitors can occupy large areas making them challenging to use as circuit and memory dimensions are reducing.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or paraelectric capacitor structure, in accordance with some embodiments.

FIG. 4B illustrates three planar ferroelectric or paraelectric capacitor structures, respectively, in accordance with some embodiments.

FIG. 4C illustrates a pedestal that connects to the top and/or bottom electrodes of the planar ferroelectric or paraelectric capacitor.

FIG. 16E illustrates a multi-element FE gain bit-cell used for FIGS. 16A-D, in accordance with some embodiments.

FIG. 20D illustrates 1Tn(ME) bit-cell used for FIGS. 20A-C, in accordance with some embodiments.

FIG. 21D illustrates a multi-element gain bit-cell used for FIGS. 21A-C, in accordance with some embodiments.

DETAILED DESCRIPTION

Figure 1:
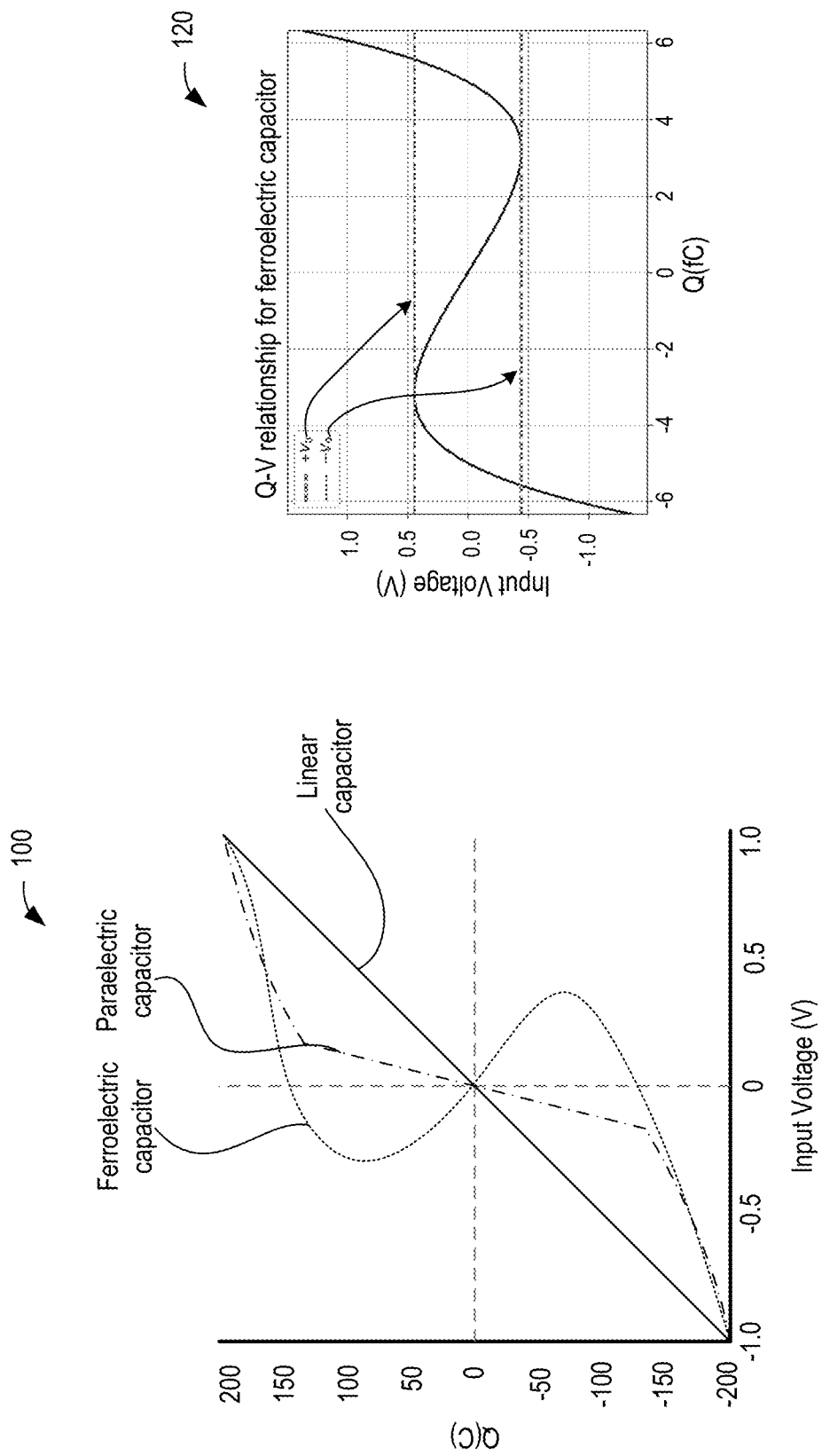
FIG. 1 illustrates a set of plots that show behavior of a ferroelectric capacitor, a paraelectric capacitor, and a linear capacitor.

Some embodiments describe a configuration for efficiently placing a group of capacitors that have one terminal connected to a common node. In some embodiments, the capacitors are stacked and folded along the common node. Here, the term "stack and fold" generally refers to a configuration of devices that are stacked vertically (substantially directly above or with a horizontal offset) such that one terminal of the devices is shared to a common node, and further the capacitors are placed along both sides of the common node. The common node thus becomes a point of fold. In various embodiments, the devices here are capacitors. The embodiments are not limited to capacitors and are applicable to any devices with a common node. In some embodiments, N number of capacitors can be divided in L number of stack layers such that there are N/L capacitors in each stacked layer. The N/L capacitor's one terminal can be shorted together with an electrode (e.g., bottom electrode). In some embodiments, the electrode can be metal, a conducting oxide, or a combination of a conducting oxide and a barrier (or insulative material).

In some embodiments, the capacitors are stacked and folded, and also vertically offset relative to lower capacitors in the stack. The offset allows for routing metal electrodes coupled to the top electrodes of the capacitors through space created by the offset while reducing parasitic to the capacitor(s) underneath. As such, the various metal electrodes are parallel to one another with limited jogs, for example.

In some embodiments, the capacitors are staggered while sharing a same bottom electrode or shared metal layer. The capacitors are staggered by having offsets in the x-direction and a y-direction relative to one another. The offsets allow for routing metal electrodes coupled to the top electrodes of the capacitors through space created by the offset. As such, the various metal electrodes are parallel to one another with limited jogs, for example. The various embodiments here can be combined with other embodiments. Hence, all possible permutations of combinations are not shown, but are within the scope of this disclosure.

Here the term "staggered configuration" or "staggered" generally refers to placement of devices (e.g., capacitors) relative to one another such that the devices are offset from one another in a horizontal plane and/or a vertical plane. When devices are offset in a horizontal plane, the devices may be diagonally away from one another (e.g., having an x-offset and a y-offset in a x-y horizontal plane). When devices are offset in a vertical plane, the devices may be diagonally away from one another (e.g., having an x-offset and a z-offset in a x-z vertical plane). In some examples, the devices can be staggered both horizontally and vertically. In some examples, the devices are staggered horizontally. In some embodiments, the devices are staggered vertically.

The capacitors can be planar or non-planar. For planar capacitors, the point of fold comprises a via that is connected to metal layers and subsequent vias along a vertical path. In some embodiments, the point of fold comprises through vias (e.g., through silicon vias or a vertical stack of vias). In some embodiments, the through vias can be a single continuous and contiguous via, which is referred to as an aligned via. A vertical stack of vias may also be aligned vertically with reference to one another but connect to a shared metal or shared bottom electrode at various junctions. In some embodiments, multiple vias are used to traverse through layers vertically. The vias may be aligned along the same vertical axis, in accordance with some embodiments. In some embodiments, the vias can be misaligned (e.g., may have horizontal offset) or may have multiple vertical paths along the point of fold. The embodiments of stacking and folding the capacitors is applicable to any device structure where one terminal is common between the device. The capacitors can include linear dielectric, ferroelectric (FE), or paraelectric (PE) material. By stacking and folding the capacitors, the vertical height of the circuit having such capacitors is lowered. As such, the transistor footprint in the x-y direction (horizontal direction) is maximized because the capacitors over the transistor occupy vertical and horizontal space using the stack and fold technique.

In some embodiments, the capacitors are part of a 1TnC bit-cell configuration. In a 1TnC configuration, a bit cell comprises one select transistor and a plurality of capacitors. In some embodiments, the capacitors are part of multi-gain element based FE cell. In some embodiments, the capacitors are part of a majority gate, minority gate, or an adaptive or configurable threshold gate.

In some embodiments, the capacitors of 1TnC and the multi-gain element bit-cell include ferroelectric or paraelectric material. While memory with memory bit-cells comprising ferroelectric material provide a new class of non-volatile memories, traditional ferroelectric memories suffer from charge degradation over time, for example, during read operations. Such memories also suffer from charge disturbance when neighboring bit-cells are accessed. Such disturbance may be a function of routing configuration of plate-line(s), relative to bit-lines and word-lines. Further, leakage from transistors coupled to ferroelectric capacitor(s) may further degrade charge on a storage node connected to the capacitor.

Consider the case for an unselected memory bit-cell where word-line to a gate of an n-type transistor of the bit-cell is at logic low. Continuing with this example, when the plate-line coupled to the capacitor is parallel to a bit-line, which is coupled to a source terminal or a drain terminal of the n-type transistor, transitions from logic low to logic high on the plate line results in a field across the ferroelectric capacitor of this unselected memory bit-cell. This field causes polarization decay for a ferroelectric material in the ferroelectric capacitor. The polarization decay causes the charge on the storage node to rise, which in turn weakens the disturb electric field across the ferroelectric material of the unselected bit-cell. The weakened disturb electric field causes the n-type transistor to leak, which in turn causes the disturb field to increase. As such, the unselected bit-cell suffers from charge disturb when the plate-line is parallel to the bit-line. Depending on the charge stored in the ferroelectric capacitor, this disturb field can either disturb or reinforce the stored value in the ferroelectric capacitor.

Parasitic capacitance (Cp) from the transistor and a dielectric component (Cde) of the ferroelectric capacitor also results in a capacitor divider. This capacitor divider causes a voltage drop across the ferroelectric capacitor of the unselected bit-cell. The voltage drop across the unselected ferroelectric capacitor can be approximately one-third to one-fourth of a voltage on the plate-line. In one example, when the plate-line voltage is twice the coercive voltage (Vc) of the ferroelectric capacitor, the disturb voltage can be two-thirds to one-half of the Vc for the unselected cell. Depending on the charge stored in the ferroelectric capacitor, this disturb voltage can either disturb or reinforce the stored value in the ferroelectric capacitor.

To mitigate such charge disturbance, the memory bit-cells may be refreshed, in accordance with some embodiments. For example, ferroelectric based random access memory (FeRAM) may apply a refresh scheme to make sure the contents in its capacitor remain valid. The refresh may be applied periodically or on an as needed basis. For instance, refresh may be applied every 1 second, or applied when a sensor determines that the contents on a storage node may have been disturbed. While various embodiments are described with reference to an FeRAM, the embodiments are applicable to other non-volatile memories (NVMs) such as magnetic random-access memory (MRAM), resistive RAM (ReRAM), ferroelectric RAM (FeRAM), paraelectric RAM (PeRAM), phase-change memory (PCM), etc.

In some embodiments, the NVM is integrated on a die which includes compute logic. In some embodiments, the NVM is a separate die which is packaged in a single package with a compute die. In some embodiments, the NVM is on a different package than the compute die. Here, examples of compute die include a die that is used for computations such as an inference logic, graphics processing unit (GPU), central processing unit (CPU), application specific integrated circuit (ASIC), digital signal processor (DSP), etc. In some embodiments, features of endurance mechanisms (e.g., randomizing mechanisms) are applicable to volatile memories such as static random-access memory (SRAM), and dynamic random-access memory (DRAM).

The endurance mechanisms (or refresh logic) of some embodiments include a wear leveling scheme that uses index rotation, outlier compensation to handle weak bits, and random swap injection (which is an example of a randomizing mechanism) to mitigate wear out attacks. In some embodiments, an index rotation logic is provided, which rotates the addresses throughout a memory bank to perform a wear leveling function. Index rotation logic ensures that memory requests are spread across memory locations rather than a single memory location. In some embodiments, a randomizing mechanism is used to randomize a mapping of an incoming address to an intermediate index. One example of a randomizing mechanism includes a random invertible bit matrix. This intermediate index is used by an index rotation logic to map to an actual physical index. In some embodiments, the rotation of gap words in the memory bank is randomized. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult. In some embodiments, random invertible bit matrix enables random swap injection which randomizes index rotation to obfuscate the mapping from addresses to rotated indexes. In some embodiments, bit repair logic is provided, which includes double error correcting, or triple error detecting error correction code (ECC) to discover new bit errors and spare disable which eliminates memory words with particularly high error rates.

Continuing with the example of a ferroelectric based memory bit-cell, the memory bit-cell is coupled to one or more plate-lines, a word-line, and a bit-line. The routing of the plate-line(s) relative to the word-line or the bit-line impacts the performance of the bit-cell. Some embodiments describe a read and write scheme (herein referred to as a pulsing scheme) for memory arrays where plate-line(s) is/are parallel to a bit-line. Some embodiments describe a pulsing scheme for memory arrays where plate-line(s) is/are parallel to a word-line. The pulsing schemes described with reference to various embodiments depend on a structure or configuration of a memory bit-cell. Some embodiments describe a pulsing scheme for a two-transistor, one-capacitor (2T1C) bit-cell configuration. Some embodiments describe a pulsing scheme for a one-transistor, n-capacitors (1TnC) bit-cell configuration. Some embodiments describe a pulsing scheme for multi-element FE gain bit-cell configuration.

In some embodiments, a memory is provided which comprises a capacitor including non-linear polar material. An individual capacitor may have a first terminal coupled to a node (e.g., a storage node) and a second terminal coupled to a plate-line. The node forms the point of fold, in accordance with various embodiments. The capacitors can be a planar capacitor or non-planar capacitor (also known as pillar capacitor) that are stacked and folded, in accordance to various embodiments. In various embodiments, the memory comprises a transistor coupled to the node and a bit-line (BL), wherein the transistor is controllable by a word-line (WL), and wherein the plate-line (PL) is parallel to the bit-line. In some embodiments, the memory comprises a refresh circuitry (e.g., wear-leveling logic) to refresh charge on the capacitor periodically or at a predetermined time. The refresh circuit can utilize one or more of the endurance mechanisms described herein. When the plate-line is parallel to the bit-line, a specific read and write scheme may be used to reduce the disturb voltage for unselected bit-cells, in accordance with some embodiments. In some embodiments, a transistor switch is coupled to the plate-line to remove the effect of PL toggles on an unselected bit-line.

In some embodiments, the memory comprises one or more circuitries to boost the word-line above a voltage supply level (Vdd) during a write operation and a read operation. The boost level may range from 5% to 30% of Vdd, in some examples. In some embodiments, the boost is provided to offset the threshold (Vt) drop account the n-type device (e.g., NMOS) access transistor when the n-type device is to pass a signal close to Vdd signal. In some embodiments, the one or more circuitries generate a first pulse on the bit-line after the word-line is boosted and before an end of the boost on the word-line during a first write operation (e.g., Write 0). These one or more circuitries can be circuitries on the periphery of the memory. In some embodiments, the one or more circuitries generate a second pulse on the plate-line after the word-line is boosted and before the end of the boost on the word-line during a second write operation (e.g., Write 1) different from the first write operation.

In some embodiments, the one or more circuitries force a first voltage (e.g., 0V) on the plate-line during the first write operation. In some embodiments, the one or more circuitries force the first voltage on the bit-line during the first write operation. In some embodiments, the one or more circuitries initially force a voltage on the bit-line and subsequently allow the bit-line to float during the read operation, wherein the one or more circuitries boost the word-line above the voltage supply level during the read operation. In some embodiments, the one or more circuitries generate a third pulse on the plate-line after the word-line is boosted and before an end of the boost on the word-line during the read operation. The pulsing scheme of various embodiments avoid high voltage on the node (storage node) when the plate-line is parallel to the bit-line. While the pulsing scheme is described for a one transistor, one capacitor (herein 1T1C), based memory bit-cell, the scheme is applicable to other memory bit cells such as 1TnC, 2T1C, 1TnC, and multi-element FE gain configurations as described herein. In some embodiments, the transistor is a low leakage transistor. For example, the transistor is a high-threshold transistor in a dual threshold CMOS process technology node. The lower leakage transistor limits the effective field across the ferroelectric based capacitor by lowering the effective field, and as such delays the process of refreshing the capacitor. In some embodiments, by having the plate-line(s) parallel to the bit-lines, the memory layout allows for introducing word-line drivers or repeaters to drive signals on the word-lines, which run orthogonal to the plate-line(s) and the bit-lines.

Other ways to reduce the effect of the disturb charge when the plate-line is parallel to the bit-line is to lower the thickness (along the z-axis for a planar capacitor) of the ferroelectric material, in accordance with some embodiments. Reducing the thickness may reduce a relative impact of a parasitic capacitance (Cp) on a storage or internal node of the memory cell relative to a dielectric capacitance (Cdie). Here, the dielectric capacitance is of a dielectric component of the ferroelectric based capacitor of the memory bit-cell. The thickness of the ferroelectric material of the ferroelectric based capacitor along a z-axis can be in the range of 5 nm to 30 nm, in accordance with some embodiments.

In some embodiments, the effect of the disturb charge is mitigated by using a higher dielectric constant for the ferroelectric material. For example, ferroelectric based capacitor of higher dielectric constant can have a dielectric constant between 100 and 600. The higher dielectric constant and/or lower film thickness reduces the effective field for an unselected bit-cell coupled to the same PL in proportion to Cp/(Cdie+Cp) as the dielectric capacitance component of the ferroelectric capacitor increases relative to the parasitic component on the storage or internal node.

In some embodiments, the disturb voltage is reduced by lowering the parasitic capacitances on the storage or internal node. Lowering the parasitic capacitances (Cp) improves the ratio Cp/Cdie+Cp) to lower the effective disturb field seen across the ferroelectric capacitor for an unselected bit-cell. In some embodiments, replacing the 1T1C memory bit-cell topology with a 2T1C topology can isolate the plate-line signal visibility for the unselected bit-cells as activity seen on the PL can be masked to other unselected bit-cells by controlling a switch (a transistor) on the PL to be in off-state. As such, the effect of the disturb voltage reduces. In some embodiments, the effect of the disturb charge is mitigated by changing the read mechanism. For example, changing the pattern of read 1 relative to read 0 periodically reduces the effect of the disturb charge. As such, read disturbances are averaged and thus reduced from their peak values.

In some embodiments, for a multi-element gain memory bit-cell, when the plate-line is parallel to the bit-line, read operation may result in reading all the memory bit-cells since the charge on the storage node may flip for all bit-cells. The charge on the storage node may flip because of excessive parasitic capacitance on the storage or internal node which is shared by multiple ferroelectric capacitors of the same multi-element gain memory bit-cell. Since the parasitic capacitance is greater than the dielectric capacitance, the field is applied to all the ferroelectric capacitors that are shared on the same plate-line, even if the bit-cell was unselected.

A multi-element FE gain memory bit-cell comprises a plurality of ferroelectric capacitors, where an individual ferroelectric capacitor is coupled to an individual plate-line. The plurality of capacitors is stacked and folded, in accordance with various embodiments. Two transistors are coupled to the storage node, which is also coupled to the ferroelectric capacitors. One of the transistors is controlled by the word-line and coupled to the bit-line, while the other transistor is controlled by the voltage on the storage node. This other transistor has a source terminal, or a drain terminal coupled to the bit-line. In some embodiments, the issue that results in reading all the memory bit-cells is resolved by introducing an individual transistor between an individual plate-line and an individual ferroelectric capacitor. This individual transistor is controlled by an individual word-line. These individual transistors on the plate-line ensure that the plate-line signal toggle is not seen by other bit-cells on the same column when the bit-cells share the same bit-line. In some embodiments, the area usage from the additional transistors on the individual plate-lines is mitigated by fabricating the additional transistors (also referred to as switches) in the backend of a die while the other two transistors of the bit-cell are fabricated on the front-end of the die.

In some cases, the plate-line is parallel to the word-line. In that case, a write operation without appropriate signaling may inherently mean writing the same value to each bit-cell. For example, writing a value by controlling the plate-line, which is shared across all selected bit-cells since the plate-line is parallel to the word-line, may result in writing the same value to all the bit-cells. To control this effect, in some embodiments, the one or more circuitries carry out a different pulsing scheme for read or write operations when the plate-line is parallel to the word-line. In some embodiments, the one or more circuitries boost the word-line above a voltage supply level during a write operation and a read operation. In some embodiments, the one or more circuitries generates a first pulse on the bit-line after the word-line is boosted and before an end of the boost on the word-line during a first write operation (Write 1). In some embodiments, the one or more circuitries generates a second pulse on the plate-line after the word-line is boosted and before the end of the boost on the word-line during a second write operation (e.g., Write 0) different from the first write operation. In some embodiments, the one or more circuitries generate a third pulse on the plate-line after the word-line is boosted and after the first pulse begins during the first write operation, wherein the third pulse ends about a time when the first pulse ends. In some embodiments, in the case where the plate-line is parallel to the word-line, the memory comprises a refresh circuitry to refresh charge on the capacitor periodically or at a predetermined time. The refresh circuit can utilize one or more of the endurance mechanisms described herein.

Referring back to the 1T1C example, where the plate-line is parallel to the bit-line, in some embodiments, the one or more circuitries force a first voltage (e.g., 0V) on the bit-line during the second write operation. In some embodiments, the one or more circuitries generates a fourth pulse on the plate-line after the word-line is boosted, wherein the fourth pulse ends before the end of the boost on the word-line. In some embodiments, the one or more circuitries initially force a voltage on the bit-line and subsequently allow the bit-line to float during the read operation, wherein the one or more circuitries is to boost the word-line above the voltage supply level during the read operation. In some embodiments, the one or more circuitries generates a fifth pulse on the plate-line after the word-line is boosted and before an end of the boost on the word-line during the read operation, wherein the fifth pulse starts when the bit-line is allowed to float. In some embodiments, the one or more circuitries boost the word-line by a threshold of the n-type-device (e.g., about 0.3V) above a voltage on the bit-line or the plate-line. In some embodiments, the one or more circuitries boost the word-line by about 1.5× of a threshold voltage of the transistor (herein also referred to as a select transistor). In some embodiments, the transistor is a low leakage transistor. In some embodiments, by having the plate-line(s) parallel to the word-lines, the memory layout allows for introducing plate-line drivers or repeaters to drive signals on the plate-lines, which run orthogonal to the bit-lines. In addition to plate-line repeaters, the memory layout allows for introducing word-line drivers or repeaters to drive signals on the word-lines, which run orthogonal to the bit-lines.

In a multi-element FE gain memory bit-cell configuration, multiple capacitors are coupled to the node (storage node) and two transistors, where one transistor (e.g., the select transistor) is controllable by word-line and the other transistor is a gain element. In some embodiments, a pulsing scheme is described which avoids writing the same value to all multi-element FE gain memory bit-cells. In some embodiments, the memory, with multi-element FE gain memory bit-cell, comprises a refresh circuitry to refresh charge on the capacitor periodically or at a predetermined time. The refresh circuit can utilize one or more of the endurance mechanisms described herein. When the plate-line is parallel to the bit-line, column multiplexing is enabled which lowers the number of sense amplifiers needed to sense the values stored in the memory bit-cells, in accordance with some embodiments. As such, lower periphery area overhead is achieved. In the case where the plate-line is parallel to the bit-line, a plate-line driver switches one memory bit-cell (and thus one ferroelectric capacitor). As such, the plate-line driver size can be reduced, which improves power and area, in accordance with some embodiments. In the case where the plate-line is parallel to the word-line, column multiplexing may be relatively challenging.

However, in the case where the plate-line is parallel to the word-line, the energy cost on the plate-line is lower than that in the case where the plate-line is parallel to the bit-line. This is because parasitic capacitance on the plate-line is amortized over multiple bit-cells, as opposed to the case where the plate-line is parallel to the bit-line where multiple plate-lines are toggled. Likewise, in the case where the plate-line is parallel to the word-line, the disturb effects are lower than that in the case where the plate-line is parallel to the bit-line. This is because merely the bits that are intended to be read or written are the ones that get exposed to the plate-line, word-line, and bit-line signals. A disturb effect generally refers to an unintentional application of field on the ferroelectric capacitor(s) coupled to unselected bit-cells during read or write operations of adjacent bit-cells on the same row or column. Such a disturb effect can cause the ferroelectric capacitors of the unselected bit-cells to lose their polar state slowly over time.

When the bit-cells that are getting programmed to (e.g., either read/write) are the bit-cells that see the voltages on the plate-line and the word-line directly, the transistor on the bit-line masks the unselected bits, unlike the case when the plate-line is parallel to the bit-line where the unselected bit-cells within the 1T1C bit-cell see activities on the plate-line without any transistor masking the signal. As discussed herein, the pulsing schemes for the various memory bit-cell configurations reduces disturb effect and allows for realization of a reliable non-volatile memory. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a ferroelectric (PE) capacitor (a nonlinear capacitor) and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization vs. voltage response. The threshold is related to: a) nonlinearity of switching transfer function; and b) the squareness of the FE switching. The nonlinearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when FE material is a perovskite, the conductive oxides are of the type AA'BB'O3. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for the FE material, conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides. In some embodiments, the conductive oxides include one or more of: Ir, In, Fe, Ru, Pd, Os, or Re.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05 or 0.5, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with a first doping material or PZT with a second doping material, wherein the doping material is one of Nb or La; and a relaxor ferroelectric such as PMN-PT.

In some embodiments, the FE material includes Bismuth ferrite (BFO) with a first doping material wherein the first doping material is one of Lanthanum or any element from the lanthanide series of the periodic table. In some embodiments, FE material includes lead zirconium titanate (PZT) or PZT with a second doping material, wherein second doping material is one of La or Nb. In some embodiments, FE material includes a relaxor ferro-electric including one of; lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, $Hf_{(1-x)}E_xO_y$ where x and y are fractions, and where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, polyvinylidene fluoride or polyvinylene difluoride (PVDF).

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. In some embodiments, the paraelectric material includes one of: SrTiO3, Ba(x)Sr(y)TiO3 (where x is −0.5, and y is 0.95), BaTiO3, HfZrO2, Hf—Si—O, La-substituted PbTiO3, or PMN-PT based relaxor ferroelectrics.

Figure 2:
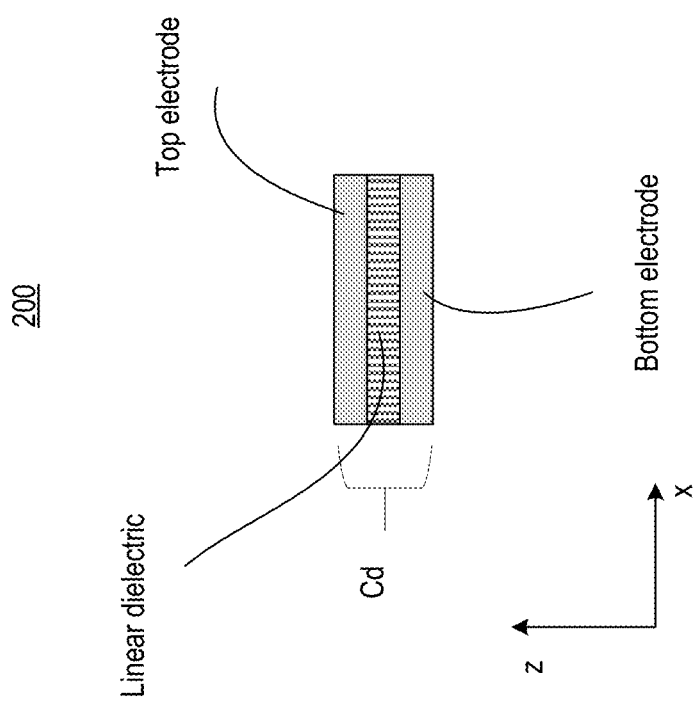
FIG. 2 illustrates a planar linear capacitor structure, in accordance with some embodiments.

While some embodiments are illustrated with reference to ferroelectric material, the ferroelectric material can be replaced with anti-ferroelectric (AFE) material. Examples of anti-ferroelectric material include:

FIG. 2 illustrates a planar linear capacitor structure 200, in accordance with some embodiments. In some embodiments, capacitors for the multi-input capacitive structures are linear capacitors. These capacitors can take any planar form. One such form is illustrated in FIG. 2. Here, planar capacitor structure 200 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn.

In some embodiments, the dielectric layer includes one or more of: SiO2, Al2O3, Li2O, HfSiO4, Sc2O3, SrO, HfO2, ZrO2, Y2O3, Ta2O5, BaO, WO3, MoO3, or TiO2. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 3A:
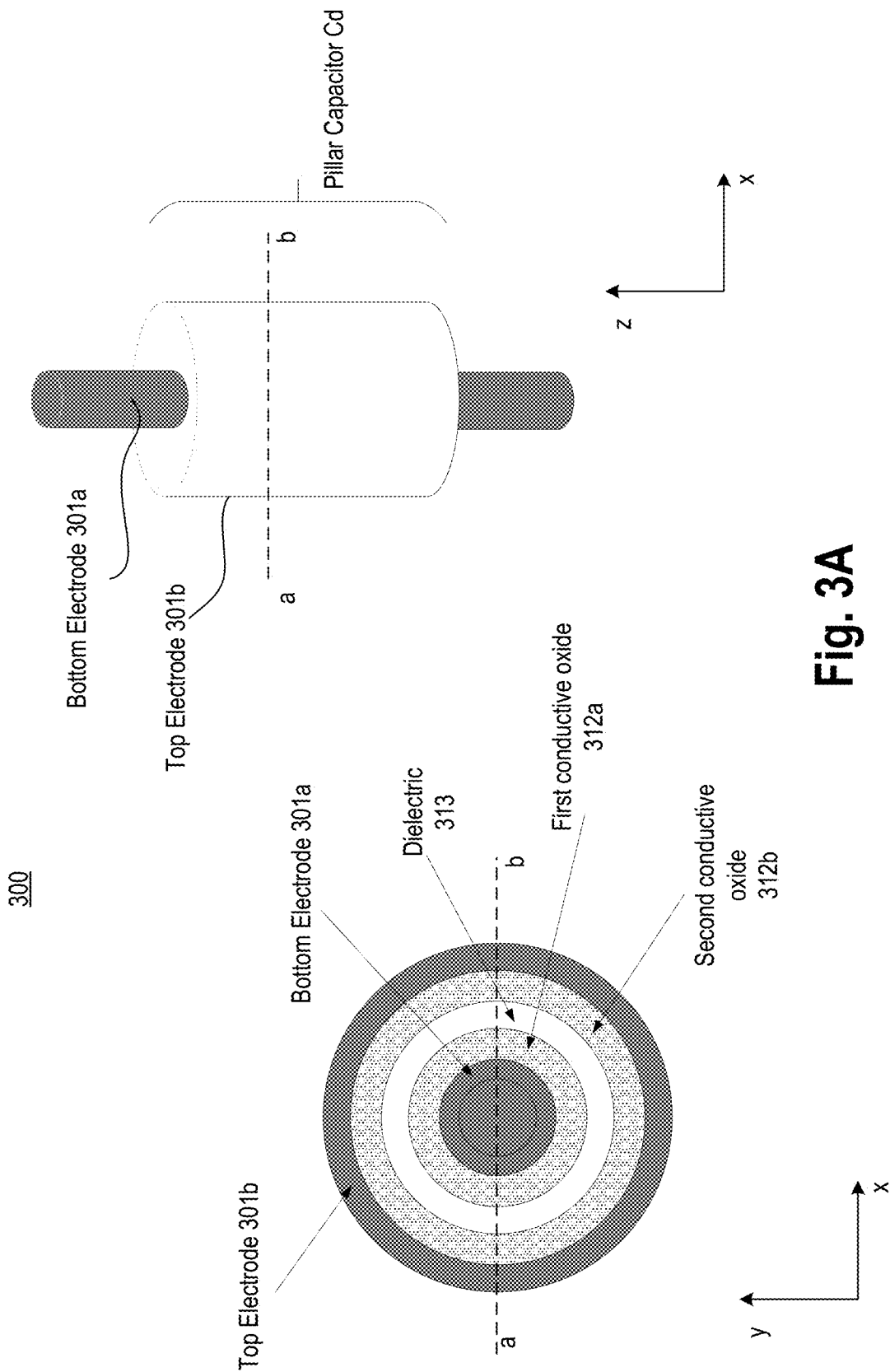
FIG. 3A illustrates a non-planar linear capacitor structure, in accordance with some embodiments.

FIG. 3A illustrates a non-planar linear capacitor structure 300, in accordance with some embodiments. In some embodiments, non-planar capacitor structure 300 is rectangular in shape. Taking the cylindrical shaped case for example, in some embodiments, the layers of non-planar capacitor structure 300 from the center going outwards include bottom electrode 301a, first conductive oxide 312a, linear dielectric material 313, second conductive oxide 312b, and top electrode 301b. A cross-sectional view along the "ab" dashed line is illustrated in the middle of FIG. 3A. In some embodiments, conducting oxides are removed and the linear dielectric is directly connected to top electrode 301b and bottom electrodes 301a. In some embodiments, linear dielectric material 313 can include any suitable dielectric, where the thickness of dielectric film is a range of 1 nm to 20 nm. In some embodiments, linear dielectric material 313 comprises a higher-K dielectric material. In some embodiments, linear dielectrics include one of: SIO2, Al2O3, Li2O, HfSiO4, Sc2O3, SrO, HfO2, ZrO2, Y2O3, Ta2O5, BaO, WO3, MoO3, or TiO2. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide.

In some embodiments, first conductive oxide 312a is conformally deposited over bottom electrode 301a. In some embodiments, dielectric material 313 is conformally deposited over first conductive oxide 312a. In some embodiments, second conductive oxide 312b is conformally deposited over dielectric material 313. In some embodiments, top electrode 301b is conformally deposited over second conductive oxide 312b. In some embodiments, bottom electrode 301a is in the center while top electrode 301b is on an outer circumference of non-planar capacitor structure 300.

In some embodiments, material for bottom electrode 301a may include one or more of: Cu, Al, Ag, Au, W, or Co, or their alloys. In some embodiments, material for first conductive oxide 312a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 312b may be same as the material for first conductive oxide 312a. In some embodiments, material for top electrode 301b may include one or more of: Cu, Al, Ag, Au, W, or Co, or their alloys.

In some embodiments, a first refractive inter-metallic layer (not shown) is formed between dielectric material 313 and first conductive oxide 312a. In some embodiments, a second refractive inter-metallic layer (not shown) is formed between dielectric capacitor material 313 and second conductive oxide 312b. In these cases, the first and second refractive inter-metallic layers are directly adjacent to their respective conductive oxide layers and to dielectric capacitor material 313. In some embodiments, refractive inter-metallic maintains the capacitive properties of the dielectric capacitor material 313. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1 to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 300 in the x-axis are in the range of 1 nm to 30 nm. In some embodiment, refractive inter-metallic layers are not used for non-planar capacitor structure 300.

Figure 3B:
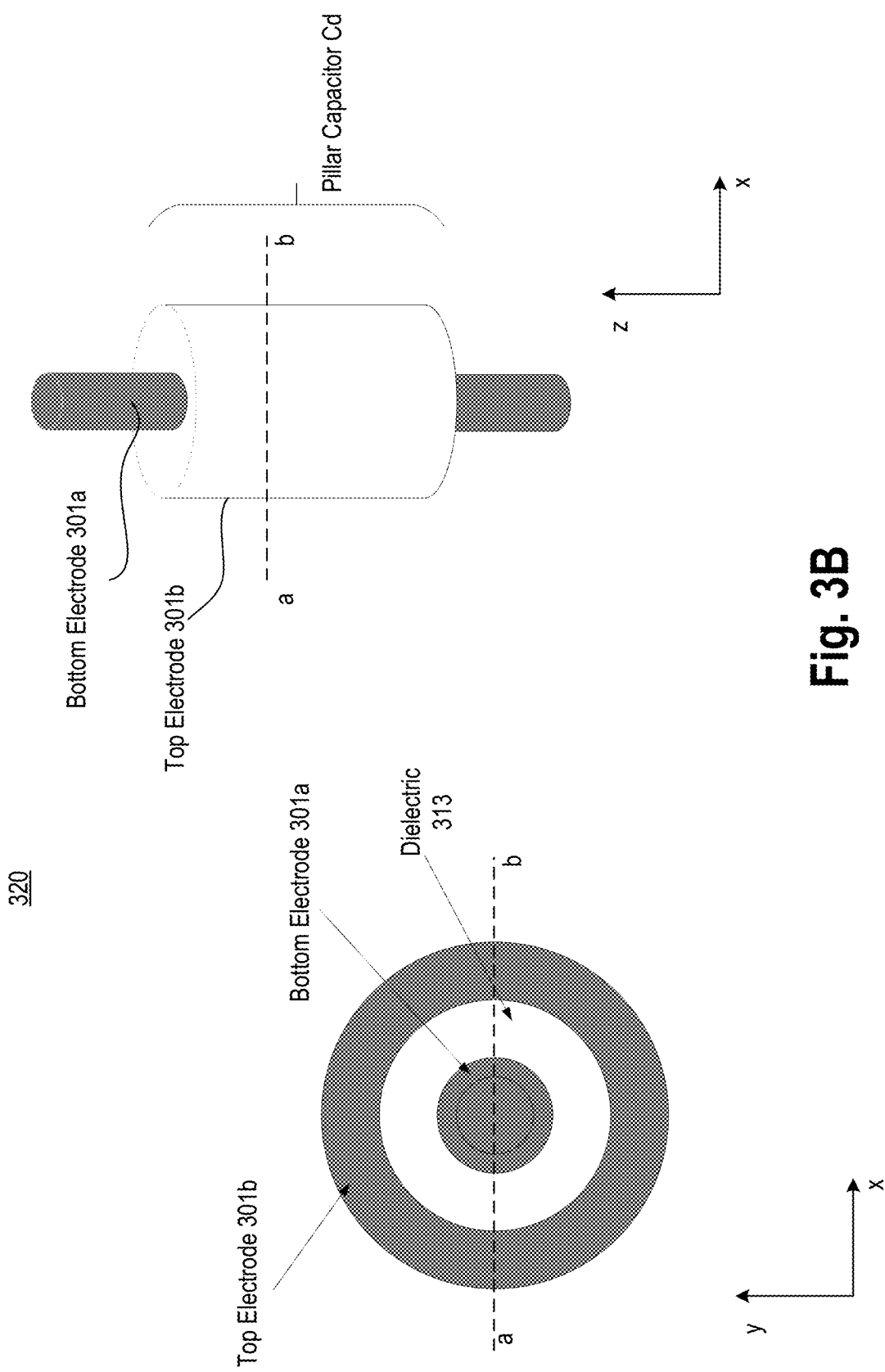
FIG. 3B illustrates a non-planar linear capacitor structure without conductive oxides, in accordance with some embodiments.

FIG. 3B illustrates a non-planar linear capacitor structure 320 without conductive oxides, in accordance with some embodiments. Compared to FIG. 3A, here the linear dielectric is adjacent to the top electrode and the bottom electrode.

FIG. 4A illustrates a planar ferroelectric or paraelectric capacitor structure, in accordance with some embodiments.

FIG. 4B illustrates three planar ferroelectric or paraelectric capacitor structures, respectively, in accordance with some embodiments.

In some embodiments, capacitors are ferroelectric or paraelectric capacitors. These capacitors can take any planar form. One such simplified form is illustrated in FIG. 4A. Here, planar capacitor structure 400 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

In some embodiments, planar capacitor 423a incudes encapsulation portions 421a and 421b (also referred to as sidewall barrier seal) that are adjacent to the side walls of the plurality of layers of the planar capacitor. In some embodiments, planar capacitor 423b incudes encapsulation portions 421c and 421d that are partially adjacent to sidewall barrier seal 421a and 421b, and refractive inter-metallic layers 411a. In some embodiments, sidewall barrier seal 421a and 421b extend in the z-plane. In various embodiments, encapsulation portions 421c and 421d terminate into a via (not shown). The material for encapsulation portions 421c and 421d is the same as those for sidewall barrier seal 421a and 421b. In some embodiments, the barrier material includes one or more of an oxide of: Ti, Al, or Mg.

In some embodiments, planar capacitor 423c includes encapsulation portions 421e and 421f that are partially adjacent to sidewall barrier seal 421a and 421b, and refractive inter-metallic layers 411b. In various embodiments, encapsulation portions 421e and 421f terminate into a via (not shown). In some embodiments, encapsulation portions 421e and 421f extend in an x-plane. The material for encapsulation portions 421e and 421f is the same as those for sidewall barrier seal 421a and 421b. Material for 421a and 421b includes one or more of: Ti—Al—O, $Al_2O_3$, MgO, or nitride. Material for 421a and 421b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 421a/b (insulating material) is in a range of 0.1 nm to 20 nm. In some embodiments, sidewall barriers are in direct contact with ILD.

In some embodiments, planar capacitors 423a, 423b, and 423c comprise a number of layers stacked together to form a planar capacitor. These layers may extend in an x-plane when the capacitor is a planar capacitor. In some embodiments, the stack of layers includes refractive inter-metallic 411a/b as a barrier material; conductive oxides 412a/b, and FE material 413. FE material 413 can be any of the FE materials discussed herein. In some embodiments, refractive inter-metallic 411a/b are removed, and electrodes are in direct contact with conductive oxides 412a/b.

In some embodiments, refractive inter-metallic 411a/b maintains the FE properties of the FE capacitor. In the absence of refractive inter-metallic 411a/b, the ferroelectric material 413 of the capacitor may lose its potency. In some embodiments, refractive inter-metallic 411a/b comprises Ti and Al (e.g., TiAl compound). In some embodiments, refractive inter-metallic 411a/b comprises one or more of Ta, W, and/or Co. For example, refractive inter-metallic 411a/b includes a lattice of Ta, W, and Co.

In some embodiments, refractive inter-metallic 411a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or FE material 413.

In some embodiments, refractive inter-metallic 411a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. In some embodiments, barrier layer 411a is coupled to a top electrode. In some embodiments, sidewall barrier seal 421a/b (insulating material) is placed around layers 411a, 412a, 413, 412b, and 411b along while the top and bottom surfaces of 411a and 411b are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form A2O3 (e.g., $In_2O_3$, $Fe_2O_3$) and ABO3 type, where 'A' is a rare earth element and B is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

FIG. 4C illustrates pedestal 440 that connects to the top and/or bottom electrodes of the planar ferroelectric or paraelectric capacitor, in accordance with some embodiments. In some embodiments, pedestal 440 comprises pedestal metal 441 and sidewall barrier 442. In some embodiments, barrier 442 includes materials to protect hydrogen and/or oxygen from interacting with pedestal metal 441. In some embodiments, barrier 442 comprises Ti—Al—O, $Al_2O_3$, MgO, or nitride. In some embodiments, pedestal metal 441 includes one of Cu, Al, Ag, Au, W, or Co.

Figure 5A:
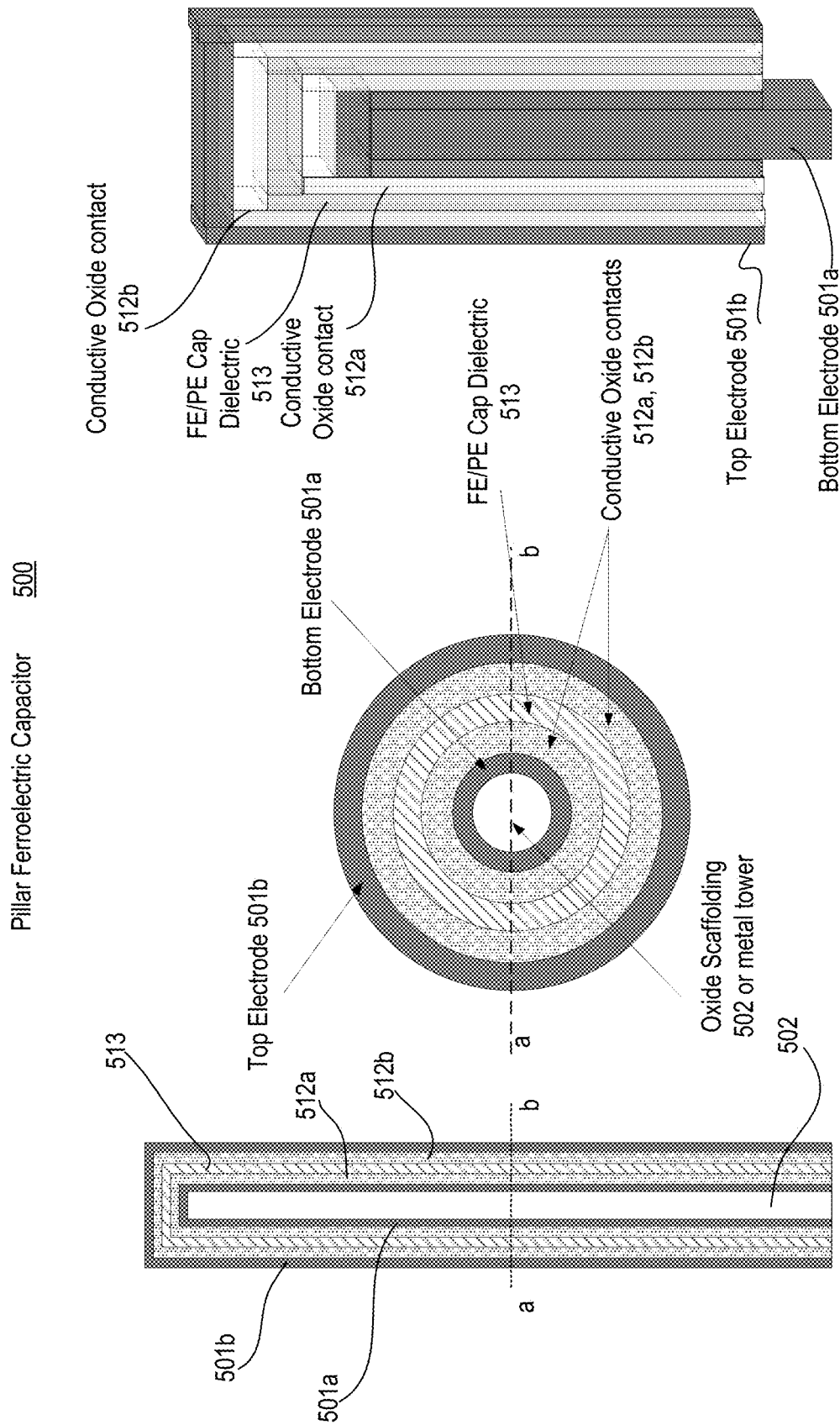
FIG. 5A illustrates a non-planar ferroelectric or paraelectric capacitor structure, in accordance with some embodiments.

FIG. 5A illustrates a non-planar ferroelectric (FE) or paraelectric (PE) capacitor structure, in accordance with some embodiments. In some embodiments, non-planar capacitor structure 500 is rectangular in shape. Taking the cylindrical shaped case for example, in some embodiments, the layers of non-planar capacitor structure 500 from the center going outwards include bottom electrode 501a, first conductive oxide 512a, ferroelectric (FE) or paraelectric (PE) dielectric material 513, second conductive oxide 512b, and top electrode 501b. In some embodiments, conducting oxides are removed and the FE/PE dielectric is directly connected to top electrode 501b and bottom electrode 501a. In some embodiments, ferroelectric dielectric material 513 can include any suitable dielectric, where the thickness of FE/PE dielectric film is a range of 1 nm to 20 nm. In some embodiments, FE/PE dielectric material 513 includes any one of the materials discussed herein for ferroelectrics or paraelectric. In some embodiments, a central region 502 of capacitor 500 is filled with oxide or an insulative material. In some embodiments, central region 502 is filled with metal that abuts with bottom electrode 501a to form a thicker bottom electrode.

In some embodiments, first conductive oxide 512a is conformally deposited over bottom electrode 501a. In some embodiments, FE/PE dielectric material 513 is conformally deposited over first conductive oxide 512a. In some embodiments, second conductive oxide 512b is conformally deposited over FE/PE dielectric material 513. In some embodiments, top electrode 501b is conformally deposited over second conductive oxide 512b. In some embodiments, bottom electrode 501a is in the center while top electrode 501b is on an outer circumference of non-planar capacitor structure 500.

In some embodiments, material for bottom electrode 501a may include one or more of: Cu, Al, Ag, Au, W, or Co, or their alloys. In some embodiments, material for first conductive oxide 512a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 512b may be same as the material for first conductive oxide 512a. In some embodiments, material for top electrode 501b may include one or more of: Cu, Al, Ag, Au, W, or Co, or their alloys.

In some embodiments, a first refractive inter-metallic layer (not shown) is formed between dielectric material 513 and first conductive oxide 512a. In some embodiments, a second refractive inter-metallic layer (not shown) is formed between FE/PE dielectric capacitor material 513 and second conductive oxide 512b. In these cases, the first and second refractive inter-metallic layers are directly adjacent to their respective conductive oxide layers and to FE/PE dielectric capacitor material 513. In some embodiments, refractive inter-metallic maintains the capacitive properties of the dielectric capacitor material 513. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy y(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 500 in the x-axis are in the range of 1 nm to 30 nm. In some embodiments, refractive inter-metallic layers are not used for non-planar capacitor structure 500.

Figure 5B:
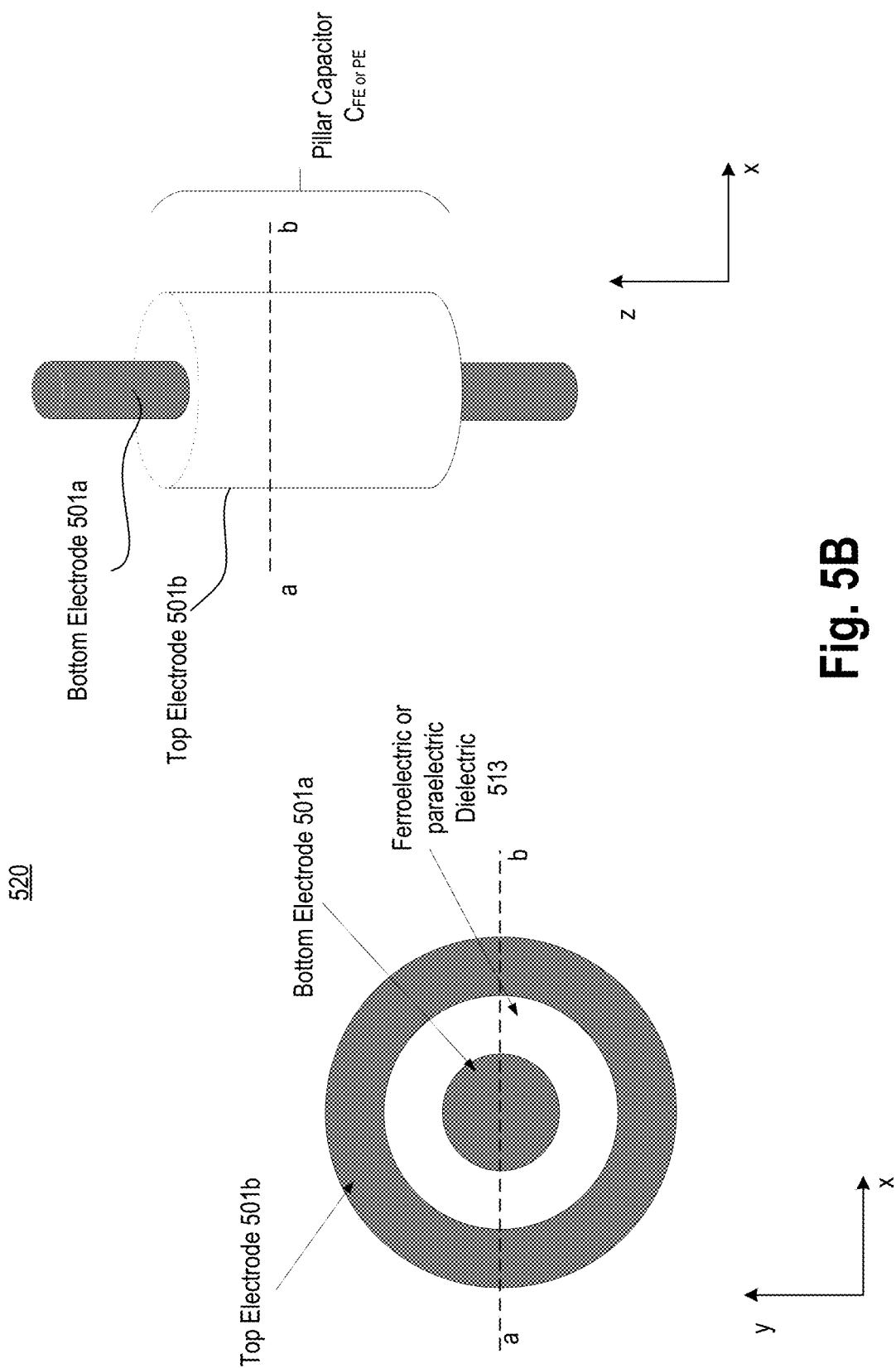
FIG. 5B illustrates a non-planar ferroelectric or paraelectric capacitor structure without conductive oxides, in accordance with some embodiments.

FIG. 5B illustrates a non-planar ferroelectric or paraelectric capacitor structure 520 without conductive oxides, in accordance with some embodiments. Compared to non-planar capacitor structure 500, here first conductive oxide 512a and second conductive oxide 512b are removed and ferroelectric material 513 is adjacent to top electrode 501b and bottom electrode 501a as shown.

Figure 6A:
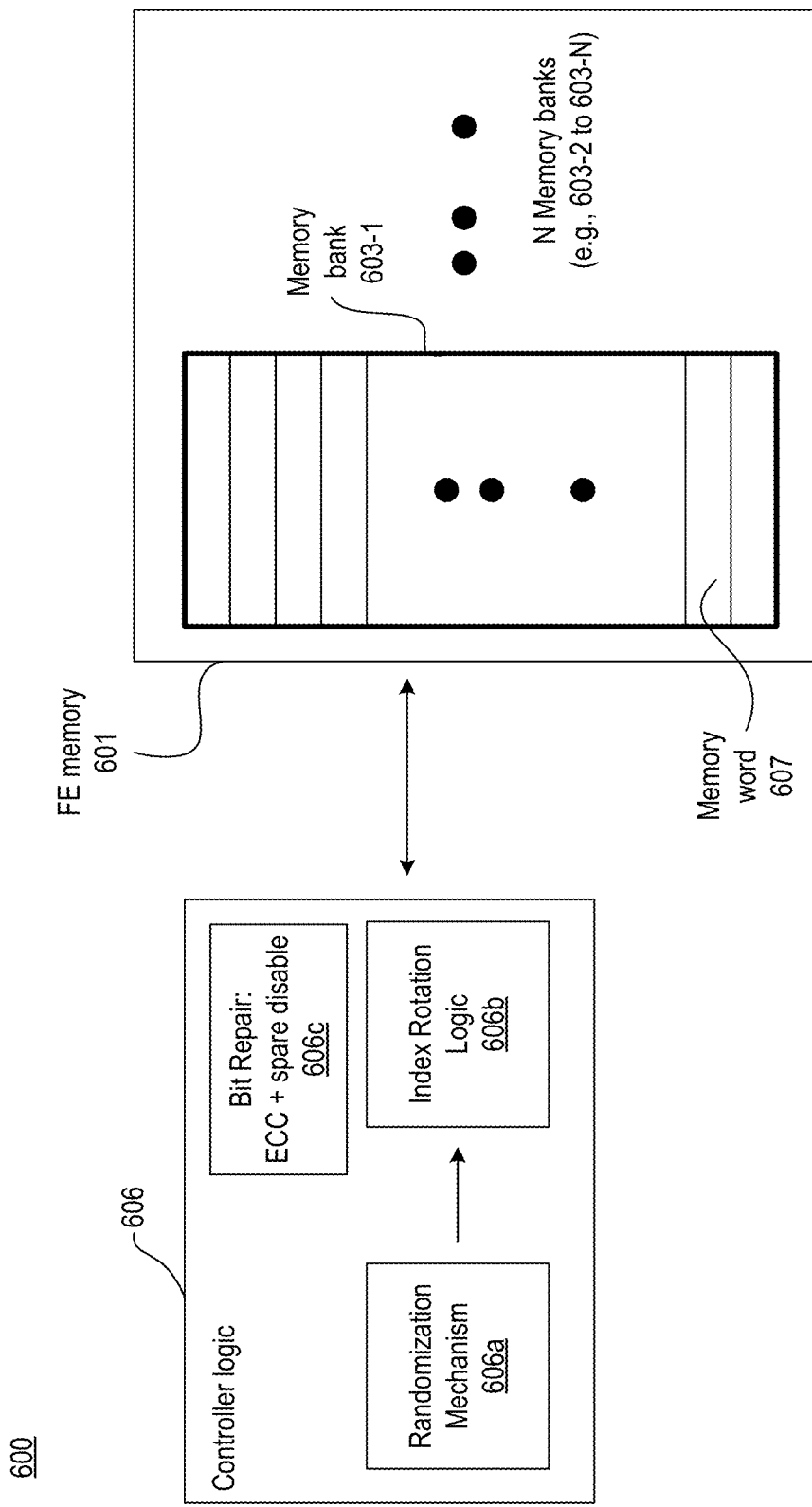
FIG. 6A illustrates a high-level endurance enhancement architecture for a paraelectric (PE) or ferroelectric (FE) memory, in accordance with some embodiments.

FIG. 6A illustrates a high-level endurance enhancement architecture 600 for a paraelectric (PE) or ferroelectric (FE) memory, in accordance with some embodiments. Architecture 600 comprises memory array 601 and controller logic 606. In various embodiments, memory array 601 is memory with non-linear polar material. For example, memory array 601 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In some embodiments, FE memory array 601 includes a plurality of memory banks (e.g., 603-1 through 603-N, where 'N' is a number). Each memory bank (e.g., 603-1) includes a plurality of memory words (e.g., memory word 607). Each memory word includes a plurality of memory bit-cells. For the sake of simplicity, other memory components are not shown such as write drivers, column multiplexers, sense-amplifiers, etc.

In various embodiments, controller logic 606 comprises endurance hardware and/or software to provide memory endurance to memory array 601. In general, memory endurance is needed to ensure write and/or read operations from memory array 601 are reliable. Write endurance is a number of programs and erase cycles that, when applied to a memory block, bank, or word before the memory block, bank, or word, becomes unreliable. The endurance mechanisms of some embodiments include a wear leveling scheme that uses index rotation, outlier compensation to handle weak bits, and random swap injection to mitigate wear out attacks. For the sake of simplicity, memory banks are generally referred to their reference 603 instead of a particular memory bank reference (e.g., 603-1, 603-2, etc.). Embodiments described to the general reference are applicable to an individual particular reference. For example, description of memory bank 603 is applicable for memory banks 603-1, 603-2, through 603-N.

In some embodiments, controller logic 606 (also referred to as refresh logic) comprises random invertible bit matrix 606a, index rotation logic 606b, and bit repair logic 606c. In some embodiments, index rotation logic 606b enables random swap injection which randomizes index rotation to obfuscate the mapping from addresses to rotated indexes. In some embodiments, index rotation logic 606b randomizes the rotation of gap words in memory bank 603. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In some embodiments, index rotation logic 606b is used for implementing the wear leveling scheme. In some embodiments, index rotation logic 606b rotates the addresses throughout memory bank 603 to perform a wear leveling function. In various embodiments, index rotation logic 606*b* ensures that memory requests are spread across memory locations rather than a single memory location.

In some embodiments, bit repair logic 606*c* includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 606*c* addresses the problem of weak memory bits. In some embodiments, each cache line or word 607 in memory bank 603 includes a valid bit. The valid bit indicates whether the data associated with that line/word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for FE memory array 601. These endurance mechanisms are applied to FE memory array 601 to maximize usage of such memory.

Figure 6B:
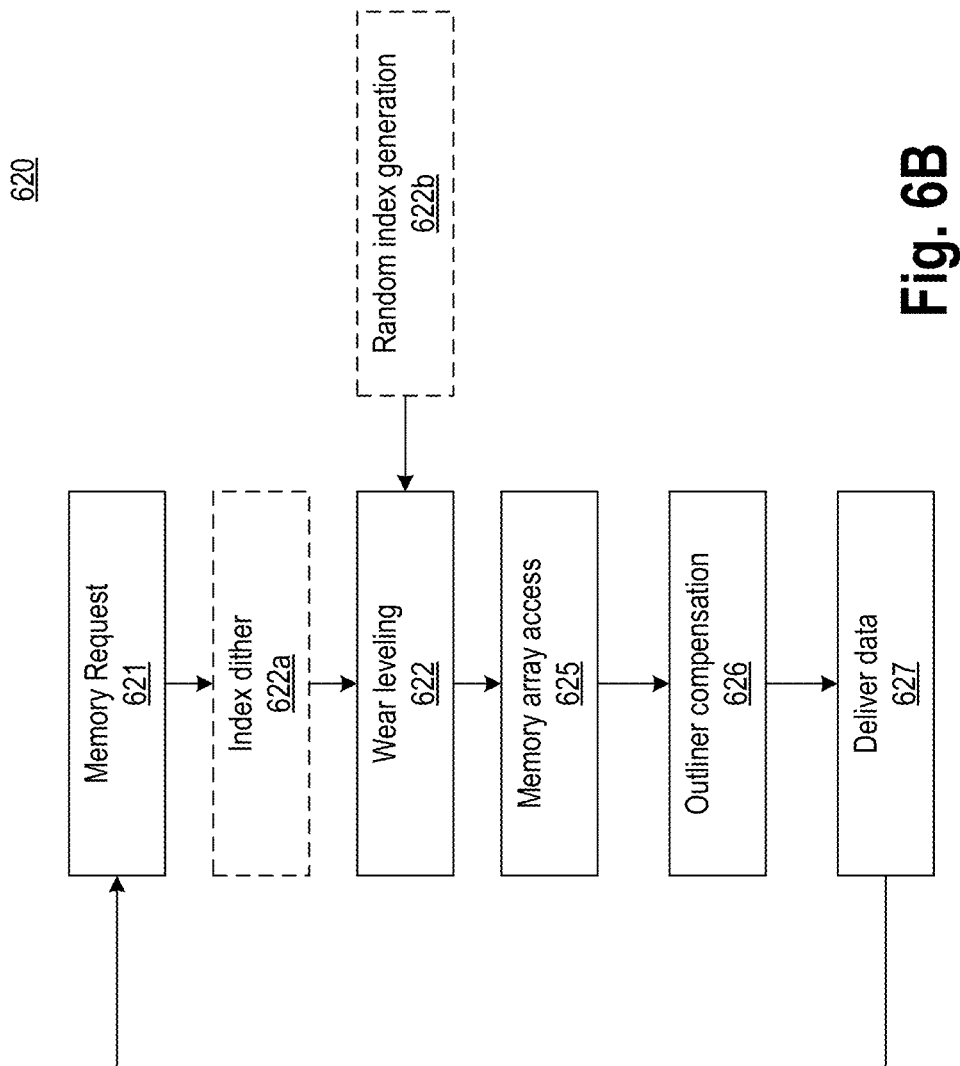
FIG. 6B illustrates a flowchart of memory endurance for the PE and FE memory, in accordance with some embodiments.

FIG. 6B illustrates flowchart 620 of memory endurance for the PE and FE memory, in accordance with some embodiments. While the blocks in flowchart 620 are illustrated in a particular order, the order can be modified. For example, some blocks may be performed before others based on whether read or write operations are being performed. As described herein, the various blocks can be implemented in hardware, software, or a combination of them.

At block 621, controller 606 sends a memory request to memory array 601. This request may be a read request or a write request. If it is a write request, controller 606 applies the wear leveling scheme at block 622. In some embodiments, the wear leveling scheme is linear in that a gap word or gap cache line is swapped with an adjacent word or cache line. In some embodiments, wear leveling is dithered as indicated by block 622*a*. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 622*b*. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 625), outlier compensation is applied as indicated by block 626. At block 626, controller 606 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to controller 606 as indicated by block 627. The memory endurance for non-linear polar material based memory is enhanced by the endurance mechanisms of various embodiments. This allows more read and writes to memory before any memory block, bank, or word becomes unreliable. In various embodiments, the capacitors for each bit-cell in FE memory 601 (which can also be a PE memory) are arranged in a stack and fold manner.

Figure 7A:
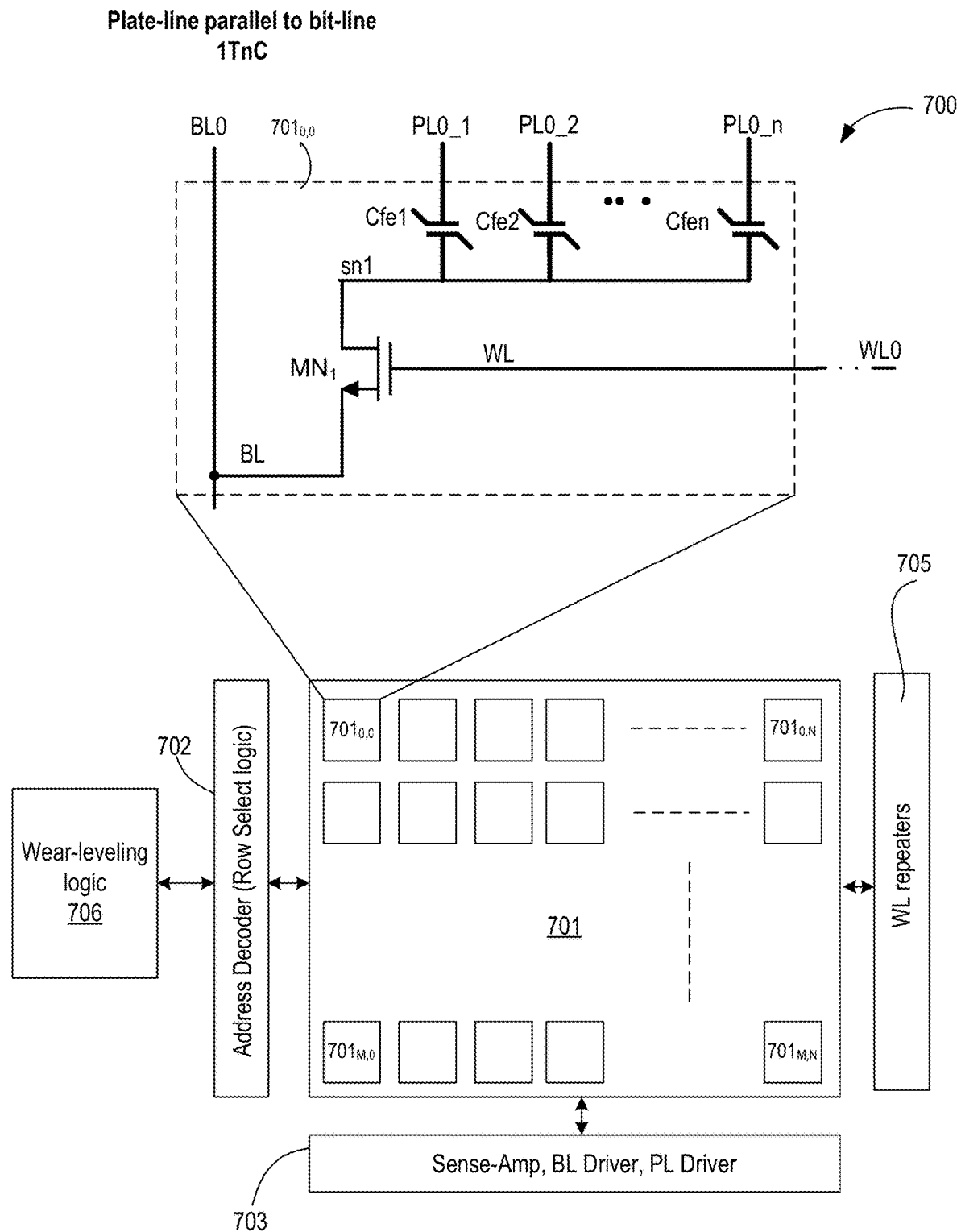
FIG. 7A illustrates an apparatus comprising memory and corresponding logic, wherein the memory comprises FE or PE memory bit-cells, where an individual memory bit-cell includes one transistor and multiple capacitors (1TnC) with PLs parallel to a BL, wherein the capacitors are in a stacked and folded configuration, in accordance with some embodiments.

FIG. 7A illustrates apparatus 700 comprising memory and corresponding logic, wherein the memory comprises FE or PE memory bit-cells, where an individual memory bit-cell includes one transistor and multiple capacitors (1TnC) with PLs parallel to a BL, wherein the capacitors are in a stacked and folded configuration, in accordance with some embodiments.

Apparatus 700 comprises M×N memory array 701 of bit-cells, logic circuitry 702 for address decoding, and logic circuitry 703 for sense amplifier, write drivers, and plate-line (PL) drivers. Plate-lines PL0, PL1 through PLN are parallel to bit-lines BL0, BL1 through BLN, while word-lines WL0, WL1, through WLM are orthogonal to the plate-lines and the bit-lines, where 'N' is a number greater than 1.

In some embodiments, each memory bit-cell in memory array 701 is organized in rows and columns. For example, memory bit-cells $701_{0,0}$ through $701_{M,N}$ are organized in an array. In some embodiments, memory bit-cell 701 (e.g., $701_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, through Cfen are stacked and folded capacitors.

The gate terminal of transistors $MN_1$ is controllable by WL. In some embodiments, BL is coupled to a source or drain terminal of transistor $MN_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_n. In some embodiments, the plurality of capacitors is coupled to storage node sn1, which is coupled to a drain or source terminal of transistor $MN_1$. For example, a first terminal of capacitor Cfe1 is coupled to PL0_1 and a second terminal of capacitor Cfe1 is coupled to storage node sn1. In some embodiments, apparatus 700 has n-number of PLs (e.g., PL0_1 through PL0_n) per column which are parallel to a BL for that column.

While the various embodiments are illustrated with reference to an n-type transistor, the embodiments are also applicable to a p-type transistor or a combination of n-type or p-type transistors. A person skilled in the art would appreciate that when a transistor of a different conductivity type is used, than what is shown in FIG. 7A, then driving logic for BL, PLs, and/or WL may also change for proper read and/or write operations. In various embodiments, PLs are parallel to BL. For example, PL0_1, PL0_2, PL0_n are parallel to BL. In some embodiments, transistor $MN_1$ is fabricated on the frontend of the die and capacitors are stacked over the transistor. For example, the capacitors are stacked along the z-direction and folded along the x-axis. The capacitors can be planar or non-planar capacitors. As such, a taller and wider bit-cell is formed with a footprint comparable to the footprint of the transistor $MN_1$. In some embodiments, the x-y footprint is determined by the size of transistor $MN_1$ and its connections to BL, WL, and storage node sn1.

In some embodiments, PL (e.g., PL0_1, PL0_2, . . . PL0_n) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In some embodiments, in standby mode (e.g., low power mode), the 1TnC bit-cell is not refreshed as there is no disturb mechanism during standby. In some embodiments, wear-leveling logic 706 provides one or more endurance mechanisms for the 1TnC memory bit-cells. One of the endurance mechanisms involves refreshing of the data content in the capacitor(s).

In the 1TnC bit-cell case (e.g., bit-cell $701_{0,0}$) with PL parallel to BL, the activities seen on an unselected or un-intended bit-cell while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected cells, can create a field across the non-linear polar material based capacitors or devices of the unselected cells. The field across the unselected non-linear polar material based capacitors or devices is a function of the dielectric component of individual non-linear polar material based capacitors or devices and the total capacitance on the storage node sn1 of those bit-cells. Since in the 1TnC bit-cells the storage capacitor have much larger capacitance load, the activity seen on the unselected bit-line can result into almost all voltage getting dropped across the ferroelectric capacitors (e.g., Vfe=Vpl*(Cp/(Cfed+Cp)), which creates a disturb effect, which in turn causes unintentional modification of the polarization stage of the ferroelectric capacitor.

Figure 7B:
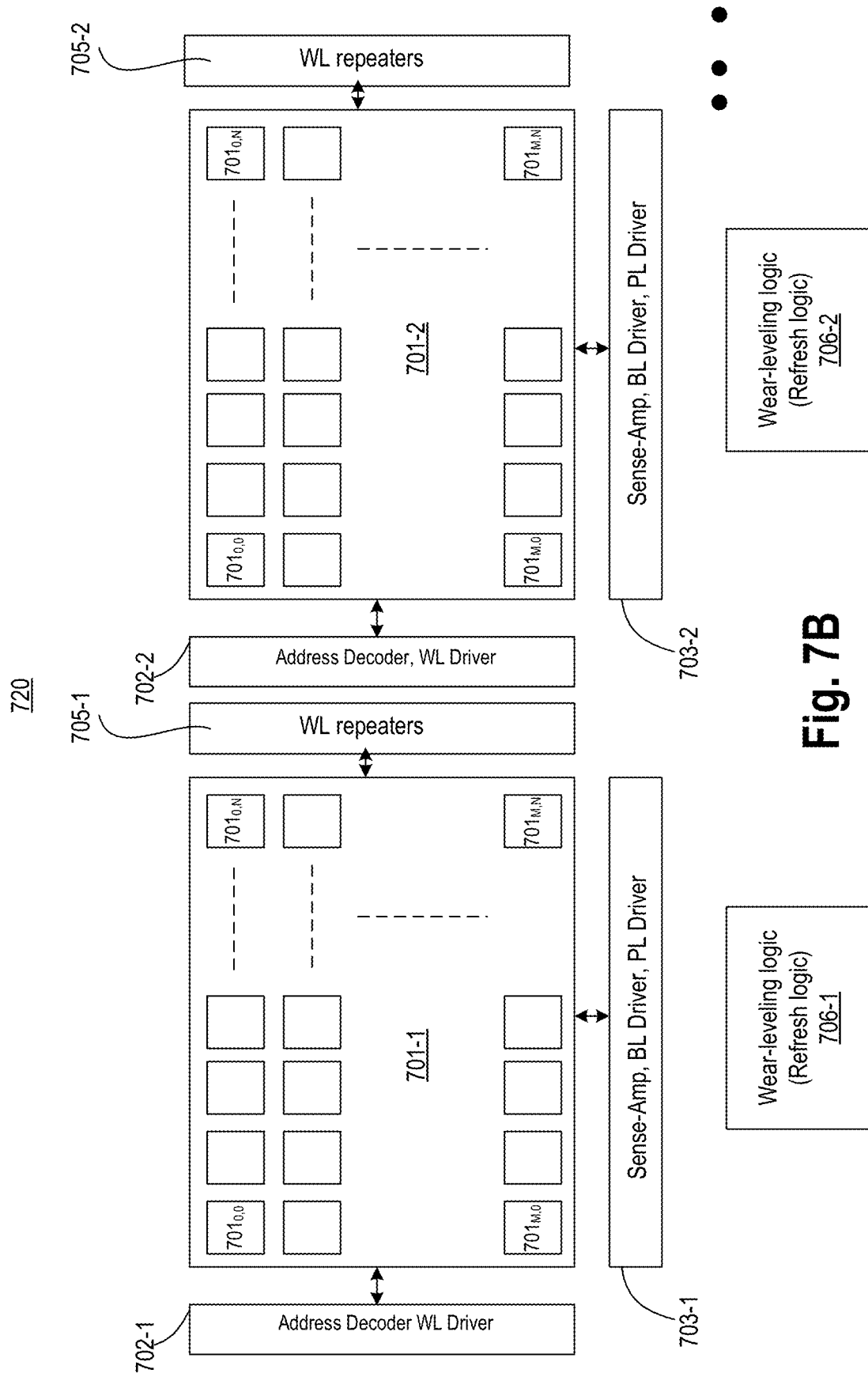
FIG. 7B illustrates an FE or PE memory with word-line repeaters, wherein memory arrays of the FE or PE memory have 1TnC bit-cells with the PL parallel to the BL, in accordance with some embodiments.

FIG. 7B illustrates an FE or PE memory apparatus 720 with word-line repeaters, wherein memory arrays of the FE or PE memory have 1TnC bit-cells with the PL parallel to the BL, in accordance with some embodiments. Apparatus 720 illustrates two instances of apparatus 700. The two instances include first memory array 701-1, logic circuitry 702-1 having first address decoder and/or WL driver, and logic circuitry 703-1 having first sense amplifier, BL driver, PL driver; and WL repeaters 705-1; and second memory array 701-2, logic circuitry 702-2 having address decoder and/or WL driver, and logic circuitry 703-2 having sense amplifier, BL driver, PL driver; and WL repeaters 705-2. In some embodiments, an individual instance of apparatus 700 includes a corresponding wear-leveling logic 706 (e.g., wear-leveling logic 706-1 and wear-leveling logic 706-2). In some embodiments, wear-leveling logic 706 is shared by multiple instances of apparatus 700. In some embodiments, when the pulsing scheme described herein is combined with the refresh function by wear-leveling logic 706-1 and wear-leveling logic 706-2, disturb issues on unselected bit-cells are mitigated. While two memory arrays are shown (e.g., array 701-1 and 701-2), any number of arrays may be part of apparatus 720. With PL parallel to the BL and orthogonal to the WL, WL repeaters 705-1, 705-2, etc. are added to improve the driving strength of the word-line signals. In some embodiments, WL repeaters 705-1 and 705-2 operate on a higher power supply level (e.g., Vdd+Vboost) to implement WL boosting.

Timing diagrams of various embodiments here show timepoints t1, t2, t3, t4, and onwards. These time points are shown as equally spaced. However, the time points can be separated by any time period.

Figure 7C:
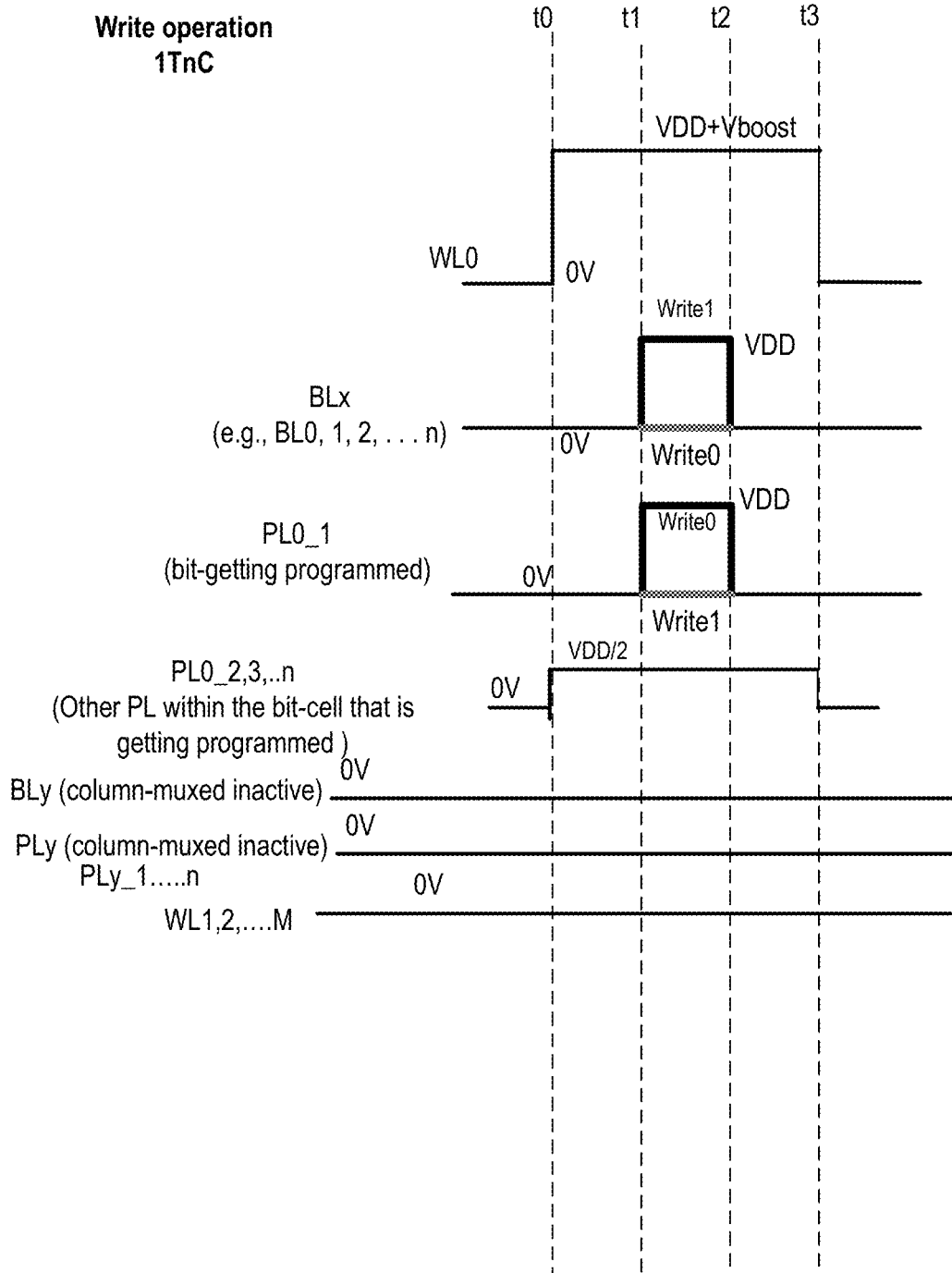
FIG. 7C illustrates a timing diagram for write operation for 1TnC FE or PE memory bit-cells with plate-lines parallel to the bit-line, where the write operation involves word-line boosting, in accordance with some embodiments.

FIG. 7C illustrates timing diagram 730 for write operation for 1TnC FE or PE memory bit-cells with plate-lines parallel to the bit-line, where the write operation involves word-line boosting, in accordance with some embodiments. In this case, PLs are parallel to the BL. Depending on whether logic 1 (Write 1) or logic 0 (Write 0) is being written to the selected capacitor with non-linear polar material, BL or PL associated with that capacitor of the bit-cell is asserted from 0V to Vdd (power supply level). Other column multiplexed BLs (e.g., BLy) and PLs (e.g., PLy) that are inactive are forced to 0V, in accordance with some embodiments.

In various embodiments, write operation begins when WL is asserted and boosted above Vdd. The boost level is Vboost which may be 10-50% of Vdd. In one example, Vboost is about equal to a threshold voltage of transistor $MN_1$ of the 1TnC bit-cell. WL boosting ensures that the full voltage swing is seen by the ferroelectric capacitors of the 1TnC bit-cell, negating the threshold (Vth) drop on the n-type transistor $MN_1$. WL boosting enables an overall lower voltage operation on the BL and PL drivers. This may use higher signal conditioning on the WL.

Since the select transistor $MN_1$ in these configurations is an n-channel device, it is good at passing the 0V and signals closer to 0V. The signal applied through the BL however, when it is at Vdd, may not pass through the transistor $MN_1$ in full. As such, there is a Vt drop across the transistor $MN_1$ if the WL is driven to Vdd. To help get the full range of signaling (e.g., 0 to Vdd) across the FE capacitor Cfe1, WL-boosting helps negate the Vt drop across the transistor such that BL when driven to Vdd, internal node will also see Vdd, as opposed to Vdd−Vt.

In this example, the asserted WL0 is boosted for write operation (e.g., to Vdd+Vboost), and then the selected BLx (e.g., BL0) and the selected PL (e.g., PL0_1) are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL1_0 is set to logic 0 to allow storage of logic 1 value in capacitor Cfe1. In some embodiments, to write a logic 0, BLx is kept at 0V when WL0 is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1.

Other PLs (e.g., PL0_2 through n) within the same selected bit-cell (e.g., $601_{0,0}$) which are not programming their respective capacitors are charged to Vdd/2. Like BLy, PL (e.g., PLy) for column multiplexed bit-cells remains at 0V while PL0_1 is being used to program Cfe1. Word-lines of unselected bit-cells is set to 0V (e.g., WL1, 2, through m are set to 0V when WL0 is selected).

When a particular bit-cell $701_{0,0}$ is being written to, the WL for unselected bit-cells (e.g., WL1 through WLm) remains at 0. Same is done for unselected BLs and PLs (e.g., BLy and PLy) by column multiplexers. In various embodiments, the BL or PLs are asserted and de-asserted within a pulse width of the boosted WL. In some embodiments, the voltage swing for the selected BL and PLs is 0 to Vdd. In some embodiments, the BL or PL pulse is generated after a predetermined or programmable time from when WL boost starts, and the BL or PL pulse ends within the WL pulse.

Figure 7D:
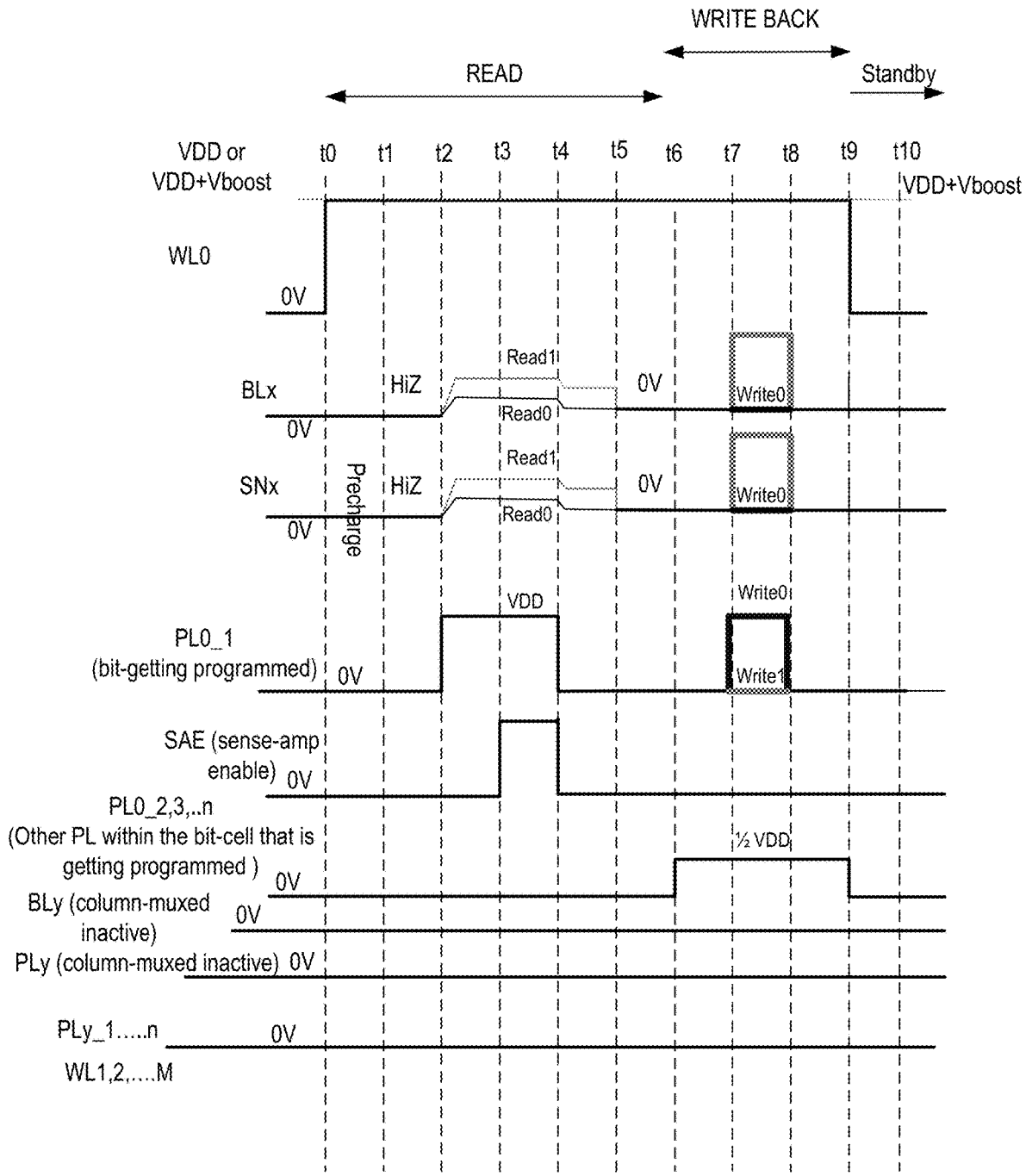
FIG. 7D illustrates a timing diagram for read operation for 1TnC FE or PE memory bit-cells with plate-lines parallel to the bit-line, where the read operation involves word-line boosting, in accordance with some embodiments.

FIG. 7D illustrates timing diagram 740 for read operation for 1TnC FE or PE memory bit-cells with plate-lines parallel to the bit-line, where the read operation involves word-line boosting, in accordance with some embodiments.

In some embodiments, read operation begins by asserting the selected WL (e.g., WL0). In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window.

In some embodiments, BLx is set to 0V, and depending on whether a logic 1 or a logic 0 is written during writeback to the selected capacitor Cfe1 (via PL0_1), the selected bit-line is toggled. In this example, during writeback and during the pulse width of the boosted WL0, PL0_1 and BLx is set to Vdd to write a 0 to the capacitor Cfe1. The writeback scheme here is the same as the writeback scheme of FIG. 7C. In this scheme, the voltage swing on the selected capacitor is +/−Vdd.

In some embodiments, a selected PL (e.g., PL0_1) is asserted for the capacitor of the bit-cell which is being read (e.g., capacitor Cfe1). In this example, PL0_1 is asserted for a time period long enough for the sense amplifier to sense the value stored on the storage node coupled to the capacitor. In various embodiments, sense amplifier enable signal (SAE) is asserted within the pulse width of the selected PL (e.g., PL0_1). In some embodiments, to read data from the storage node, BL is first set or forced to zero volts and then allowed to float (e.g., BLx driver goes into high impedance state Z (HiZ)). In some embodiments, BL is precharged to a certain voltage or a programmable voltage. So, when the WL0 is selected, in conjunction with the PL voltage, a field is created across the FE capacitor.

Thereafter, the BL driver is configured in a high impedance stage, the selected BL is floated, which allows the sense amplifier to sense the voltage on the storage node via the BL. In some embodiments, the sense amplifier is configured to sense the voltage on the BL by comparing it to one or more thresholds. In some embodiments, when BLx charges to a first voltage level, a logic 0 is read (Read0). In some embodiments, when BLx charges to a second voltage level (higher than the first voltage level), a logic 1 is read (Read1). In some embodiments, after the sense amplifier is disabled (SAE is set to 0), the voltage on the selected BL is forced to zero volts. In some embodiments, after the selected BL is forced to 0V, the write back process begins. In some embodiments, the writeback process may not be needed if the read operation is not a destructive read.

In some embodiments, in the write back process, BL is charged to Vdd or set to 0V depending upon whether a logic 1 or a logic 0 is written back to the selected bit-cell. In some embodiments, the value written back to the bit-cell is the same value that the sense amplifier detects when reading the voltage on the BL. In some embodiments, the write back mechanism is like the write operation described with reference to FIG. 7C. In various embodiments, the WL for the unselected bit-cells is set to 0V (e.g., WL0, . . . WLm is set to 0 when WL1 is selected). In various embodiments, the BL and the PLs (e.g., PL0_2 through PL0_n) for the unselected bit-cells is also set to 0V. In some embodiments, wear-leveling logic 706 is used for memory endurance.

Figure 8A:
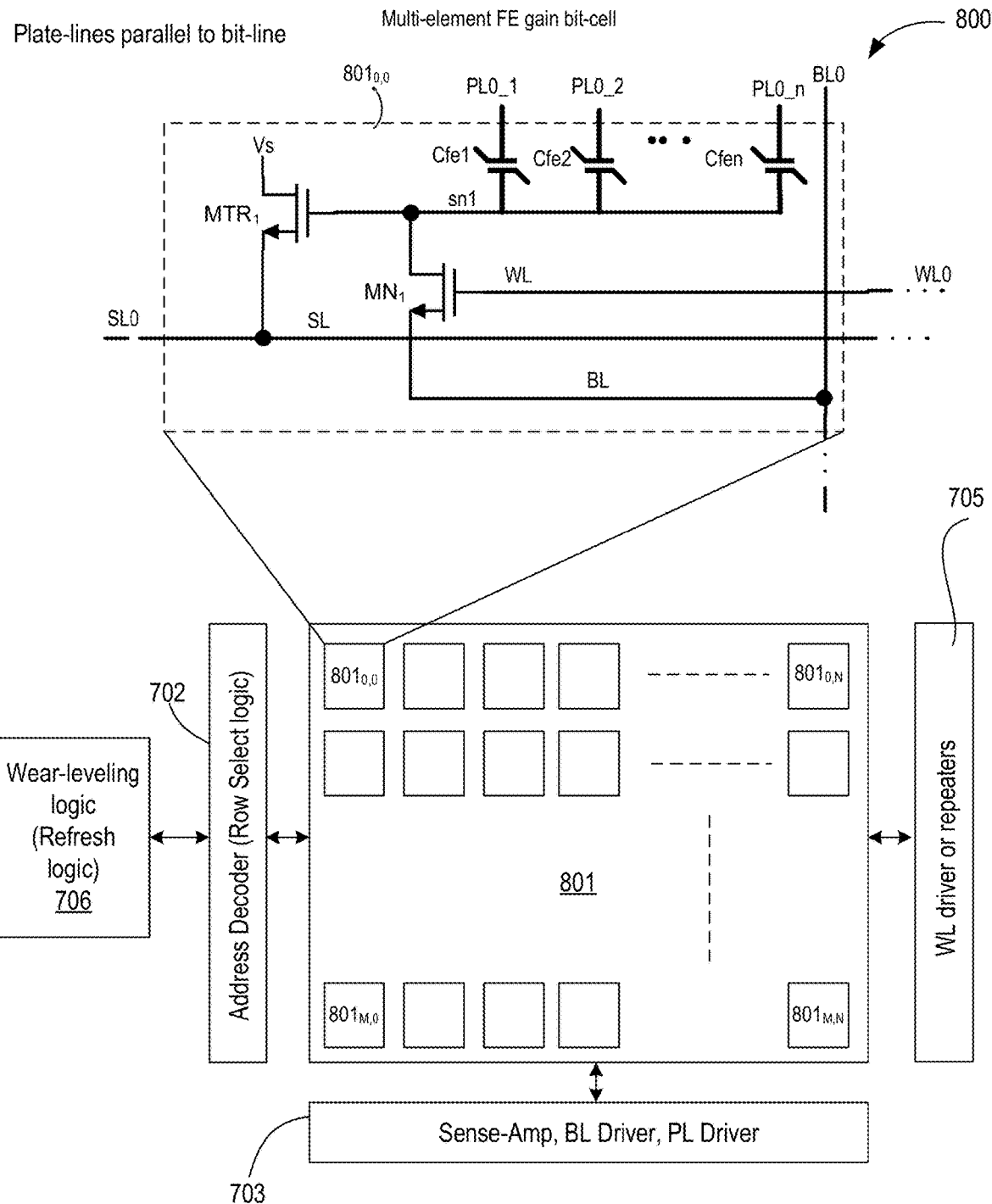
FIG. 8A illustrates an apparatus comprising memory and corresponding logic, wherein the memory comprises FE or PE memory bit-cells, where an individual memory bit-cell is a multi-element FE or PE gain bit-cell with PLs parallel to a BL, where the corresponding logic is to apply word-line boosting, and wherein the capacitors are in a stacked and folded configuration, in accordance with some embodiments.

FIG. 8A illustrates apparatus 800 comprising memory and corresponding logic, wherein the memory comprises FE or PE memory bit-cells, where an individual memory bit-cell is multi-element FE or PE gain bit-cell with PLs parallel to a BL, where the corresponding logic is to apply word-line boosting, and wherein the capacitors are in a stacked and folded configuration, in accordance with some embodiments.

Apparatus 800 is like apparatus 700 of FIG. 7A but for a different kind of memory bit-cell. In some embodiments, each memory bit-cell (e.g., $801_{0,0}$) in memory array 801 is organized in rows and columns like in apparatus 800. For example, memory bit-cells $801_{0,0}$ through $801_{M,N}$ are organized in an array.

In some embodiments, a bit-cell (e.g., $801_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen is coupled to a corresponding plate-line (PL). For example, the second terminal of Cfe1 is coupled to PL0_1, the second terminal of Cfe2 is coupled to PL0_2, and so on. Apparatus 700 has n-number of PLs (e.g., PL0_1 through PL0_n) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked and horizontally folded allowing for tall bit-cells (e.g., higher in the z-direction) but with x-y footprint two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, ... PL_n) controls which cell within the same access transistor gets programmed, and the value of programming. In some embodiments, BL acts as a sense-line. The voltage on BL (e.g., sense voltage) can create disturbance on other bit-lines during read operation. To mitigate such disturbances, in some embodiments, multi-element FE gain bit-cell (e.g., $801_{0,0}$) is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell (e.g., $801_{0,0}$) is not refreshed as there is no disturb mechanism during standby. In some embodiments, multi-element FE gain bit-cell (e.g., $801_{0,0}$) relies on isolating the read mode from BL or SL capacitance by isolating through access transistor $MN_1$, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node. i.e., when a read pulse of some polarity is applied at PL of the capacitor to be read, a non-zero voltage is applied on other PLs of multi-element FE gain bit-cell (e.g., $801_{0,0}$), that matches the expected disturbance seen on the shared node. In one such example, the PL driver is configured to support driving different voltage levels on different PLs. In some embodiments, wear-leveling logic 706 provides one or more endurance mechanisms for the multi-element FE gain bit-cells. One of the endurance mechanisms involves refreshing of the data content in the capacitor(s).

Figure 8B:
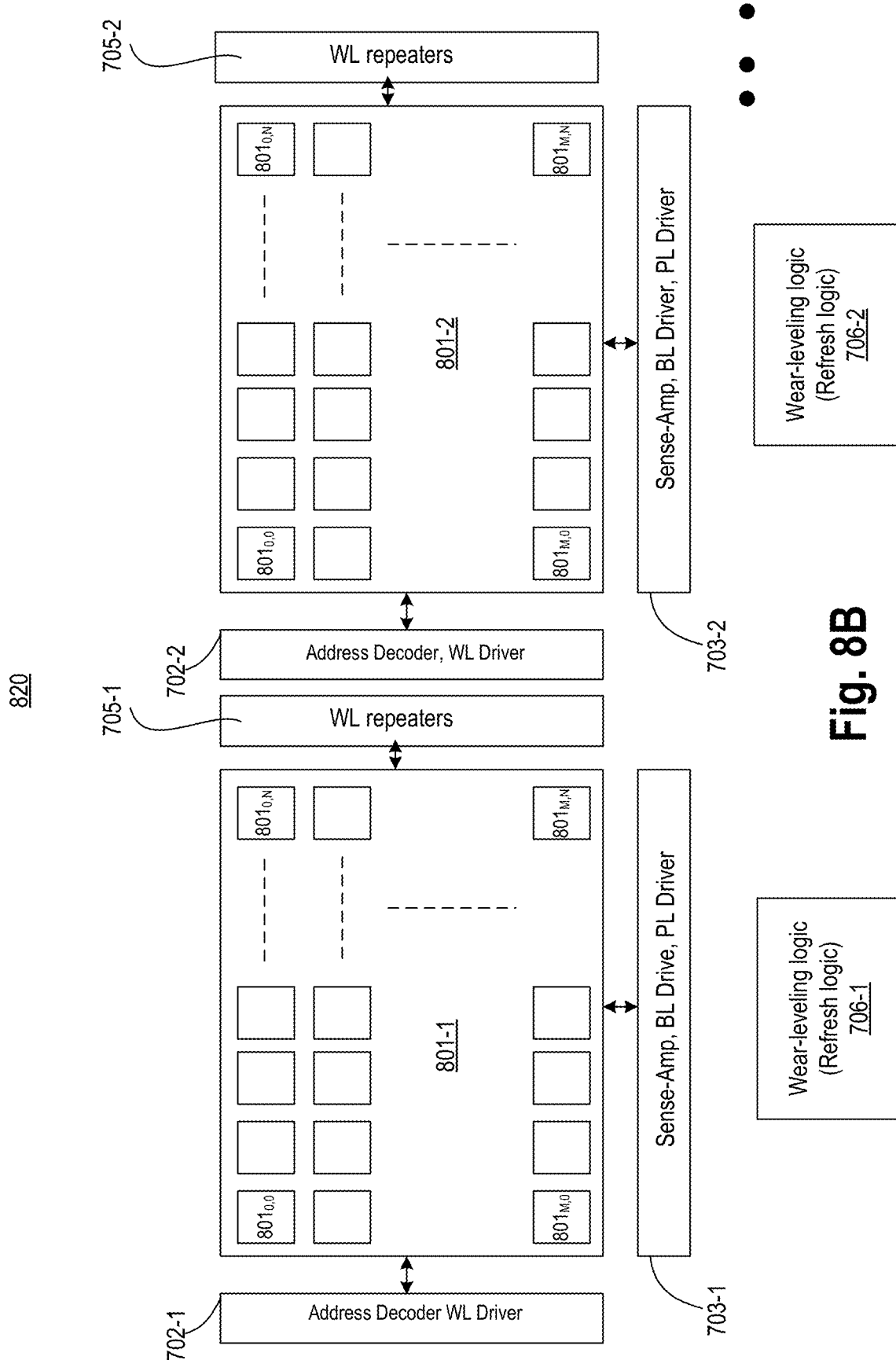
FIG. 8B illustrates an FE or PE memory with word-line repeaters, wherein memory arrays of the FE or PE memory have multi-element FE or PE gain bit-cells with the PL parallel to the BL, in accordance with some embodiments.

FIG. 8B illustrates an FE or PE memory apparatus 820 with word-line repeaters, wherein memory arrays of the FE or PE memory have multi-element FE or PE gain bit-cells with the PL parallel to the BL, in accordance with some embodiments. Apparatus 820 is like apparatus 720, but with memory arrays 801-1 and 801-2. Each memory array includes memory bit-cells of FIG. 7A.

Figure 8C:
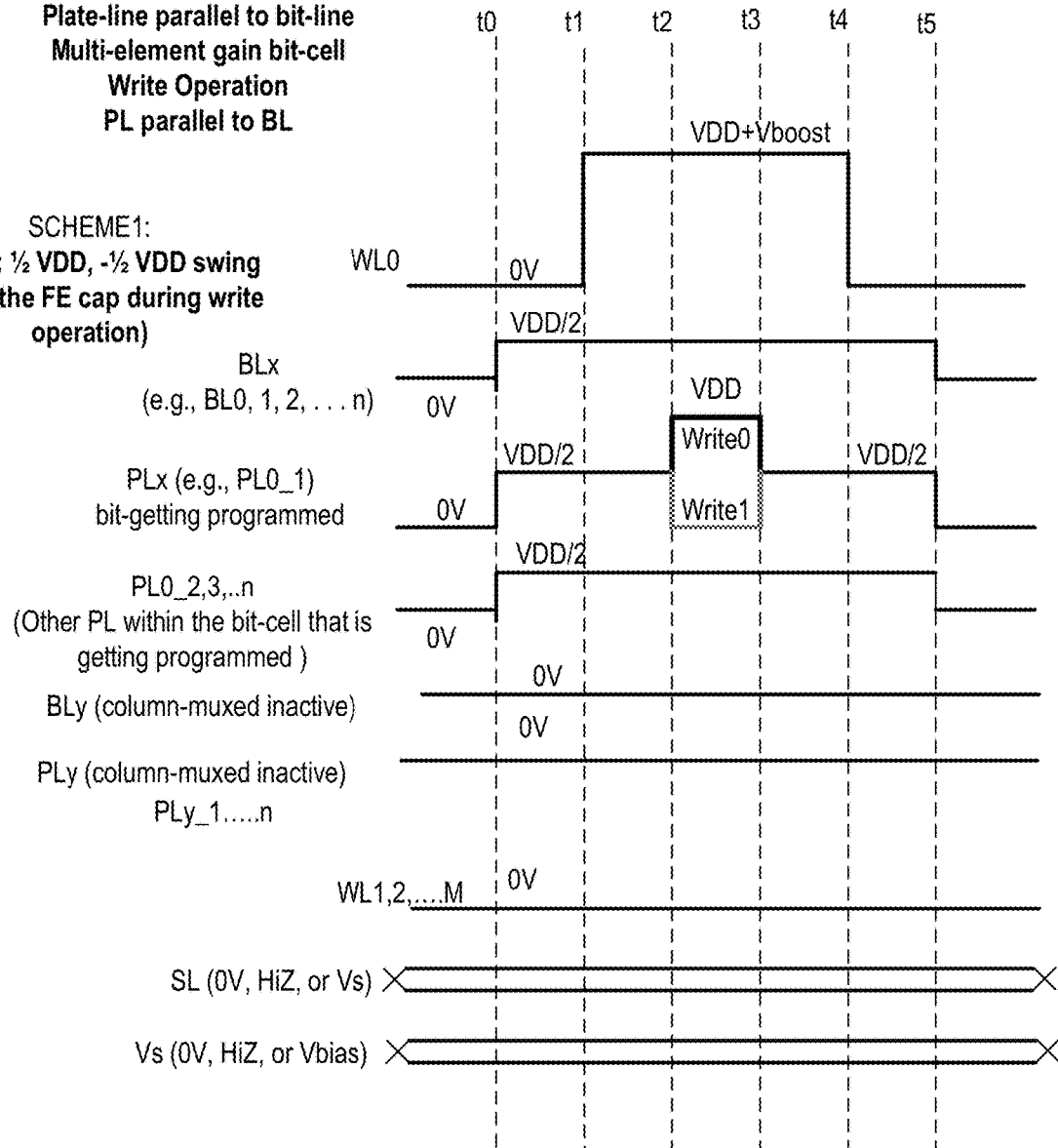
FIG. 8C illustrates a timing diagram for a first scheme for write operation for multi-element FE or PE gain bit-cells with the PL parallel to the BL, in accordance with some embodiments.

FIG. 8C illustrates timing diagram 830 for a first scheme for write operation for multi-element FE or PE gain bit-cells with the PL parallel to the BL, in accordance with some embodiments. In some embodiments, the voltage swing across the selected ferroelectric capacitor is Vdd during write operation (e.g., the swing is ½ Vdd to −½ Vdd). To write to a capacitor of a multi-element FE gain bit-cell (e.g., $701_{0,0}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL0 to store a 0 or a 1 to that capacitor. In this example, PL0_1 is charged from 0V to Vdd/2 when BL is charged to Vdd/2. Then during the pulse width of the boosted WL0, PL0_1 is set to Vdd to write a 0 to capacitor Cfe1. In some embodiments, during the pulse width of the boosted WL0, PL0_1 is set to 0V to write a logic 1 to the capacitor Cfe1. Other PLs (e.g., PL0_2 through n) within the same selected bit-cell (e.g., $801_{0,0}$) are charged to Vdd/2 like Blx. PL (e.g., PLy) for column multiplexed bit-cells remains at 0V while PL0_1 is being used to program Cfe1. Word-lines of unselected bit-cells is set to 0V (e.g., WL1, 2, through m are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 8D:
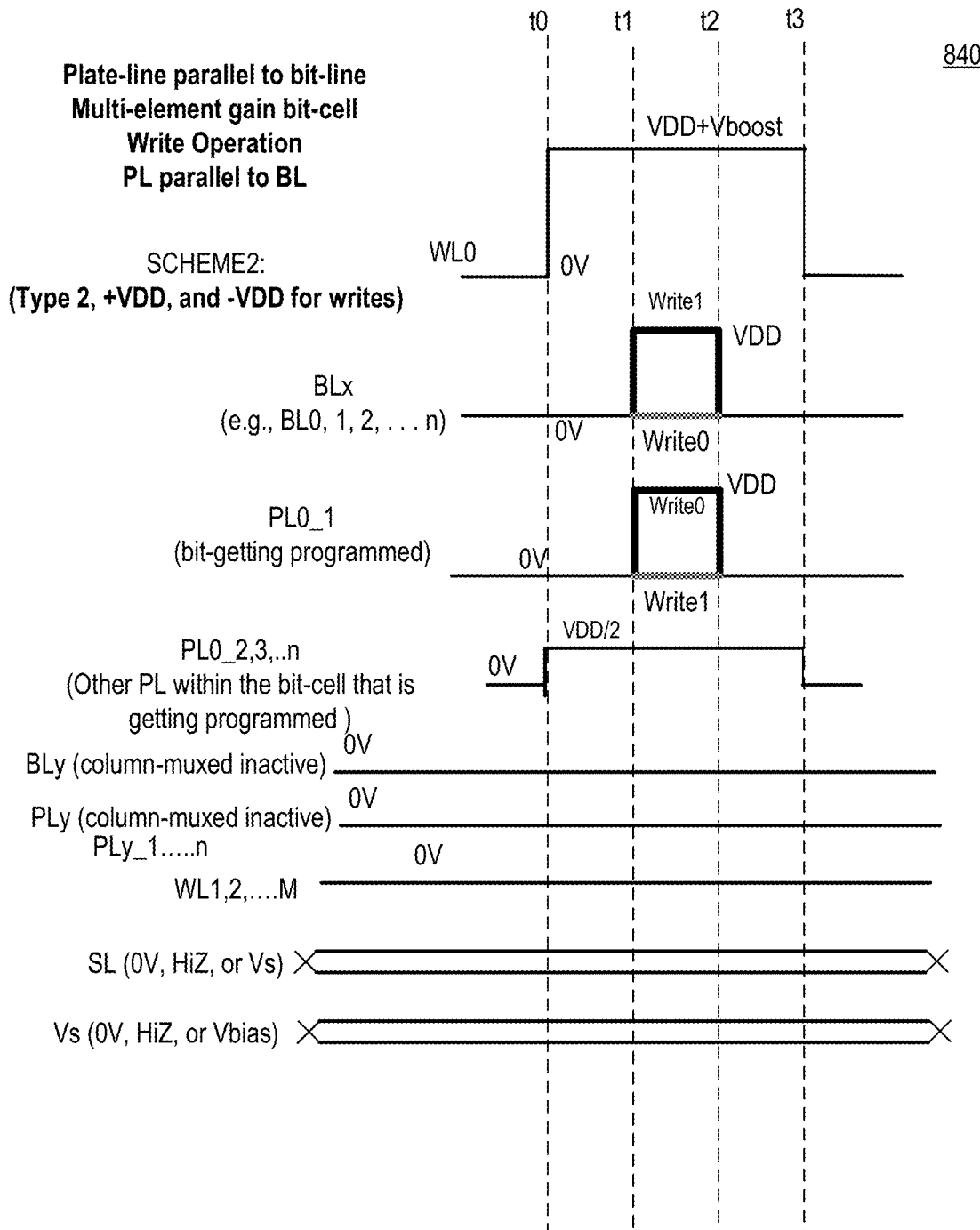
FIG. 8D illustrates a timing diagram for a second scheme for write operation for multi-element FE or PE gain bit-cells with the PL parallel to the BL, in accordance with some embodiments.

FIG. 8D illustrates timing diagram 840 for a second scheme for write operation for multi-element FE or PE gain bit-cells with the PL parallel to the BL, in accordance with some embodiments. Compared to scheme 1 described with reference to FIG. 8C, here instead of setting the selected BL (e.g., BLx) and the selected PL (e.g., PL0_1) to ½ Vdd, they are set to 0V. WL is boosted for write operation (e.g., to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL1_0 is set to logic 0 to allow storage of logic 1 value in capacitor Cfe1. In some embodiments, to write a logic 0, BLx is kept at 0V when WL0 is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1.

Other PLs (e.g., PL0_2 through n) within the same selected bit-cell (e.g., $701_{0,0}$) are charged to Vdd/2 like Blx. PL (e.g., PLy) for column multiplexed bit-cells remains at 0V while PL0_1 is being used to program Cfe1. By charging the PLy 0 ½Vdd reduces the disturb effect on the unselected bit-cells. Word-lines of unselected bit-cells is set to 0V (e.g., WL1, 2, through m are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 8E:
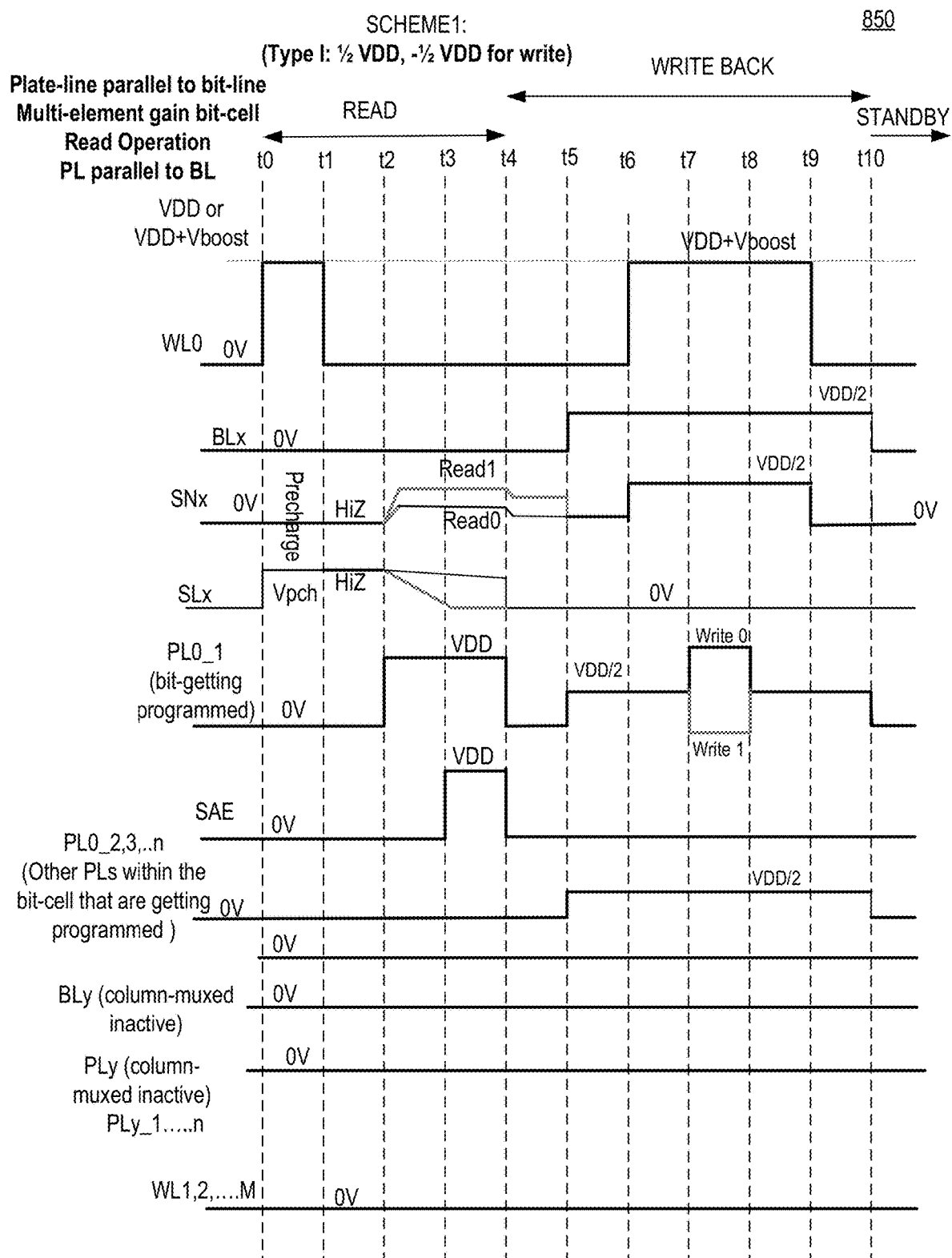
FIG. 8E illustrates a timing diagram for the first scheme read operation for multi-element FE or PE gain bit-cells with the PL parallel to the BL, in accordance with some embodiments.

FIG. 8E illustrates timing diagram 850 for the first scheme read operation for multi-element FE or PE gain bit-cells with the PL parallel to the BL, in accordance with some embodiments. In some embodiments, read operation begins by asserting the selected WL (e.g., WL0). In some embodiments, the selected WL is boosted for read operation. WL0 is boosted above Vdd to Vdd+Vboost level. In some embodiments, a writeback scheme is implemented after the read operation to ensure the read operation does not corrupt the data value stored in the selected bit-cell. In one such embodiment, the data which is read is also written back in the writeback time window after the read time window. In some embodiments, PL (e.g., PL0_1) is asserted for the bit-cell which is being read. Other unselected PLs (e.g., PL0_2, 3, through n) of the bit-cell (e.g., $801_{0,0}$) are kept at 0V during read operation, and then to Vdd/2 during writeback if the first scheme is followed.

The PL (e.g., PL0_1) for the selected capacitor (e.g., Cfe1) of the bit-cell (e.g., $701_{0,0}$) is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node sn1, BLx (e.g., BL0) is set or forced to zero volts during read operation, and then set to ½ Vdd just before WL0 is boosted for write back operation when the first scheme is followed. Write back operation for the first scheme is like the write operation discussed with reference to FIG. 8C. In some embodiments, the refresh mechanism is applied upon a read operation. This allows it to maintain the logic value in the bit-cell.

Referring to FIG. 8E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node (sense-line node) over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In the write back process, the selected bit-cell BLx (e.g., BL0) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 8C. Here, here, 'x' in PLx_n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on. In some embodiments, during the read operation, plate-lines that are not used to program a capacitor are set to 0. For example, PLy (e.g., PLy_1 through n) are set to 0V while PL0_1 is being used to read from capacitor Cfe1. Here 'y' indicates all other PLs for unselected bit-cells. In some examples, PL0_2 through n, are parked to a non-0V value (e.g., Vdd/2, Vdd/3, etc.), which can be optimized to reduce disturb to other capacitors during read while PL0_1 is being used to read from capacitor Cfe1.

Figure 8F:
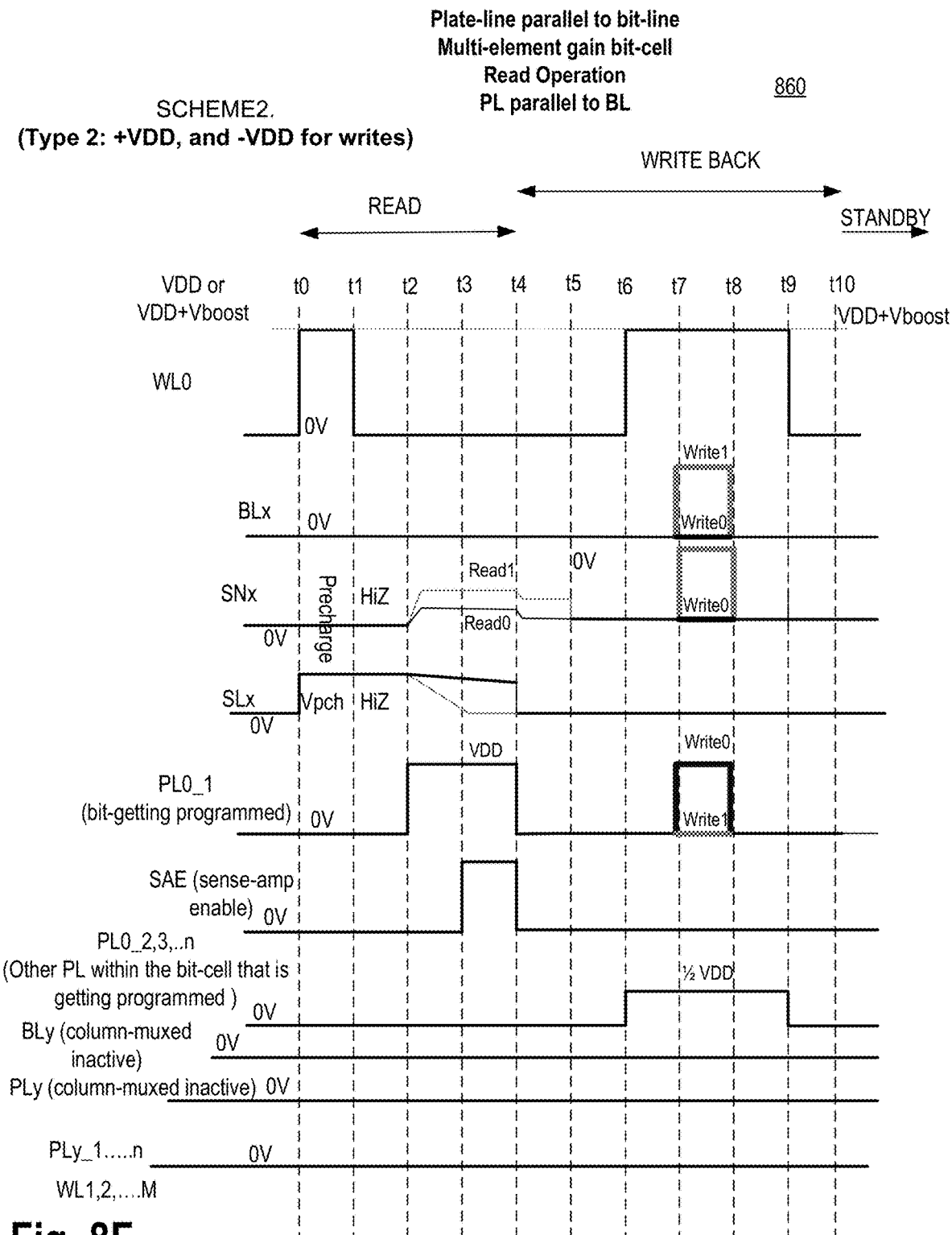
FIG. 8F illustrates a timing diagram for the second scheme read operation for multi-element FE or PE gain bit-cells with the PL parallel to the BL, in accordance with some embodiments.

FIG. 8F illustrates timing diagram 860 for the second scheme read operation for multi-element FE or PE gain bit-cells with the PL parallel to the BL, in accordance with some embodiments. Compared to timing diagrams 860, here the selected bit-line (BLx) is not set to ½ Vdd. In some embodiments, BLx is set to 0V, and depending on whether a logic 1 or a logic 0 is written during writeback to the selected capacitor Cfe1 (via PL0_1), the selected bit-line is toggled. In this example, during writeback and during the pulse width of the boosted WL0, PL0_1 and BLx is set to Vdd to write a 0 to the capacitor Cfe1. The writeback scheme here is the same as the writeback scheme of FIG. 8D. In this scheme (second scheme), the voltage swing on the selected capacitor is +/−Vdd. In the scheme of FIG. 8E (first scheme), the voltage swing on the selected capacitor is +/−Vdd/2.

Figure 9A:
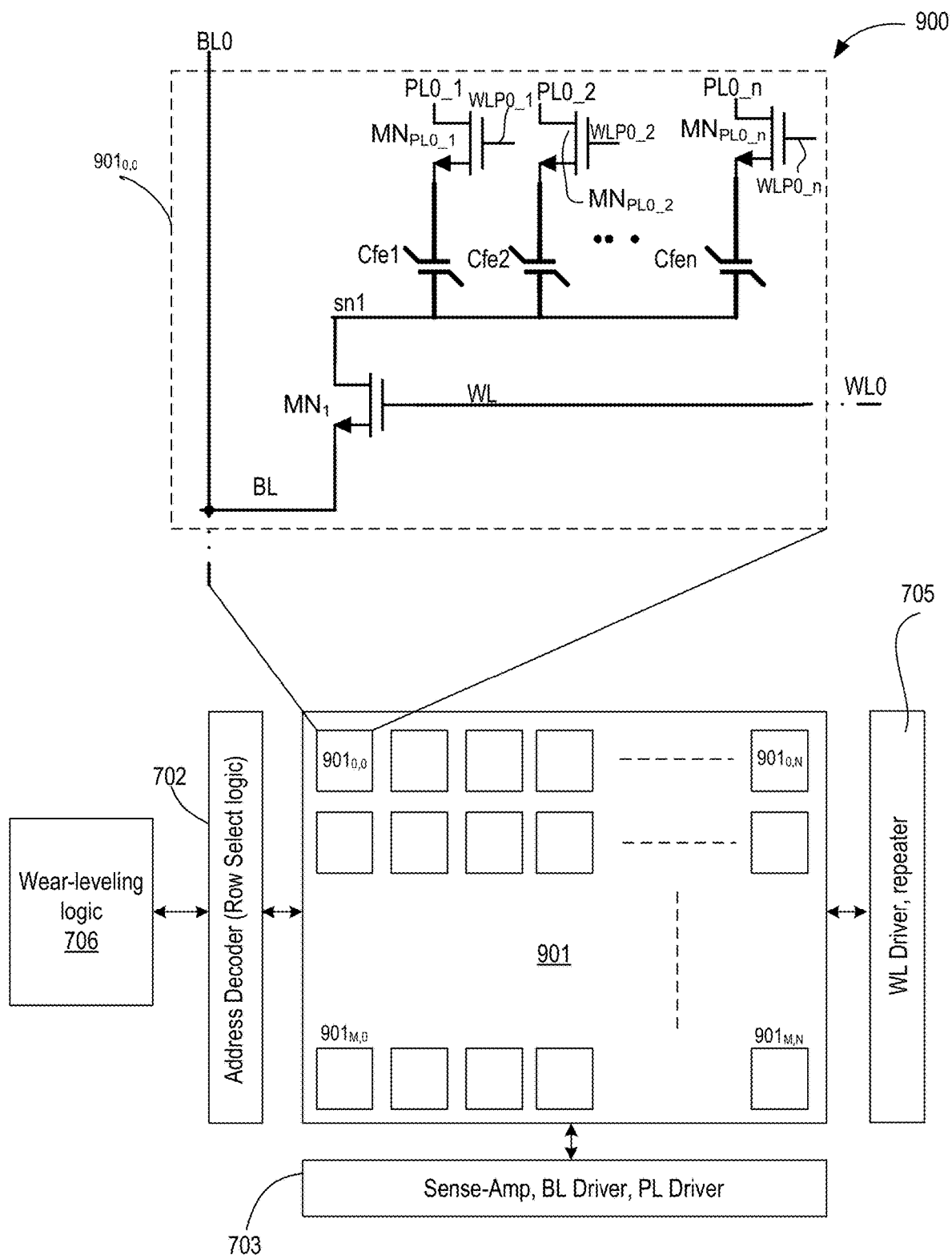
FIG. 9A illustrates an apparatus comprising memory and corresponding logic, wherein the memory comprises FE memory bit-cells, where an individual memory bit-cell includes 1TnC bit-cells with PLs parallel to a BL, and with individual switches coupled to the capacitors on the plate-line side, where the corresponding logic is to apply word-line boosting, and wherein the capacitors are in a stacked and folded configuration, in accordance with some embodiments.

FIG. 9A illustrates apparatus 900 comprising memory and corresponding logic, wherein the memory comprises FE memory bit-cells, where an individual memory bit-cell includes 1TnC bit-cells with PLs parallel to a BL, and with individual switches coupled to the capacitors on the plate-line side, where the corresponding logic is to apply word-line boosting, and wherein the capacitors are in a stacked and folded configuration, in accordance with some embodiments.

Apparatus 900 is like apparatus 700, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in memory array 901 is organized in rows and columns like in apparatus 700, but with bit-lines running parallel to the plate-lines. For example, memory bit-cells $901_{0,0}$ through $801_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_n. In some embodiments, n-type transistor $MN_{PLB\_x}$ is coupled to compensation capacitor Cd and PLB_x. Each transistor (or switch) is controlled separately, in accordance with some embodiments. In some embodiments, transistor $MN_{PLO\_1}$ is controllable by WLP0_1, transistor $MN_{PLO\_2}$ is controllable by WLP0_2, and so on. Likewise, transistor $MN_{PLO\_n}$ is controllable by WLP0_n. Here, WLP0_1 . . . . WLP0_n are the extensions of an address space. In this case, depending upon which storage element is being programmed or read, the corresponding WLP0_1 . . . WLP0_n are kept high (e.g., Vdd) whenever the plate-line voltage of 0V or Vdd is applied, while the unselected storage element sees 0V.

While the various embodiments are illustrated with reference to n-type transistors or switches, the embodiments are also applicable to a p-type transistor or a combination of n-type or p-type transistors. A person skilled in the art would appreciate that when a transistor of a different conductivity type is used, than what is shown in FIG. 9A, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, ... and $MN_{PLO\_n}$, are fabricated in the backend of the die. On one such embodiment, the capacitor Cfe is fabricated between the frontend and the backend of the die. In one example, capacitors Cfe are vertically stacked capacitors. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. These backed transistors or switches can be fabricated using any suitable technology such as IGZO (Indium gallium zinc oxide).

Figure 9B:
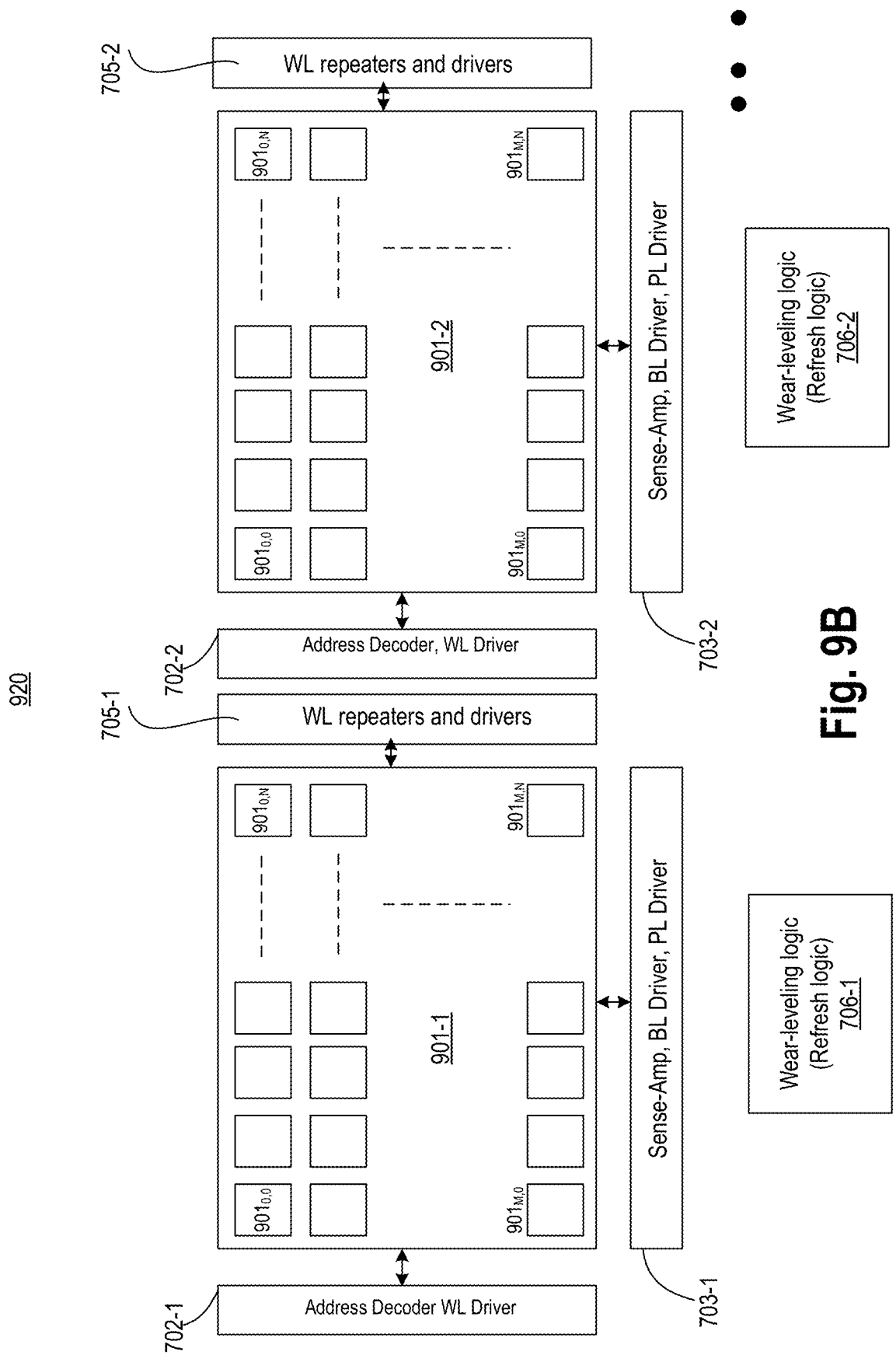
FIG. 9B illustrates an FE memory with word-line repeaters, wherein memory arrays include FE memory 1TnC bit-cells of FIG. 9A, in accordance with some embodiments.

FIG. 9B illustrates FE memory apparatus 920 with word-line repeaters, wherein the memory arrays include the FE memory 1TnC bit-cells of FIG. 9A, in accordance with some embodiments. Apparatus 920 is like apparatus 720, but with memory arrays 901-1 and 901-2. Each memory array includes memory bit-cells 901 of FIG. 9A.

Figure 9C:
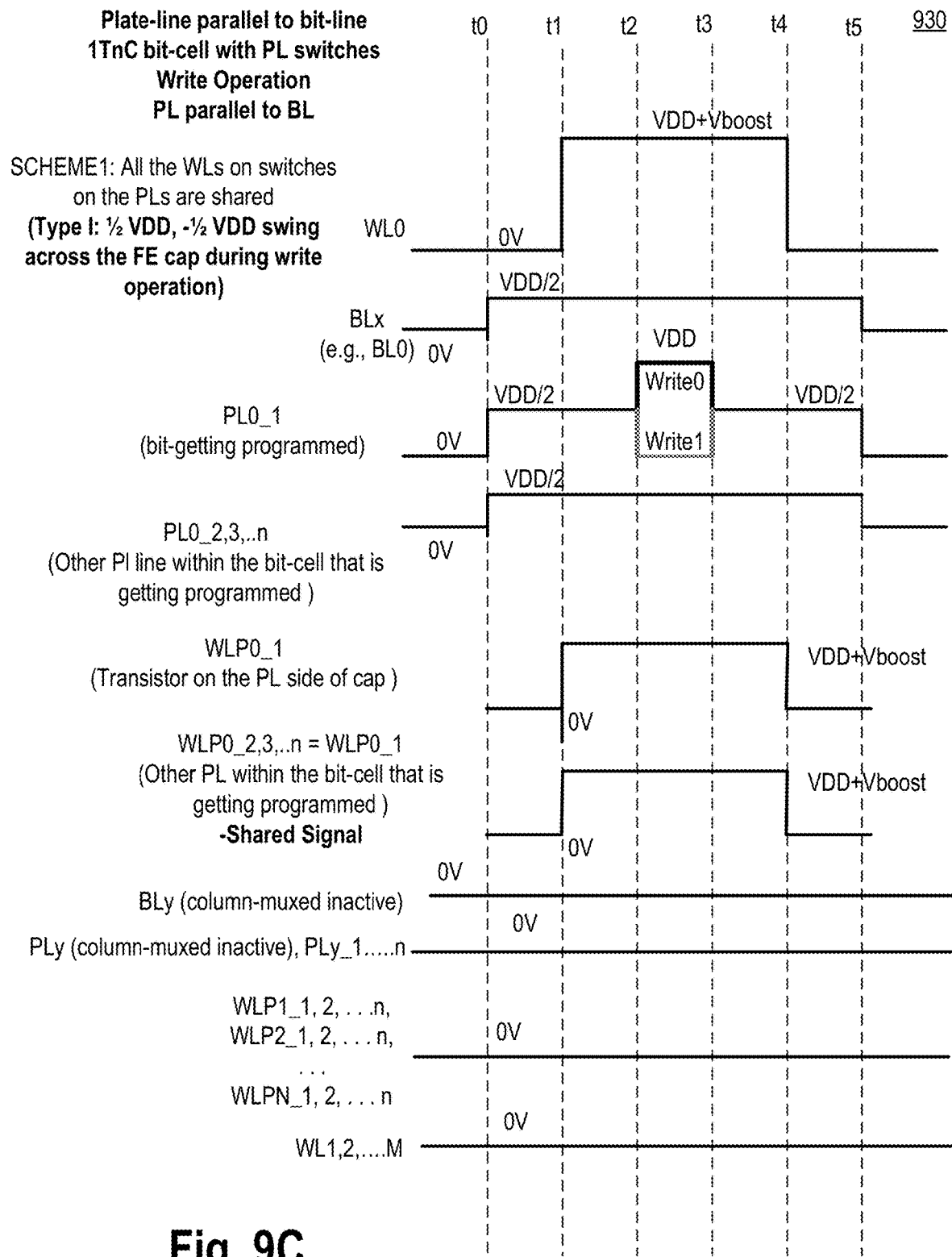
FIG. 9C illustrates a timing diagram for write operation for 1T1C bit-cells with the PL parallel to the BL and where the word-lines (WLPs) for switch transistors for multiple plate-lines within a bit-cell are driven by a same signal, in accordance with some embodiments.

FIG. 9C illustrates timing diagram 930 for write operation for 1T1C bit-cells with the PL parallel to the BL and where the word-lines (WLPs) for switch transistors for multiple plate-lines within a bit-cell are driven by a same signal, in accordance with some embodiments. In this scheme (first scheme) all WLPs for switch transistors are driven by the same signal per bit-cell, in accordance with some embodiments. For example, WLP0_1, WLP0_2, . . . WLP0_n for bit-cell $901_{0,0}$ share the same signal driver. In some embodiments, the signals on WLPs for switch transistors for a bit-cell during the write operation are the same as the WL0 signal for that bit-cell.

To write to a capacitor of a multi-element FE gain bit-cell (e.g., $901_{0,0}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx (e.g., BL0) is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL to store a 0 or a 1 to that capacitor. In this example, PL0_1 is charged from 0V to Vdd/2 when BL0 is charged to Vdd/2. Then during the pulse width of the boosted WL, PL0_1 is set to Vdd to write a 0 to capacitor Cfe1. In some embodiments, during the pulse width of the boosted WL, PL0_1 is set to 0V to write a 1 to the capacitor Cfe1.

Other PLs (e.g., PL0_2 through n) within the same selected bit-cell (e.g., $901_{0,0}$) are charged to Vdd/2 like Blx. PL (e.g., PLy) for column multiplexed bit-cells remains at 0V while PL0_1 is being used to program Cfe1. Word-lines of unselected bit-cells are set to 0V (e.g., WL1, 2, through M are set to 0V when WL0 is selected).

In some embodiments, the voltage swing across the selected ferroelectric capacitor is Vdd during write operation (e.g., the swing is ½ Vdd to −½ Vdd). For example, during write 0, BL0 is Vdd/2 and PL0_1 is Vdd, which makes the voltage across the selected ferroelectric capacitor Cfe1 BL0-PL0_1=−Vdd/2. Likewise, during write 1, BL0 is Vdd/2 and PL0_1 is 0, which makes the voltage across the selected ferroelectric capacitor Cfe1 BL0-PL0_1=Vdd/2.

As illustrated, in this scheme WLPs to the switches follow the same signal as WL during the write operations, in accordance with some embodiments. For example, WPL0_1 associated with the capacitor Cfe1 to be programmed and other WLPs (e.g., WLP0_2 through WLP0_n) are also driven to the same value as WLP0_1). In various embodiments, WLPs for inactive or unselected bit-cells are set to 0V just like WLs for the unselected bit-cells.

Figure 9D:
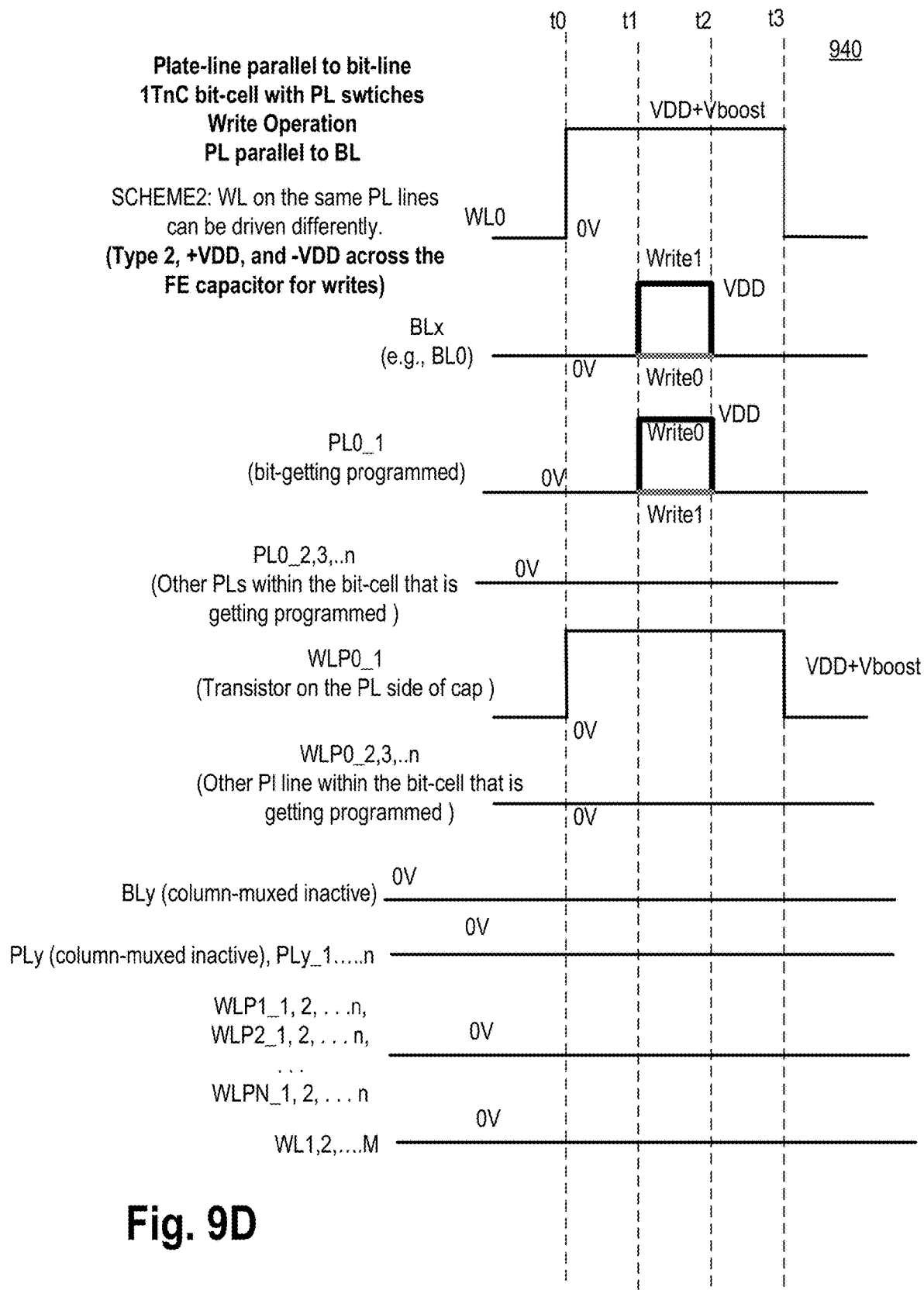
FIG. 9D illustrates a timing diagram for write operation for 1T1C bit-cells with the PL parallel to the BL and where the word-lines (WLPs) for switch transistors for multiple plate-lines within a bit-cell are driven by different signals, in accordance with some embodiments.

FIG. 9D illustrates timing diagram 940 for write operation for 1T1C bit-cells with the PL parallel to the BL and where the word-lines (WLPs) for switch transistors for multiple plate-lines within a bit-cell are driven by different signals, in accordance with some embodiments. Compared to scheme 1 described with reference to FIG. 9C, here the word-lines (WLPs) to the switches coupled to the plate-lines are driven by different signals. Further, instead of toggling the selected BLx (e.g., BL0) and the selected PL (e.g., PL0_1) to ½ Vdd and thereafter toggling the selected PL between 0V and Vdd for different write values, here both selected BL and selected PL are toggled between 0V and Vdd depending upon the write values.

In various embodiments, WL is boosted for write operation (e.g., WL0 is boosted to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL0_1 is set to logic 0 to allow storage of logic 1 value in capacitor Cfe1. In some embodiments, to write a logic 0, BLx is kept at 0V when WL is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1. All other plate-lines (e.g., PL0_2, PL0_3, . . . PL0_n) remain at 0V when the selected PL (e.g., PL0_1) is being used to program a capacitor in the bit-cell.

In various embodiments, for this scheme, the transistor coupled to the capacitor being programmed is turned on during write operation, while other switches for unselected capacitors remain off. For example, WLP0_1 follows the same signal pattern as WL to turn on transistor $MN_{PLO\_1}$ to program capacitor Cfe1, while other WLPs (e.g., WLP0_2 through WLP0_n) are set to 0V to keep the n-type switches off. In various embodiments, other BLs which are unselected are set to 0V by a column multiplexer. In some embodiments, PLs of other unselected bit-cells and WLs of other unselected bit-cells are also kept at 0V to reduce any cross-noise.

Other PLs (e.g., PL0_2 through n) within the same selected bit-cell (e.g., $901_{0,0}$) are set to 0. PL (e.g., PLy) for column multiplexed bit-cells remains at 0V while PL0_1 is being used to program Cfe1. Word-lines of unselected bit-cells is set to 0V (e.g., WL1, 2, through M are set to 0V when WL0 is selected).

In some embodiments, the voltage swing across the selected ferroelectric capacitor is 2Vdd during write operation (e.g., the swing is Vdd to −Vdd). For example, during write 0, BL0 is 0 and PL0_1 is Vdd, which makes the voltage across the selected ferroelectric capacitor Cfe1 BL0-PL0_1=−Vdd. Likewise, during write 1, BL0 is Vdd and PL0_1 is 0, which makes the voltage across the selected ferroelectric capacitor Cfe1 BL0-PL0_1=Vdd.

As illustrated, in this scheme WLPs to the switches may not follow the same signal as WL during the write operations, in accordance with some embodiments. For example, WPL0_1 associated with the capacitor Cfe1 to be programmed and other WLPs (e.g., WLP0_2 through WLP0_n may not be driven to the same value as WLP0_1. In various embodiments, WLPs for inactive or unselected bit-cells are set to 0V just like WLs for the unselected bit-cells. Scheme 2 simplifies signal generation compared to scheme 1 where tri-level signaling is used (e.g., scheme 1 uses tri-level signaling in BL and PL). Here, 2-level signaling is used. Further, scheme 2 allows for a higher voltage swing on the ferroelectric capacitor for a given supply, which effectively enables lower voltage supply operation. While scheme 1 may share drivers for WLPs, here the drivers for WLPs may be independent from one another.

Figure 9E:
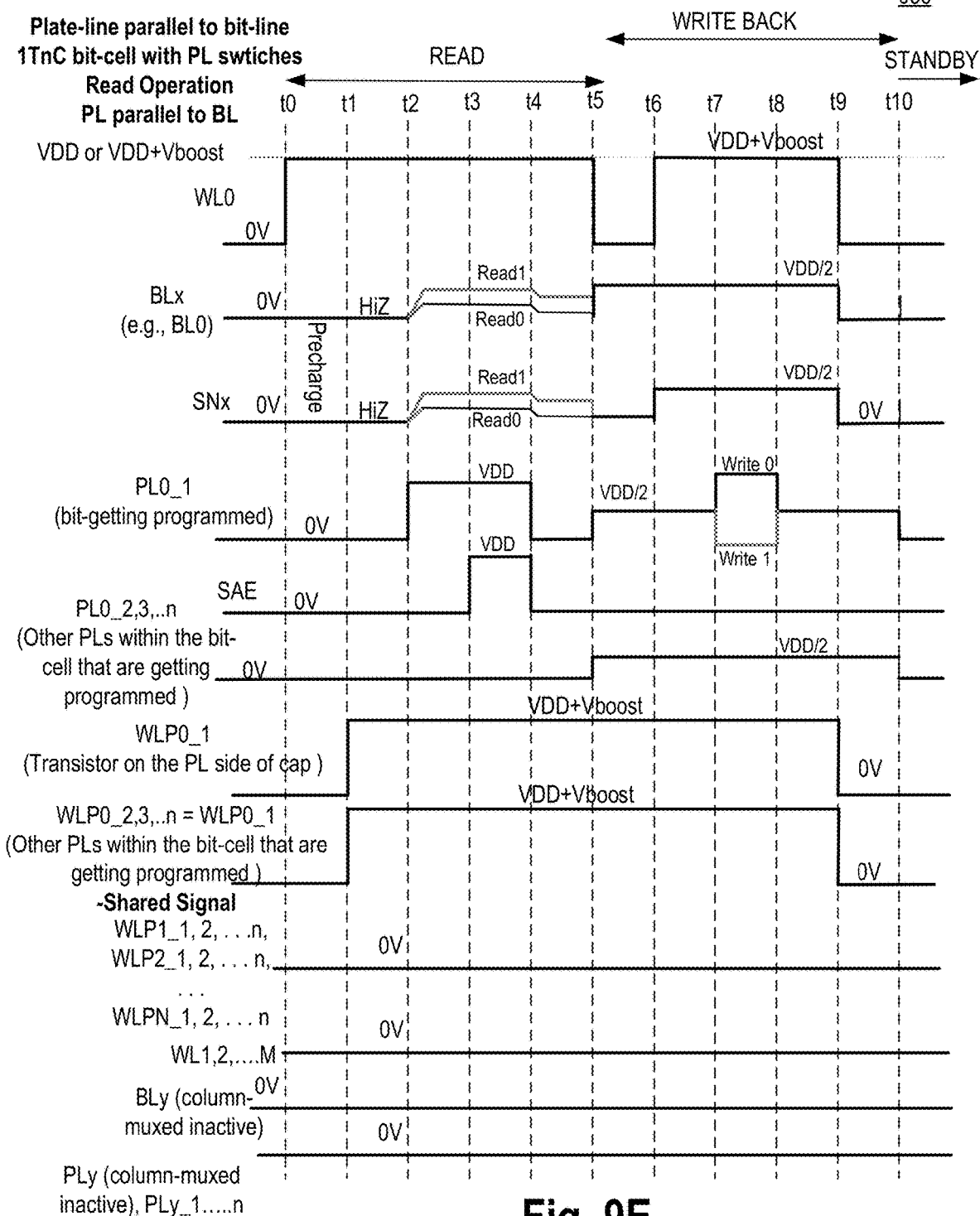
FIG. 9E illustrates a timing diagram for read operation for 1T1C bit-cells with the PL parallel to the BL and where the word-lines (WLPs) for switch transistors for multiple plate-lines within a bit-cell are driven by a same signal, in accordance with some embodiments.

FIG. 9E illustrates timing diagram 950 for read operation for 1T1C bit-cells with the PL parallel to the BL and where the word-lines (WLPs) for switch transistors for multiple plate-lines within a bit-cell are driven by a same signal, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL (e.g., PL0_1) is asserted for the bit-cell which is being read. Other unselected PLs (e.g., PL0_2, PL_3, . . . PL0_n) of the bit-cell are kept at 0V during read operation, and then to Vdd/2 during writeback if the first scheme is followed. Here, here, 'x' in PLx_n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on.

The PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BLx (e.g., BL0) is set or forced to zero volts during read operation, and then set to Vdd just before WL is boosted for write back operation when the first scheme is followed. Writeback operation for the first scheme is like the write operation discussed with reference to FIG. 9C.

Referring to FIG. 9E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In various embodiments, selected BLx (e.g., BL0) follows similar characteristics as SNx during the read phase.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In various embodiments, the WLPs to the gates of the switches are driven by a same signal. In some embodiments, during the read operation (which includes the writeback), WLPs are asserted to a boosted level (e.g., Vdd+Vboost). In some embodiments, during the read operation, plate-lines that are not used to program a capacitor are set to 0. For example, PL0_2 through n, PL1_0 through n are set to 0V while PL0_1 is being used to read from capacitor Cfe1. In some embodiments, PL0_2 through n are parked to a non-0V value (e.g., Vdd/2, Vdd/3, etc.), which can be optimized to reduce disturb to other capacitors during read while PL0_1 is being used to read from capacitor Cfe1.

In some embodiments, WPL0_1 associated with the capacitor Cfe1 to be programmed and other WLPs (e.g., WLP0_2 through WLP0_n) are also driven to the same value as WLP0_1. In various embodiments, WLPs for inactive or unselected bit-cells are set to 0V just like WLs for the unselected bit-cells.

Figure 9F:
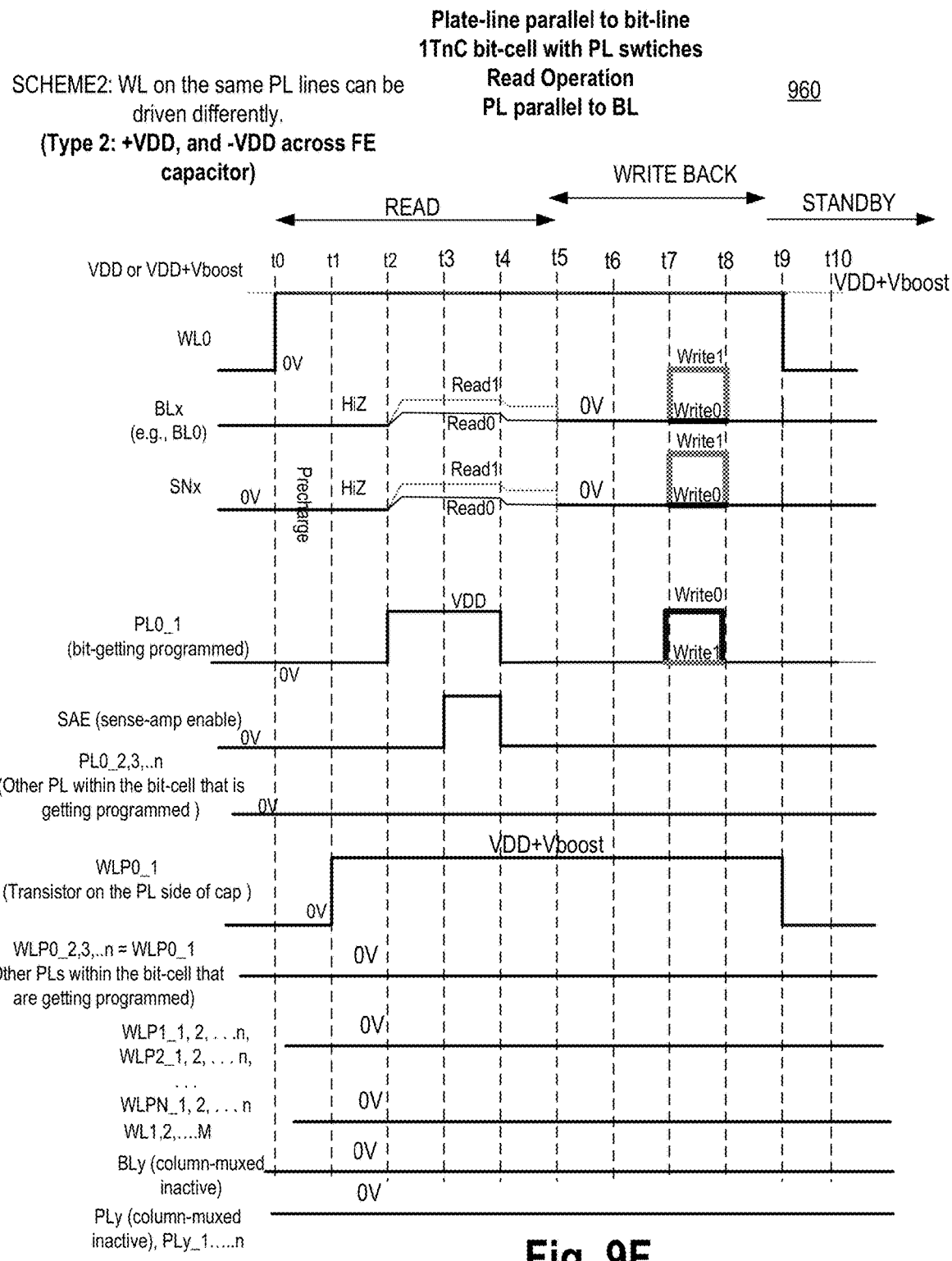
FIG. 9F illustrates a timing diagram for write operation for 1T1C bit-cells with the PL parallel to the BL and where the word-lines (WLPs) for switch transistors for multiple plate-lines within a bit-cell are driven by different signals, in accordance with some embodiments.

FIG. 9F illustrates timing diagram 960 for write operation for 1T1C bit-cells with the PL parallel to the BL and where the word-lines (WLPs) for switch transistors for multiple plate-lines within a bit-cell are driven by different signals, in accordance with some embodiments. Here, the writeback scheme is the same as that in FIG. 9D, in accordance with some embodiments. In various embodiments, the read scheme in timing diagram 860 is the same scheme as that of FIG. 9E, except for the signals on other WLPs of the unselected capacitors of the same bit-cell are driven to 0V as opposed to the same value.

Figure 10A:
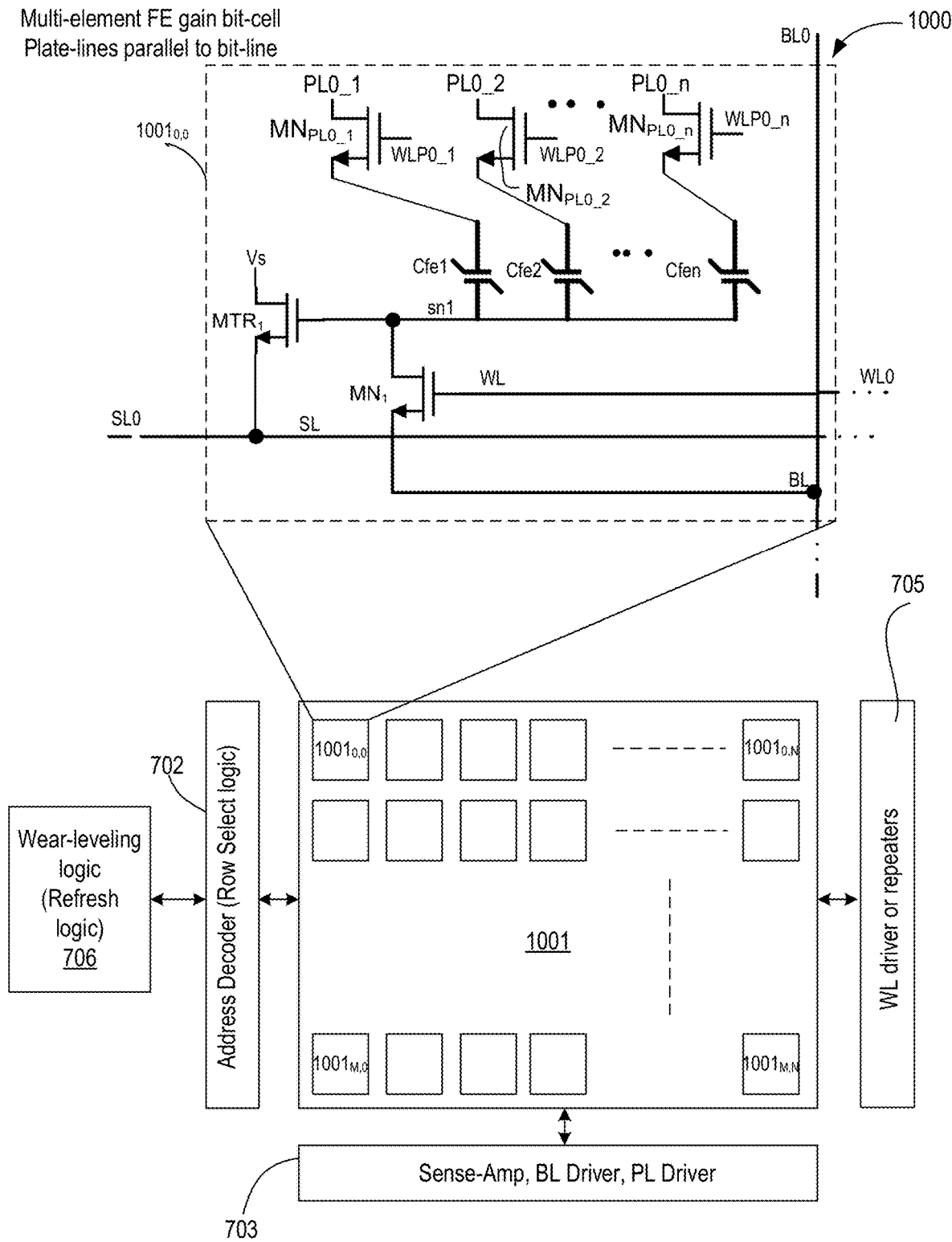
FIG. 10A illustrates an apparatus comprising memory and corresponding logic, wherein the memory comprises FE memory bit-cells, where an individual memory bit-cell includes a multi-element FE gain bit-cell with PLs parallel to a BL, and with individual switches coupled to the capacitors on the plate-line side, where the corresponding logic is to apply word-line boosting, and wherein the capacitors are in a stacked and folded configuration, in accordance with some embodiments.

FIG. 10A illustrates apparatus 1000 comprising memory and corresponding logic, wherein the memory comprises FE memory bit-cells, where an individual memory bit-cell includes multi-element FE gain bit-cells with PLs parallel to a BL, and with individual switches coupled to the capacitors on the plate-line side, where the corresponding logic is to apply word-line boosting, and wherein the capacitors are in a stacked and folded configuration, in accordance with some embodiments.

Apparatus 1000 is like apparatus 800, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in memory array 1001 is organized in rows and columns like in apparatus 800, but with bit-lines running parallel to the plate-lines. For example, memory bit-cells $1001_{0,0}$ through $1001_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_n. Each transistor (or switch) is controlled separately, in accordance with some embodiments. In some embodiments, transistor $MN_{PLO\_1}$ is controllable by WLP0_1, transistor $MN_{PLO\_2}$ is controllable by WLP0_2, and so on. Likewise, transistor $MN_{PLO\_n}$ is controllable by WLP0_n. Here, WLP0_1 . . . . WLP0_n are the extensions of an address space. In this case, depending upon which storage element is being programmed or read, the corresponding WLP0_1 . . . WLP0_n are kept high (e.g., Vdd)

whenever the plate-line voltage of 0V or Vdd is applied, while the unselected storage element sees 0V.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 10A, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . and $MN_{PLO\_n}$, are fabricated in the backend of the die. On one such embodiment, the capacitor Cfe is fabricated between the frontend and the backend of the die. In one example, capacitors Cfe are vertically stacked capacitors and horizontally folded. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In some embodiments, capacitors Cfe1 and Cfe2 are stacked and folded. These backed transistors or switches can be fabricated using any suitable technology such as IGZO (Indium gallium zinc oxide).

Figure 10B:
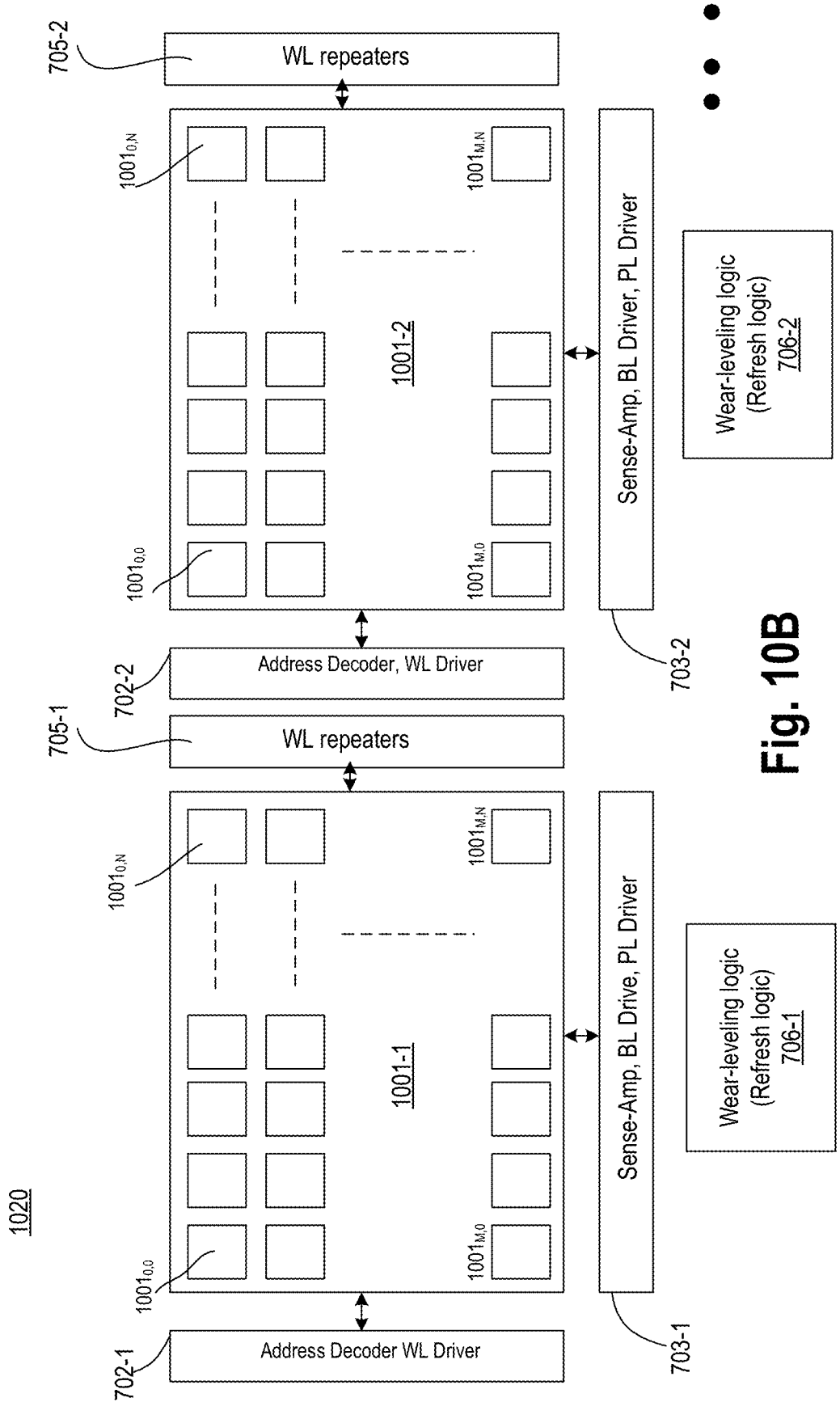
FIG. 10B illustrates an FE memory with word-line repeaters, wherein memory arrays of the multi-element FE gain bit-cells of FIG. 10A, in accordance with some embodiments.

FIG. 10B illustrates FE memory apparatus 1020 with word-line repeaters, wherein memory arrays of the multi-element FE gain bit-cells of FIG. 10A, in accordance with some embodiments. Apparatus 1020 is like apparatus 820, but with memory arrays 1001-1 and 1001-2. Each memory array includes memory bit-cells of FIG. 10A.

Figure 10C:
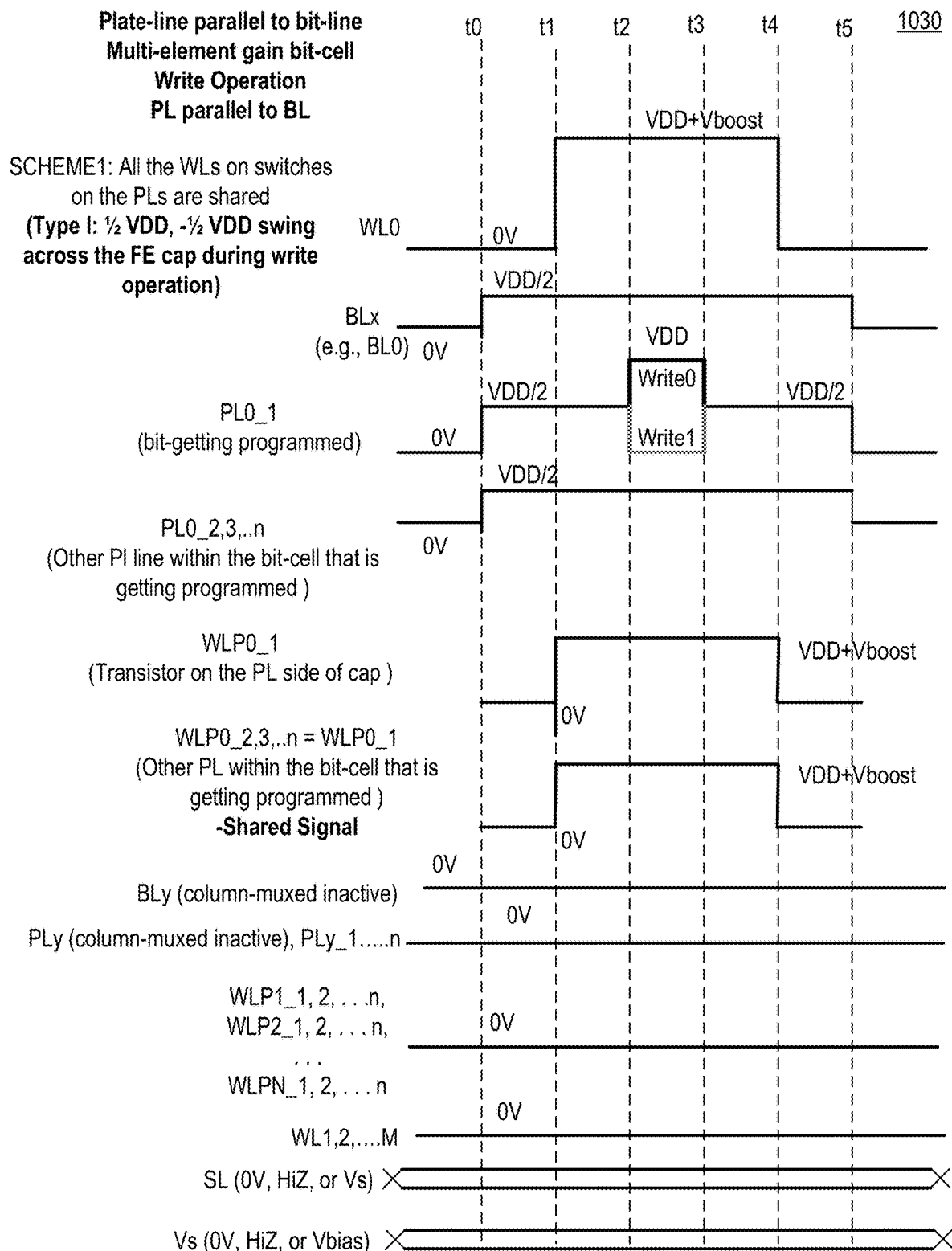
FIG. 10C illustrates a timing diagram for write operation for multi-element FE gain bit-cells with the PL parallel to the BL and where the word-lines (WLPs) for switch transistors for multiple plate-lines within a bit-cell are driven by a same signal, in accordance with some embodiments.

FIG. 10C illustrates timing diagram 1030 for write operation for multi-element FE gain bit-cells with the PL parallel to the BL and where the word-lines (WLPs) for switch transistors for multiple plate-lines within a bit-cell are driven by a same signal, in accordance with some embodiments. In this scheme (first scheme) all WLPs for switch transistors are driven by a same signal per bit-cell, in accordance with some embodiments. For example, WLP0_1, WLP0_2, . . . WLP0_n for bit-cell $1001_{0,0}$ share a same signal driver. In some embodiments, the signals on WLPs for switch transistors for a bit-cell during the write operation are same as the WL0 signal for that bit-cell.

To write to a capacitor of a multi-element FE gain bit-cell (e.g., $1001_{0,0}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx (e.g., BL0) is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL to store a 0 or a 1 to that capacitor. In this example, PL0_1 is charged from 0V to Vdd/2 when BL0 is charged to Vdd/2. Then during the pulse width of the boosted WL, PL0_1 is set to Vdd to write a 0 to capacitor Cfe1. In some embodiments, during the pulse width of the boosted WL, PL0_1 is set to 0V to write a 1 to the capacitor Cfe1.

Other PLs (e.g., PL0_2 through n) within the same selected bit-cell (e.g., $901_{0,0}$) are charged to Vdd/2 like Blx.

PL (e.g., PLy) for column multiplexed bit-cells remains at 0V while PL0_1 is being used to program Cfe1. Word-lines of unselected bit-cells is set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

In some embodiments, the voltage swing across the selected ferroelectric capacitor is Vdd during write operation (e.g., the swing is ½ Vdd to –½ Vdd). For example, during write 0, BL0 is Vdd/2 and PL0_1 is Vdd, which makes the voltage across the selected ferroelectric capacitor Cfe1 BL0-PL0_1=–Vdd/2. Likewise, during write 1, BL0 is Vdd/2 and PL0_1 is 0, which makes the voltage across the selected ferroelectric capacitor Cfe1 BL0-PL0_1=Vdd/2.

As illustrated, in this scheme WLPs to the switches follow the same signal as WL during the write operations, in accordance with some embodiments. For example, WPL0_1 associated with the capacitor Cfe1 to be programmed and other WLPs (e.g., WLP0_2 through WLP0_n are also driven to the same value as WLP0_1). In various embodiments, WLPs for inactive or unselected bit-cells are set to 0V just like WLs for the unselected bit-cells.

Figure 10D:
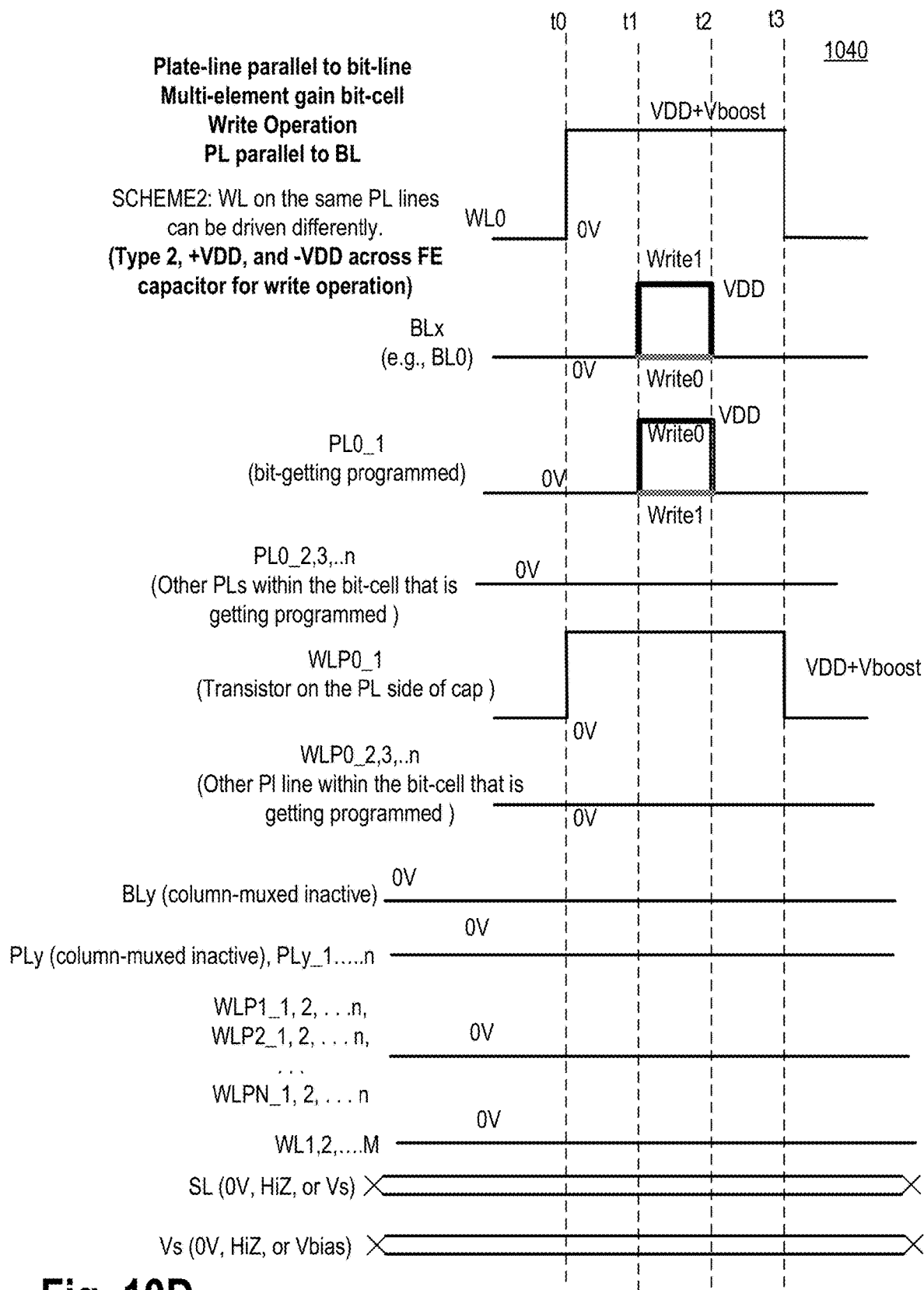
FIG. 10D illustrates a timing diagram for write operation for multi-element FE gain bit-cells with the PL parallel to the BL and where the word-lines (WLPs) for switch transistors for multiple plate-lines within a bit-cell are driven by different signals, in accordance with some embodiments.

FIG. 10D illustrates timing diagram 1040 for write operation for multi-element FE gain bit-cells with the PL parallel to the BL and where the word-lines (WLPs) for switch transistors for multiple plate-lines within a bit-cell are driven by different signals, in accordance with some embodiments. Compared to scheme 1 described with reference to FIG. 10C, here the word-lines (WLPs) to the switches coupled to the plate-lines are driven by different signals. Further, instead of toggling the selected BLx (e.g., BL0) and the selected PL (e.g., PL0_1) to ½ Vdd and thereafter toggling the selected PL between 0V and Vdd for different write values, here both selected BL and selected PL are toggled between 0V and Vdd depending upon the write values.

In various embodiments, WL is boosted for write operation (e.g., WL0 is boosted to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL0_1 is set to logic 0 to allow storage of logic 1 value in capacitor Cfe1. In some embodiments, to write a logic 0, BLx is kept at 0V when WL is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1. All other plate-lines (e.g., PL0_2, PL0_3, . . . PL0_n) remain at 0V when the selected PL (e.g., PL0_1) is being used to program a capacitor in the bit-cell.

In various embodiments, for this scheme, the transistor coupled to the capacitor being programmed is turned on during write operation, while other switches for unselected capacitors remain off. For example, WLP0_1 follows the same signal pattern as WL to turn on transistor $MN_{PLO\_1}$ to program capacitor Cfe1, while other WLPs (e.g., WLP0_2 through WLP0_n) are set to 0V to keep the n-type switches off. In various embodiments, other BLs which are unselected are set to 0V by a column multiplexer. In some embodiments, PLs of other unselected bit-cells and WLs of other unselected bit-cells are also kept at 0V to reduce any cross-noise.

Other PLs (e.g., PL0_2 through n) within the same selected bit-cell (e.g., $1001_{0,0}$) are set to 0. PL (e.g., PLy) for column multiplexed bit-cells remains at 0V while PL0_1 is being used to program Cfe1. Word-lines of unselected bit-cells are set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

In some embodiments, the voltage swing across the selected ferroelectric capacitor is 2Vdd during write operation (e.g., the swing is Vdd to −Vdd). For example, during write 0, BL0 is 0 and PL0_1 is Vdd, which makes the voltage across the selected ferroelectric capacitor Cfe1 BL0-PL0_1=−Vdd. Likewise, during write 1, BL0 is Vdd and PL0_1 is 0, which makes the voltage across the selected ferroelectric capacitor Cfe1 BL0-PL0_1=Vdd.

As illustrated, in this scheme WLPs to the switches may not follow the same signal as WL during the write operations, in accordance with some embodiments. For example, WPL0_1 associated with the capacitor Cfe1 to be programmed and other WLPs (e.g., WLP0_2 through WLP0_n) may not be driven to the same value as WLP0_1. In various embodiments, WLPs for inactive or unselected bit-cells are set to 0V just like WLs for the unselected bit-cells. Scheme 2 simplifies signal generation compared to scheme 1 where tri-level signaling is used (e.g., scheme 1 uses tri-level signaling in BL and PL). Here, 2-level signaling is used. Further, scheme 2 allows for a higher voltage swing on the ferroelectric capacitor for a given supply, which effectively enables lower voltage supply operation. While scheme 1 may share drivers for WLPs, here the drivers for WLPs may be independent from one another.

Figure 10E:
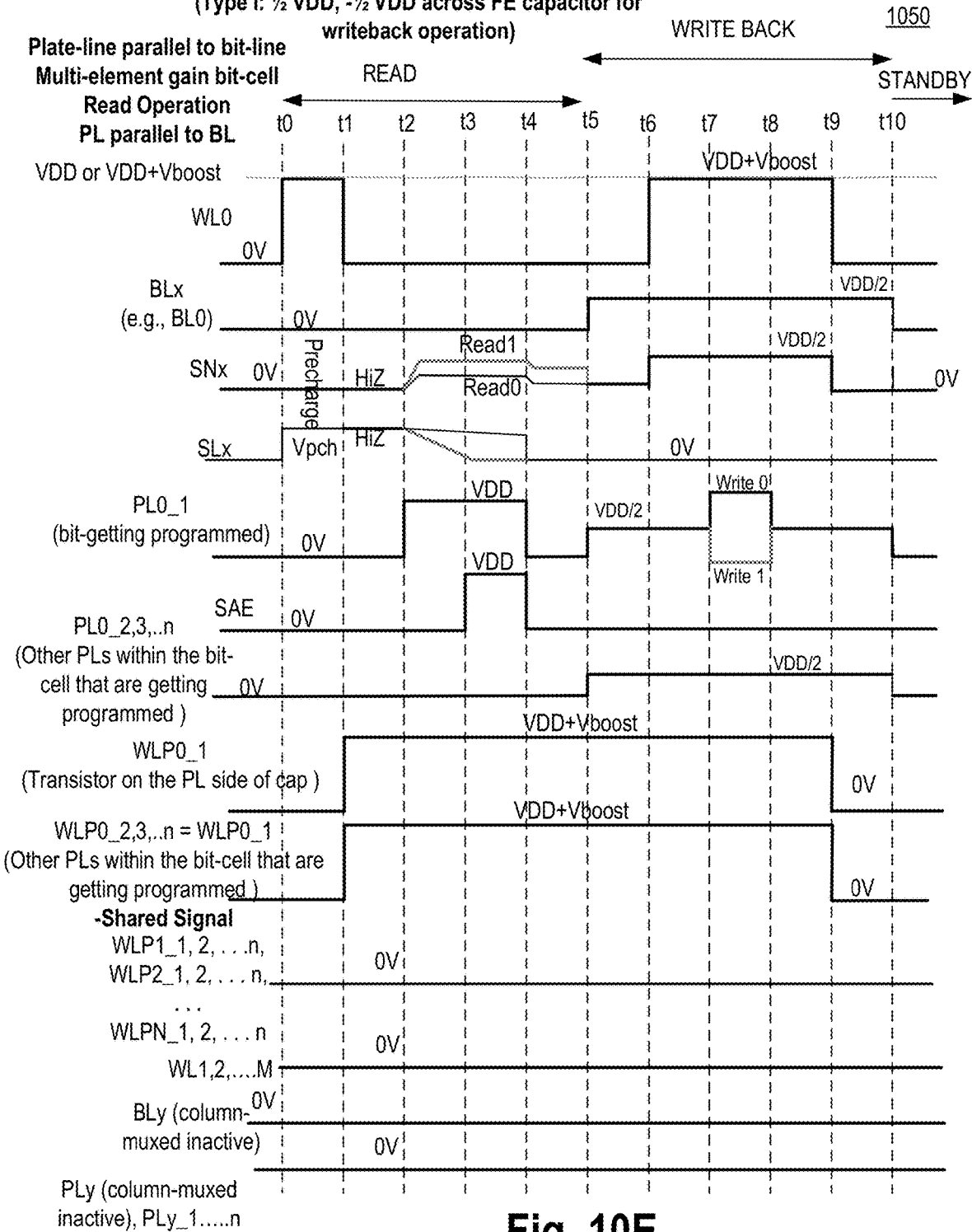
FIG. 10E illustrates a timing diagram for read operation for multi-element FE gain bit-cells with the PL parallel to the BL and where the word-lines (WLPs) for switch transistors for multiple plate-lines within a bit-cell are driven by a same signal, in accordance with some embodiments.

FIG. 10E illustrates timing diagram 1050 for read operation for multi-element FE gain bit-cells with the PL parallel to the BL and where the word-lines (WLPs) for switch transistors for multiple plate-lines within a bit-cell are driven by a same signal, in accordance with some embodiments.

In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL (e.g., PL0_1) is asserted for the bit-cell which is being read. Other unselected PLs (e.g., PL0_2, PL_3, . . . PL0_n) of the bit-cell are kept at 0V during read operation, and then to Vdd/2 during writeback if the first scheme is followed. Here, here, 'x' in PLx_n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on.

The PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts during read operation, and then set to ½ Vdd just before WL is boosted for write back operation when the first scheme is followed. Write back operation for the first scheme is like the write operation discussed with reference to FIG. 10C.

Referring to FIG. 10E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In various embodiments, the WLPs to the gates of the switches are driven by the same signal. In some embodiments, during the read operation (which includes the write-back), WLPs are asserted to a boosted level (e.g., Vdd+Vboost). In some embodiments, during the read operation, plate-lines that are not used to program a capacitor are set to 0. For example, PL0_2 through n, PL1_0 through n are set to 0V while PL0_1 is being used to read from capacitor Cfe1. In some embodiments, PL0_2 through n are parked to a non-0V value (e.g., Vdd/2, Vdd/3, etc.), which can be optimized to reduce disturb to other capacitors during read while PL0_1 is being used to read from capacitor Cfe1.

In some embodiments, WPL0_1 associated with the capacitor Cfe1 to be programmed and other WLPs (e.g., WLP0_2 through WLP0_n are also driven to the same value as WLP0_1). In various embodiments, WLPs for inactive or unselected bit-cells are set to 0V just like WLs for the unselected bit-cells.

Figure 10F:
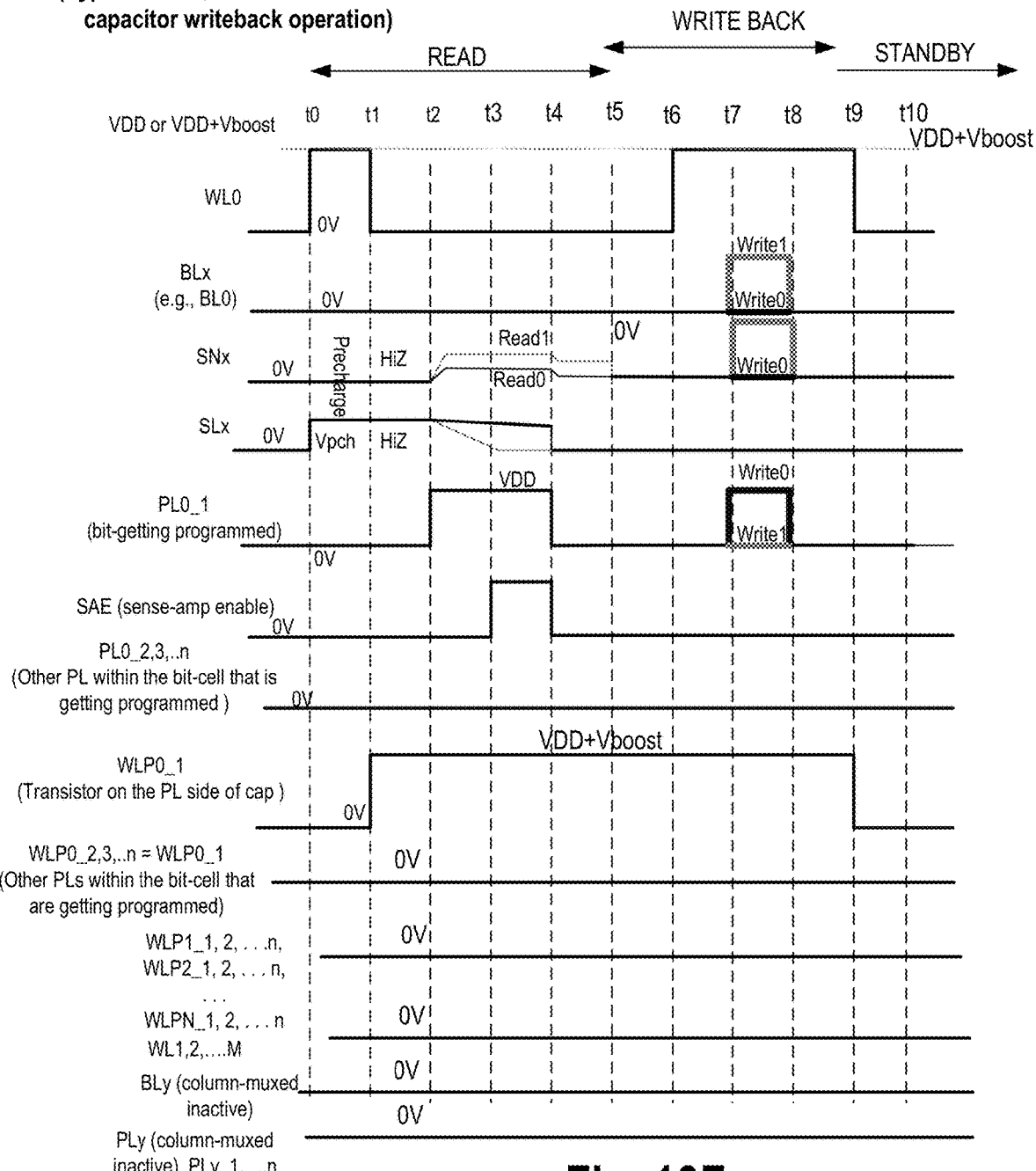
FIG. 10F illustrates a timing diagram for write operation for multi-element FE gain bit-cells with the PL parallel to the BL and where the word-lines (WLPs) for switch transistors for multiple plate-lines within a bit-cell are driven by different signals, in accordance with some embodiments.

FIG. 10F illustrates timing diagram 1060 for write operation for multi-element FE gain bit-cells with the PL parallel to the BL and where the word-lines (WLPs) for switch transistors for multiple plate-lines within a bit-cell are driven by different signals, in accordance with some embodiments. Here, the writeback scheme is the same as that in FIG. 10D, in accordance with some embodiments. In various embodiments, the read scheme in timing diagram 1060 is the same scheme as that in FIG. 10E, except for the signals on other WLPs of the unselected capacitors of the same bit-cell are driven to 0V as opposed to the same value.

Figure 11A:
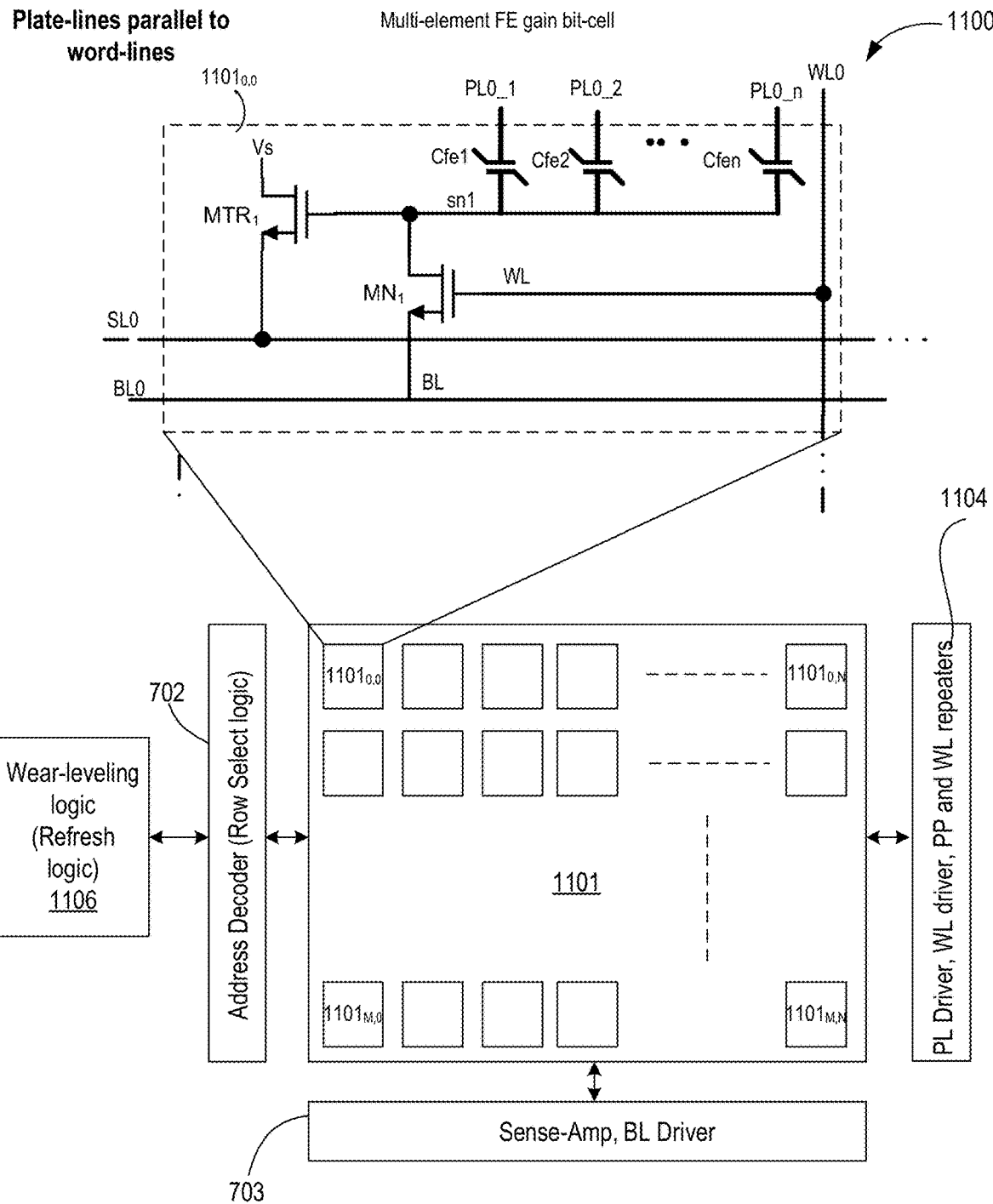
FIG. 11A illustrates an apparatus comprising memory and corresponding logic, wherein the memory comprises FE memory bit-cells, where an individual memory bit-cell is multi-element FE gain bit-cell with plate-lines parallel to a word-line, where the corresponding logic is to apply word-line boosting, in accordance with some embodiments.

FIG. 11A illustrates apparatus 1100 comprising memory and corresponding logic, wherein the memory comprises FE memory bit-cells, where an individual memory bit-cell is multi-element FE gain bit-cell with plate-lines parallel to a word-line, where the corresponding logic is to apply word-line boosting, in accordance with some embodiments.

Apparatus 1100 is like apparatus 800 of FIG. 8A but for WL parallel to PLs. In some embodiments, each memory bit-cell in memory array 1101 is organized in rows and columns like in apparatus 800. For example, memory bit-cells $1101_{0,0}$ through $1101_{M,N}$ are organized in an array. In some embodiments, PL drivers and WL drivers are lumped in logic 1104 orthogonal to BL drivers in logic circuitry 703, in accordance with some embodiments. Here, wear-leveling logic 706 is labeled as 1106.

Figure 11B:
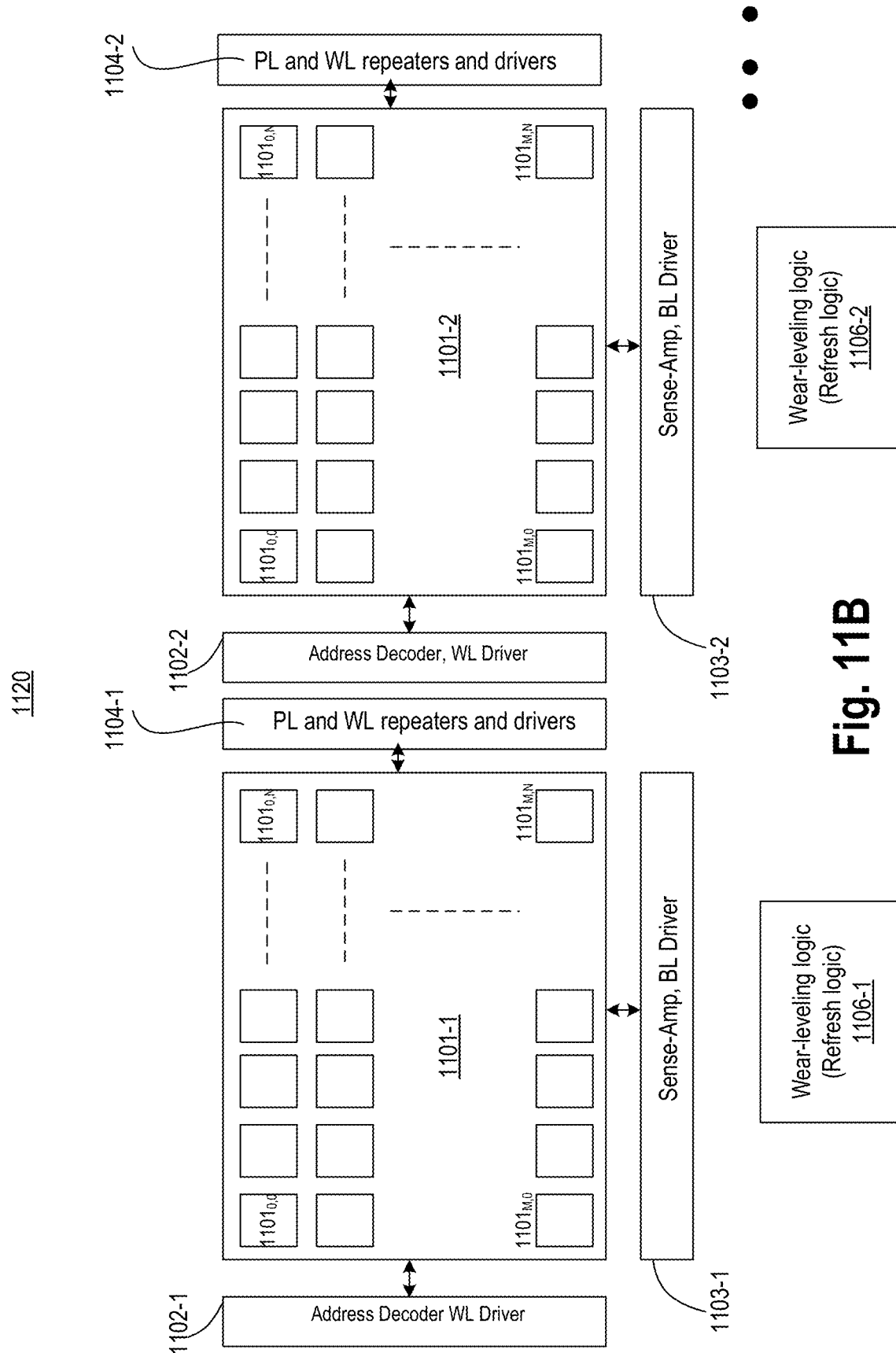
FIG. 11B illustrates an apparatus having FE memory with word-line repeaters, wherein memory arrays of the FE memory having multi-element FE gain bit-cells with the plate-lines parallel to the word-line, in accordance with some embodiments.

FIG. 11B illustrates apparatus 1120 having FE memory with word-line repeaters, wherein memory arrays of the FE memory having multi-element FE gain bit-cells with the plate-lines parallel to the word-line, in accordance with some embodiments. Apparatus 1120 illustrates two instances of apparatus 1100. The two instances include first memory array 1101-1, logic circuitry 1102-1 having first address decoder and/or WL driver, logic circuitry 1103-1 having first sense amplifier and BL driver, logic circuitry 1104-1 having PL and WL repeaters; second memory array 1101-2, logic circuitry 1102-2 having first address decoder and/or WL driver, logic circuitry 1103-2 having first sense amplifier and BL driver, and logic circuitry 1104-2 having PL and WL repeaters. In some embodiments, an individual instance of apparatus 1100 includes a corresponding wear-leveling logic 1106 (e.g., wear-leveling logic 1106-1 and wear-leveling logic 1106-2). In some embodiments, when the pulsing scheme described herein is combined with the refresh function by wear-leveling logic 1106-1 and wear-leveling logic 1106-2, disturbance issues on unselected bit-cells are mitigated. While two memory arrays are shown (e.g., memory arrays 1101-1 and 1101-2), any number of arrays may be part of apparatus 1120. With PL parallel to the WL and orthogonal to logic circuitries 1104-1, 1104-2 etc. having BL, PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

Figure 11C:
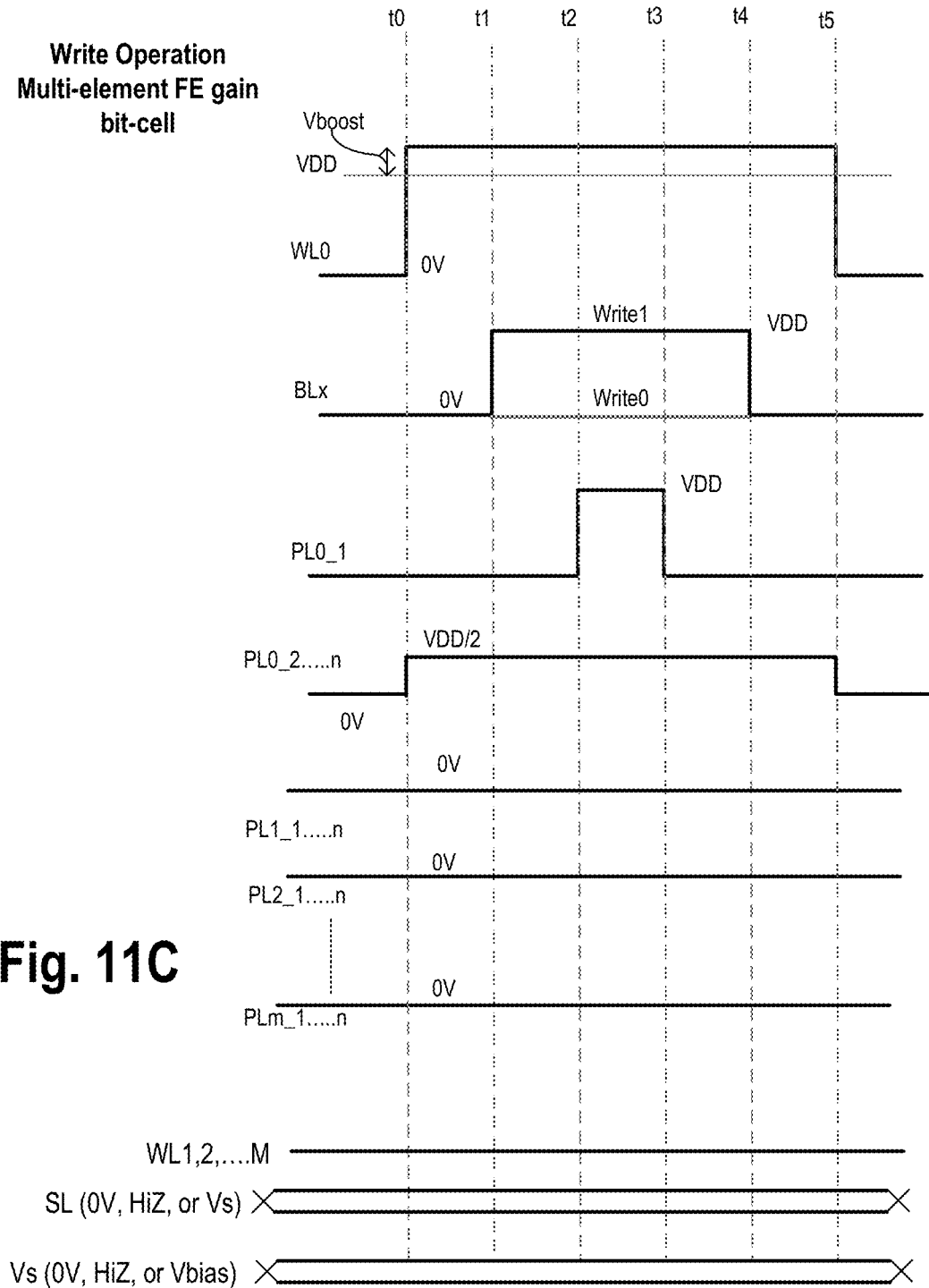
FIG. 11C illustrates a timing diagram for write operation for multi-element FE gain bit-cells with the plate-line parallel to the word-line, where the write operation involves word-line boosting, in accordance with some embodiments.

FIG. 11C illustrates timing diagram 1130 for write operation for multi-element FE gain bit-cells with plate-line parallel to the word-line, where the write operation involves word-line boosting, in accordance with some embodiments. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., $1101_{0,0}$) is asserted from 0V to Vdd (power supply level). Other WLs or PLs not part of the bit-cell are forced to 0V. In some embodiments, other PLs (e.g., PL0_2, PL0_3 . . . . PL0_n) of the selected bit-cell (e.g., $1101_{0,0}$) are set between 0 and Vdd (e.g., Vdd/2). In some embodiments, PL of the unselected bit-cells (e.g., PL1_0, . . . PL1_n to PLm_0, . . . PLm_n) are set to 0V. In some embodiments, the WLs for the unselected bit-cells (e.g., WL1, WL2, . . . WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor MN of the 1T1C bit-cell. Since, the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd−Vt.

For the bit-cell topology with PL parallel to the WL, the word-line boosting is used as otherwise it can lead to a buildup of a voltage level of approximately 2×Vdd on the storage node sn1, when BL line is at Vdd, and PL goes from 0V to Vdd. Since, with WL at Vdd, the transistor $MN_1$ can be off with BL at Vdd, the storage node sn1 will sit at Vdd−Vt when PL is at 0V. After that when PL goes from 0V to Vdd, the internal node can jump to 2Vdd−Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., $1101_{0,0}$) is being written to, the WL for unselected bit-cells (e.g., WL0 through WLm) remains at 0. Same is done for unselected PLs as illustrated. Timing diagram 1130 is a first order diagram without column multiplexing. A person skilled in the art would appreciate that column multiplexing is used for accessing memory bit-cells in an array. Here. all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce an overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, . . . PL0_n), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_n are forced to 0V, and likewise PL2_1, PL2_2, through PL2_n are forced to 0V, and so on).

PLs (e.g., PL0_2 through n) within the same selected bit-cell (e.g., $1101_{0,0}$) are charged to Vdd/2, in accordance with various embodiments. In some embodiments, PL for unselected bit-cells remains at 0V while PL0_1 is being used to program capacitor Cfe1. Word-lines of unselected bit-cells are set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 11D:
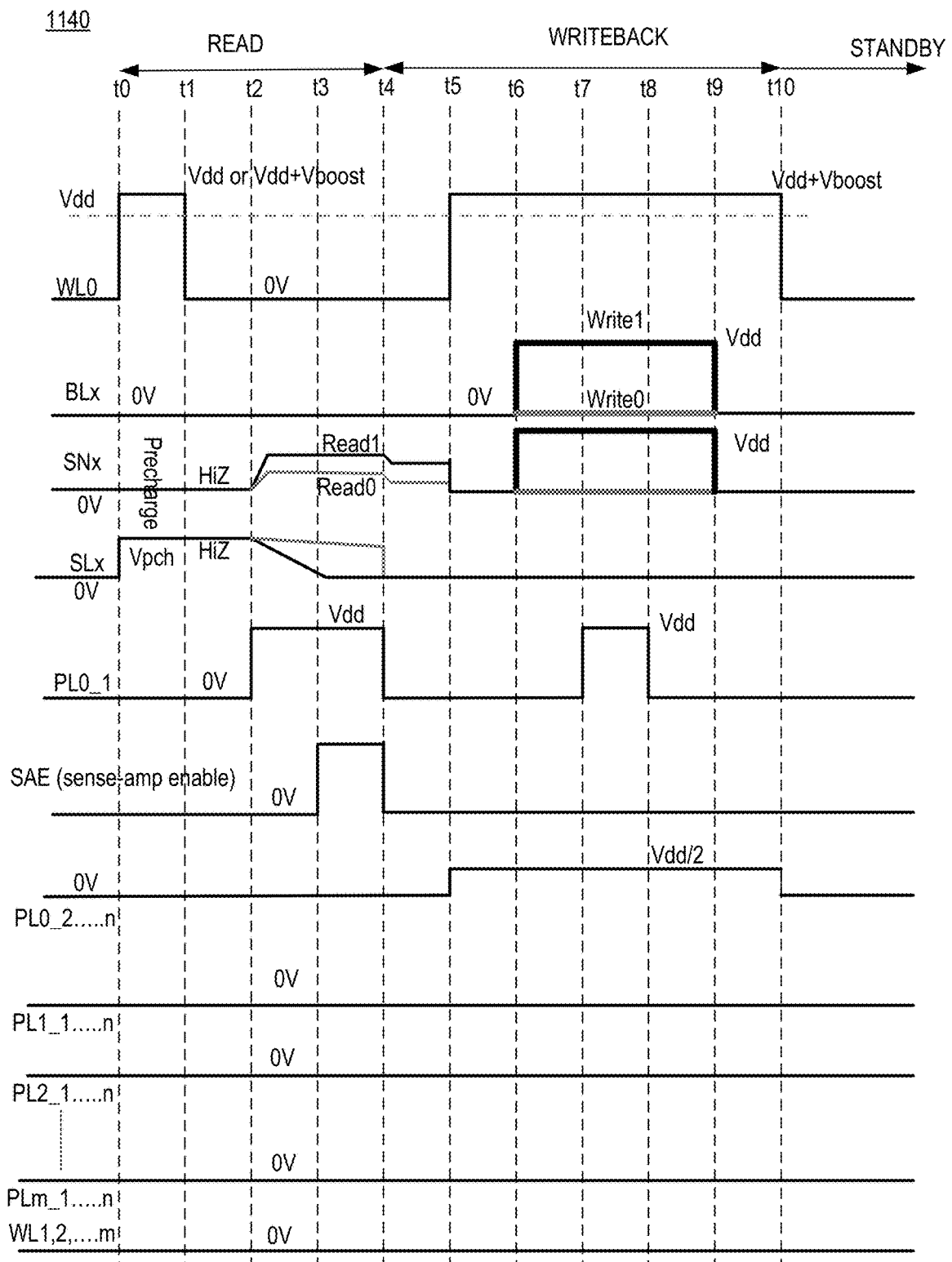
FIG. 11D illustrates a timing diagram for read operation for multi-element FE gain bit-cells with plate-line parallel to the word-line, where the read operation involves word-line boosting, in accordance with some embodiments.

FIG. 11D illustrates timing diagram 1140 for read operation for multi-element FE gain bit-cells with plate-line parallel to the word-line, where the read operation involves word-line boosting, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive reads in this configuration, in accordance with some embodiments.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 11C. Here, here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

Figure 12A:
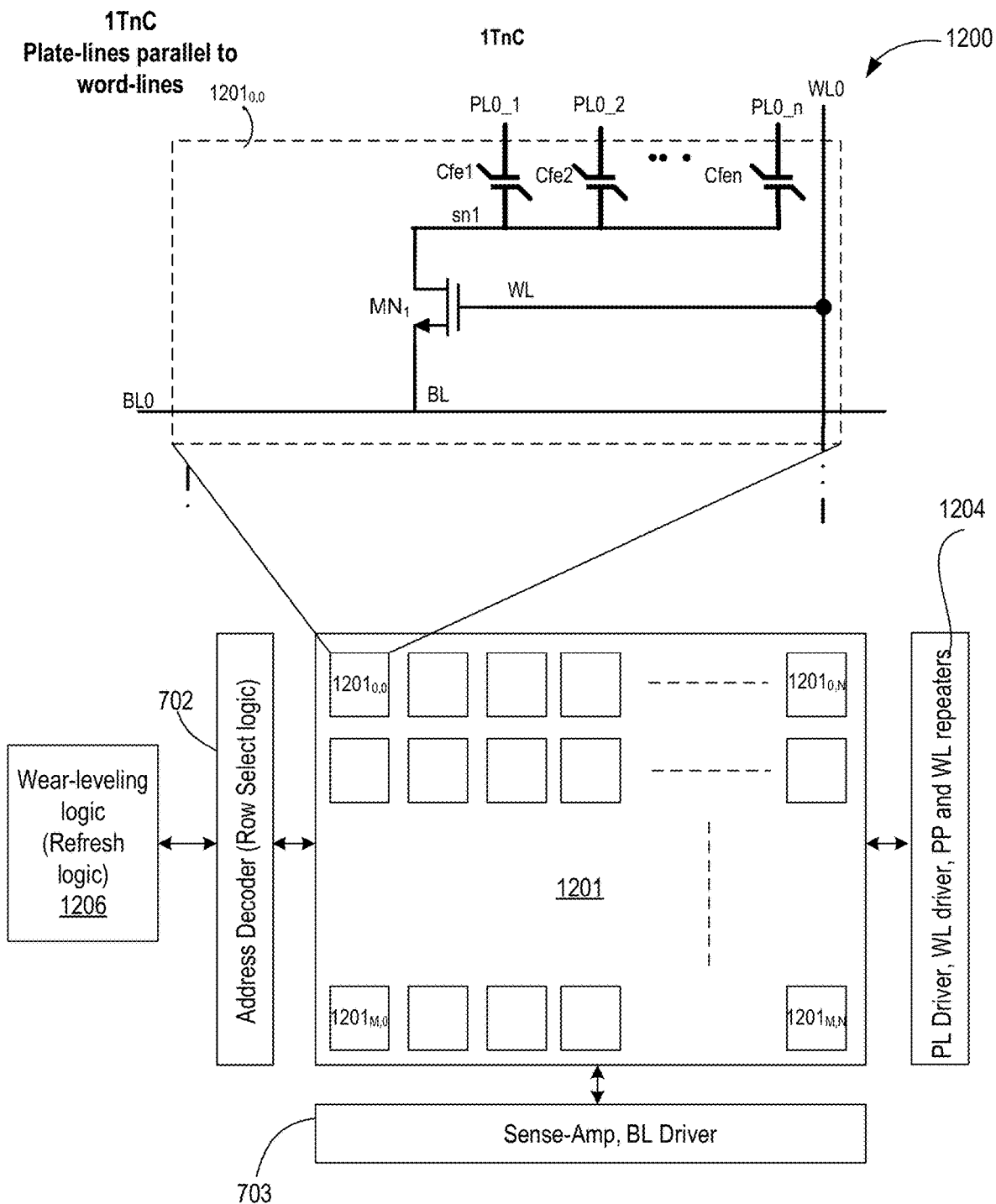
FIG. 12A illustrates an apparatus comprising memory and corresponding logic, wherein the memory comprises FE memory bit-cells, where an individual memory bit-cell is 1TnC bit-cell with plate-lines parallel to a word-line, where the corresponding logic is to apply word-line boosting, and wherein the capacitors are in a stacked and folded configuration, in accordance with some embodiments.

FIG. 12A illustrates apparatus 1200 comprising memory and corresponding logic, wherein the memory comprises FE memory bit-cells, where an individual memory bit-cell is 1TnC bit-cell with plate-lines parallel to a word-line, where the corresponding logic is to apply word-line boosting, and wherein the capacitors are in a stacked and folded configuration, in accordance with some embodiments. Apparatus 1200 is like apparatus 700 of FIG. 7A but for WL parallel to PLs. In some embodiments, each memory bit-cell in memory array 1201 is organized in rows and columns like in apparatus 700. For example, memory bit-cells $1201_{0,0}$ through $1201_{M,N}$ are organized in an array. In some embodiments, PL drivers and WL drivers are lumped in logic 1204 orthogonal to BL drivers in logic circuitry 703, in accordance with some embodiments. Here, wear-leveling logic 706 is labeled as 1206.

Figure 12B:
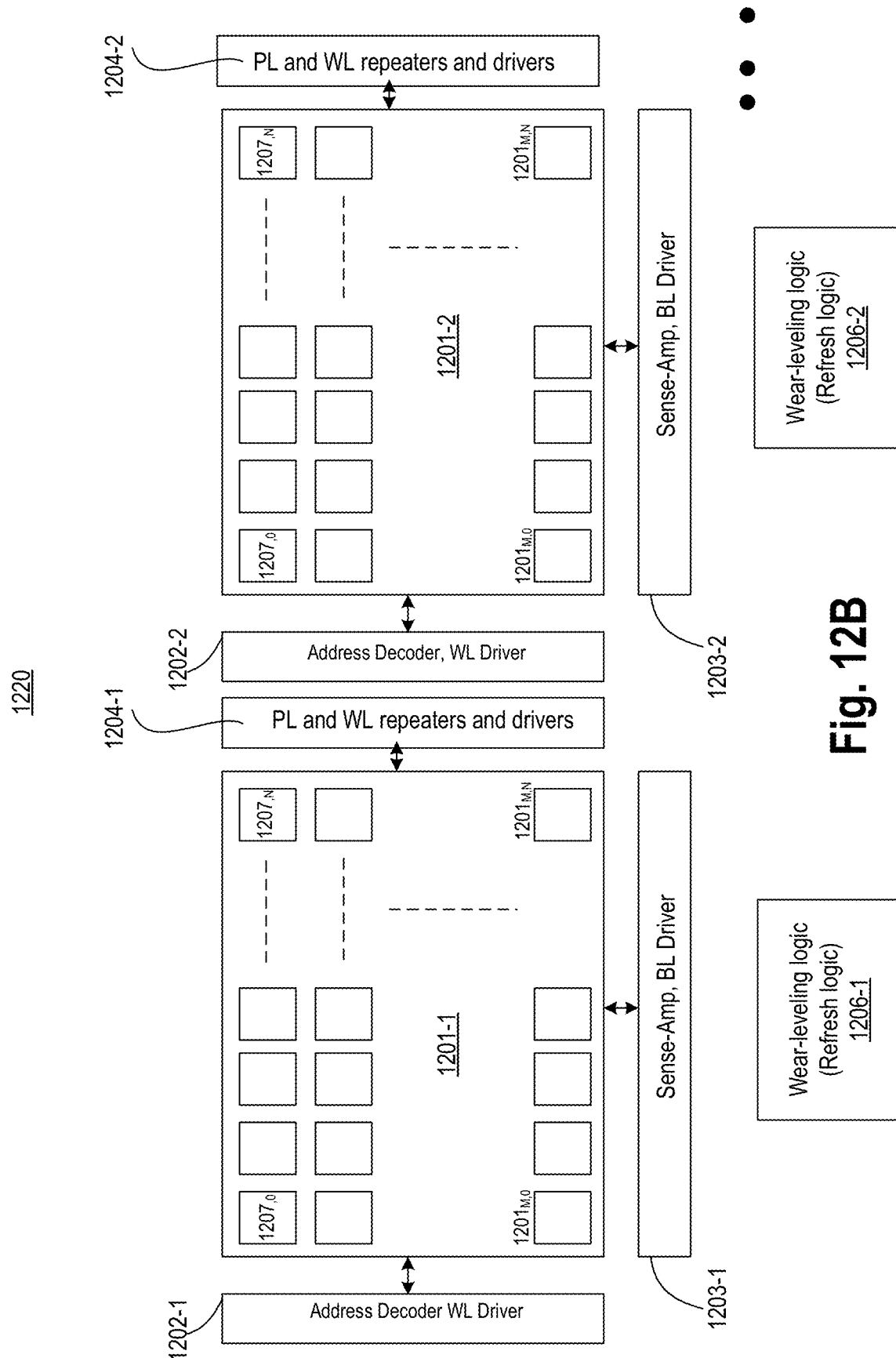
FIG. 12B illustrates an apparatus having FE memory with word-line repeaters, wherein memory arrays of the FE memory having 1TnC bit-cells with the plate-lines parallel to the word-line, in accordance with some embodiments.

FIG. 12B illustrates apparatus 1220 having FE memory with word-line repeaters, wherein memory arrays of the FE memory having 1TnC bit-cells with the plate-lines parallel to the word-line, in accordance with some embodiments. Apparatus 1220 illustrates two instances of apparatus 1200. The two instances include first memory array 1201-1, logic circuitry 1202-1 having first address decoder and/or WL driver, logic circuitry 1203-1 having first sense amplifier and BL driver, logic circuitry 1204-1 having PL and WL repeaters; second memory array 1201-2, logic circuitry 1202-2 having first address decoder and/or WL driver, logic circuitry 1203-2 having first sense amplifier and BL driver, and logic circuitry 1204-2 having PL and WL repeaters. In some embodiments, an individual instance of apparatus 1200 includes a corresponding wear-leveling logic 1206 (e.g., wear-leveling logic 1206-1 and wear-leveling logic 1206-2). In some embodiments, when the pulsing scheme described herein is combined with the refresh function by wear-leveling logic 1206-1 and wear-leveling logic 1206-2, disturbance issues on unselected bit-cells are mitigated. While two memory arrays are shown (e.g., memory arrays 1201-1 and 1201-2), any number of arrays may be part of apparatus 1220. With PL parallel to the WL and orthogonal to logic circuitries 1204-1, 1204-2 etc. having BL, PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

Figure 12C:
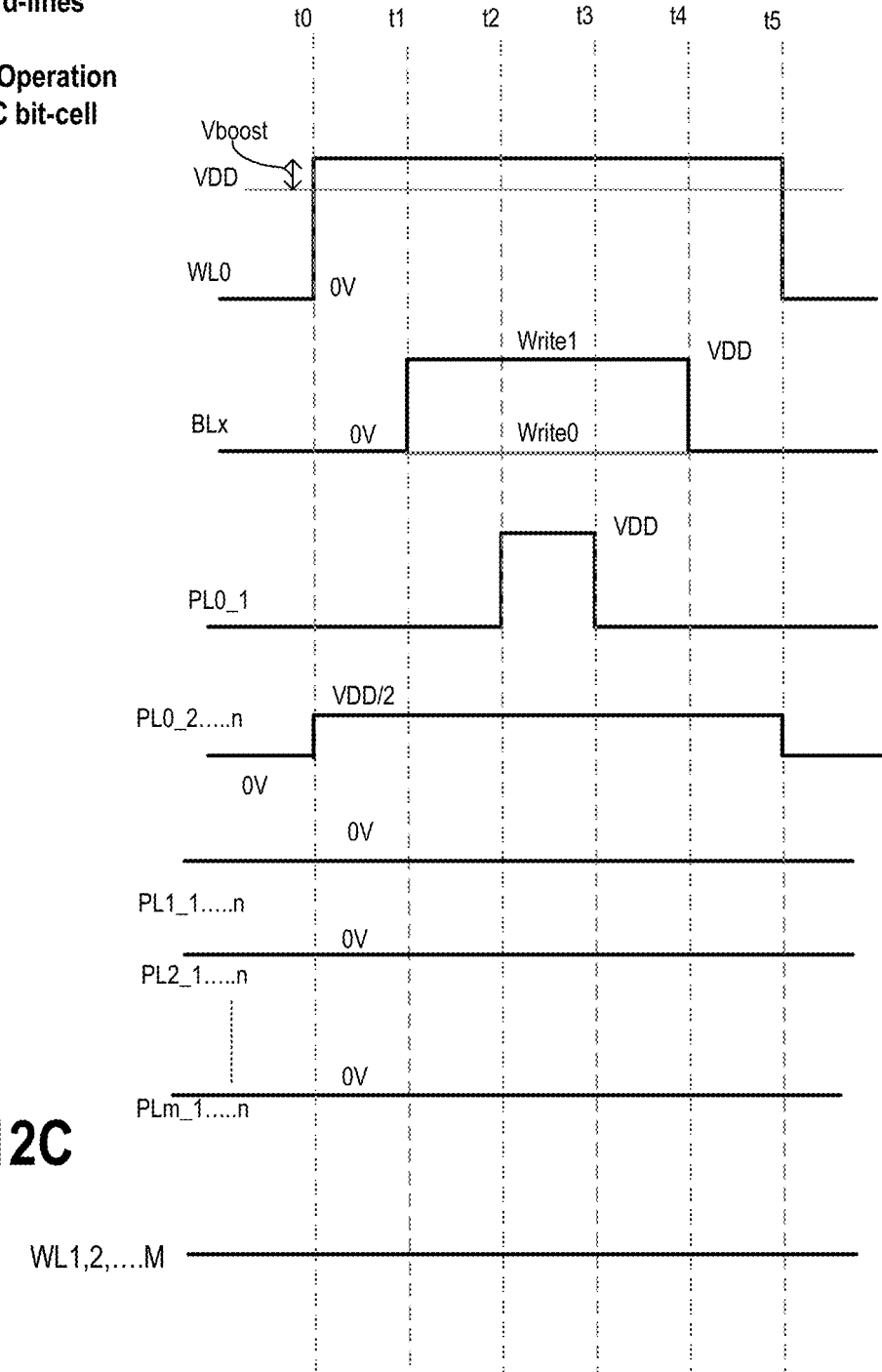
FIG. 12C illustrates a timing diagram for write operation for 1TnC bit-cells with plate-line parallel to the word-line, where the write operation involves word-line boosting, in accordance with some embodiments.

FIG. 12C illustrates timing diagram 1230 for write operation for 1TnC bit-cells with plate-line parallel to the word-line, where the write operation involves word-line boosting, in accordance with some embodiments. In this case, PLs are parallel to the WL. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., $1401_{0,0}$) is asserted from 0V to Vdd (power supply level). Other WLs or PLs not part of the bit-cell are forced to 0V. In some embodiments, other PLs (e.g., PL0_2, PL0_3 . . . . PL0_n) of the selected bit-cell (e.g., $1401_{0,0}$) are set between 0 and Vdd (e.g., Vdd/2). In some embodiments, PL of the unselected bit-cells (e.g., PL1_0, . . . PL1_n to PLm_0, . . . PLm_n) are set to 0V. In some embodiments, the WLs for the unselected bit-cells (e.g., WL1, WL2, . . . WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor MN of the 1T1C bit-cell. Since, the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd−Vt.

For the bit-cell topology with PL parallel to the WL, the word-line boosting is used as otherwise it can lead to a buildup of a voltage level of approximately 2×Vdd on the storage node sn1, when BL line is at Vdd, and PL goes from 0V to Vdd. Since, with WL at Vdd, the transistor $MN_1$ can be off with BL at Vdd, the storage node sn1 will sit at Vdd−Vt when PL is at 0V. After that when PL goes from 0V to Vdd, the internal node can jump to 2Vdd−Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., $1201_{0,0}$) is being written to, the WL for unselected bit-cells (e.g., WL0 through WLm) remains at 0. Same is done for unselected PLs as illustrated. Timing diagram 1230 is a first order diagram without column multiplexing. A person skilled in the art would appreciate that column multiplexing is used for accessing memory bit-cells in an array. Here. all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce an overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, . . . PL0_n), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_n are forced to 0V, and likewise PL2_1, PL2_2, through PL2_n are forced to 0V, and so on).

PLs (e.g., PL0_2 through n) within the same selected bit-cell (e.g., $1201_{0,0}$) are charged to Vdd/2, in accordance with various embodiments. In some embodiments, PL for unselected bit-cells remains at 0V while PL0_1 is being used to program Cfe1. Word-lines of unselected bit-cells are set to 0V (e.g., WL1, 2, through M are set to 0V when WL0 is selected).

Figure 12D:
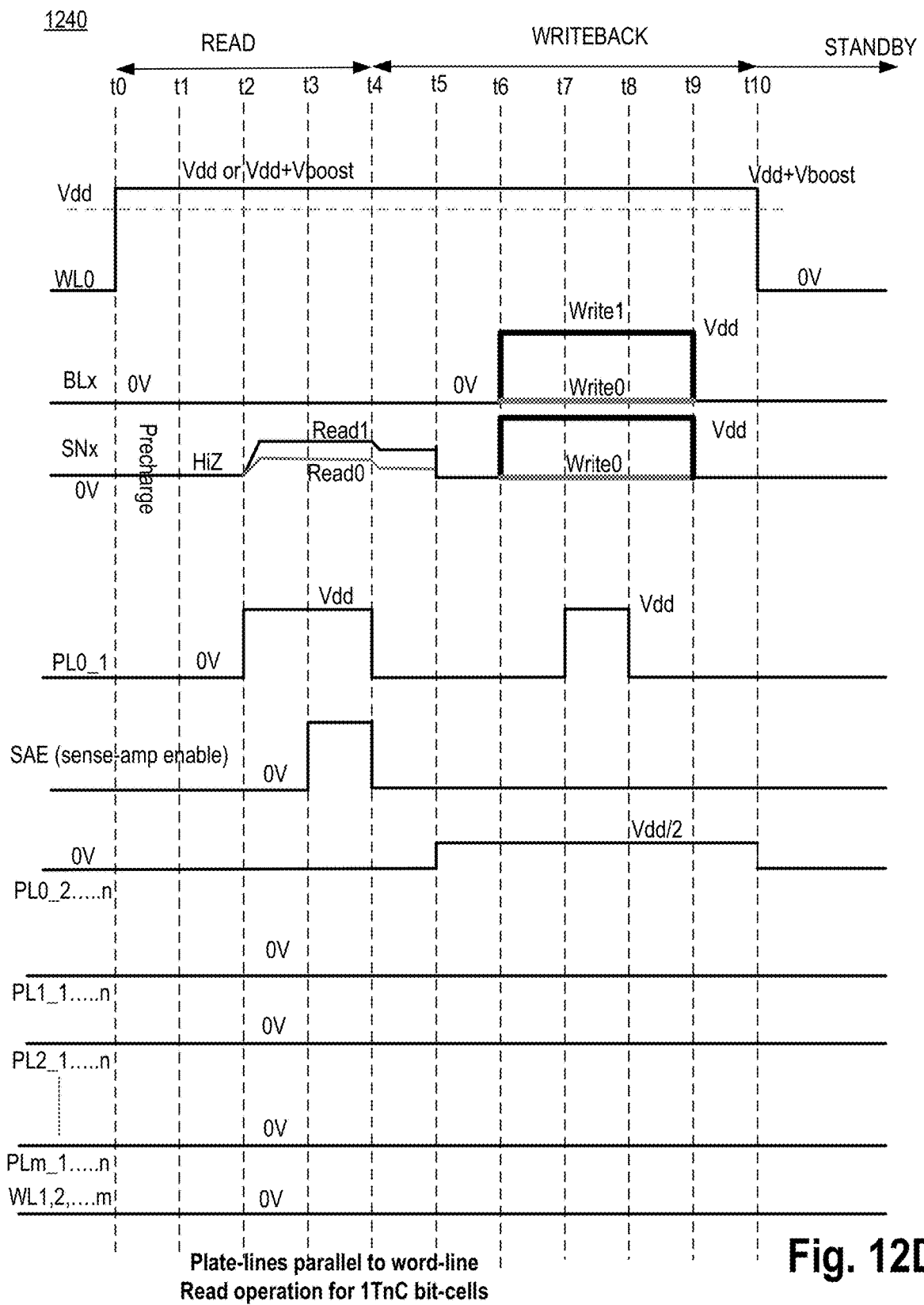
FIG. 12D illustrates a timing diagram for read operation 1TnC bit-cells with plate-line parallel to the word-line, where the read operation involves word-line boosting, in accordance with some embodiments.

FIG. 12D illustrates timing diagram 1240 for read operation 1TnC bit-cells with plate-line parallel to the word-line, where the read operation involves word-line boosting, in accordance with some embodiments. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL for the desired FE capacitor is toggled, which results into voltage buildup on the SNx node. The voltage build-up on the SNx node may be different voltage levels depending upon whether the FE capacitor state was logic 0 or logic 1. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 12C. Here, here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

While various embodiments are described with reference to select transistors as being n-type transistors, the n-type transistors may be replaced with p-type transistors. In one such case, the logic associated with the transistors may be modified to achieve the correct polarity of the signals for proper function of the bit-cells.

Various embodiments illustrate the read mechanism where the BL is precharged to a 0V signal, and the PL across the FE capacitor is pulsed from 0 to Vdd and back to 0V resulting into a sense-signal with respect to having written a 0 state to the FE capacitor (voltage on the BL minus the voltage on the PL being −Ve). The sense-signal on the sense-line corresponds to whether the bit-cell was holding a prior state of 0 (same-state) or 1 (opposite state). In some embodiments, the scheme for read can be changed such that the BL is precharged to Vdd instead, and the PL is held at 0V. In this case, at the end of the precharge phase, the selected bit-cell may create a signal on the BL that will correspond to the bit-cell being written a logic 1 state instead (voltage on the BL minus the voltage on the PL being +ve). The sense-signal as generated on the BL in this case may still correspond to as if the bit-cell was holding a prior state of 0 (opposite-state) or 1 (same-state), with the voltage on BL changing from its precharged state by higher amount when it's an opposite state. This scheme can have the potential for better sense-margin, as the PL switching may not happen during the sense-phase, avoiding any potential coupling related sense-margin reduction. The scheme is also helpful for avoiding read disturbance due to the PL toggles on the bit-cells. Particularly in configurations where the unselected bit-cells can be exposed to the PL toggle, the scheme avoids coupling on the BL, as PL may not have to toggle.

In some embodiments, the way the cells are read can be periodically changed. For example, with the same state being 1 (write 1 during read, i.e., BL is precharged high, while keeping PL low), or same state being 0 (write 0 during read, i.e., BL is precharged low, and PL is toggled high) during the read phase. This can be done to improve the retention characteristics for the cells, as monotonic continuous reads requiring writes of the same polarity can hurt the disturb-induced effect on other bit-cells which gets negated due to the periodic inversion of the way the reads are done. This also can improve the artefact of imprint phenomenon, since a bit-cell even if it is holding a particular state, it may not continuously get written the same value since the read mechanism diversifies it between a read with same state or opposite state, thereby lowering imprint effects with the memory cell.

Figure 13A:
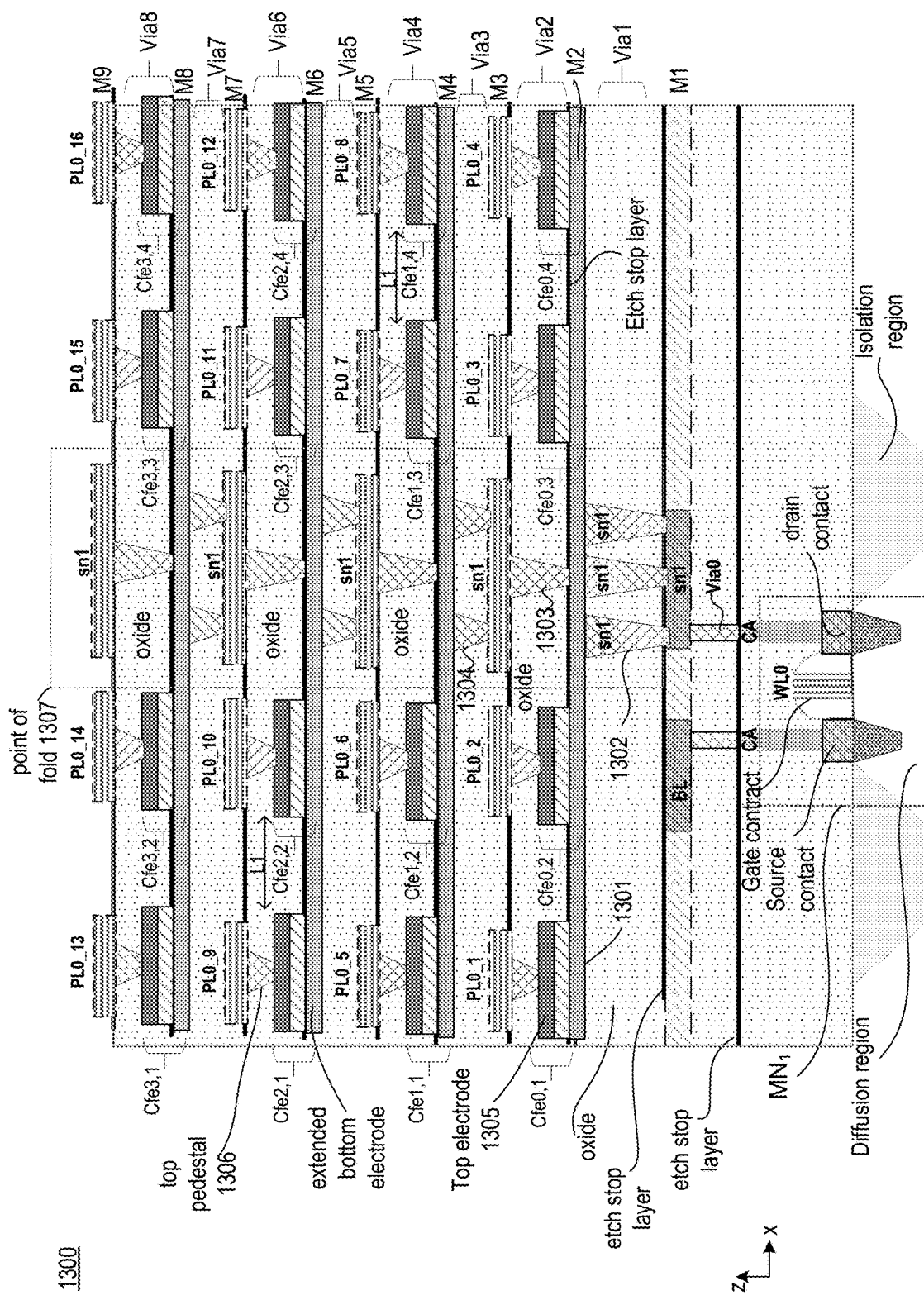
FIG. 13A illustrates a 1TnC bit-cell with stacked and folded planar capacitors that use extended bottom electrodes and misaligned central pedestals, in accordance with some embodiments.

FIG. 13A illustrates 1TnC bit-cell 1300 with stacked and folded planar capacitors that use extended bottom electrodes and misaligned central pedestals, in accordance with some embodiments. In this example, the memory bit-cell comprises one transistor $MN_1$ having a gate terminal controllable by WL0. The source and drain terminals or contacts of the transistor are coupled to respective contacts (CA). Etch stop layer is used in the fabrication of vias (via0) to connect one of the source or drain contacts of the transistor to the storage node sn1 on metal-1 (M1) layer, and another one of the source or drain contacts of the transistor to BL on M1 layer. In some embodiments, another etch stop layer is formed over M1 layer to fabricate vias (via1) to couple to respective M1 layers.

In this example, the 1TnC memory bit-cell has 16 capacitors. However, any number of capacitors may be used for 1TnC memory bit-cell. An individual capacitor has a bottom electrode 1301 which is coupled to storage node sn1 1302 (1303, 1304) and top electrode 1305 which is coupled to a respective plate-line. In some embodiments, top electrode 1305 is coupled to the plate-line via pedestal 1306. In the stack and fold configuration, capacitors N number of capacitors can be divided in L number of stack layers such that there are N/L capacitors in each cap layer. In this example, 16 capacitors (Cfe0,1, Cfe0,2, Cfe0,3, Cfe0,4, Cfe1,1, Cfe1, 2, Cfe1,3, Cfe1,4, Cfe2,1, Cfe2,2, Cfe2,3, Cfe2,4, Cfe3,1, Cfe3,2, Cfe3,3, and Cfe3,4) are divided in four number of stacked layers such that there are 16/4 capacitors in each stacked layer. Each capacitor has a first terminal coupled to a common node sn1 1302, and a second terminal coupled to a respective plate-line. In various embodiments, common node sn1 1302 thus becomes a point of fold 1307.

In the various embodiments, the planar capacitors are illustrated with three layers-top electrode, dielectric, and bottom electrode. While capacitors can be formed like that, the illustrative capacitor can include any of the planar capacitor configurations discussed herein. For example, the planar capacitors can be any one of capacitors of FIGS. 4A-B.

Referring to FIG. 13A, in some embodiments, the capacitors are positioned symmetrically relative to point of fold 1307, common node sn1. In one example, equal number of capacitors are positioned on either sides of the common node sn1 and in the stack. In some embodiments, the capacitors are not positioned symmetrically relative to the point of fold. For example, there may be more capacitors on one side of the storage node sn1 relative to another side. Further, each layer may also have a symmetric or non-symmetric arrangement of the capacitors. In some embodiments, the capacitors are spaced by substantially at equal lateral (horizontal x-plane) distance L1. In some embodiments, the capacitors are separated by non-equal lateral distance.

In a stacked only configuration, the capacitors would be vertically stacked resulting in a tall memory cell. In that case, depending on the process technology node, the number of capacitors may be limited by the number of metal layers available by the process technology node. In the stack and fold configuration, the capacitors are vertically stacked as well as horizontally placed by sharing a common electrode, which in turn couples to a shared node (e.g., storage node sn1). So, first terminals of the capacitors are coupled to the shared node sn1.

In some embodiments, in the first row, the second terminal of Cfe0,1 is coupled to plate-line PL0_1, the second terminal of Cfe0,2 is coupled to plate-line PL0_2, the second terminal of Cfe0,3 is coupled to plate-line PL0_3, and the second terminal of Cfe0,4 is coupled to plate-line PL0_4. In some embodiments, in the second row, the second terminal of Cfe1,1 is coupled to plate-line PL0_5, the second terminal of Cfe1,2 is coupled to plate-line PL0_6, the second terminal of Cfe1,3 is coupled to plate-line PL0_7, and the second terminal of Cfe1,4 is coupled to plate-line PL0_8. In some embodiments, in the third row, the second terminal of Cfe2,1 is coupled to plate-line PL0_9, the second terminal of Cfe2,2 is coupled to plate-line PL0_10, the second terminal of Cfe2,3 is coupled to plate-line PL0_11, and the second terminal of Cfe2,4 is coupled to plate-line PL0_12. In some embodiments, in the fourth row, the second terminal of Cfe3,1 is coupled to plate-line PL0_13, the second terminal of Cfe3,2 is coupled to plate-line PL0_14, the second terminal of Cfe3,3 is coupled to plate-line PL0_15, and the second terminal of Cfe3,4 is coupled to plate-line PL0_16.

In some embodiments, each capacitor structure includes a shared bottom electrode 1301 which couples to the capacitors of that row and to the common node sn1 1302. In some embodiments, multiple vias are used for common node sn1 to connect the common node sn1 on M1 to shared bottom electrode 1301. In this example, three vias are shown. Fewer or more vias for storage node sn1 may be used. In some examples, multiple vias are used for storage node sn1 to couple to shared bottom electrode 1301 to reduce reliability issues like electromigration. In some embodiments, a vertical tower of vias and metal layers are used to extend the storage node sn1 to higher levels along the vertical direction. For example, via 1303 is connected to shared bottom electrode 1301 (on M2) and to storage node sn1 on M3. Via 1303 is connected to a top surface of shared bottom electrode 1301 and to the next metal layer M3. Multiple vias 1304 then couple storage node sn1 on M3 to the next shared bottom electrode on M4, and so on. Vias 1304 may be misaligned relative to via 1303. As such, a network of vias is used to connect storage node sn1 on M1 to shared bottom electrodes of each capacitive structure on various metal layers.

In some embodiments, shared bottom electrode 1301 (or the extended bottom electrode) can be a metal electrode or a first conductive oxide, or a combination of a second conductive oxide and a barrier or insulative material, in accordance with some embodiments. The barrier material or insulative material can be according to any one of the insulative materials discussed herein. In some embodiments, shared bottom electrode 1301 comprises a reflective intermetallic material. By using a shared bottom electrode, fabrication steps for fabricating each capacitor are reduced. Further, the vertical height is also reduced for the memory bit-cell.

In some embodiments, a metal layer is formed over top electrode of each capacitor to connect to a respective input. In some embodiments, a pedestal is formed between the top electrode and the metal layer connected to the respective input. For example, metal layer over a pedestal which is adjacent to the top electrode of capacitor Cfe0,1 is connected to plate-line PL0_1. Metal layer over a pedestal which is adjacent to the top electrode of capacitor Cfe1,1 is connected to plate-line PL0_5 and so on. In some embodiments, the pedestals have a barrier material on its sidewalls as discussed with reference to FIG. 4C.

Referring to FIG. 13A, the metal layers coupled to the bottom electrodes of the capacitors are coupled to storage node sn1 through respective vias. In some embodiments, multiple vias connect the bottom extended electrode of each capacitor stack. These multiple vias are connected to the storage node sn1. The multiple vias, connected to the metal layer (e.g., M3) for sn1 as the storage node, connect to extended bottom electrode of higher capacitors in the stack. In this example, the vias for storage node sn1 are misaligned relative to the center storage node sn1 via. On each metal layer for sn1, at least two vias are formed to connect to the subsequent higher metal layer based extended bottom electrode. Here the term "misaligned" is generally referred to vias or pedestals that are not continuous in their vertical extension and have side branches as the vias couple to metal layers and other vias to extend vertically up. Conversely, the term "aligned" here generally refers to vias or pedestals that are continuous in their vertical extension. The term continuous here generally means that the via or pedestal extends without interruption. In some examples, the term continuous also refers to the extension of via or pedestal with nominal interruption (such as an intervening metal layer) but the subsequent via or pedestal on the metal layer is along the same vertical line of extension as the via below the metal line.

In some embodiments, metal-2 (M2) is deposited over vias (via1). M2 layer is then polished. In some embodiments, capacitors can be moved further up in the stack, where the capacitor level processing is done between different layers. In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the capacitors are formed in a backend of the die. In some embodiments, deposition of ILD is followed by surface polish.

In some embodiments, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to plate-lines and storage node sn1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated to form various capacitors in the stack.

In some embodiments, the top electrode of each capacitor is allowed to directly contact the metal above. For example, the pedestals that connect to the top electrodes are removed. In this embodiment, the height of the stacked capacitors is lowered, and the fabrication process is simplified because the extra steps for forming the pedestals are removed.

Figure 13B:
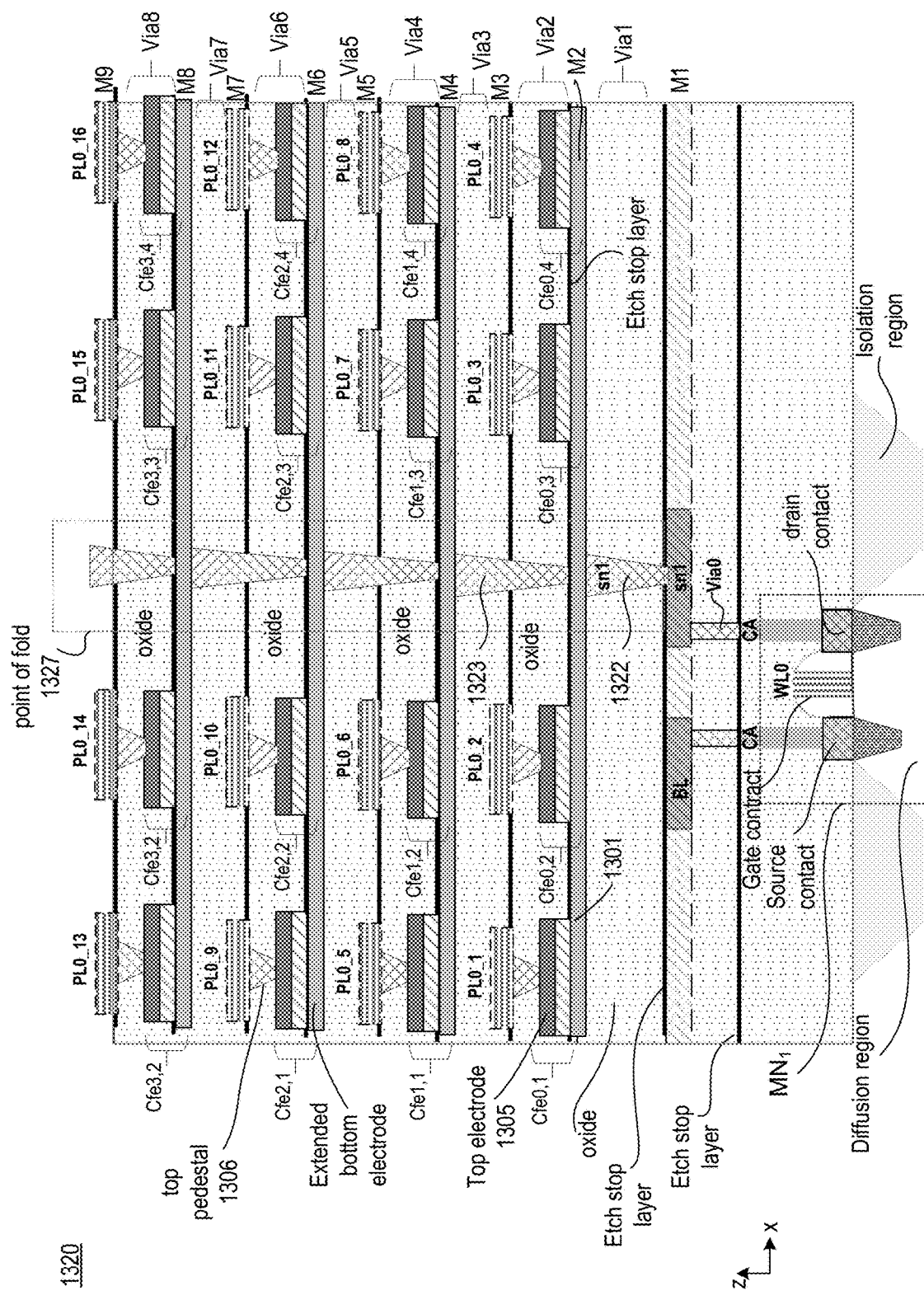
FIG. 13B illustrates a 1TnC bit-cell with stacked and folded planar capacitors that use extended bottom electrodes and aligned central pedestals, in accordance with some embodiments.

FIG. 13B illustrates 1TnC bit-cell 1320 with stacked and folded planar capacitors that use extended bottom electrodes and aligned central pedestals, in accordance with some embodiments. Compared to FIG. 13A, here the through vias 1322 are used for storage node sn1 to connect to various extended bottom electrodes of different layers. Vias 1322 are also referred to as pedestals as they connect one metal layer to another metal layer (e.g., extended bottom electrode 1301 of M2 layer to extended bottom electrode 1301 of M4 layer). Via 1322 is connected to extended bottom electrode 1301 and to subsequent via 1323. In various embodiments, vias 1322 and 1323 are vertically aligned. This embodiment allows for simpler fabrication compared to 1TnC bit-cell 1300 because fewer vias for storage node sn1 are used and those vias are aligned to form through vias. In some embodiments, vias 1322 and 1323 are formed using the same technology which is used to form through-silicon vias (TSVs). In this example, the capacitors are symmetrically placed on either side of point of fold 1327. In some embodiments, one side of point of fold 1327 has more capacitors than the other side. For example, the capacitors are asymmetrically placed on either side of point of fold 1327.

Figure 13C:
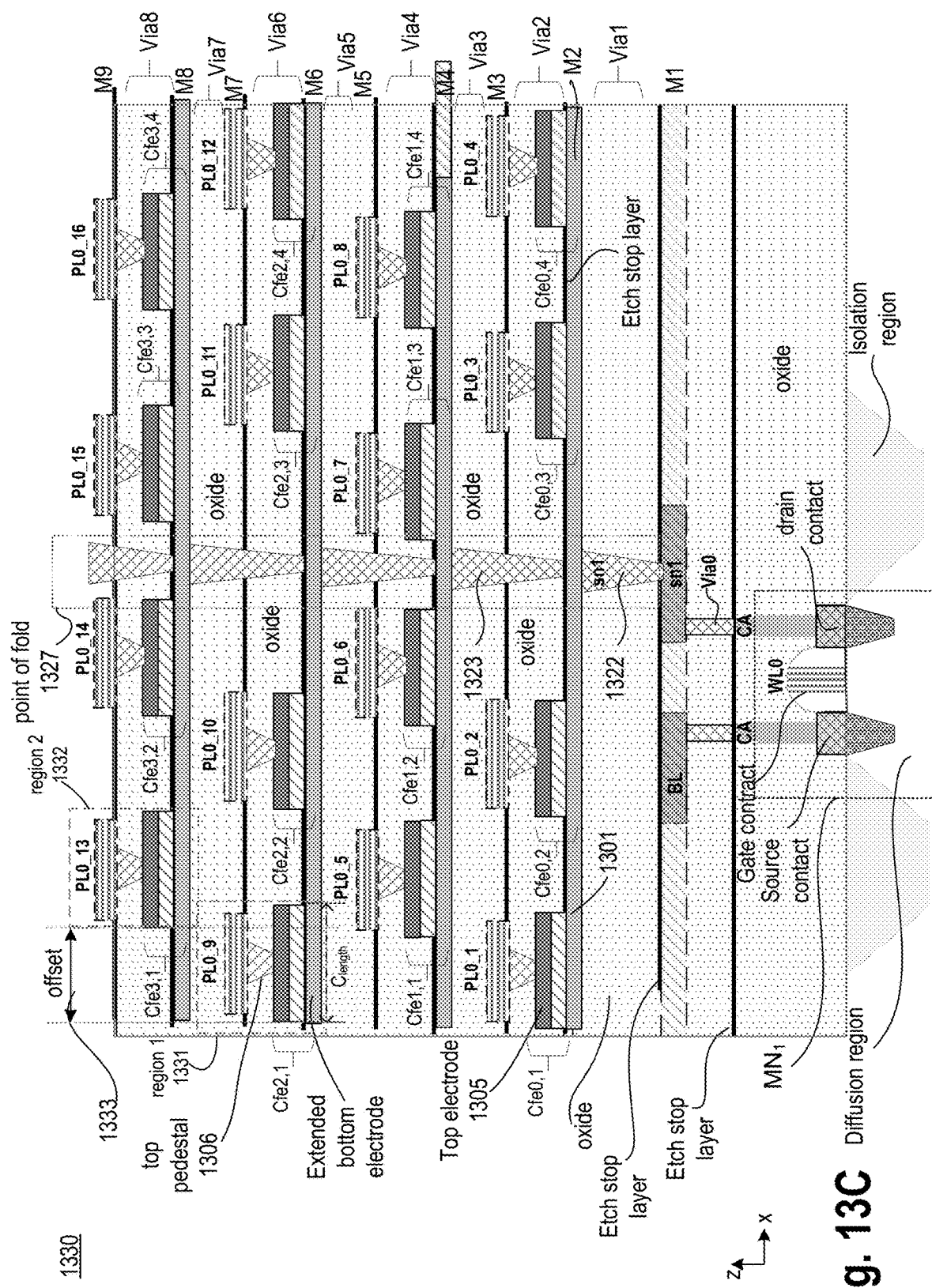
FIG. 13C illustrates a 1TnC bit-cell with stacked and folded planar capacitors having offset and that use extended bottom electrodes and with aligned central pedestals, in accordance with some embodiments.

FIG. 13C illustrates 1TnC bit-cell 1330 with stacked and folded planar capacitors having offset and that use extended bottom electrodes and with aligned central pedestals, in accordance with some embodiments. Compared to FIG. 13B, here the capacitor stacks that share the extended bottom electrode are vertically offset from one another. In this example, offset 1333 is illustrated as offset between capacitors Cfe3,1 and Cfe2,1, both of which are on different shared bottom electrodes and in a vertical stack. Continuing with this example, the first capacitor Cfe2,1 occupies first region 1331 (which includes the layers that form the capacitor including the top electrode pedestal and the plate-line PL0_9). The second capacitor Cfe3,1 occupies second region 1332 (which includes the layers that form the capacitor including the top electrode pedestal and the plate-line PL0_13). In some embodiments, first region 1331 and second region 1332 are laterally offset by offset 1333. In some embodiments, offset 1333 can be substantially equal to a lateral length $C_{length}$ of the first capacitor. In some embodiments, offset 1333 is less than the lateral length $C_{length}$ of the first capacitor such that first region 1331 overlaps second region 1332. In some embodiments, offset 1333 can be used to route the plate-lines of the capacitors through the voids caused by the offsets. Offset 1333 can be between a lateral distance of two times a lateral length of the dielectric material and 5% of the lateral length of the dielectric material, in accordance with some embodiments. In one example, when the number of rows of capacitors is three, offset 1333 can be substantially 33% of the lateral length of the dielectric material. In another example, when the number of rows of capacitors is two, offset 1333 can be substantially 50% of the lateral length of the dielectric material. Other offset distances may also be used. As such, capacitors are placed in a stack and folded manner and vertically staggered relative to one another.

Figure 13D:
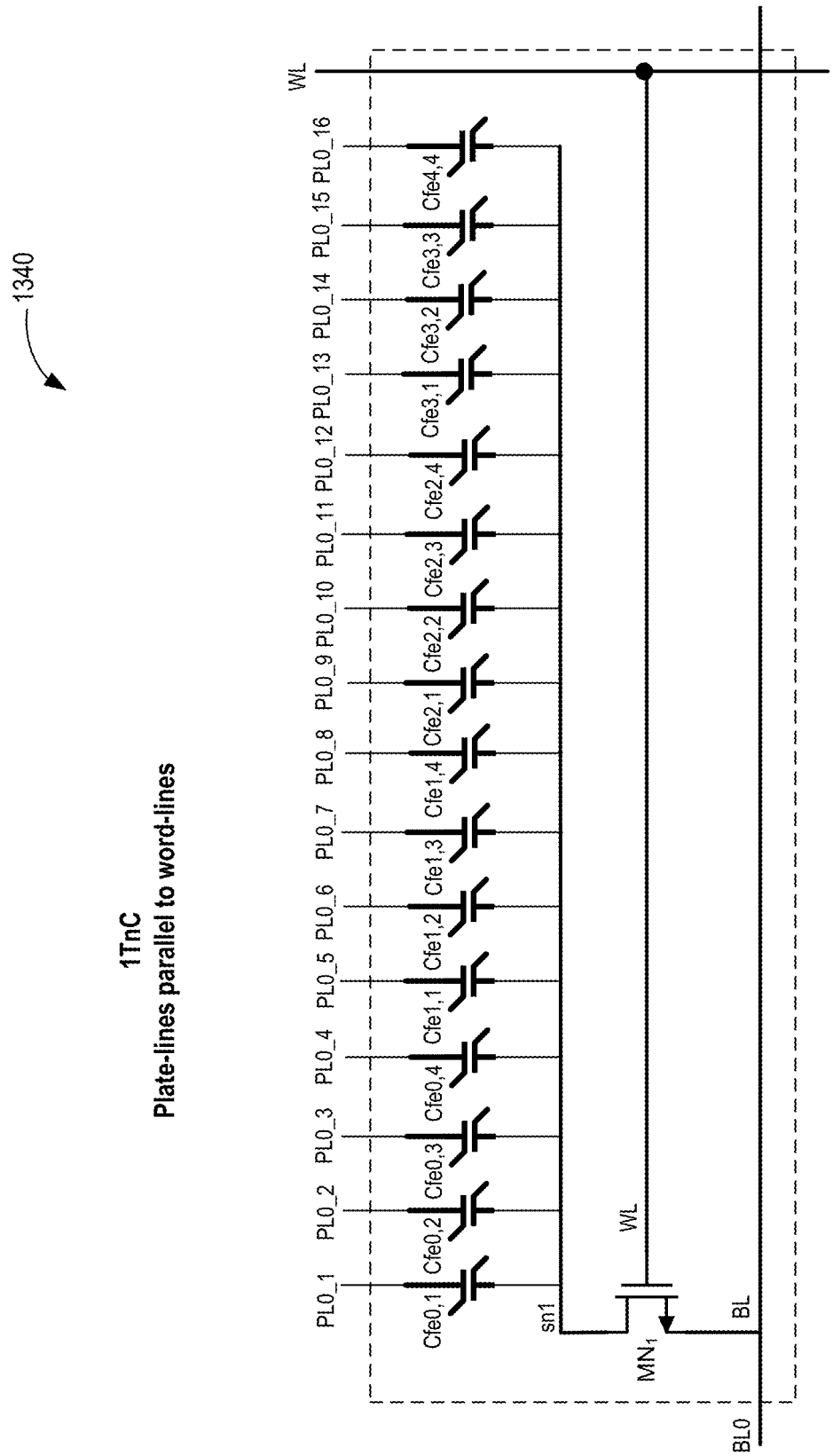
FIG. 13D illustrates a 1TnC bit-cell used for FIGS. 13A-C, in accordance with some embodiments.

FIG. 13D illustrates 1TnC bit-cell 1340 used for FIGS. 13A-C, in accordance with some embodiments. 1TnC bit-cell 1340 is the same as the 1TnC bit-cell described herein, but with 16 capacitors and 16 associated plate-lines.

Figure 14A:
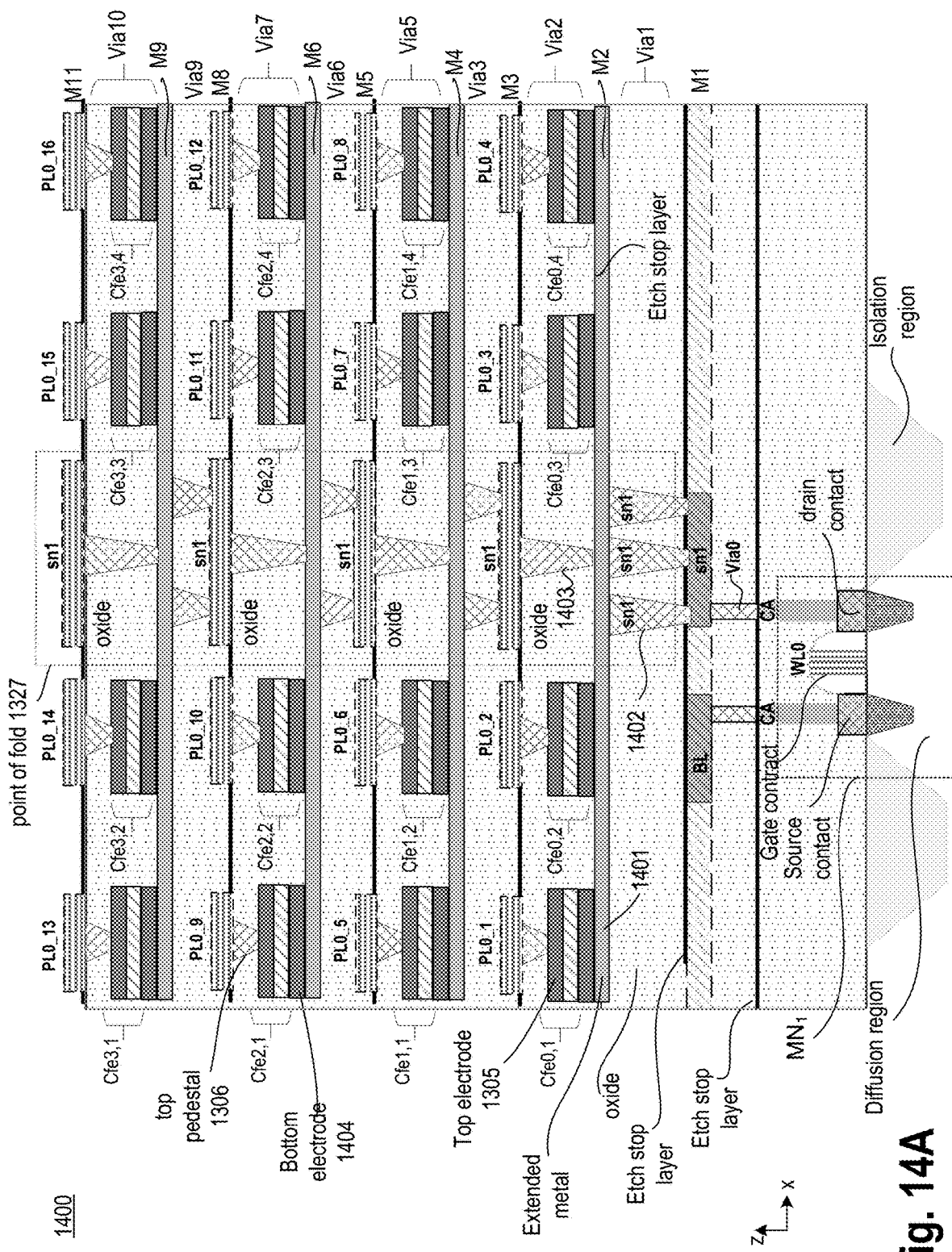
FIG. 14A illustrates a 1TnC bit-cell with stacked and folded planar capacitors that use extended shared metal and misaligned central pedestals, in accordance with some embodiments.

FIG. 14A illustrates 1TnC bit-cell 1400 with stacked and folded planar capacitors that use extended shared metal and misaligned central pedestals, in accordance with some embodiments. 1TnC bit-cell 1400 is like 1TnC bit-cell 1300 but with extended shared metal 1401 instead of extended or shared bottom electrode 1301. While extended shared metal 1401 is coupled to the bottom electrodes of each capacitor in the same horizontal region, each capacitor includes its own bottom electrode 1404. In various embodiments, the vias or pedestals 1402 and 1403 for storage node sn1 are coupled or connected to extended shared metal 1401.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective plate-line electrodes.

Figure 14B:
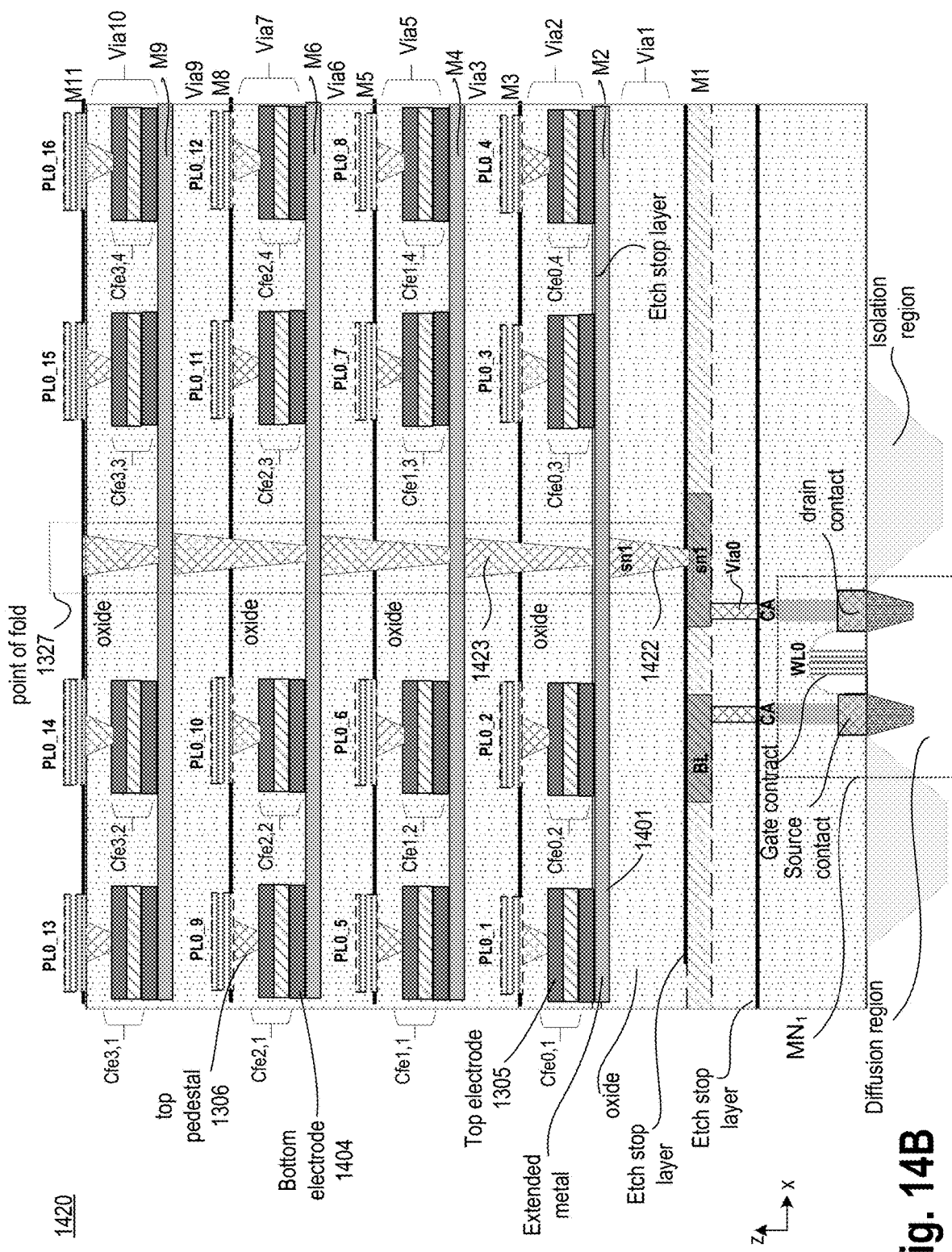
FIG. 14B illustrates a 1TnC bit-cell with stacked and folded planar capacitors that use extended shared metal and aligned central pedestals, in accordance with some embodiments.

FIG. 14B illustrates 1TnC bit-cell 1420 with stacked and folded planar capacitors that use extended shared metal and aligned central pedestals, in accordance with some embodiments. Compared to FIG. 14A, here the through vias 1422 are used for storage node sn1 to connect to various extended shared metal 1401 of different layers. Vias 1422 are also referred to as pedestals as they connect one metal layer to another metal layer (e.g., extended metal layer 1401 of M2 layer to extended shared metal 1401 of M4 layer). Via 1422 is connected to extended shared metal 1401 and to subsequent via 1423. In various embodiments, vias 1422 and 1423 are vertically aligned. This embodiment allows for simpler fabrication compared to 1TnC bit-cell 1400 because fewer vias for storage node sn1 are used and those vias are aligned to form through vias. In some embodiments, vias 1422 and 1423 are formed using the same technology which is used to form through-silicon vias (TSVs).

Figure 14C:
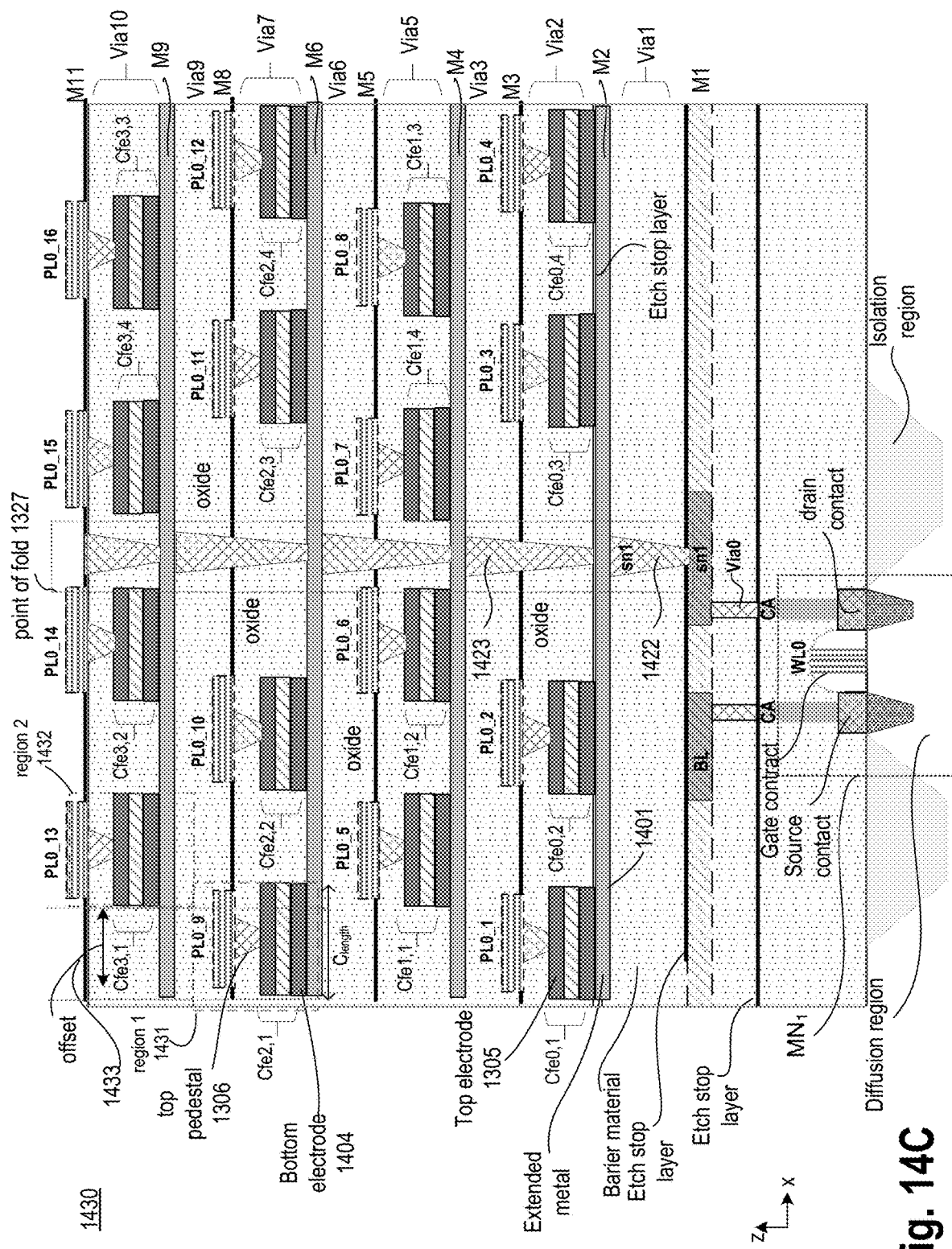
FIG. 14C illustrates a 1TnC bit-cell with stacked and folded planar capacitors having offset and that use extended shared metal and with aligned central pedestals, in accordance with some embodiments.

FIG. 14C illustrates 1TnC bit-cell 1430 with stacked and folded planar capacitors having offset and that use extended shared metal and with aligned central pedestals, in accordance with some embodiments. Compared to FIG. 14C, here the capacitor stacks that share the extended bottom metal 1401 are vertically offset from one another. In this example, offset 1433 is illustrated as offset between capacitors Cfe3,1 and Cfe2,1, both of which are on different shared extended metal 1401 and in a vertical stack. Continuing with this example, the first capacitor Cfe2,1 occupies first region 1431 (which includes the layers that form the capacitor including top electrode pedestal 1306 and the plate-line PL0_9). The second capacitor Cfe3,1 occupies second region 1432 (which includes the layers that form the capacitor including the top electrode pedestal and the plate-line PL0_13). The first region and the second region are laterally offset by offset 1433. In some embodiments, offset 1433 can be substantially equal to a lateral length $C_{length}$ of the first capacitor. In some embodiments, offset 1433 is less than the lateral length $C_{length}$ of the first capacitor such that first region 1431 overlaps second region 1432. The offset can be used to route the plate-lines of the capacitors through the voids caused by the offsets. The offset can be between a lateral distance of two times a lateral length of the dielectric material and 5% of the lateral length of the dielectric material, in accordance with some embodiments. In one example, when the number of rows of capacitors is three, offset 1433 can be substantially 33% of the lateral length of the dielectric material. In another example, when the number of rows of capacitors is two, offset 1433 can be substantially 50% of the lateral length of the dielectric material. Other offset distances may also be used. As such, capacitors are placed in a stacked and folded manner and vertically staggered relative to one another.

Figure 14D:
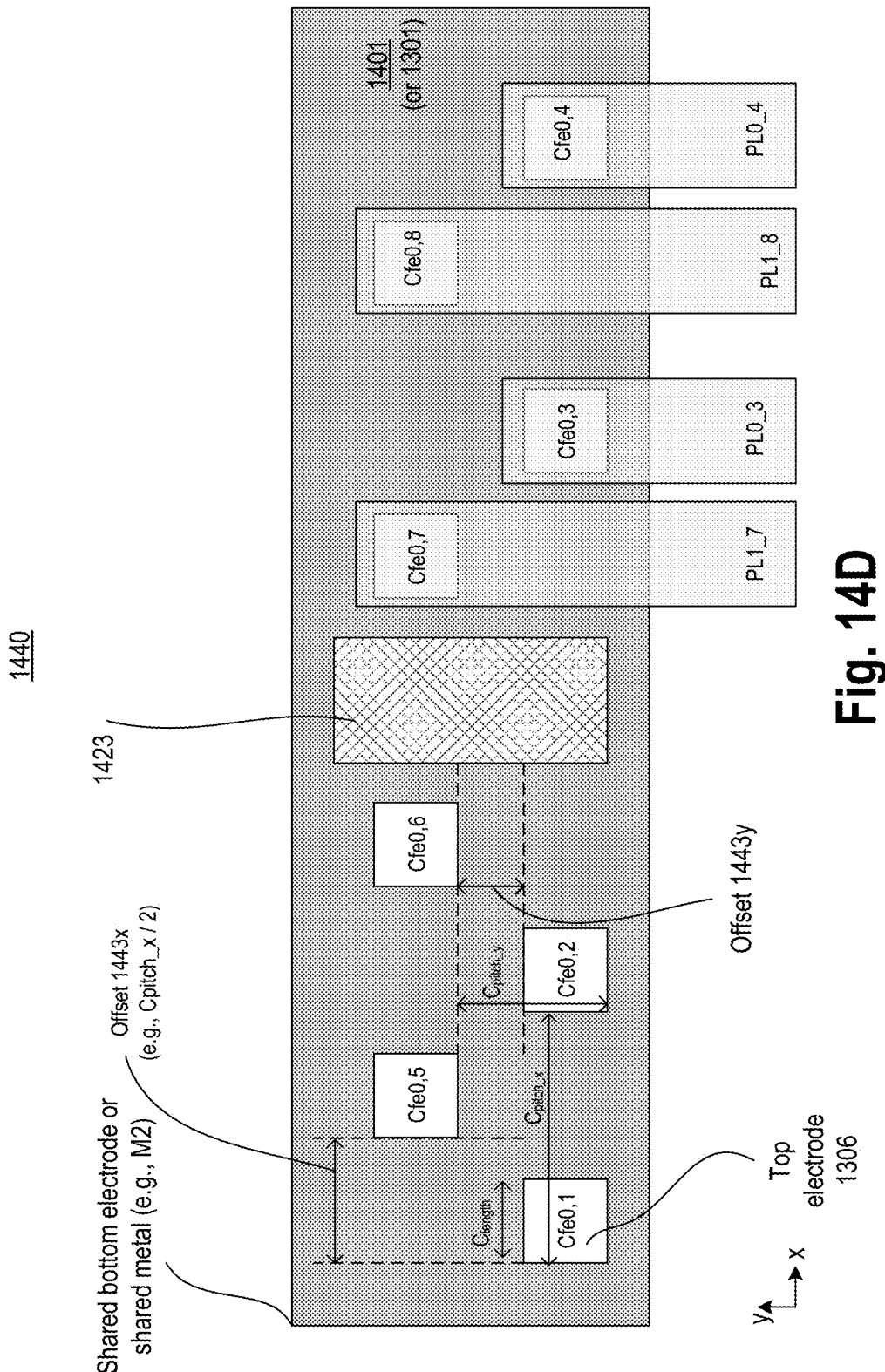
FIG. 14D illustrates a top view cross-section of a capacitor placement configuration where planar capacitors are staggered on a shared bottom electrode or shared metal, in accordance with some embodiments.

FIG. 14D illustrates a top view cross-section of a capacitor placement configuration 1440 where planar capacitors are staggered on a shared bottom electrode or shared metal, in accordance with some embodiments. In some embodiments, the capacitors are vertically stacked in a stacked and folded configuration with vertical offset as shown in FIG. 14C. In some embodiments, in addition to the placement of the capacitors with offset in the vertical z-plane (FIG. 14C), capacitors can also be staggered with offset in the horizontal plane (x-y plane). In some embodiments, all capacitors are placed on shared bottom electrode 1301 or shared metal 1401 in a staggered configuration. This staggered configuration is a staggering of capacitors in the x-y plane (horizontal plane).

In this example, additional capacitors Cfe0,5, Cfe0,6, Cfe0,7, and Cfe0,8, are coupled to shared bottom electrode 1301 or shared extended metal 1401. In some embodiments, these additional capacitors are placed on either side of via 1423, which established the point of fold. In some embodiments, via 1423 does not exist because all capacitors are on shared bottom electrode 1301 or shared extended metal 1401. One purpose of staggering the capacitors is to allow for internal nodes or plate-lines to route in parallel.

In some embodiments, the capacitors on an individual metal layer (e.g., 1301 or 1401) may be symmetrically placed on either side of via 1423, in accordance with some embodiments. In some embodiments, capacitors on an individual metal layer (e.g., 1301 or 1401) may be asymmetrically placed on either side of via 1423, in accordance with some embodiments. In some embodiments, the capacitors on shared bottom electrode 1301 or shared metal 1401 are staggered with an x-offset 1443x and/or a y-offset 1443y. In some embodiments, x-offset 1443x and/or y-offset 1443y can be a lateral distance which is function of $C_{pitch\_x}$ or $C_{pitch\_y}$ depending on the escape routing of lines coupled to the top electrodes of the capacitors, in accordance with some embodiments. Other offset distances may also be used.

In various embodiments, the staggered capacitors on shared bottom electrode 1301 or shared metal 1401 allow for metal route escapes for the plate-lines. For example, Cfe0,7 is coupled to plate-line PL1_7, Cfe0,3 is coupled to plate-line PL0_3, Cfe0,8 is coupled to plate-line PL1_8, Cfe0,4 is coupled to plate-line PL0_4. In some embodiments, these plate-lines are parallel to one another. The staggered configuration allows for the plate-line escapes on either side of shared bottom electrode 1301 or shared metal 1401, in accordance with some embodiments. In some embodiments, all capacitors of the 1TnC bit-cell are placed in a staggered configuration of FIG. 14D on shared bottom electrode 1301 or shared metal 1401. In one such embodiment, the capacitors are not stacked and folded, but staggered with horizontal offsets in the x and y directions. In some embodiments, via 1423 is removed when all capacitors are placed in a staggered configuration of FIG. 14D on shared bottom electrode 1301 or shared metal 1401.

In some embodiments, the offset 1443x is 50% of $C_{pitch\_x}$ when there are two rows of capacitors on shared electrode 1301 or metal plane 1401. In some embodiments, the offset 1443x is substantially 50% of $C_{pitch\_x}$ when there are two rows of capacitors on shared electrode 1301 or metal plane 1401. In this example of FIG. 14D, two rows are shown. In some embodiments, the offset 1443x are substantially 33% of $C_{pitch\_x}$ when there are three rows of capacitors on shared electrode 1301 or metal plane 1401. In some embodiments, all capacitors are formed on shared electrode 1301 or metal plane 1401 in a staggered configuration.

Figure 15A:
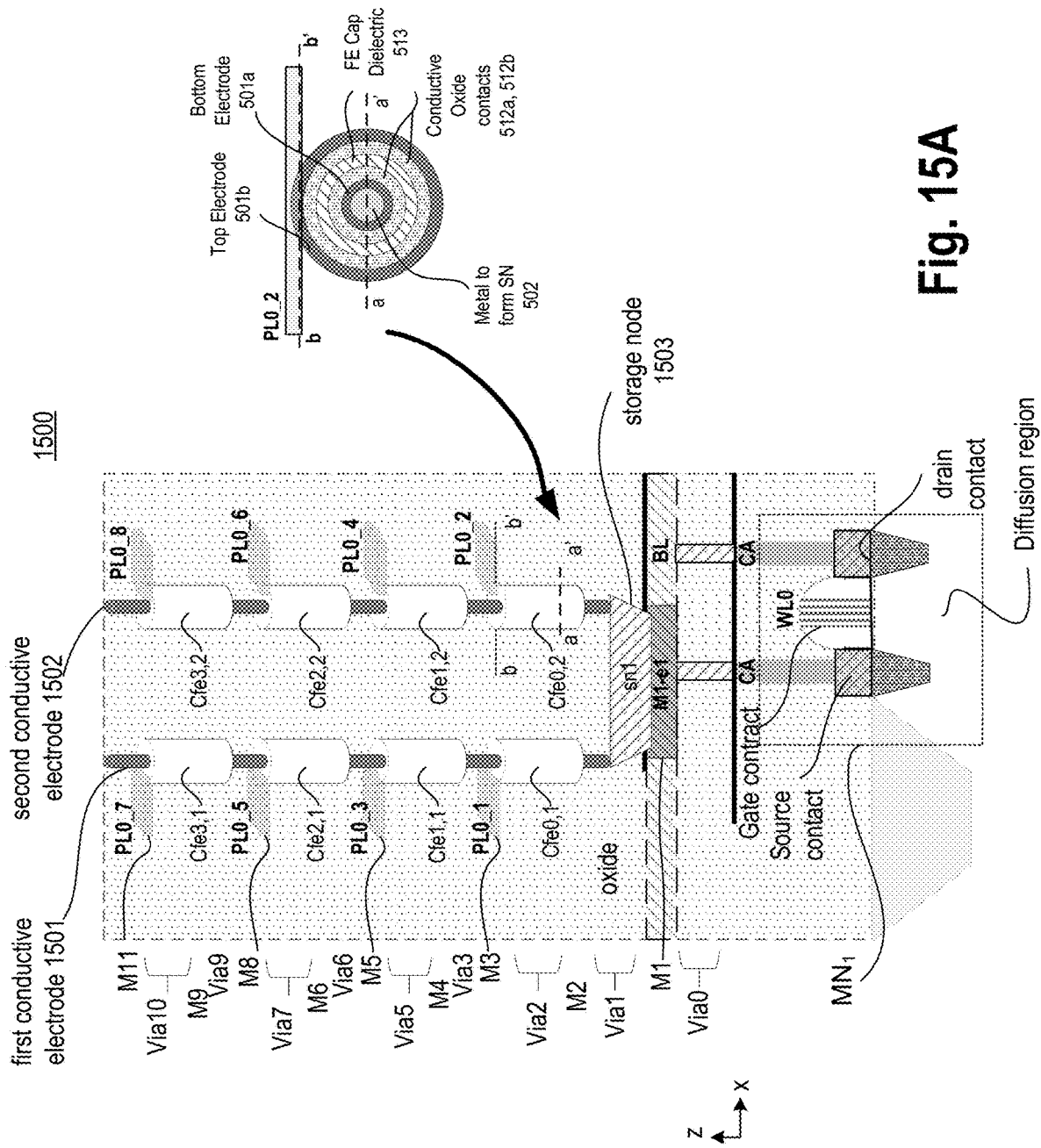
FIG. 15A illustrates a 1TnC bit-cell with stacked and folded non-planar capacitors, in accordance with some embodiments.

FIG. 15A illustrates 1TnC bit-cell 1500 with stacked and folded non-planar capacitors (a plurality of capacitors), in accordance with some embodiments. In this example eight capacitors are stacked and folded. In some embodiments, at least two columns of shared metal (here identified as 1501 and 1502) are connected to storage node sn1 1503. For further folding of capacitors, additional columns of shared metal can be connected to storage node sn1. In one such embodiment, via1 for storage node 1503 sn1 is made wider to accommodate connection with additional columns. Storage node sn1 1503 is coupled to a metal stub on M1 which in turn is coupled to a source contact of transistor $MN_1$. The drain contact of transistor $MN_1$ is connected to BL. The gate terminal of the transistor is connected to WL0. The columns of vertical metal form the bottom electrodes of the capacitors or are directly adjacent to the bottom electrodes of the capacitors.

In some embodiments, the plurality of capacitors has a first terminal coupled to storage node sn1 1503. In some embodiments, a second terminal of an individual capacitor of the plurality of capacitors is coupled to an individual plate-line, wherein the plurality of capacitors are non-planar capacitors that are arranged in a stacked and folded configuration. In some embodiments, 1TnC bit-cell 1500 comprises first conductive electrode 1501 directly connected to storage node sn1 1503, wherein first conductive electrode 1501 extends vertically away from storage node sn1 1503. In some embodiments, 1TnC bit-cell 1500 comprises second conductive electrode 1502 directly connected to storage node sn1 1503. In some embodiments, second conductive electrode 1502 extends vertically away from storage node sn1 1503. In some embodiments, first conductive electrode 1501 and second conductive electrode 1502 are substantially parallel. In some embodiments, the plurality of capacitors includes a first set of capacitors (Cfe0,1, Cfe1,1, Cfe2,1, and Cfe3,1) adjacent to first conductive electrode 1501. In some embodiments, the plurality of capacitors includes a second set of capacitors (Cfe0,2, Cfe1,2, Cfe2,2, and Cfe3,2) adjacent to second conductive electrode 1502.

In various embodiments, the top electrode of each capacitor is partially adjacent to a respective plate-line. For example, the top electrode of capacitor Cfe0,1 is partially coupled to plate-line PL0_1, the top electrode of capacitor Cfe0,2 is partially coupled to plate-line PL0_2, the top electrode of capacitor Cfe1,1 is partially coupled to plate-line PL0_3, the top electrode of capacitor Cfe1,2 is partially coupled to plate-line PL0_4, the top electrode of capacitor Cfe2,1 is partially coupled to plate-line PL0_5, the top electrode of capacitor Cfe2,2 is partially coupled to plate-line PL0_6, the top electrode of capacitor Cfe3,1 is partially coupled to plate-line PL0_7, and the top electrode of capacitor Cfe3,2 is partially coupled to plate-line PL0_8. In this instance, the capacitors are formed between regions reserved for Via1 through Via11 (e.g., between M1 through M11 layers). To reduce the height of the memory bit-cell, further folding can be performed by forming capacitors on additional metal columns or shafts that connect to storage node sn1 1503.

For linear non-planar capacitors, example structures are described with reference to FIGS. 3A-B. For non-linear non-planar capacitors, example structures are described with reference to FIGS. 5A-B.

Figure 15B:
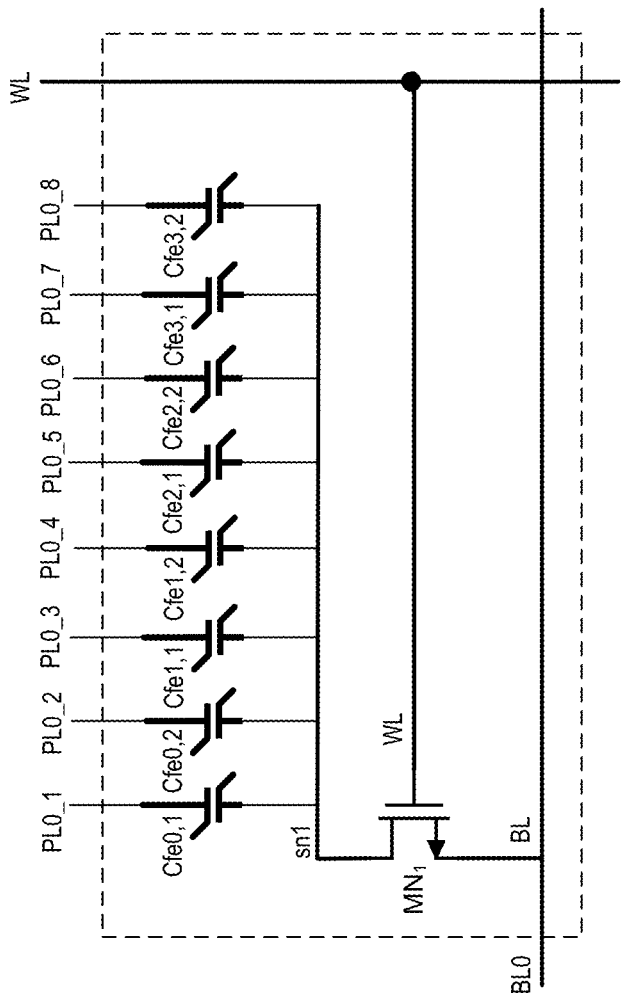
FIG. 15B illustrates a 1TnC bit-cell used for FIG. 15A, in accordance with some embodiments.

FIG. 15B illustrates a 1TnC bit-cell 1520 used for FIG. 15A, in accordance with some embodiments. 1TnC bit-cell 1520 is the same as the 1TnC bit-cell described herein, but with 8 capacitors and 8 associated plate-lines.

Figure 16A:
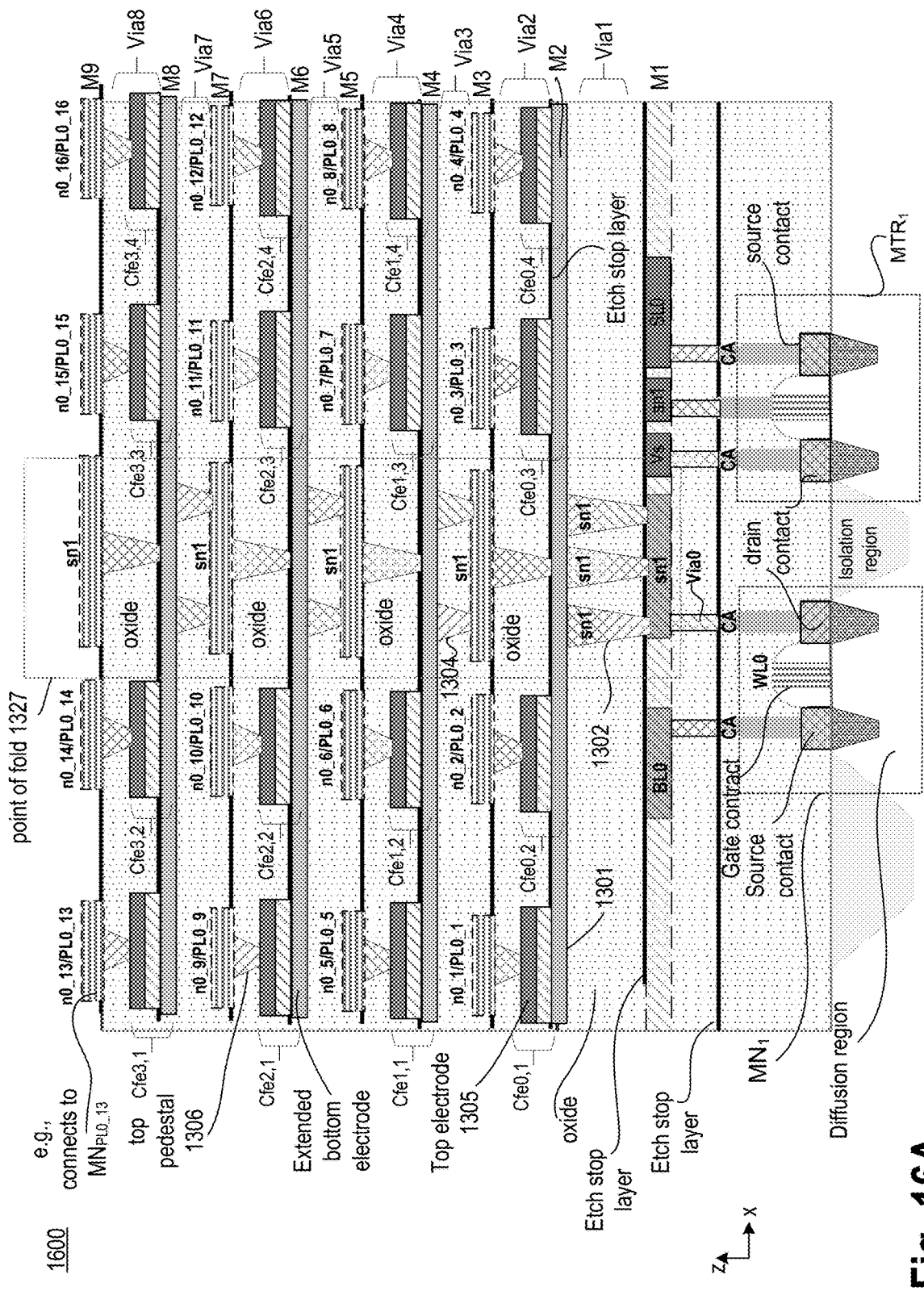
FIG. 16A illustrates a multi-element FE gain bit-cell with stacked and folded planar capacitors that use extended bottom electrodes and misaligned central pedestals, in accordance with some embodiments.

FIG. 16A illustrates multi-element FE gain bit-cell 1600 with stacked and folded planar capacitors that use extended bottom electrodes and misaligned central pedestals, in accordance with some embodiments. The stacked and folded capacitors here are organized the same as those in FIG. 13A. Here, top electrode 1305 of each capacitor is coupled to a node that in turn couples to a corresponding switch transistor. The switch transistor can be fabricated in the front end of the die like transistor $MN_1$ or backend of the die above the stack of capacitors. In some embodiments, the switch transistors are removed and the capacitors are connected directly to plate-lines.

In some embodiments, in the first row, the second terminal of Cfe0,1 is coupled to node n0_1, the second terminal of Cfe0,2 is coupled to node n0_2, the second terminal of Cfe0,3 is coupled to node n0_3, and the second terminal of Cfe0,4 is coupled to node n0_4. In some embodiments, in the second row, the second terminal of Cfe1,1 is coupled to node n0_5, the second terminal of Cfe1,2 is coupled to node n0_6, the second terminal of Cfe1,3 is coupled to node n0_7, and the second terminal of Cfe1,4 is coupled to node n0_8. In some embodiments, in the third row, the second terminal of Cfe2,1 is coupled to node n0_9, the second terminal of Cfe2,2 is coupled to node n0_10, the second terminal of Cfe2,3 is coupled to node n0_11, and the second terminal of Cfe2,4 is coupled to node n0_12. In some embodiments, in the fourth row, the second terminal of Cfe3,1 is coupled to node n0_13, the second terminal of Cfe3,2 is coupled to node n0_14, the second terminal of Cfe3,3 is coupled to node n0_15, and the second terminal of Cfe3,4 is coupled to node n0_16.

Node n0_1 is coupled to switch $MN_{PL\_01}$. Gate terminal of $MN_{PL\_01}$ is controllable by WLP0_1 while the source or drain terminal of $MN_{PL\_01}$ is coupled to node PL0_1. Node n0_2 is coupled to switch $MN_{PL\_02}$. Gate terminal of $MN_{PL\_02}$ is controllable by WLP0_2 while the source or drain terminal of $MN_{PL\_02}$ is coupled to node n0_2. Node n0_3 is coupled to switch $MN_{PL\_03}$. Gate terminal of $MN_{PL\_03}$ is controllable by WLP0_3 while the source or drain terminal of $MN_{PL\_03}$ is coupled to node n0_3. Node n0_4 is coupled to switch $MN_{PL\_04}$. Gate terminal of $MN_{PL\_04}$ is controllable by WLP0_4 while the source or drain terminal of $MN_{PL\_04}$ is coupled to node n0_4. Node n0_5 is coupled to switch $MN_{PL\_05}$. Gate terminal of $MN_{PL\_05}$ is controllable by WLP0_5 while the source or drain terminal of $MN_{PL\_05}$ is coupled to node n0_5. Node n0_6 is coupled to switch $MN_{PL\_06}$. Gate terminal of $MN_{PL\_06}$ is controllable by WLP0_6 while the source or drain terminal of $MN_{PL\_06}$ is coupled to node n0_6. Node n0_7 is coupled to switch $MN_{PL\_07}$. Gate terminal of $MN_{PL\_07}$ is controllable by WLP0_7 while the source or drain terminal of $MN_{PL\_07}$ is coupled to node n0_7. Node n0_8 is coupled to switch $MN_{PL\_08}$. Gate terminal of $MN_{PL\_08}$ is controllable by WLP0_8 while the source or drain terminal of $MN_{PL\_08}$ is coupled to node n0_8. Node n0_9 is coupled to switch $MN_{PL\_09}$. Gate terminal of $MN_{PL\_09}$ is controllable by WLP0_9 while the source or drain terminal of $MN_{PL\_09}$ is coupled to node n0_9. Node n0_10 is coupled to switch $MN_{PL\_10}$. Gate terminal of $MN_{PL\_10}$ is controllable by WLP0_10 while the source or drain terminal of $MN_{PL\_10}$ is coupled to node n0_10. Node n0_11 is coupled to switch $MN_{PL\_11}$. Gate terminal of $MN_{PL\_11}$ is controllable by WLP0_11 while the source or drain terminal of $MN_{PL\_11}$ is coupled to node n0_11. Node n0_12 is coupled to switch $MN_{PL\_12}$. Gate terminal of $MN_{PL\_12}$ is controllable by WLP0_12 while the source or drain terminal of $MN_{PL\_12}$ is coupled to node n0_12. Node n0_13 is coupled to switch $MN_{PL\_13}$. Gate terminal of $MN_{PL\_13}$ is controllable by WLP0_13 while the source or drain terminal of $MN_{PL\_13}$ is coupled to node n0_13. Node n0_14 is coupled to switch $MN_{PL\_14}$. Gate terminal of $MN_{PL\_14}$ is controllable by WLP0_14 while the source or drain terminal of $MN_{PL\_14}$ is coupled to node n0_14. Node n0_15 is coupled to switch $MN_{PL\_15}$. Gate terminal of $MN_{PL\_15}$ is controllable by WLP0_15 while the source or drain terminal of $MN_{PL\_15}$ is coupled to node n0_15. Node n0_16 is coupled to switch $MN_{PL\_16}$. Gate terminal of $MN_{PL\_16}$ is controllable by WLP0_16 while the source or drain terminal of $MN_{PL\_16}$ is coupled to node n0_16. The switches can be formed in the backend of the die or the front end of the die like in transistor $MN_1$. In some embodiments, when WLs are parallel to PLs, switches can be removed. In that case, the capacitors are coupled to the PLs like in FIG. 13A and FIG. 14A.

Figure 16B:
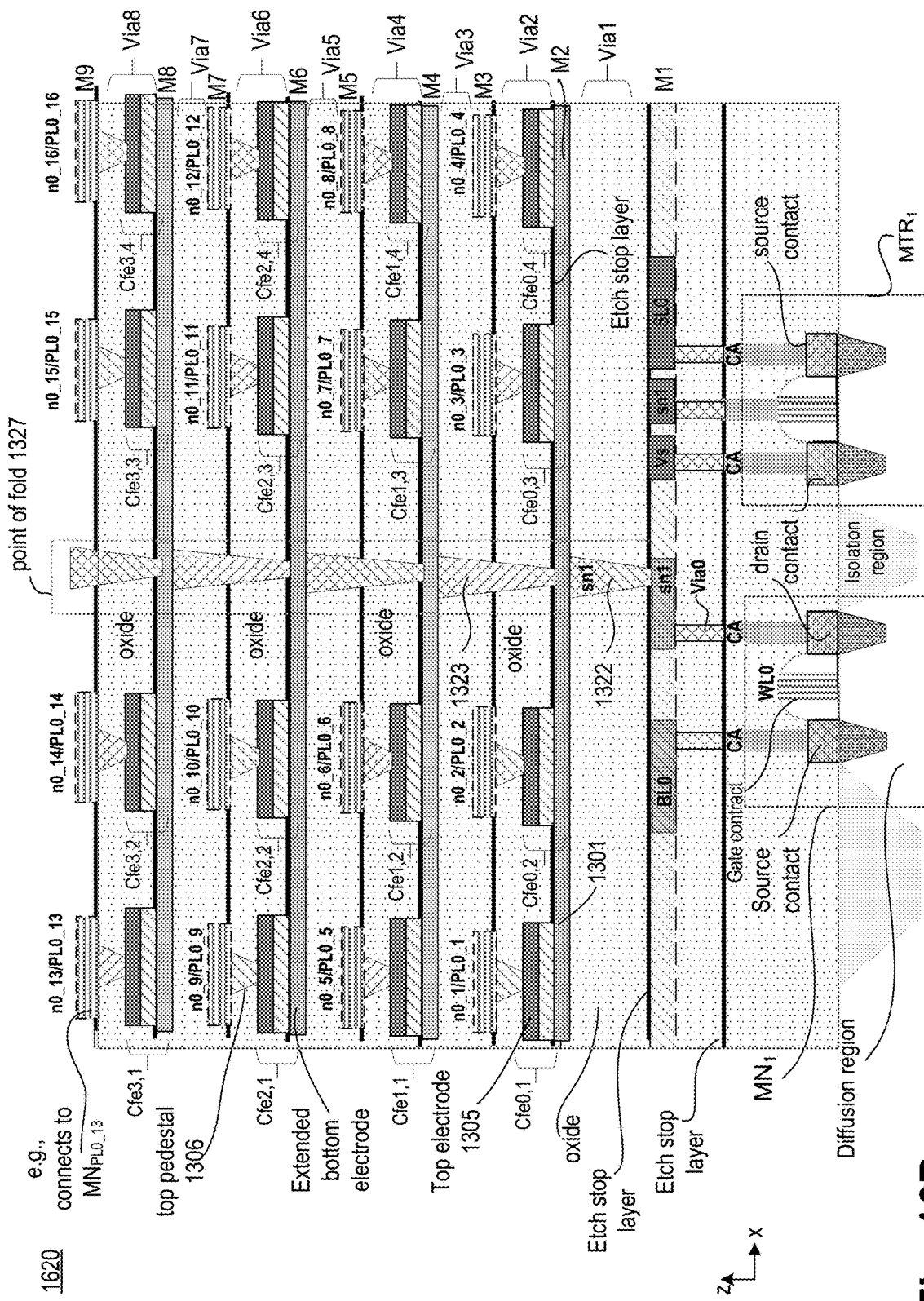
FIG. 16B illustrates a multi-element FE gain bit-cell with stacked and folded planar capacitors that use extended bottom electrodes and aligned central pedestals, in accordance with some embodiments.

FIG. 16B illustrates multi-element FE gain bit-cell 1620 with stacked and folded planar capacitors that use extended bottom electrodes and aligned central pedestals, in accordance with some embodiments. Compared to FIG. 16A, here the through vias 1322 are used for storage node sn1 to connect to various extended bottom electrodes of different layers. Vias 1322 are also referred to as pedestals as they connect one metal layer to another metal layer (e.g., extended bottom electrode 1301 of M2 layer to extended bottom electrode 1301 of M4 layer). Via 1322 is connected to extended bottom electrode 1301 and to subsequent via 1323. In various embodiments, vias 1322 and 1323 are vertically aligned. This embodiment allows for simpler fabrication compared to 1TnC bit-cell 1300 because fewer vias for storage node sn1 are used and those vias are aligned to form through vias. In some embodiments, vias 1322 and 1323 are formed using the same technology which is used to form through-silicon vias (TSVs).

Figure 16C:
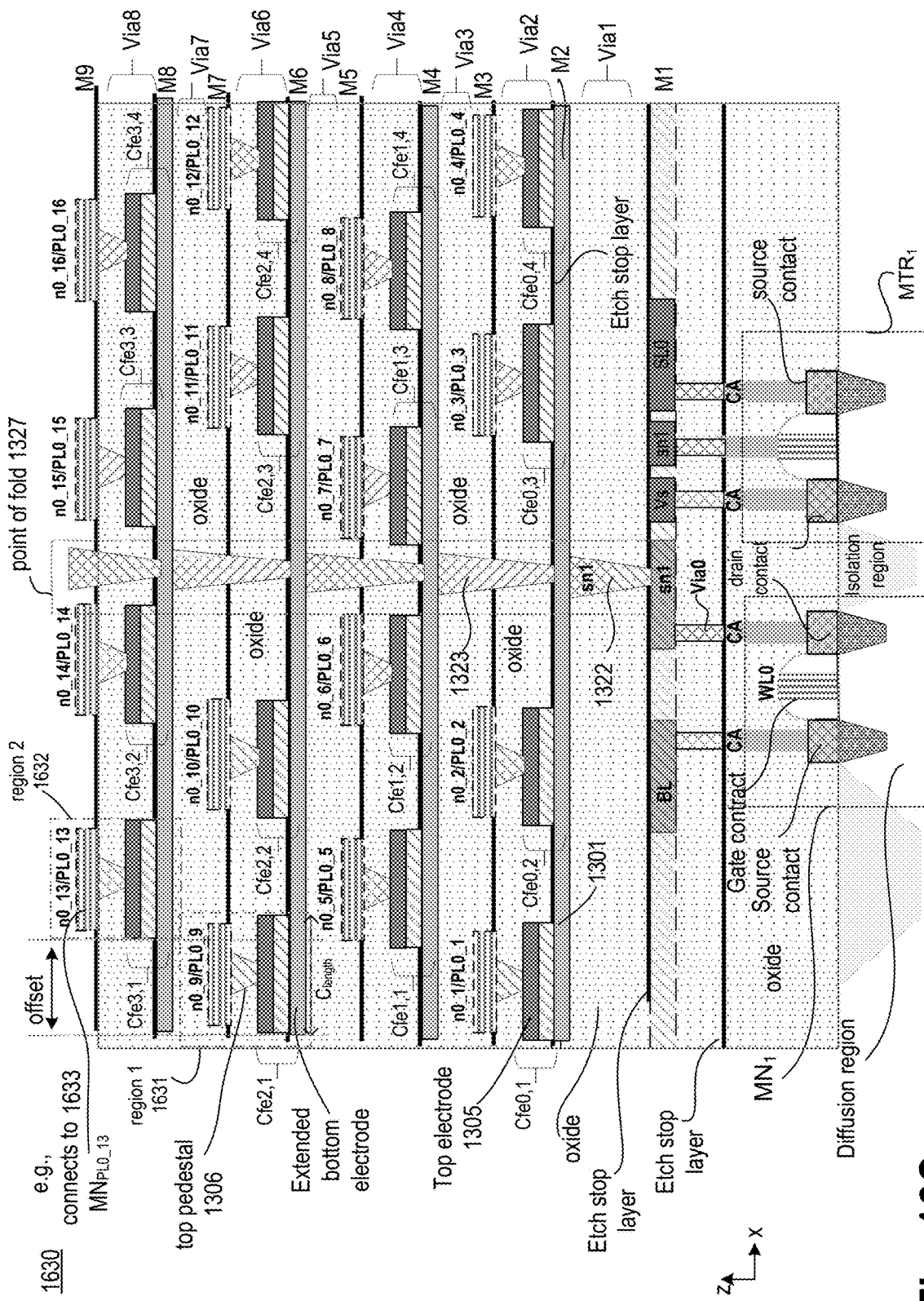
FIG. 16C illustrates a multi-element FE gain bit-cell with stacked and folded planar capacitors having offset and that use extended bottom electrodes and with aligned central pedestals, in accordance with some embodiments.

FIG. 16C illustrates multi-element FE gain bit-cell 1630 with stacked and folded planar capacitors having offset and that use extended bottom electrodes and with aligned central pedestals, in accordance with some embodiments. Compared to FIG. 16B, here the capacitor stacks that share the extended bottom electrode are vertically offset from one another. Compared to FIG. 14C, here the capacitor stacks that share the extended bottom electrode are vertically offset from one another. In this example, offset 1633 is illustrated as offset between capacitors Cfe3,1 and Cfe2,1, both of which are on different shared bottom electrodes and in a vertical stack. Continuing with this example, the first capacitor Cfe2,1 occupies first region 1631 (which includes the layers that form the capacitor including the top electrode pedestal and the node n0_9). The second capacitor Cfe3,1 occupies second region 1632 (which includes the layers that form the capacitor including the top electrode pedestal and the node n0_13). First region 1631 and second region 1632 are laterally offset by offset 1633. In some embodiments, offset 1633 can be substantially equal to a lateral length $C_{length}$ of the first capacitor. In some embodiments, offset 1633 is less than the lateral length $C_{length}$ of the first capacitor such that first region 1631 overlaps second region 1632. In some embodiments, offset 1633 can be used to route the plate-lines of the capacitors through the voids caused by the offsets. In some embodiments, offset 1633 can be between a lateral distance of two times a lateral length of the dielectric material and 5% of the lateral length of the dielectric material, in accordance with some embodiments. Other offset distances may also be used. As such, capacitors are placed in a stack and folded manner and vertically staggered relative to one another.

Figure 16D:
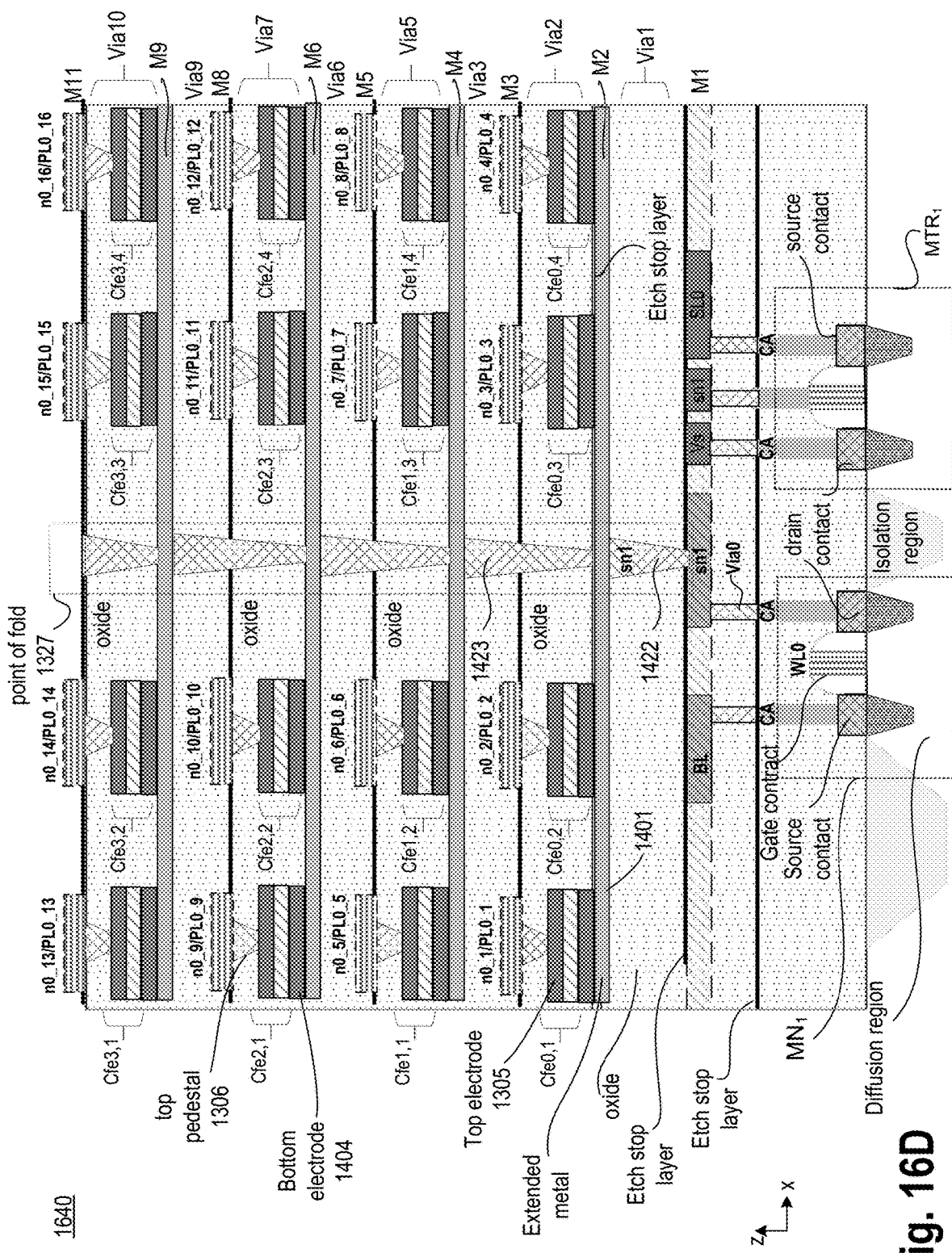
FIG. 16D illustrates a multi-element FE gain bit-cell with stacked and folded planar capacitors having offset and that use extended shared metal and with aligned central pedestals, in accordance with some embodiments.

FIG. 16D illustrates multi-element FE gain bit-cell 1640 with stacked and folded planar capacitors that use extended shared metal 1401 and aligned central pedestals, in accordance with some embodiments. Compared to FIG. 16A, here the through vias 1422 are used for storage node sn1 to connect to various extended shared metal 1401 of different layers. Vias 1422 are also referred to as pedestals as they connect one metal layer to another metal layer (e.g., extended metal layer 1401 of M2 layer to extended shared metal 1401 of M4 layer). Via 1422 is connected to extended bottom electrode 1401 and to subsequent via 1423. In various embodiments, vias 1422 and 1423 are vertically aligned. This embodiment allows for simpler fabrication compared to multi-element FE gain bit-cell 1600 because fewer vias for storage node sn1 are used and those vias are aligned to form through vias. In some embodiments, vias 1422 and 1423 are formed using the same technology which is used to form through-silicon vias (TSVs).

FIG. 16E illustrates multi-element FE gain bit-cell 1650 used for FIGS. 16A-D, in accordance with some embodiments. Multi-element FE gain bit-cell 1650 is the same as the multi-element FE gain bit-cell described herein, but with 16 capacitors and 16 associated plate-lines. In some embodiments, multi-element FE gain bit-cell 1650 does not have switches $MN_{PL0\_1}$ through $MN_{PL0\_16}$. One such embodiment is illustrated in FIG. 11A with apparatus 1100 having multi-element FE gain bit-cell. Using the multi-element FE gain bit-cell of FIG. 11A as an example, the internal nodes n0_1 through n0_16 are replaced with plate-lines like those shown in FIGS. 13A-C and FIGS. 14A-C. In some embodiments, when WLs are parallel to PLs, switches can be removed. In that case, the capacitors are coupled to the PLs like in FIG. 13A and FIG. 14A. One such embodiment is illustrated by multi-element FE gain bit-cell 1655.

Figure 16F:
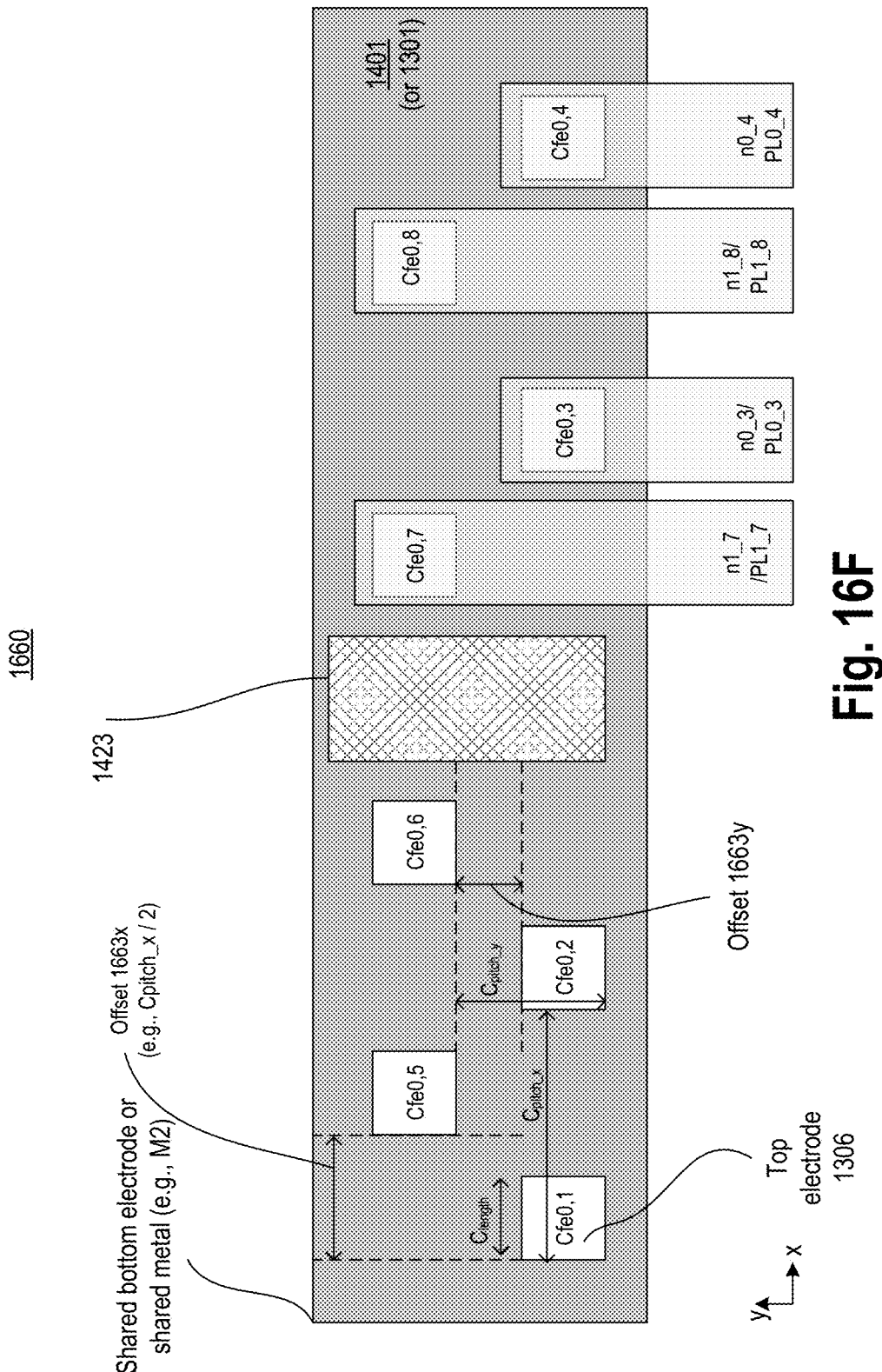
FIG. 16F illustrates a top view cross-section of a capacitor placement configuration, where planar capacitors are staggered on a shared bottom electrode or shared metal, in accordance with some embodiments.

FIG. 16F illustrates a top view cross-section of a capacitor placement configuration 1660 where planar capacitors are staggered on a shared bottom electrode or shared metal, in accordance with some embodiments. In some embodiments, the capacitors are vertically stacked in a stacked and folded configuration with vertical offset as shown in FIG. 16C. In some embodiments, in addition to the placement of the capacitors with offset in the vertical z-plane (FIG. 16C), capacitors can also be staggered with offset in the horizontal plane (x-y plane). In some embodiments, all capacitors are placed on shared bottom electrode 1301 or shared metal 1401 in a staggered configuration. This staggered configuration is a staggering of capacitors in the x-y plane (horizontal plane).

In this example, additional capacitors Cfe0,5, Cfe0,6, Cfe0,7, and Cfe0,8, are coupled to shared bottom electrode 1301 or shared extended metal 1401. In some embodiments, these additional capacitors are placed on either side of via 1423, which established the point of fold. In some embodiments, via 1423 does not exist because all capacitors are on shared bottom electrode 1301 or shared extended metal 1401. One purpose of staggering the capacitors is to allow for internal nodes or plate-lines to route in parallel.

In some embodiments, the capacitors on an individual metal layer (e.g., 1301 or 1401) may be symmetrically placed on either side of via 1423, in accordance with some embodiments. In some embodiments, capacitors on an individual metal layer (e.g., 1301 or 1401) may be asymmetrically placed on either side of via 1423, in accordance with some embodiments. In some embodiments, the capacitors on shared bottom electrode 1301 or shared metal 1401 are staggered with an x-offset 1663x and/or a y-offset 1663y. In some embodiments, x-offset 1663x and/or y-offset 1663y can be a lateral distance which is function of $C_{pitch\_x}$ or $C_{pitch\_y}$ depending on the escape routing of lines coupled to the top electrodes of the capacitors, in accordance with some embodiments. Other offset distances may also be used.

In various embodiments, the staggered capacitors on shared bottom electrode 1301 or shared metal 1401 allow for metal route escapes for internal nodes. For example, Cfe0,7 is coupled to internal node n1_7, Cfe0,3 is coupled to internal node n0_3, Cfe0,8 is coupled to internal node n1_8, Cfe0,4 is coupled to internal node n0_4. In some embodiments, these internal nodes are parallel to one another. The staggered configuration allows for the internal node connections on either side of shared bottom electrode 1301 or shared metal 1401, in accordance with some embodiments. The internal nodes are then coupled to the respective switches. In some embodiments, all capacitors of multi-element FE gain bit-cell 1640 are placed in a staggered configuration of FIG. 16E on shared bottom electrode 1301 or shared metal 1401. In one such embodiment, the capacitors are not stacked and folded, but staggered with horizontal offsets in the x and y directions.

The internal nodes (e.g., n1_7, n0_3, n1_8) can be connected to individual switches, in accordance with some embodiments. In some embodiments, the internal nodes are directly coupled to plate-lines, and there are no switches of FIG. 16D. For example, when WL is parallel to PLs, then switches may not be used for the multi-element gain bit-cell. In some embodiments, when BL is parallel to PLs, then switches may be used.

In some embodiments, the offset 1663x is 50% of $C_{pitch\_x}$ when there are two rows of capacitors on shared electrode 1301 or metal plane 1401. In some embodiments, the offset 1663x is substantially 50% of $C_{pitch\_x}$ when there are two rows of capacitors on shared electrode 1301 or metal plane 1401. In some embodiments, the offset 1663x are substantially 33% of $C_{pitch\_x}$ when there are three rows of capacitors on shared electrode 1301 or metal plane 1401. In some embodiments, all capacitors are formed on shared electrode 1301 or metal plane 1401 in a staggered configuration.

Figure 17A:
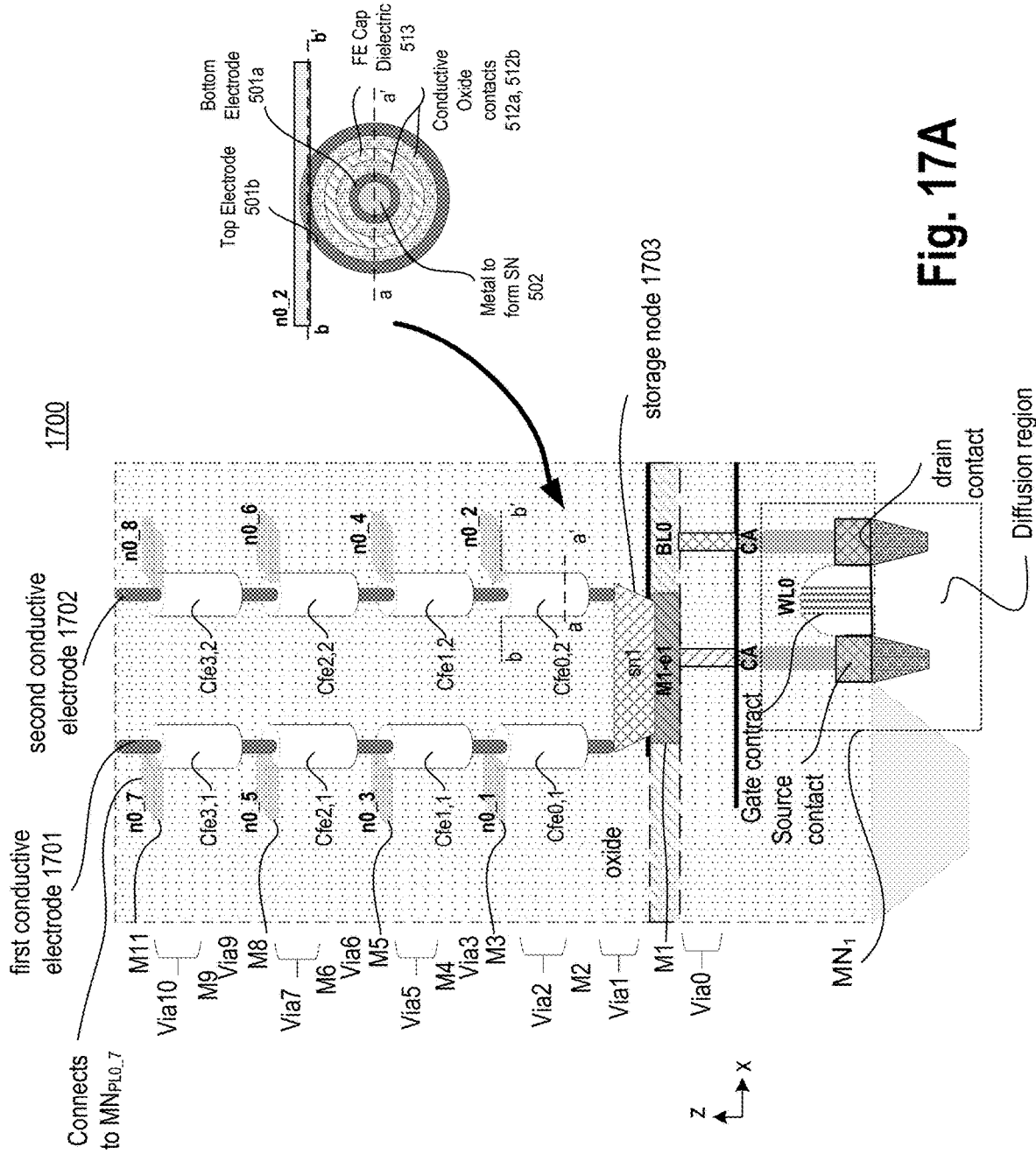
FIG. 17A illustrates a multi-element FE gain bit-cell with stacked and folded non-planar capacitors, in accordance with some embodiments.

FIG. 17A illustrates multi-element FE gain bit-cell 1700 with stacked and folded non-planar capacitors, in accordance with some embodiments. In some embodiments, at least two columns of shared metal are connected to storage node sn1. For further folding of capacitors, additional columns of shared metal can be connected to storage node sn1. In one such embodiment, via1 for sn1 is made wider to accommodate connection with additional columns. The storage node sn1 is coupled to a metal stub on M1 which in turn is coupled to a source contact of transistor $MN_1$. The drain contact of transistor $MN_1$ is connected to BL. The gate terminal of the transistor is connected to WL0. The columns of vertical metal form the bottom electrodes of the capacitors or are directly adjacent to the bottom electrodes of the capacitors.

In some embodiments, the plurality of capacitors has a first terminal coupled to the storage node sn1. In some embodiments, a second terminal of an individual capacitor of the plurality of capacitors is coupled to nodes, which in turn are coupled to switches. In various embodiments, the plurality of capacitors are non-planar capacitors that are arranged in a stacked and folded configuration. In some embodiments, multi-element FE gain bit-cell 1700 comprises first conductive electrode 1701 directly connected to storage node sn1 1703, wherein the first conductive electrode extends vertically away from storage node sn1 1703. In some embodiments, multi-element FE gain bit-cell 1700 comprises second conductive electrode 1702 directly connected to storage node sn1 1703. In some embodiments, second conductive electrode 1702 extends vertically away from storage node sn1 1702. In some embodiments, first conductive electrode 1701 and second conductive electrode 1702 are substantially parallel. In some embodiments, the plurality of capacitors includes a first set of capacitors (Cfe0,1, Cfe1,1, Cfe2,1, and Cfe3,1) adjacent to first conductive electrode 1701. In some embodiments, the plurality of capacitors includes a second set of capacitors (Cfe0,2, Cfe1,2, Cfe2,2, and Cfe3,2) adjacent to second conductive electrode 1702.

In various embodiments, the top electrode of each of the capacitor is partially adjacent to a respective intermediate node. For example, the top electrode of capacitor Cfe0,1 is partially coupled to node n0_1, the top electrode of capacitor Cfe0,2 is partially coupled to node n0_2, the top electrode of capacitor Cfe1,1 is partially coupled to node n0_3, the top electrode of capacitor Cfe1,2 is partially coupled to node n0_4, the top electrode of capacitor Cfe2,1 is partially coupled to node n0_5, the top electrode of capacitor Cfe2,2 is partially coupled to node n0_6, the top electrode of capacitor Cfe3,1 is partially coupled to node n0_7, and the top electrode of capacitor Cfe3,2 is partially coupled to node n0_8. In this instance, the capacitors are formed between regions reserved for Via1 through Via11 (e.g., between M1 through M11 layers). To reduce the height of the memory bit-cell, further folding can be performed by forming capacitors on additional metal columns or shafts that connect to storage node sn1. The nodes n0_1 through n0_8 are connected to switches as discussed with reference to FIG. 15A. The switches can be formed in the backend of the die or the front-end of the die like in transistor $MN_1$. For linear non-planar capacitors, example structures are described with reference to FIGS. 3A-B. For non-linear non-planar capacitors, example structures are described with reference to FIGS. 5A-B.

Figure 17B:
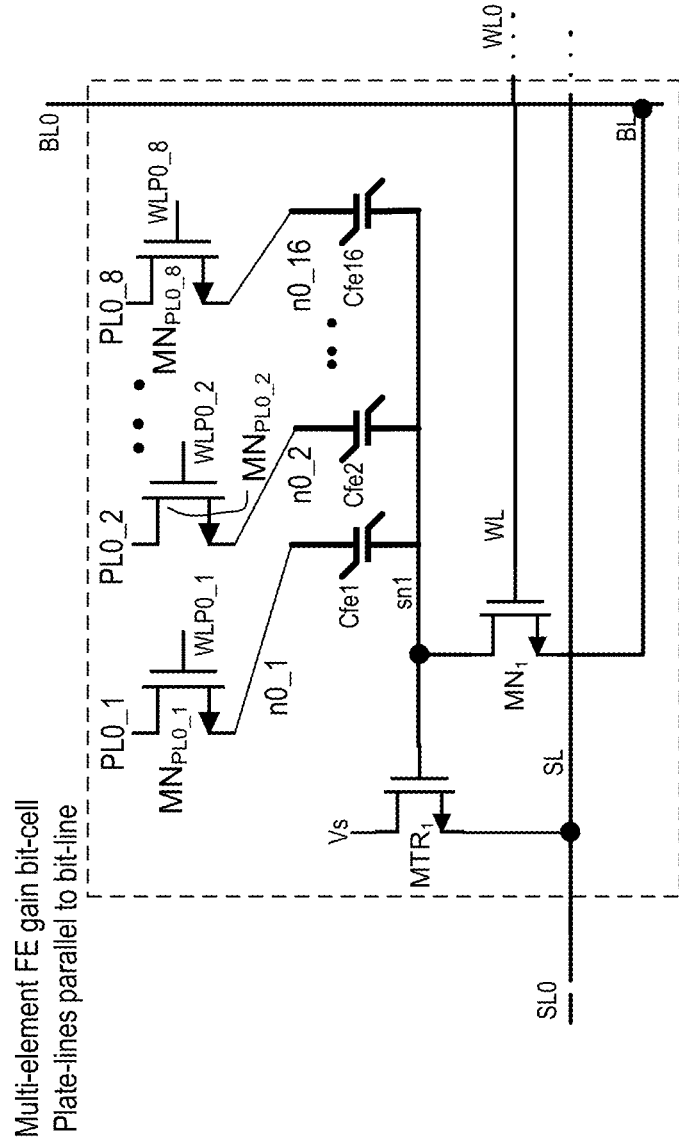
FIG. 17B illustrates a multi-element FE gain bit-cell used for FIG. 17A, in accordance with some embodiments.

FIG. 17B illustrates multi-element FE gain bit-cell 1720 used for FIG. 17A, in accordance with some embodiments. Multi-element FE gain bit-cell 1720 is the same as the multi-element FE gain bit-cell as described herein, but with 8 capacitors, 8 switches, and 8 associated plate-lines.

Figure 18A:
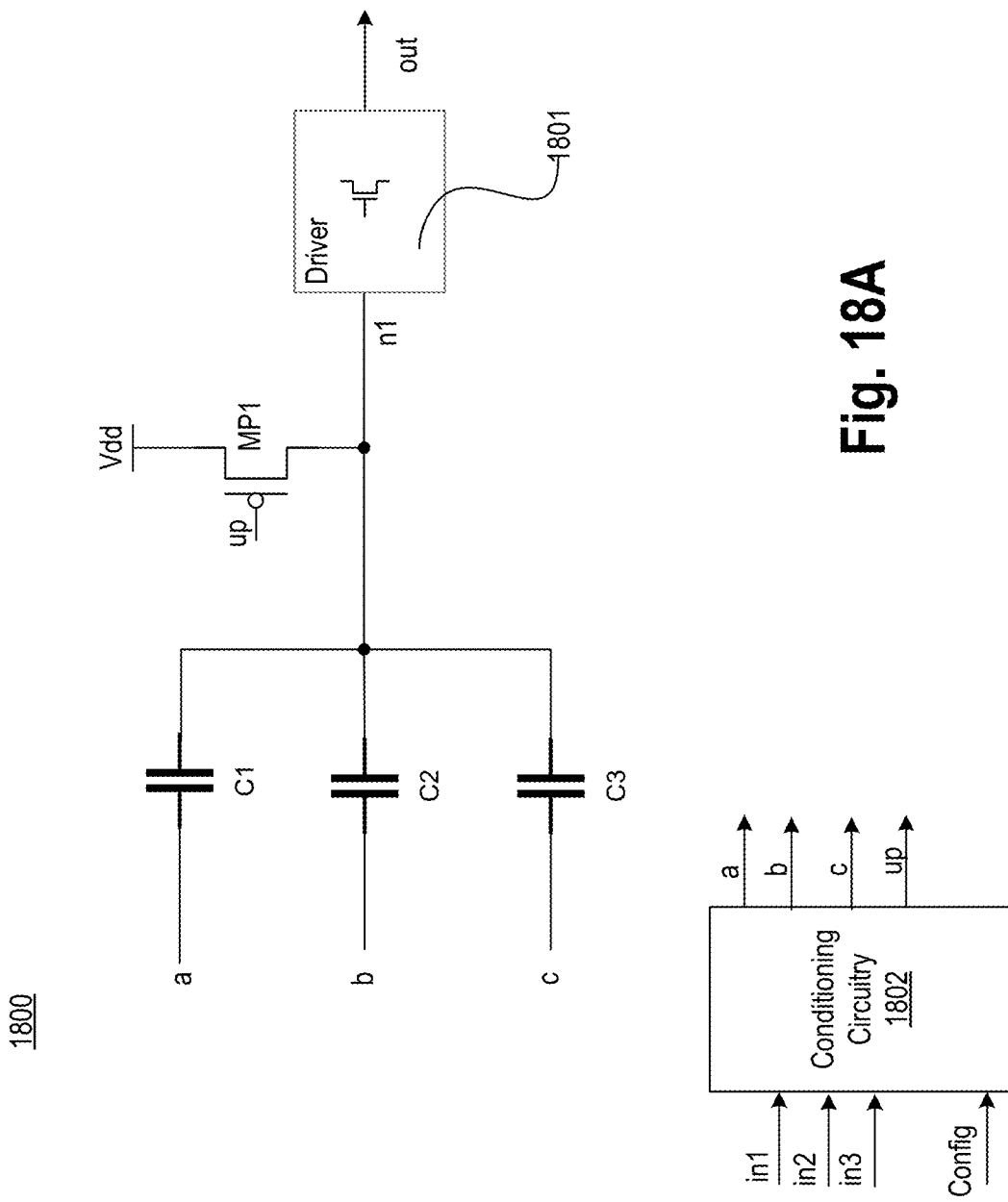
FIG. 18A illustrates a 3-input configurable threshold gate with a pull-up device and having linear or paraelectric capacitors that are arranged as stacked and folded non-planar capacitors or stacked and folded planar capacitors, in accordance with some embodiments.

FIG. 18A illustrates 3-input configurable threshold gate 1800 (also referred to as 3-input capacitive input circuit 1800) with a pull-up device and having linear or paraelectric capacitors that are arranged as stacked and folded non-planar capacitors or stacked and folded planar capacitors, in accordance with some embodiments. 3-input capacitive circuit 1800 has first input 'a', second input 'b', and third input 'c'. First input 'a' is associated with capacitor C1, second input 'b' is associated with capacitor C2, and third input 'c' is associated with capacitor C3. In some embodiments, a first terminal of capacitor C3 is coupled to input 'c' while a second terminal of capacitor C3 is coupled to summing node n1. The summing node n1 may be coupled to a driver circuitry 1801. The driver circuitry may be any suitable driver such as buffer, inverter, multiplier, logic gate (AND, NOR, NAND, OR, XOR, gate, etc.). In some embodiments, driver circuitry 1801 is not present. Conditioning circuitry 1802 may receive inputs in1, in2, and in3 and configuration setting (e.g., reset or evaluation) to determine the outputs 'a', 'b', 'c', and up. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and conditioning the inputs 'a', 'b', and 'c' during a reset phase, the charge at node n1 is set so that in an evaluation phase when the pull-up device is disabled, 3-input capacitive circuit 1600 attains a desired function.

In one instance, when the threshold is set to 2 in a reset phase by a particular sequencing of turning on/off the pull-up device and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' are a logic low, then the voltage on node n1 resolves to logic low. As such, 3-input capacitive circuit 1800 is programmed or configured as a majority gate at node n1 and a minority gate at output out (when the driver circuitry is an inverter). In some cases, depending upon the leakage balance of pull-up transistor MP1 as it impacts charge on the summing node n1, 3-input capacitive circuit 1800 may lose its majority logic functionality over time. This loss in functionality of the majority function can be restored by resetting the summing node n1 via transistor MP1, in accordance with some embodiments.

In some embodiments, when the threshold is set to 3 in a reset phase by a particular sequencing of turning on/off the pull-up device and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' are a logic low, then the voltage on node n1 resolves to logic low. As such, 3-input capacitive circuit 1800 is programmed or configured as a 3-input AND at node n1 and a 3-input NAND gate at output out (assuming the driver circuitry is an inverter).

In some embodiments, when the threshold is set to 1 in a reset phase by a particular sequencing of turning on/off the pull-up device and conditioning of the inputs 'a' and 'b; it means that during an evaluation phase when any of the inputs 'a' 'b', or 'c' is logic high, then voltage on node n1 is logic high. Continuing with this example, when all inputs 'a', 'b', or 'c' are a logic low, then the voltage on node n1 resolves to logic low. As such, 3-input capacitive circuit 1800 is programmed or configured as an OR gate at node n1 and a NOR gate at output out.

So, the same circuit can be used as a majority/minority gate, AND/NAND or OR/NOR gate by conditioning the inputs and resetting or setting the voltage on the summing node during a reset phase. Subsequently, in the evaluation phase the circuit will behave as a 3-input majority/minority, 3-input AND/NAND or 3-input OR/NOR gate.

In some embodiments, conditioning circuitry 1802 sets the threshold to 0 in a reset phase by enabling the pull-up device MP1 and providing logic 1 to the first input 'a', logic 0 to the second input 'b', and logic 0 to the third input 'c'. In some embodiments, conditioning circuitry 1802 sets the threshold to 0 in a reset phase by turning on or enabling the pull-up device MP1 and providing logic 0 to all inputs 'a', 'b', and 'c'. A threshold of 0 means that the capacitive-input circuit is an always-on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1802 (or any other conditioning circuit) sets the threshold to 4. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regardless of input setting when the threshold is 4 (e.g., n+1).

Table 1 illustrates that when inputs 'a', 'b', and 'c' are conditioned and pull-up device MP1 is enabled during the reset phase, then the threshold is set to 0, 1, or 2. In this example, the capacitors comprise linear dielectric.

TABLE 1

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 0 |
| 1 | 1 | 0 | 0 (enable MP1) | 1 |
| 1 | 1 | 1 | 0 (enable MP1) | 2 |

In the evaluation phase, 3-input capacitive circuit 1800 can then behave as an OR/NOR gate (when threshold is 1) or a majority/minority gate (when threshold is 2). Note, this example assumes equal weights for C1, C2, and C3 (e.g., C1=C2=C3). In some embodiments, the threshold may change (e.g., from 1 to 2) when the ratio of capacitances of capacitors C1, C2, and/or C3 are modified.

Table 6 illustrates that when inputs 'a', 'b', and 'c' are conditioned and pull-up device MP1 is enabled during the reset phase, then the threshold is set to 0, 1, or 2. When the capacitors comprise paraelectric material, different thresholds are achieved compared to the linear dielectric material for the same input conditioning. Table 2 is the case when capacitors comprise paraelectric material.

TABLE 2

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 1 |
| 1 | 1 | 0 | 0 (enable MP1) | 1 |
| 1 | 1 | 1 | 0 (enable MP1) | 2 |

In the evaluation phase, 3-input capacitive circuit 1800 can then behave as a logic1/logic0 driver (when threshold is 0), an OR/NOR gate (when threshold is 1), a minority/ minority gate (when threshold is 2). Note, this example assumes equal weights for C1, C2, and C3 (e.g., C1=C2=C3). In some embodiments, the threshold may change (e.g., from 1 to 2 or to another other value) when the ratio of capacitances of capacitors C1, C2, and/or C3 are modified.

Figure 18B:
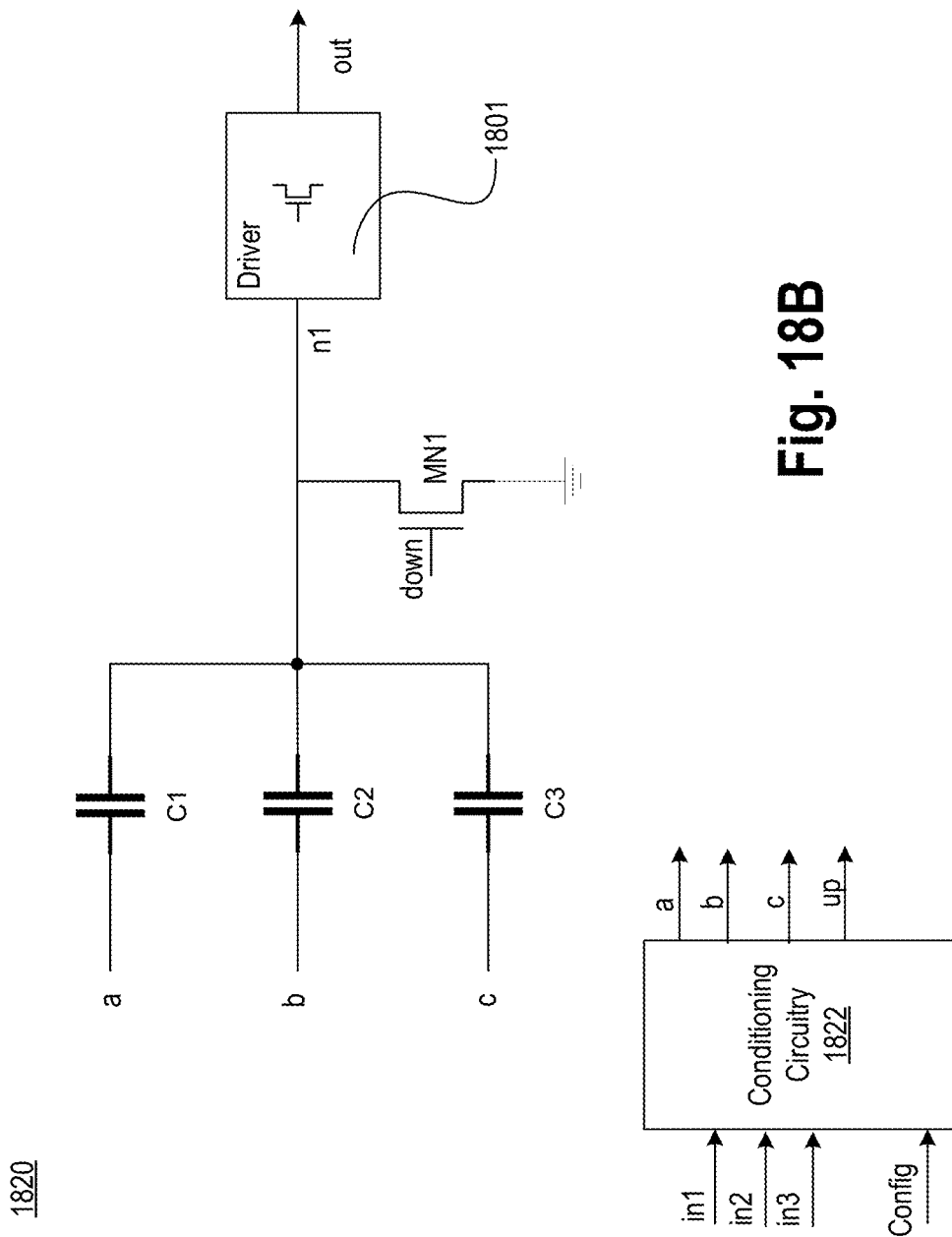
FIG. 18B illustrates a 3-input configurable threshold gate with a pull-down device and having linear or paraelectric capacitors that are arranged as stacked and folded non-planar capacitors or stacked and folded planar capacitors, in accordance with some embodiments.

FIG. 18B illustrates 3-input configurable threshold gate 1820 with a pull-down device and having linear or paraelectric capacitors that are arranged as stacked and folded non-planar capacitors or stacked and folded planar capacitors, in accordance with some embodiments. Compared to FIG. 18A, here the pull-up device MP1 is removed and pull-down device MN1 is added which is coupled to node n1 and ground supply rail. In various embodiments, during the reset phase, node n1 is pulled-down by MN1 to ground, and inputs 'a', 'b', and 'c' are conditioned via configuration circuit 1822 to adjust the threshold of 3-input capacitive circuit 1820. Conditioning circuitry 1822 may receive inputs in1, in2, and in3 and configuration setting(s) (e.g., reset or evaluation) to determine the outputs 'a', 'b', 'c', and down. During the evaluation phase, in1 is passed on to output 'a', in2 is passed on to 'b', and in3 is passed on to 'c'. During the reset phase, depending on a desired threshold, outputs 'a', 'b', and 'c' are conditioned. Table 3 illustrates that when inputs 'a', 'b', and 'c' are conditioned and pull-down device MN1 is enabled during the reset phase, then the threshold is set to 2 or 3. In this example, the capacitors comprise linear dielectric material.

TABLE 3

| 'a' | 'b' | 'c' | Second control (down) | Threshold |
|-----|-----|-----|----------------------|-----------|
| 0   | 0   | 0   | 1 (enable MN1)       | 2         |
| 1   | 0   | 0   | 1 (enable MN1)       | 3         |
| 1   | 1   | 0   | 1 (enable MN1)       | 3         |
| 1   | 1   | 1   | 1 (enable MN1)       | 3         |

In the evaluation phase, 3-input capacitive circuit 1820 can then behave as a majority/majority gate (when threshold is 2) or an AND/NAND gate (when threshold is 3). Note, this example assumes equal weights for C1, C2, and C3 (e.g., C1=C2=C3). In some embodiments, the threshold may change (e.g., from 3 to 2 or to 1) when the ratio of capacitances of capacitors C1, C2, and/or C3 are modified.

Table 4 illustrates that when inputs 'a', 'b', and 'c' are conditioned and pull-down device MN1 is enabled during the reset phase, then the threshold is set to 2, 3, or 4. When the capacitors comprise paraelectric material, different thresholds are achieved compared to the linear dielectric material for the same input conditioning. Table 4 is the case when capacitors comprise paraelectric material.

TABLE 4

| 'a' | 'b' | 'c' | Second control (down) | Threshold |
|-----|-----|-----|----------------------|-----------|
| 0   | 0   | 0   | 1 (enable MN1)       | 2         |
| 1   | 0   | 0   | 1 (enable MN1)       | 3         |
| 1   | 1   | 0   | 1 (enable MN1)       | 3         |
| 1   | 1   | 1   | 1 (enable MN1)       | 4         |

In the evaluation phase, 3-input capacitive circuit 1820 can then behave as a logic1/logic0 driver (when threshold is 0), a majority/majority gate (when threshold is 2), an AND/NAND gate (when threshold is 3), or a disconnected circuit (when threshold is 4). Note, this example assumes equal weights for C1, C2, and C3 (e.g., C1=C2=C3). In some embodiments, the threshold may change (e.g., from 3 to 2 or to 1, or any other value) when the ratio of capacitances of capacitors C1, C2, and/or C3 are modified.

Figure 18C:
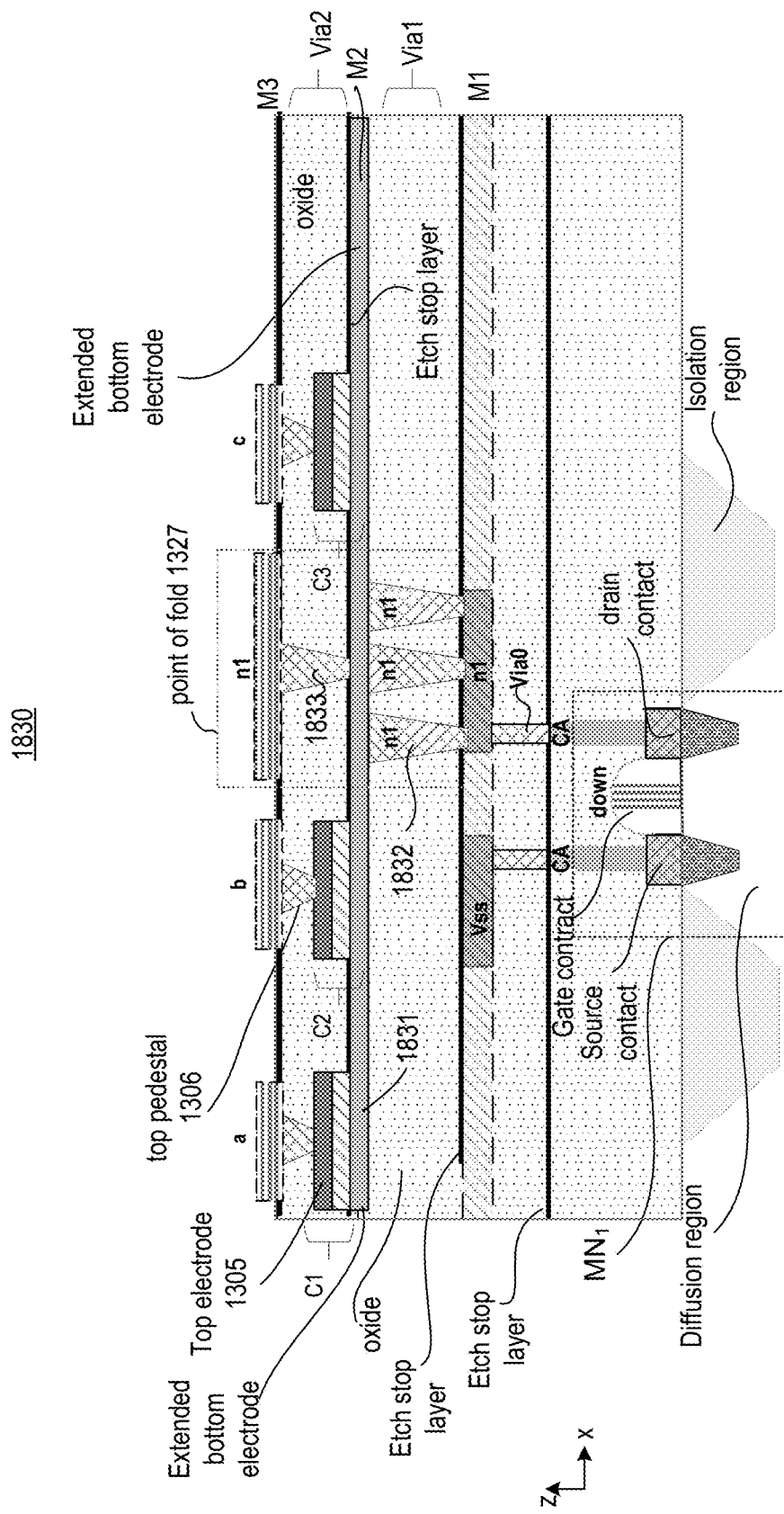
FIG. 18C illustrates the 3-input configurable threshold gate with the pull-down device and having linear or paraelectric capacitors that are arranged as folded planar capacitors and misaligned central pedestal and extended bottom electrode, in accordance with some embodiments.

FIG. 18C illustrates 3-input configurable threshold gate 1830 (e.g., 1800) with the pull-down device and having linear or paraelectric capacitors that are arranged as folded planar capacitors and misaligned central pedestal and an extended bottom electrode, in accordance with some embodiments. In this example, the number of stacks is 1 with folded capacitors. It is folded because capacitor C3 is on one side of folding point n1 (summing node n1) and capacitors C1 and C2 on the other lateral side of folding point n1. The source and drain terminals or contacts of the pull-down transistor $MN_1$ are coupled to respective contacts (CA). Etch stop layer is used in the fabrication of vias (via0) to connect one of the source or drain contacts of the transistor to the summing node n1 on metal-1 (M1) layer, and another one of the source or drain contacts of the transistor to ground (Vdd) on M1 layer. In some embodiments, another etch stop layer is formed over M1 layer to fabricate vias (via1) to couple to respective M1 layers.

Each capacitor has a first terminal coupled to a summing node n1, and a second terminal coupled to a respective input. The summing node n1 thus becomes a point of fold. In the various embodiments, the planar capacitors C1, C2, and C3 are illustrated with three layers—top electrode, dielectric, and bottom electrode. While capacitors can be formed like that, the illustrative capacitors can include any of the planar capacitor configurations discussed herein. For example, the planar capacitors can be any one of capacitors of FIGS. 4A-B (for paraelectric material) and FIG. 2 for linear capacitor.

Referring to FIG. 18C, in some embodiments, when the capacitors are even in number, the capacitors are positioned symmetrically relative to the point of fold, summing node sn1. In one example, an equal number of capacitors are positioned on either sides of the common node sn1 and in the stack. In some embodiments, the capacitors are not positioned symmetrically relative to the point of fold as shown in FIG. 18C. For example, there may be more capacitors (e.g., C1 and C2) on one side of the summing node n1 relative to another side which has capacitor C3. Further, each layer may also have a symmetric or non-symmetric arrangement of the capacitors. In this example, one stack layer is used.

In a stacked only configuration, the capacitors would be vertically stacked resulting in a tall memory cell. In that case, depending on the process technology node, the number of capacitors may be limited by the number of metal layers available by the process technology node. In the stack and fold configuration, the capacitors are vertically stacked as well as horizontally placed by sharing a common electrode, which in turn couples to a shared node (e.g., summing node n1). Here, one stack is shown with one fold. Capacitors C1 and C2 are on one side of point of fold 1327 while capacitor C3 is on the other side of point of fold 1327. In this example, the capacitors C1, C2, and C3 are asymmetrically placed on either side of point of fold 1327 because the number of capacitors is odd in number.

In some embodiments, in the first row, the second terminal of C1 is coupled to input a, the second terminal of C2 is coupled to input b, and the second terminal of capacitor C3 is coupled to input c. In some embodiments, each capacitor structure includes a shared bottom electrode 1831 (like 1301) which couples to the capacitors of that row and to the common node n1 1832. In some embodiments, multiple vias are used for common node n1 to connect the common node n1 on M1 to shared bottom electrode 1831. In this example, three vias are shown. Fewer or more vias for summing node n1 may be used. In some examples, multiple vias are used for summing node n1 to couple to shared bottom electrode 1831 to reduce reliability issues like electromigration.

In some embodiments, shared bottom electrode 1831 (or the extended bottom electrode) can be a metal electrode or a conductive oxide, in accordance with some embodiments. In some embodiments, shared bottom electrode 1831 comprises a reflective intermetallic material. By using shared bottom electrode 1831, fabrication steps for fabricating each capacitor are reduced. Further, the vertical height is also reduced for the memory bit-cell.

In some embodiments, a metal layer is formed over top electrode 1305 of each capacitor to connect to a respective input. In some embodiments, pedestal 1306 is formed between top electrode 1305 and the metal layer connected to the respective input (e.g., input a, b, or c). For example, a metal layer over pedestal 1306 which is adjacent to top electrode 1305 of capacitor C1 is connected to input a. A metal layer over a pedestal which is adjacent to the top electrode of capacitor C2 is connected to input b and so on. In some embodiments, the pedestals have a barrier material on its side walls as discussed with reference to FIG. 4C.

Referring to FIG. 18C, the metal layers coupled to the bottom electrodes of the capacitors are coupled to summing node n1 through respective vias. In some embodiments, multiple vias connect the bottom extended electrode of each capacitor stack. These multiple vias are connected to the summing node n1. In some embodiments, the multiple vias, connected to the metal layer (e.g., M3) for n1 as the summing node, connect to extended bottom electrode of higher capacitors in the stack. In this example, the vias for summing node n1 1832 are misaligned relative to the center summing node n1 via 1833.

In some embodiments, the pull-up transistor MP1 and the pull-down transistor MN1 are removed and driver circuitry 1801 is coupled to the bottom electrodes or terminals (e.g., 1831 or 1851) of capacitors C1, C2, and C3. In that case, a gate terminal of driver circuitry 1801 is connected to node n1. In some embodiments, driver circuitry 1801 is present along with the pull-up transistor MP1 and/or the pull-down transistor MN1.

Figure 18D:
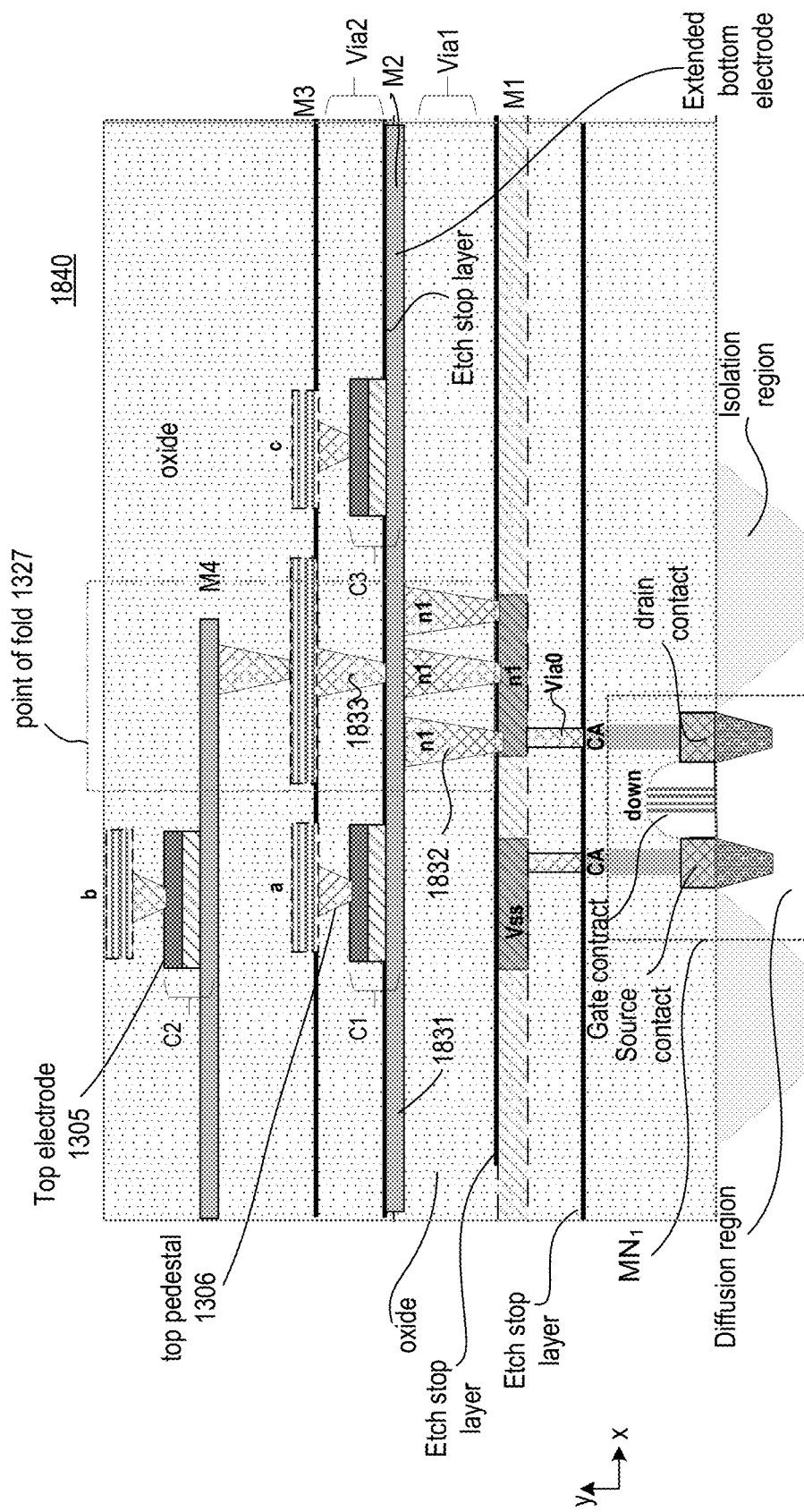
FIG. 18D illustrates the 3-input configurable threshold gate with the pull-down device and having linear or paraelectric capacitors that are arranged as stacked and folded planar capacitors and aligned central pedestal and extended bottom electrode, in accordance with some embodiments.

FIG. 18D illustrates 3-input configurable threshold gate 1840 (e.g., 1800) with the pull-down device and having linear or paraelectric capacitors that are arranged as stacked and folded planar capacitors, and with an aligned central pedestal and extended bottom electrode, in accordance with some embodiments. In some embodiments, the three capacitors C1, C2, and C3 are arranged in a stacked and folded configuration, where there are 2 stacks and one fold along point of fold 1327. In some embodiments, a vertical tower of vias and metal layers are used to extend the summing node n1 to higher levels along the vertical direction. For example, via 1832 is connected to shared bottom electrode 1831 and to summing node n1 on M3. One or more vias 1833 then couple summing node n1 on M3 to the next shared bottom electrode on M4, and so on. As such, a network of vias is used to connect summing node n1 on M1 to shared bottom electrodes of each capacitive structure on various metal layers.

In some embodiments, the first stack capacitors C1 and C3 are symmetrically placed on either side of the point of fold 1327. On the second stack, capacitor C2 can be placed above capacitor C1 such that there is no horizontal offset between capacitor C1 and C2, in accordance with some embodiments. In this example, the second stack is asymmetric because there is one capacitor on one side of point of fold 1327 and no capacitor on the other side of point of fold 1327. In some embodiments, capacitor C2 is horizontally offset relative to capacitor C1.

Figure 18E:
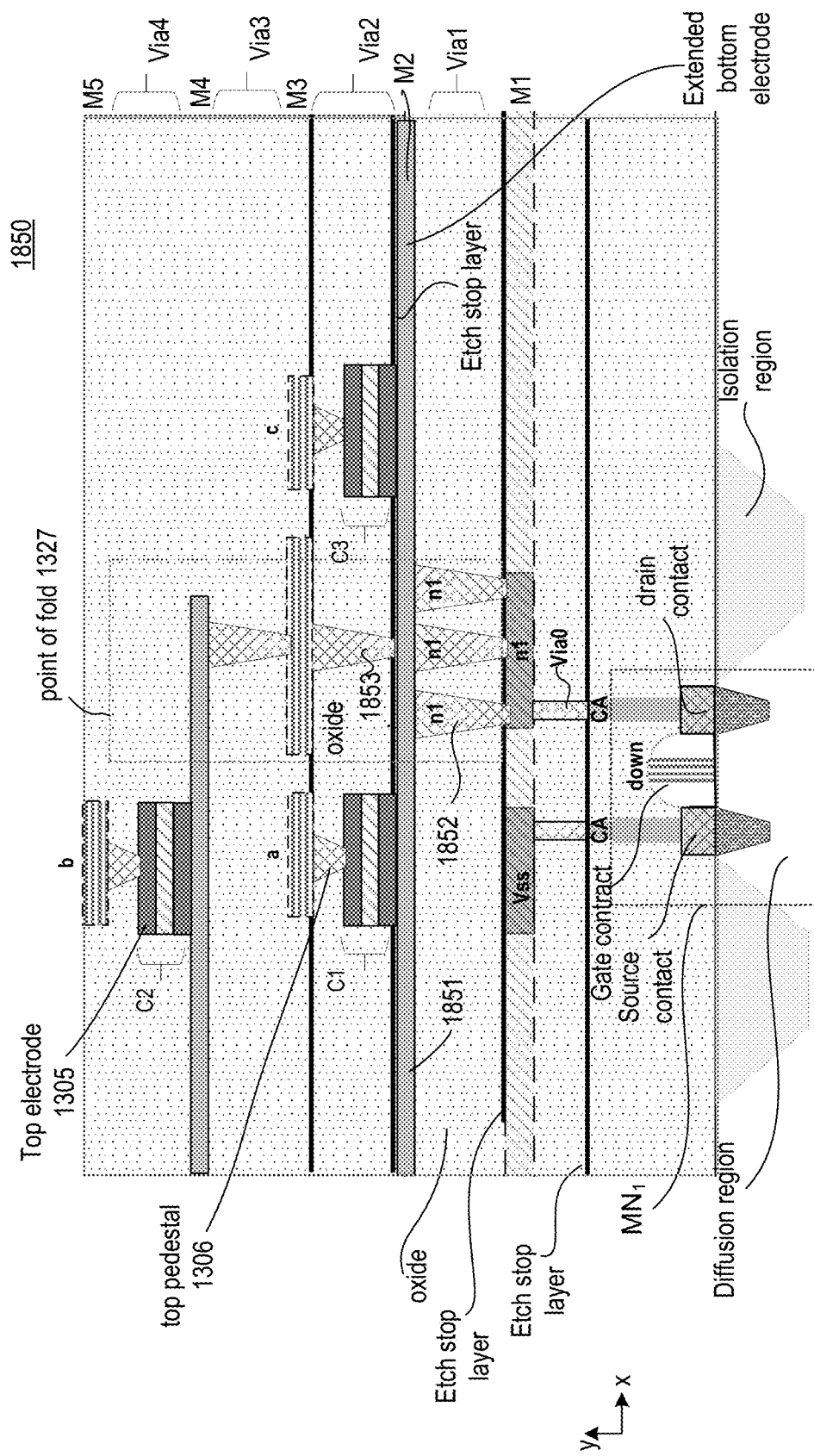
FIG. 18E illustrates the 3-input configurable threshold gate with the pull-down device and having linear or paraelectric capacitors that are arranged as stacked and folded planar capacitors and aligned central pedestal and extended metal layer, in accordance with some embodiments.

FIG. 18E illustrates 3-input configurable threshold gate 1850 (e.g., 1800) with pull-down device and having linear or paraelectric capacitors that are arranged as stacked and folded planar capacitors, and with aligned central pedestal, and an extended metal layer, in accordance with some embodiments. 3-input configurable threshold gate 1850 is like 3-input configurable threshold gate 1840 but with extended shared metal 1851 instead of extended bottom electrode 1831. While extended shared metal 1851 is coupled to the bottom electrodes of each capacitor in the same horizontal region, each capacitor includes its own bottom electrode. In various embodiments, the vias or pedestals 1852 and 1853 for summing node n1 are coupled or connected to extended shared metal 1851.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective plate-line electrodes.

Figure 18F:
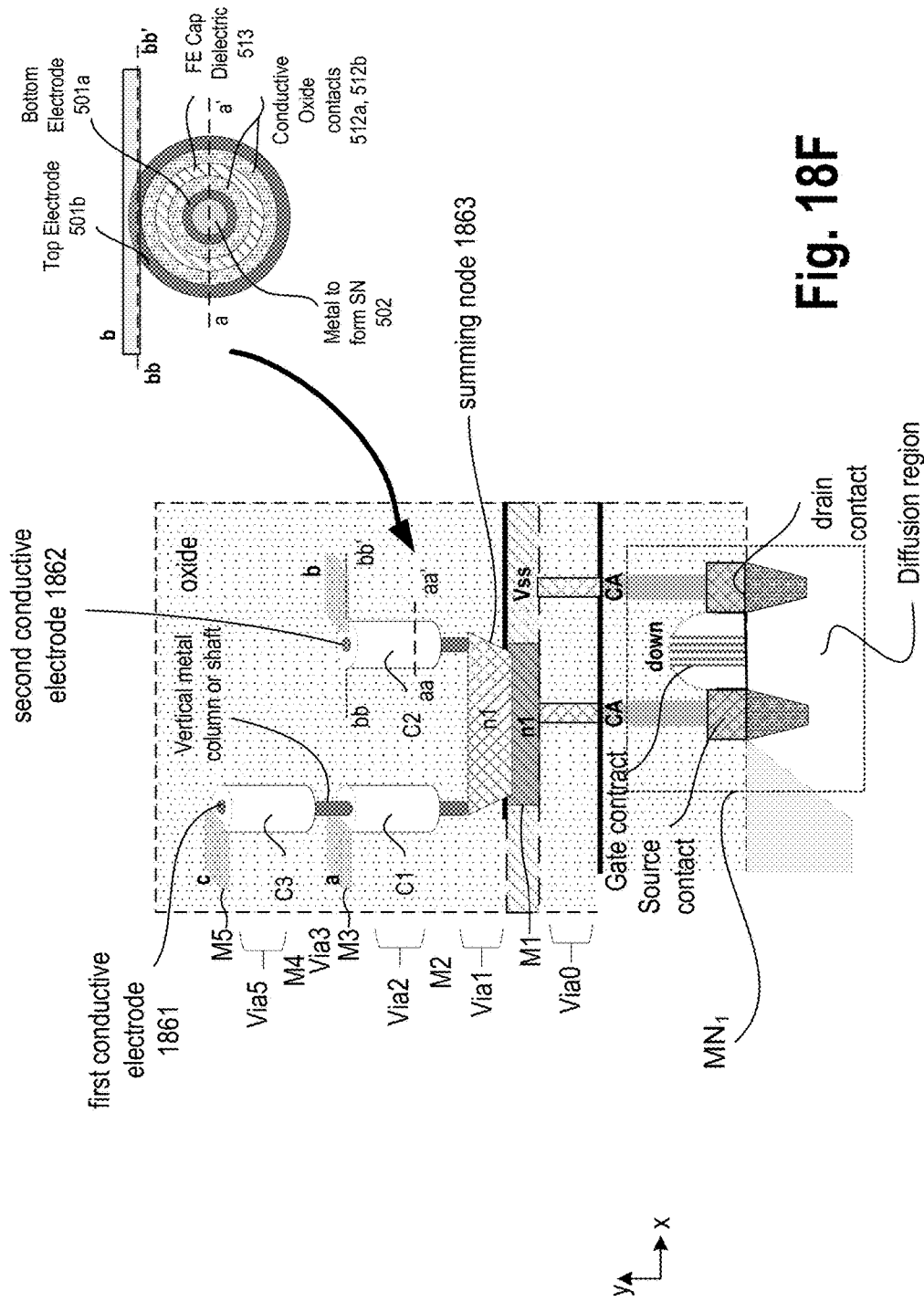
FIG. 18F illustrates the 3-input configurable threshold gate with the pull-down device and having linear or paraelectric capacitors that are arranged as stacked and folded non-planar capacitors and aligned central pedestal and extended metal layer, in accordance with some embodiments.

FIG. 18F illustrates 3-input configurable threshold gate 1860 with the pull-down device and having linear or paraelectric capacitors that are arranged as stacked and folded non-planar capacitors, and with an aligned central pedestal and an extended metal layer, in accordance with some embodiments. In this example three capacitors are stacked and folded. In some embodiments, at least two columns of shared metal are connected to summing node n1 1863. For further folding of capacitors, additional columns of shared metal can be connected to summing node n1 1863. In one such embodiment, via1 for n1 is made wider to accommodate connection with additional columns. In some embodiments, all three capacitors are directly coupled to summing node n1 1863 and there are no capacitors vertically over the capacitors. In some embodiments, at least two capacitors are on a vertical stack and one capacitor is on a separate stack directly coupled to summing node n1 1863.

In some embodiments, summing node n1 1863 is coupled to a metal stub on M1 which in turn is coupled to a source contact of transistor $MN_1$. The drain contact of transistor $MN_1$ is connected to Vss (ground). The gate terminal of the transistor is connected to control node "down". The columns of vertical metal form the bottom electrodes of the capacitors or are directly adjacent to the bottom electrodes of the capacitors.

In some embodiments, the plurality of capacitors has a first terminal coupled to summing node n1 1863. In some embodiments, a second terminal of an individual capacitor of the plurality of capacitors is coupled to input lines (e.g., a, b, and c). In various embodiments, the plurality of capacitors are non-planar capacitors that are arranged in a stacked and folded configuration. In some embodiments, 3-input configurable threshold gate 1860 comprises first conductive electrode 1861 directly connected to summing node n1 1863, wherein first conductive electrode 1861 extends vertically away from summing node n1 1863. In some embodiments, 3-input configurable threshold gate 1860 comprises second conductive electrode 1862 directly connected to summing node n1 1863. In some embodiments, second conductive electrode 1862 extends vertically away from summing node n1 1863. In some embodiments, first conductive electrode 1861 and second conductive electrode 1862 are substantially parallel. In some embodiments, the plurality of capacitors includes a first set of capacitors (C1 and C3) adjacent to first conductive electrode 1861. In some embodiments, the plurality of capacitors includes a second set of capacitors (C2) adjacent to second conductive electrode 1862.

In various embodiments, the top electrode of each of the capacitor is partially adjacent to a respective input line. For example, the top electrode of capacitor C1 is partially coupled to input line a (which carries input a), the top electrode of capacitor C2 is partially coupled to input line b (which carries input b), and the top electrode of capacitor C3 is partially coupled to input line c (which carries input b). In this instance, the capacitors are formed between regions reserved for Via1 through Via5 (e.g., between M1 through M5 layers). To reduce the height of the memory bit-cell, further folding can be performed by forming capacitors on additional metal columns or shafts that connect to summing node n1. While the embodiments are illustrated with reference to pull-down transistor $MN_1$, the same embodiments are also applicable to pull-up transistor $MP_1$. Here, the capacitors are linear capacitors or paraelectric capacitors. For linear non-planar capacitors, example structures are described with reference to FIGS. 3A-B. For non-linear non-planar capacitors, example structures are described with reference to FIGS. 5A-B.

Figure 18G:
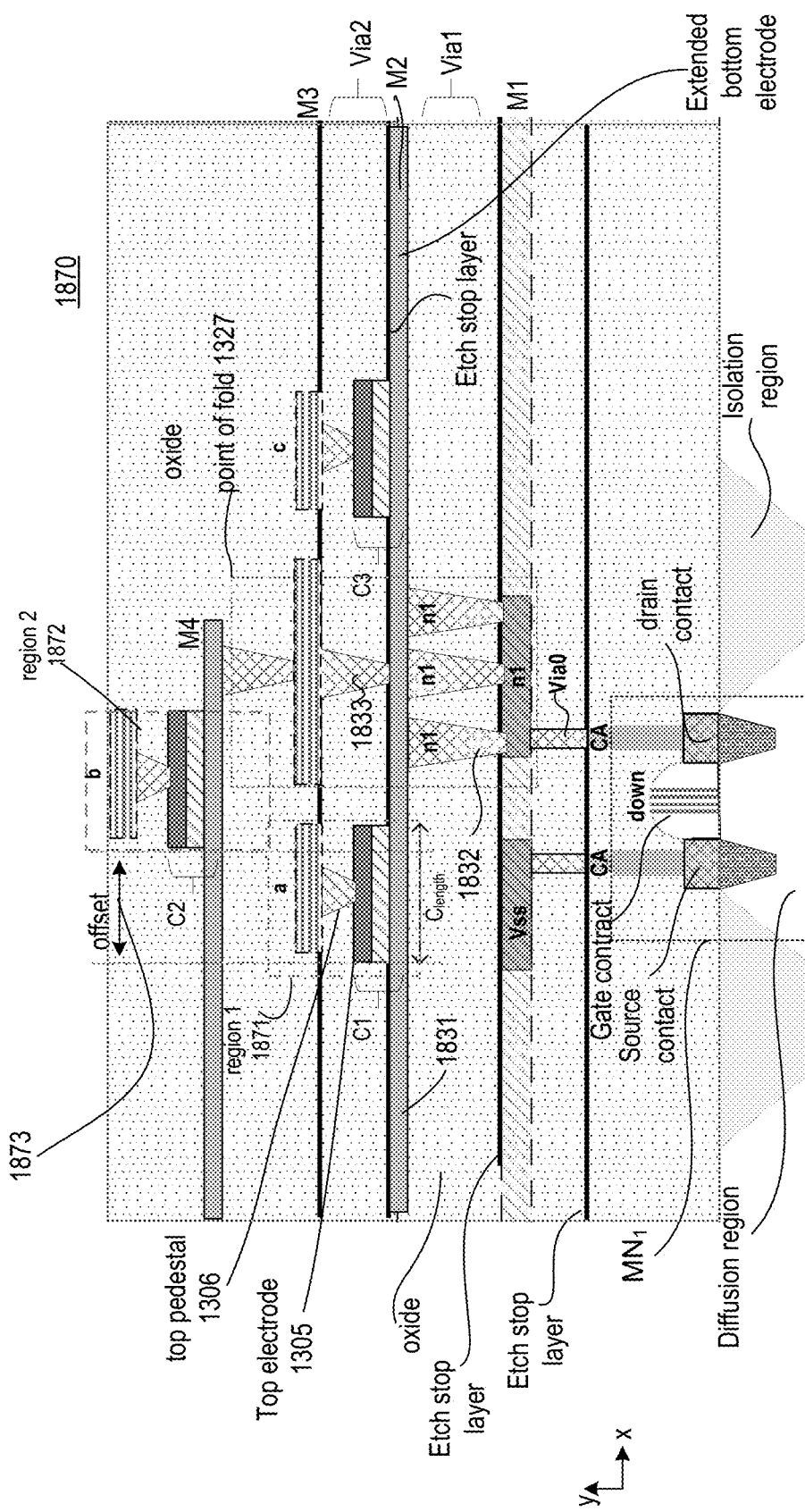
FIG. 18G illustrates the 3-input configurable threshold gate with the pull-down device and having linear or paraelectric capacitors that are arranged as stacked and folded planar capacitors with an offset and aligned central pedestal and extended bottom electrode, in accordance with some embodiments.

FIG. 18G illustrates 3-input configurable threshold gate 1870 with the pull-down device and having linear or paraelectric capacitors that are arranged as stacked and folded planar capacitors with an offset, and with an aligned central pedestal and an extended bottom electrode, in accordance with some embodiments. Compared to FIG. 18D, here the capacitor stacks that share the extended bottom electrode are vertically offset from one another. In this example, offset 1873 is illustrated as offset between capacitors C1 and C2, both of which are on different shared bottom electrodes and in a vertical stack. Continuing with this example, the first capacitor C2 occupies first region 1871 (which includes the layers that form the capacitor including the top electrode pedestal and the input-line a). The second capacitor C2 occupies second region 1872 (which includes the layers that form the capacitor including the top electrode pedestal and the input-line b). In some embodiments, first region 1871 and second region 1872 are laterally offset by offset 1873. In some embodiments, offset 1873 can be substantially equal to a lateral length $C_{length}$ of the first capacitor. In some embodiments, offset 1873 is less than the lateral length $C_{length}$ of the first capacitor such that first region 1871 overlaps second region 1872. In some embodiments, offset 1873 can be used to route the input-lines of the capacitors through the voids caused by the offsets. The offset can be between a lateral distance of two times a lateral length of the dielectric material and 5% of the lateral length of the dielectric material, in accordance with some embodiments. Other offset distances may also be used. As such, capacitors are placed in a stack and folded manner and staggered relative to one another.

Figure 18H:
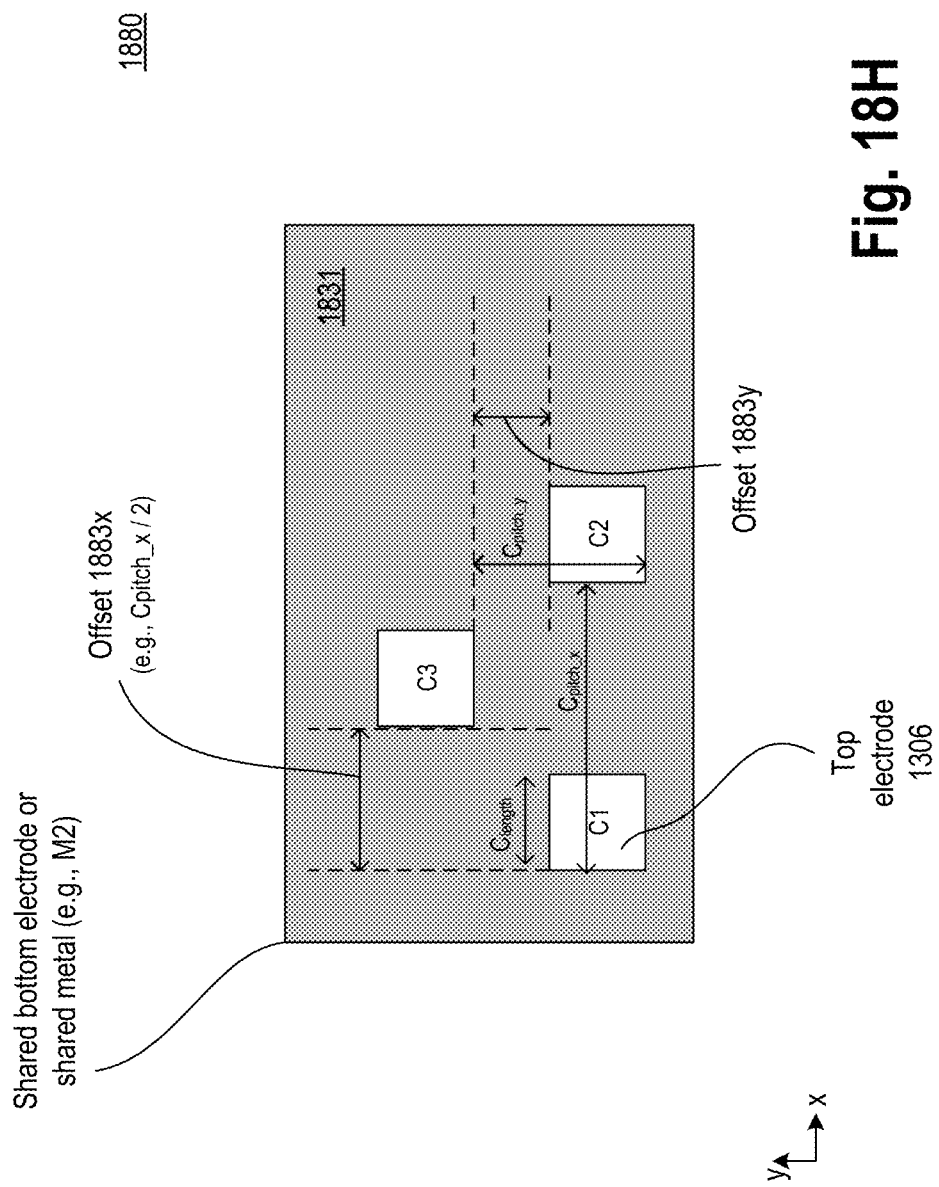
FIG. 18H illustrates a top view cross-section of a capacitor placement configuration, where planar capacitors are staggered on a shared bottom electrode or shared metal, in accordance with some embodiments.

FIG. 18H illustrates a top view cross-section of a capacitor placement configuration 1880 where planar capacitors are staggered on a shared bottom electrode or shared metal, in accordance with some embodiments. In some embodiments, capacitors C1, C2, and C3 are stacked with offset in the vertical z-plane as shown in FIG. 18G. In some embodiments, capacitors are staggered with offset in the horizontal plane (x-y plane). In this example, additional capacitors C1, C2, and C3 are coupled to shared bottom electrode 1831 or a shared extended metal. In some embodiments, the capacitors on shared bottom electrode 1831 or the shared metal are staggered with an x-offset 1883x and/or a y-offset 1883y.

In some embodiments, the offset 1883x is 50% of $C_{pitch\_x}$ when there are two rows of capacitors on shared electrode 1831. In some embodiments, the offset 1883x is substantially 50% of $C_{pitch\_x}$ when there are two rows of capacitors on shared electrode 1301 or metal plane 1401. In this example, two rows are shown. In some embodiments, the offset 1883x are substantially 33% of $C_{pitch\_x}$ when there are three rows of capacitors on shared electrode 1831. In some embodiments, all capacitors are formed on shared electrode 1831 in a staggered configuration. In various embodiments, the staggered capacitors on shared bottom electrode 1831 or the shared metal allow for metal route escapes for input-lines. For example, C1 is coupled to input-line a, C2 is coupled to input-line b, and C3 is coupled to input-line C3. In some embodiments, these input-lines are parallel to one another. The staggered configuration allows for input-line connections on either side of shared bottom electrode 1831 or the shared metal, in accordance with some embodiments.

Figure 19A:
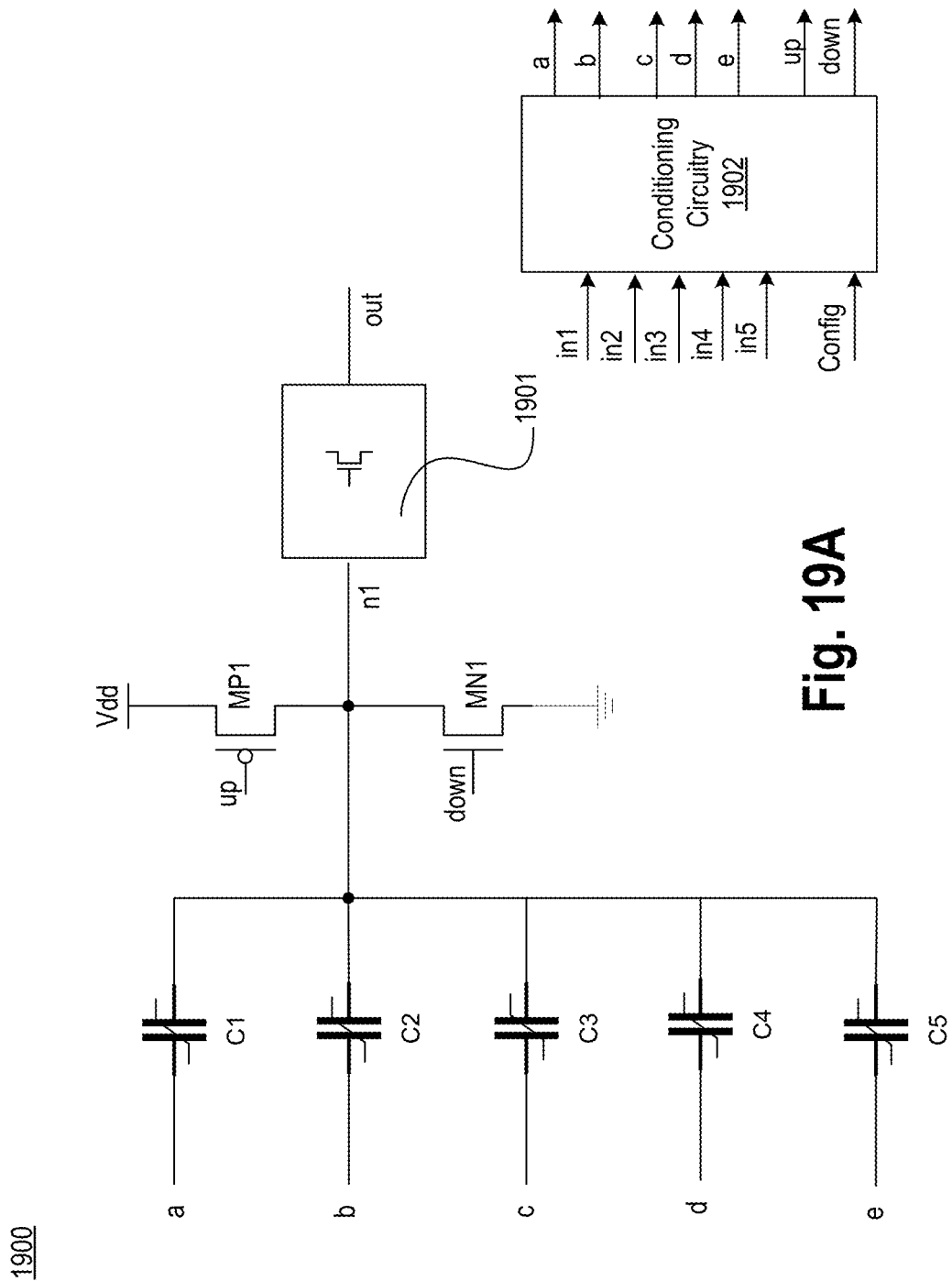
FIG. 19A illustrates a 5-input configurable threshold gate with a pull-up device and a pull-down device and having ferroelectric capacitors that are arranged as stacked and folded non-planar capacitors or stacked and folded planar capacitors, in accordance with some embodiments.

FIG. 19A illustrates 5-input configurable threshold gate 1900 (also referred to as a 5-input capacitive input circuit 1900) with a pull-up device and a pull-down device and having ferroelectric capacitors that are arranged as stacked and folded non-planar capacitors or stacked and folded planar capacitors, in accordance with some embodiments.

In some embodiments, when the stacked and folded capacitors comprise linear dielectric or paraelectric capacitors, then the summing node n1 may have one of a pull-up device or a pull-down device. In some embodiments, x-input configurable threshold gate has a pull-up device MP1 controllable by an up signal and no pull-down device on the summing node n1 or with a disabled pull-down device on the summing node n1. In some embodiments, x-input configurable threshold gate has a down-up device MP1 controllable by the down signal and no pull-up device on summing node n1 or with a disabled pull-up device on the summing node n1. In some embodiments, when the x-input configurable threshold gate has capacitors with ferroelectric material, then both pull-up and pull-down devices are coupled to the summing node to configure the threshold gate.

FIG. 19A is comparable to FIG. 18A, but for additional input 'd' and associated capacitor C4 and additional input 'e' and associated capacitor C5. In some embodiments, a first terminal of capacitor C4 is coupled to input 'd' while a second terminal of capacitor C4 is coupled to summing node n1. In some embodiments, a first terminal of capacitor C5 is coupled to input 'e' while a second terminal of capacitor C5 is coupled to summing node n1. Conditioning circuit 1802 is replaced with a conditioning circuit 1902. Conditioning circuitry 1902 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In various embodiments, during the reset phase, node n1 is pulled-up by MP1 to Vdd, and inputs 'a', 'b', 'c', 'd', and 'e' are conditioned via configuration circuitry 1902 to adjust the threshold of 5-input capacitive circuit 1900. Conditioning circuitry 1902 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned. Table 9 illustrates that when inputs 'a', 'b', 'c', 'd', and 'e' are conditioned and pull-up device MP1 is enabled during the reset phase, then the threshold is set to 1 or 3. In this example, the capacitors comprise linear dielectric material.

TABLE 5

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 0 |
| 1 | 1 | 0 | 0 | 0 | 0 (enable MP1) | 0 |
| 1 | 1 | 1 | 0 | 0 | 0 (enable MP1) | 1 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1900 can then behave as an OR/NOR gate (when threshold is 1), a majority-0/minority-0 gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5) when the ratio of capacitances of capacitors C1, C2, C3, C4, and/or C5 are modified.

Table 10 illustrates that when inputs 'a', 'b', 'c', 'd', and 'e' are conditioned and the pull-up device MP1 is enabled during the reset phase, then the threshold is set to 1 or 3. When the capacitors comprise paraelectric material, different thresholds are achieved compared to the linear dielectric material for the same input conditioning. Table 10 is the case when capacitors comprise paraelectric material.

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 1 |
| 1 | 1 | 0 | 0 | 0 | 0 (enable MP1) | 1 |
| 1 | 1 | 1 | 0 | 0 | 0 (enable MP1) | 2 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1900 can then behave as an always-on circuit that drives a constant logic value on node n1 (when threshold is 0), an OR/NOR gate (when threshold is 1), a majority-0/minority-0 gate or a threshold gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5 or any other value) when the ratio of capacitances of capacitors C1, C2, C3, C4, and/or C5 are modified.

In some embodiments, by turning on/off the pull-up device MP1 and pull-down device MN1 in a sequence, and conditioning the inputs 'a', 'b', 'c', 'd', and 'e' during a reset phase, the charge at node n1 is set. As such, in an evaluation phase when the pull-up and pull-down devices (MP1 and MN1) are disabled, 5-input capacitive circuit 1900 attains a desired function.

In some embodiments, conditioning circuitry 1902 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c', logic 0 to the fourth input 'd', and logic 0 to the fifth input 'e'. A threshold of 0 means that conditioning circuitry 1902 is an always-on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1902 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c', logic 0 to the fourth input 'd', and logic 0 to the fifth input 'e'. In some embodiments, conditioning circuitry 1902 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c', logic 0 to the fourth input 'd', and logic 0 to the fifth input 'e'. In some embodiments, when the threshold is set to 1 in a reset phase by a particular sequencing of turning on/off the pull-up and the pull-down devices and conditioning of the inputs 'a' 'b', 'c', 'd', and 'e'; it means that during an evaluation phase when any of the inputs 'a' 'b', 'c', 'd', or 'e' are logic high, then voltage on node n1 is logic high. Continuing with this example, when all inputs 'a', 'b', 'c' 'd', or 'e' are logic low, then the voltage on node n1 resolves to logic low. As such, 5-input capacitive circuit 1900 is programmed or configured as an OR gate at node n1 and an NOR gate at output out.

In some embodiments, conditioning circuitry 1902 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c', logic 0 to the fourth input 'd', and logic 0 to the fifth input 'e'. In some embodiments, conditioning circuitry 1902 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c', logic 0 to the fourth input 'd', and logic 0 to the fifth input 'e'. In one instance, when the threshold is set to 2 in a reset phase by a particular sequencing of turning on/off the pull-up and pull-down devices and conditioning of the inputs 'a', 'b', 'c', 'd', and 'e'; it means that during an evaluation phase when at least two of the five inputs 'a', 'b' 'c', 'd', and 'e' are logic high, then voltage on node n1 is logic high. Continuing with this example, when one or zero inputs of the five inputs 'a' 'b', 'c', 'd', and 'e' are a logic high, then the voltage on node n1 resolves to logic low. As such, 5-input capacitive circuit 1900 is programmed or configured as a 5-input majority 0 gate-like logic (e.g., a threshold gate with a threshold of 2) at node n1 and a 5-input minority 0 gate-like logic (e.g., an inverted threshold gate with a threshold of 2) at output out.

In some embodiments, conditioning circuitry 1902 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 0 to the fourth input 'd', and logic 0 to the fifth input 'e'. In some embodiments, conditioning circuitry 1902 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c', logic 0 to the fourth input 'd', and logic 0 to the fifth input 'e'. In one instance, when the threshold is set to 3 in a reset phase by a particular sequencing of turning on/off the pull-up and/or the pull-down devices and conditioning of the inputs 'a', 'b', 'c', 'd', and 'e'; it means that during an evaluation phase when at least three of the five inputs 'a', 'b' 'c', 'd', and 'e' are logic high, then voltage on node n1 is logic high. Continuing with this example, when at least two inputs of the five inputs 'a' 'b', 'c', 'd', and 'e' are a logic low (or 2 or fewer inputs are logic high), then the voltage on node n1 resolves to logic low. As such, 5-input capacitive circuit 1900 is programmed or configured as a 5-input majority gate logic at node n1 and a 5-input minority gate logic at output out (assuming driver circuitry 1901 is an inverter).

In some embodiments, conditioning circuitry 1902 sets the threshold to 4 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 0 to the fifth input 'e'. In some embodiments, conditioning circuitry 1902 sets the threshold to 4 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 0 to the fourth input 'd', and logic 0 to the fifth input 'e'. In some embodiments, when the threshold is set to 4 in a reset phase by a particular sequencing of turning on/off the pull-up and the pull-down devices and conditioning of the inputs 'a', 'b', 'c', 'd', and 'e'; it means that during an evaluation phase when at least four inputs from the five inputs 'a', 'b' 'c', 'd' and 'e' are logic high, then voltage on node n1 is logic high. Continuing with this example, when three or fewer inputs from the five inputs 'a' 'b', 'c', 'd' and 'e' are logic high, then the voltage on node n1 resolves to logic low. As such, 5-input capacitive circuit 1900 is programmed or configured as a 5-input majority 1 gate-like logic (e.g., a threshold gate with a threshold of 4) at node n1 and a 5-input minority 1 gate-like logic (e.g., an inverted threshold gate with a threshold of 4) at output out.

In some embodiments, conditioning circuitry 1902 sets the threshold to 5 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 1 to the fifth input 'e'. In some embodiments, conditioning circuitry 1902 sets the threshold to 5 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 0 to the fifth input 'e'. In some embodiments, when the threshold is set to 5 in a reset phase by a particular sequencing of turning on/off the pull-up and the pull-down devices and conditioning of the inputs 'a', 'b', 'c', 'd', and 'e'; it means that during an evaluation phase when all five inputs 'a', 'b' 'c', 'd', and 'e' are logic high, then voltage on node n1 is logic high. Continuing with this example, when any of the five inputs 'a' 'b', 'c', 'd', and 'e' is a logic low, then the voltage on node n1 resolves to logic low. As such, 5-input capacitive circuit 1900 is programmed or configured as a 5-input AND at node n1 and a 5-input NAND gate at output out (assuming that the driver circuitry 1901 is an inverter).

In some embodiments, conditioning circuitry 1902 sets the threshold to 6 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 1 to the fifth input 'e'. A threshold of 6 for a 5-input capacitive circuit means that the capacitive input circuit is an always off circuit regardless of the logic levels of the inputs. In one such embodiment, during the evaluation phase for the circuit configured with threshold of n+1 (e.g., 6, where 'n' is the number of capacitive inputs), the logic value on node n1 is floating and may eventually discharge to ground or charge to supply level. In some embodiments, the voltage on node n1 is zero volts regardless of input setting when the threshold is 6 (e.g., n+1).

Thus, the same circuit can be used as a majority/minority gate logic majority/minority gate-like logic (or threshold logic gate), AND/NAND, OR/NOR gate, a gate driving a predetermined output, or a disconnected gate by conditioning the inputs and resetting or setting the voltage on the summing node in a sequence during a reset phase. Subsequently, in the evaluation phase the circuit will behave as a 5-input majority/minority gate logic, 5-input majority/minority gate-like or threshold logic, 5-input AND/NAND gate, 5-input OR/NOR gate, an always-on gate, or a disconnected gate.

Table 7 illustrates an example of input conditioning to set various thresholds during a reset phase for 5-input capacitive circuit 1900. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 7

| 'a' | 'b' | 'c' | 'd' | 'e' | T1 | T2 | T3 | Threshold |
|---|---|---|---|---|---|---|---|---|
| 0 | 0 | 0 | 0 | 0 | 1 (enable MN1) | 0 (disable MN1) | 0 (enable MP1) | 0 |
| 1 | 0 | 0 | 0 | 0 | 1 (enable MN1) | 0 (disable MN1) | 0 (enable MP1) | 1 |
| 1 | 1 | 0 | 0 | 0 | 1 (enable MN1) | 0 (disable MN1) | 0 (enable MP1) | 2 |
| 1 | 1 | 1 | 0 | 0 | 1 (enable MN1) | 0 (disable MN1) | 0 (enable MP1) | 3 |
| 1 | 1 | 1 | 1 | 0 | 1 (enable MN1) | 0 (disable MN1) | 0 (enable MP1) | 4 |
| 1 | 1 | 1 | 1 | 1 | 1 (enable MN1) | 0 (disable MN1) | 0 (enable MP1) | 5 |
| 0 | 0 | 0 | 0 | 0 | 0 (enable MP1) | 1 (disable MP1) | 1 (enable MN1) | 1 |
| 1 | 0 | 0 | 0 | 0 | 0 (enable MP1) | 1 (disable MP1) | 1 (enable MN1) | 2 |
| 1 | 1 | 0 | 0 | 0 | 0 (enable MP1) | 1 (disable MP1) | 1 (enable MN1) | 3 |
| 1 | 1 | 1 | 0 | 0 | 0 (enable MP1) | 1 (disable MP1) | 1 (enable MN1) | 4 |

TABLE 7-continued

| 'a' | 'b' | 'c' | 'd' | 'e' | T1 | T2 | T3 | Threshold |
|---|---|---|---|---|---|---|---|---|
| 1 | 1 | 1 | 1 | 0 | 0 (enable MP1) | 1 (disable MP1) | 1 (enable MN1) | 5 |
| 1 | 1 | 1 | 1 | 1 | 0 (enable MP1) | 1 (disable MP1) | 1 (enable MN1) | 6 |

Table 8 illustrates a logic function achieved in the evaluation phase by configuring the threshold is the reset phase for 5-input capacitive circuit 1900. In various embodiments, the pull-up device MP1 and the pull-down device MN1 are disabled during the evaluation phase.

TABLE 8

| Threshold | Logic Function on node n1 | Logic function on node "out" |
|---|---|---|
| 0 | Logic 1 | Logic 0 |
| 1 | OR | NOR |
| 2 | Majority 0 gate-like (e.g., a threshold gate with a threshold of 2) | Minority 0 gate-like (e.g., an inverted threshold gate with a threshold of 2) |
| 3 | Majority gate | Minority gate |
| 4 | Majority 1 gate-like (e.g., a threshold gate with a threshold of 4) | Minority 1 gate-like (e.g., an inverted threshold gate with a threshold of 4) |
| 5 | AND | NAND |
| 6 | Logic 0 | Logic 1 |

By setting inputs to have a particular number of 0s and 1s and at the same time controlling the logic level appearing at the summation node (n1) by controlling the pull-up and pull-down devices in a sequence, two effects are accomplished, in accordance with various embodiments. First, each capacitor stores a deterministic charge. Second, a specific displacement charge is put on the summing or floating node n1. Setting a specific displacement charge value at the floating node n1 sets the threshold of when the floating node (n1) during the evaluation phase is allowed to go to the logic value of 0 or 1. For example, for an n-input threshold gate, if the threshold is set such that the floating node n1 goes closer to 1 logic level than 0 logic level, when all of the inputs are set to 1, then the capacitive input circuit becomes a NAND gate. Similarly, if it is desired that any one input becomes logic 1 in the evaluation phase to give voltage closer to logic level 1 at the floating node, then the circuit becomes an OR gate with n-inputs. Similarly, any intermediate threshold from 0 to n can be set. In some embodiments, a threshold of zero means that the gate becomes a buffer. For instance, the circuit is always turned on to input logic level 1. A threshold of n+1 for an n-input gate means that the summation node n1 may not go closer to logic level 1, even when all the inputs are set to 1. This would mean that the capacitive input circuit becomes a disconnected circuit.

In general, the input capacitive circuit when configured as a threshold gate, it can be expressed as:

$$Y = 1 \text{ if } \sum_{j=1}^{m} W_j X_j \geq T,$$
$$Y = 0 \text{ if } \sum_{j=1}^{m} W_j X_j < T,$$

Where 'Y' is the output (logic level on node n1), 'X' is the input, 'W' is the capacitive weight, and 'T' is the threshold. Assuming all Ws are ones (e.g., all capacitors have the same capacitance), when T is equal to the number of inputs, and AND gate is realized at node n1. In this example, for a 3-input capacitive circuit, a 3-input AND gate is realized when threshold is set to 3. In another example, when T equals 1, a NOR gate is realized at node n1. In yet another example, when T is equal to 0, the input capacitive circuit is always on, and the voltage on node n1 is logic 1. In yet another example, when T is greater than the number of inputs to the circuit, the circuit is always off or disconnected. In this case, voltage on node n1 is floating and may over time leak away.

While the embodiments are described with reference to up to 5-input capacitive circuit using equal ratio for the capacitance, the same idea can be expanded to any number of input capacitive circuits with equal or unequal ratio for capacitances. In various embodiments, the capacitances are ferroelectric capacitors. In some embodiments, the ferroelectric capacitors are planar capacitors. In some embodiments, the ferroelectric capacitors are pillar or trench capacitors. In some embodiments, the ferroelectric capacitors are vertically stacked capacitors to reduce the overall footprint of the multi-input capacitive circuit.

In some embodiments, the transistors (MP1 and MN1) that charge or discharge the summing node n1 are planar or non-planar transistors. In some embodiments, transistors MP1 and MN1 are fabricated in the front-end of the die on a substrate. In some embodiments, one of the transistors (e.g., MP1 or MN1) is fabricated in the front end of the die while another one of the transistors is fabricated in the backend of the end such that the stack of capacitors is between the frontend of the die and the backend of the die or between the two transistors. As such, the footprint of the multi-input capacitive circuit may be a footprint of a single transistor or slightly more than that. These backed transistors or switches can be fabricated using any suitable technology such as IGZO (Indium gallium zinc oxide). In some embodiments, the ferroelectric capacitors can be formed using transistors configured as capacitors, where transistor gates have ferroelectric material. These capacitors can be on the frontend or the backend of the die.

While the various embodiments are described with reference to driver circuitry 1901 connected at node n1, driver circuitry 1901 can be removed. When input capacitors for a capacitive input circuit are linear capacitors (e.g., comprising linear dielectric material), the voltage developed at node n1 may not reach rail-to-rail. As such, the subsequent driver circuitry 1901 connected to node n1 may experience static leakage. Static leakage increases power consumption. In various embodiments, when input capacitors comprise non-linear polar material (e.g., ferroelectric material), then the voltage developed on node n1 results in reduced static leakage in the subsequent driver circuitry 1901. One reason for this reduced leakage is because ferroelectric material in the input capacitors allow for voltage on node n1 to reach closer to rail-to-rail voltage, which reduces static leakage in subsequent driver circuitry 1901. Here, summation node n1 can maintain displacement charge (to provide logic 0 or logic 1 functions for the programmed threshold) for a longer period compared to linear capacitors. Consequently, the reset overhead of turning on/off the pull-up or pull-down devices is reduced. For example, when the leakage at the summation node n1 is low, the pull-up or pull-down devices may not need to turn on for tens of microseconds, which reduces the reset activity on node n1. Thus, circuit using nonlinear capacitors (e.g., ferroelectric capacitor) in this configuration becomes a viable option to realize low leakage logic circuits for advanced process technology nodes (e.g., advanced finFET process technology node).

Since the voltage on node n1 for the various threshold gates described herein is closer to rail-to-rail voltage compared to the case when linear input capacitors are used, subsequent driver circuitry 1901 can be removed. As such, the input capacitors with nonlinear polar material can drive another capacitive input circuit directly. Here, closer to rail-to-rail voltage on node n1 using nonlinear polar material based capacitors (e.g., ferroelectric or paraelectric capacitors) implies that the static leakage in the subsequent driver 1901 is reduced compared to the case when voltage on n1 is not close to rail-to-rail voltage. When linear capacitors are used, a voltage divider is formed on node n1 based on the number of capacitors and their logic inputs. Such a voltage divider results in non-rail-to-rail voltage on node n1 that results in static leakage in the subsequent driver 1901. When nonlinear capacitors are used, the voltage divider is not a linear voltage divider. This results in a much closer rail-to-rail voltage on n1 which reduces static leakage in the subsequent driver 1901. The higher the nonlinearity, the closer the voltage on node n1 is rail-to-rail. Nonlinear capacitors as shown in various embodiments allow the logic gate to have more inputs compared to the case when linear capacitors are used while keeping the leakage through driver 1901 low.

In various embodiments, 5-input configurable threshold gate 1900 can be configured as a stack and fold configuration as described with reference to FIGS. 18A-G. For linear non-planar capacitors, example structures are described with reference to FIGS. 3A-B. For non-linear non-planar capacitors, example structures are described with reference to FIGS. 5A-B.

Figure 19B:
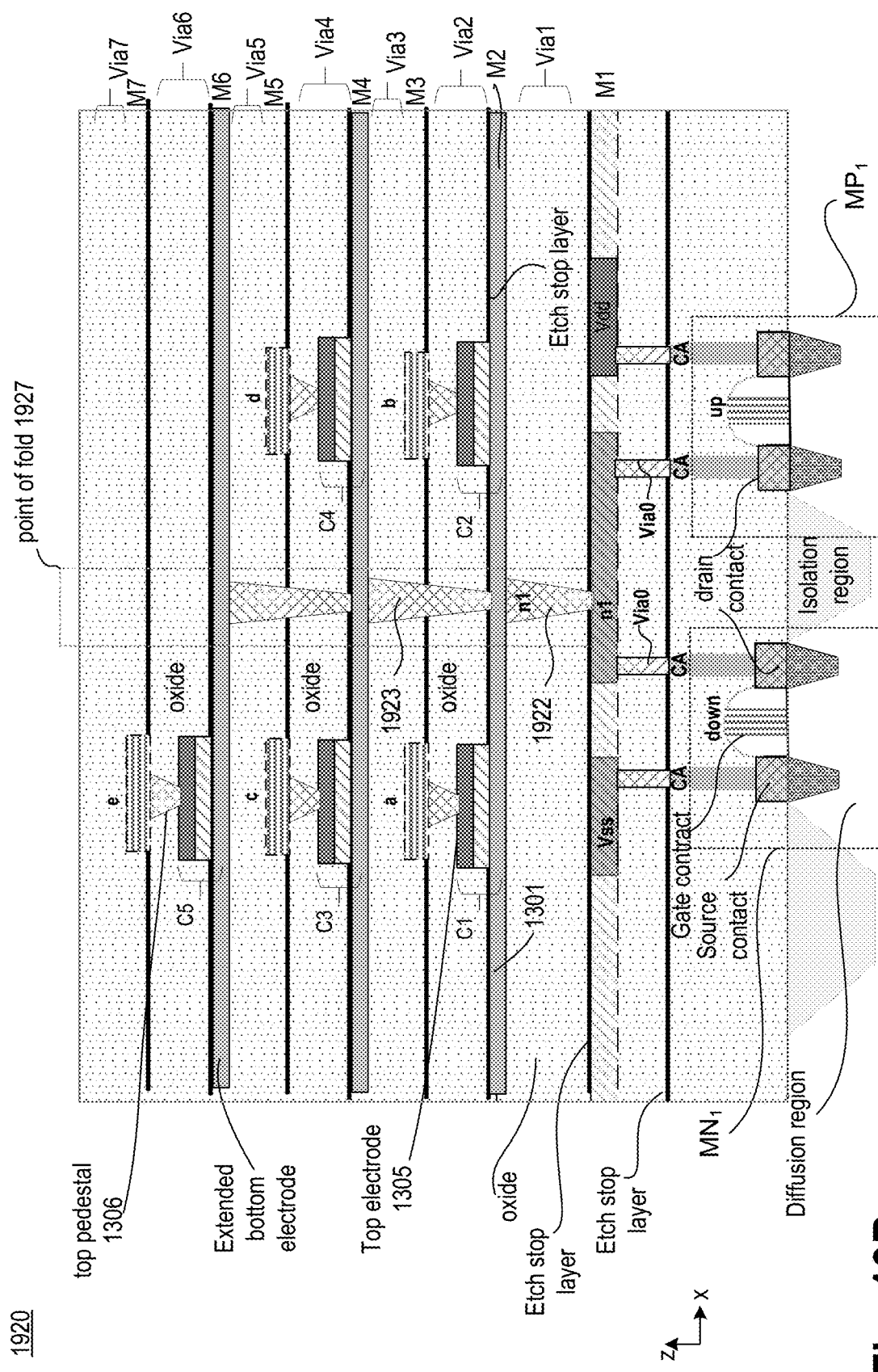
FIG. 19B illustrates a 5-input configurable threshold gate with a pull-down device and a pull-up device and with ferroelectric capacitors that are arranged as stacked and folded planar capacitors, and with an aligned central pedestal and extended bottom electrode, in accordance with some embodiments.

FIG. 19B illustrates 5-input configurable threshold gate 1920 (e.g., 1900) with the pull-down device MN1 and pull-up device MN2 and with ferroelectric capacitors that are arranged as stacked and folded planar capacitors, and with an aligned central pedestal and extended bottom electrode, in accordance with some embodiments. In some embodiments, the five capacitors C1, C2, C3, C4, and C5 are arranged in a stacked and folded configuration, where there are 3 stacks and one fold along point of fold 1927. In some embodiments, a vertical tower of vias and metal layers are used to extend the summing node n1 to higher levels along the vertical direction. For example, via 1922 is connected to shared bottom electrode 1301 and to summing node n1 on M2. One or more vias 1923 then couple summing node n1 on M2 to the next shared bottom electrode on M4, and so on. As such, a network of vias is used to connect summing node n1 on M1 to shared bottom electrodes of each capacitive structure on various metal layers.

In some embodiments, the first stack capacitors C1 and C2 are symmetrically placed on either side of the point of fold 1327. In some embodiments, the second stack capacitors C3 and C4 are symmetrically placed on either side of the point of fold 1327. On the third stack, capacitor C5 can be placed above capacitor C3 such that there is no horizontal offset between capacitor C3 and C5, in accordance with some embodiments. In this example, the third stack is asymmetric because there is one capacitor on one side of point of fold 1327 and no capacitor on the other side of point of fold 1327. In some embodiments, the capacitors are horizontally offset relative to their bottom capacitors.

Figure 19C:
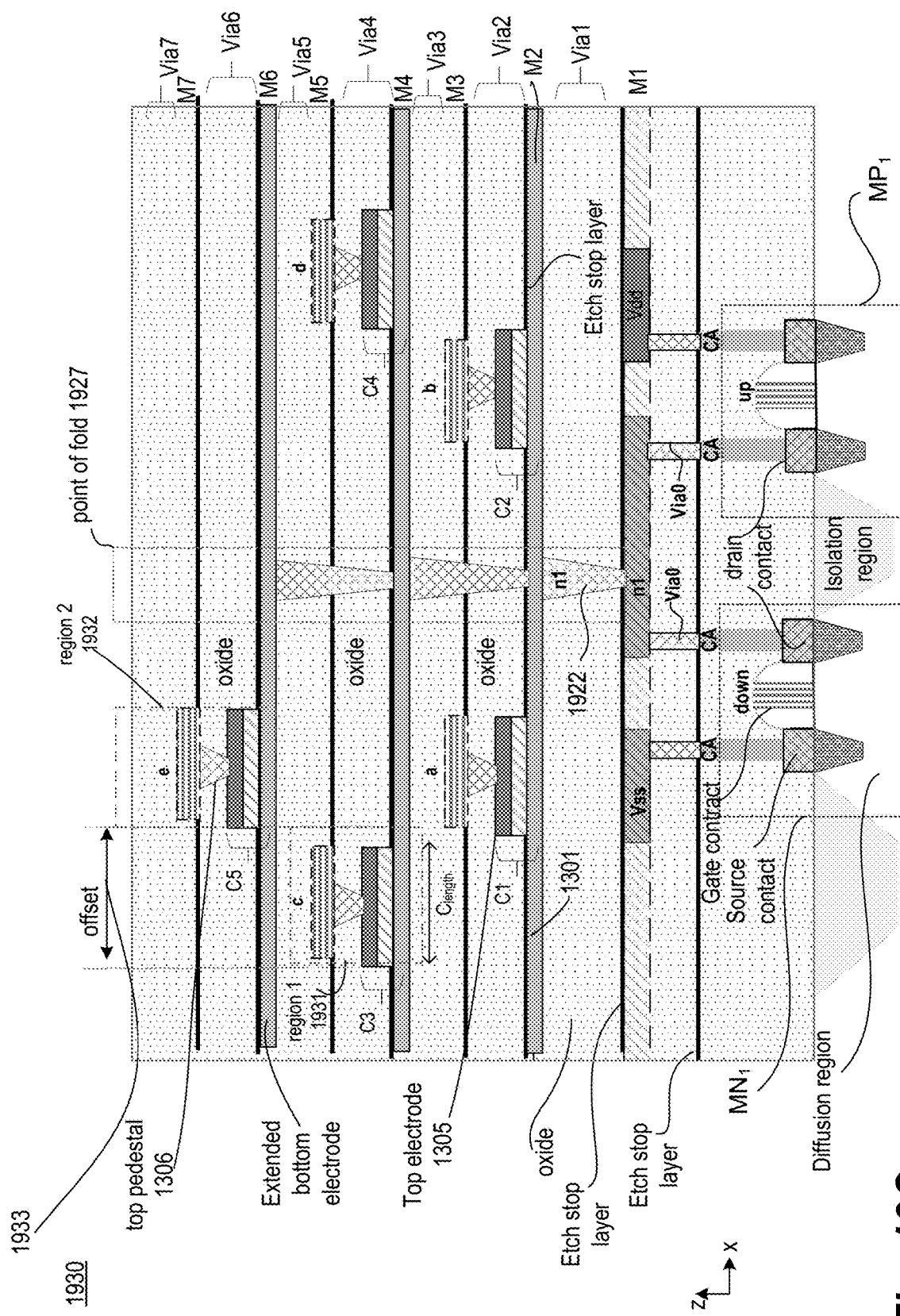
FIG. 19C illustrates a 5-input configurable threshold gate with the pull-down device MN1 and pull-up device MN2 and with ferroelectric capacitors that are arranged as stacked and folded planar capacitors with an offset, and with an aligned central pedestal and an extended bottom electrode, in accordance with some embodiments.

FIG. 19C illustrates 5-input configurable threshold gate 1930 (e.g., 1900) with the pull-down device MN1 and pull-up device MN2 and with ferroelectric capacitors that are arranged as stacked and folded planar capacitors with an offset, and with an aligned central pedestal and an extended bottom electrode, in accordance with some embodiments. Compared to FIG. 19B, here the capacitor stacks that share extended bottom electrode 1302 are vertically offset from one another. In this example, offset 1933 is illustrated as offset between capacitors C3 and C5, both of which are on different shared bottom electrodes and in a vertical stack. Continuing with this example, capacitor C3 occupies first region 1931 (which includes the layers that form the capacitor including the top electrode pedestal and the input-line c). Capacitor C5 occupies second region 1932 (which includes the layers that form the capacitor including the top electrode pedestal and the input-line e). In some embodiments, first region 1931 and second region 1932 are laterally offset by offset 1933. In some embodiments, offset 1933 can be substantially equal to a lateral length $C_{length}$ of first capacitor C3. In some embodiments, offset 1933 is less than the lateral length $C_{length}$ of the capacitor C3 such that first region 1931 overlaps second region 1932. In some embodiments, offset 1933 can be used to route the input-lines of the capacitors through the voids caused by the offsets. The offset can be between a lateral distance of two times a lateral length of the dielectric material and 5% of the lateral length of the dielectric material, in accordance with some embodiments. Other offset distances may also be used. As such, capacitors are placed in a stack and folded manner and staggered relative to one another.

Figure 19D:
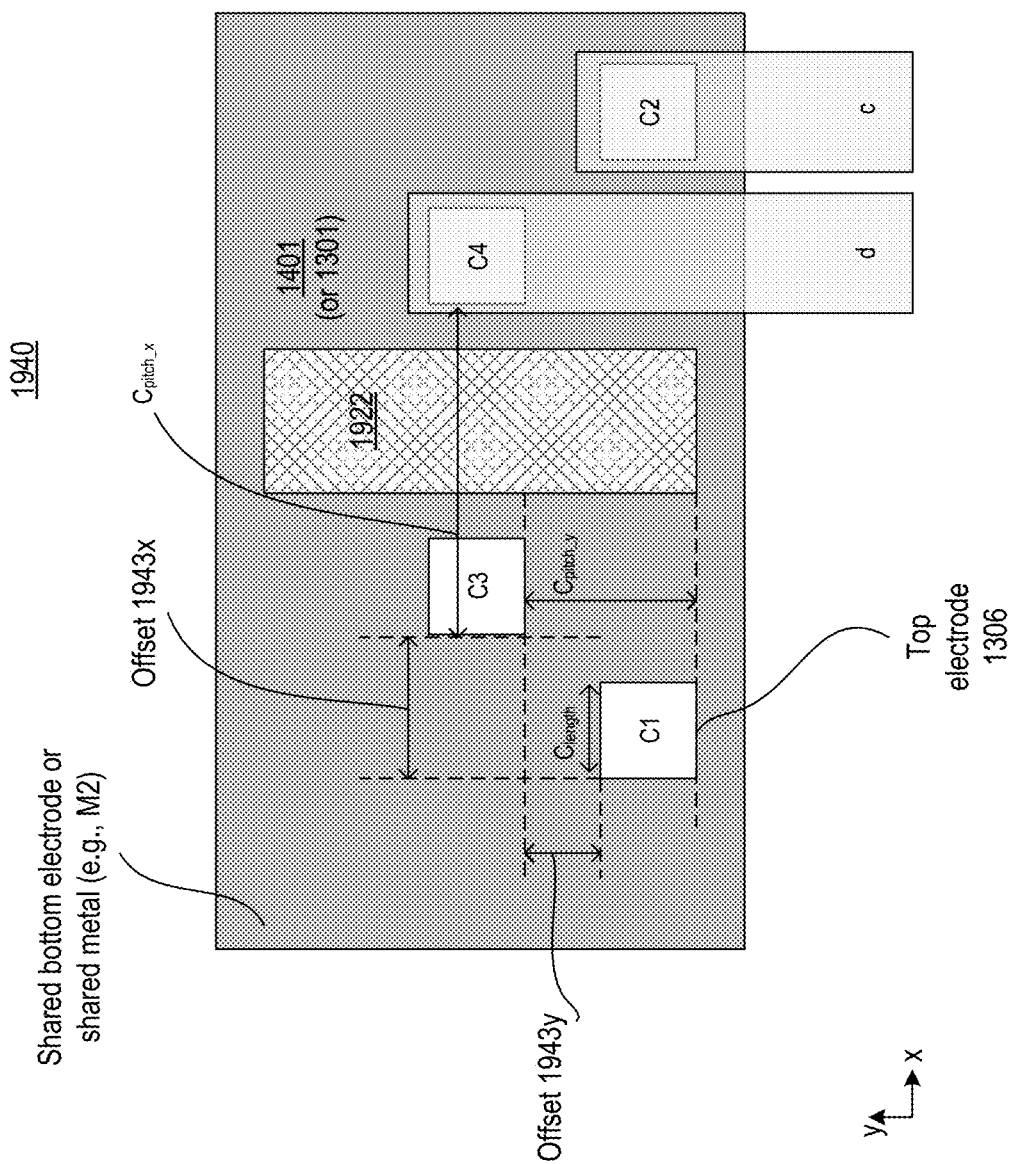
FIG. 19D illustrates a top view cross-section of a capacitor placement configuration, where planar capacitors are staggered on a shared bottom electrode or shared metal, in accordance with some embodiments.

FIG. 19D illustrates a top view cross-section of a capacitor placement configuration 1940 where planar capacitors are staggered on a shared bottom electrode or shared metal, in accordance with some embodiments. In some embodiments, the capacitors are vertically stacked in a stacked and folded configuration with vertical offset as shown in FIG. 19C. In some embodiments, in addition to the placement of the capacitors with offset in the vertical z-plane (FIG. 19C), capacitors can also be staggered with offset in the horizontal plane (x-y plane). In some embodiments, all capacitors are placed on shared bottom electrode 1301 or shared metal 1401 in a staggered configuration. This staggered configuration is a staggering of capacitors in the x-y plane (horizontal plane).

In this example, additional capacitors C1, C2, C3, and C4, are coupled to shared bottom electrode 1301 or shared extended metal 1401. In some embodiments, these additional capacitors are placed on either side of via 1922, which established the point of fold. In some embodiments, via 1922 does not exist because all capacitors are on shared bottom electrode 1301 or shared extended metal 1401. One purpose of staggering the capacitors is to allow for internal nodes or plate-lines to route in parallel.

In some embodiments, the capacitors on an individual metal layer (e.g., 1301 or 1401) may be symmetrically placed on either side of via 1922, in accordance with some embodiments. In some embodiments, capacitors on an individual metal layer (e.g., 1301 or 1401) may be asymmetrically placed on either side of via 1922, in accordance with some embodiments. In some embodiments, the capacitors on shared bottom electrode 1301 or shared metal 1401 are staggered with an x-offset 1943x and/or a y-offset 1943y. In some embodiments, x-offset 1943x and/or y-offset 1943y can be a lateral distance which is function of $C_{pitch\_x}$ or $C_{pitch\_y}$ depending on the escape routing of lines coupled to the top electrodes of the capacitors, in accordance with some embodiments. Other offset distances may also be used.

In various embodiments, the staggered capacitors on shared bottom electrode 1301 or shared metal 1401 allow for metal route escapes for the plate-lines. For example, capacitor C4 is coupled to input d, and capacitor C2 is coupled to input c. In some embodiments, input lines carrying inputs (e.g., a, b, c, d, e) are parallel to one another. The staggered configuration allows for the input lines on either side of shared bottom electrode 1301 or shared metal 1401, in accordance with some embodiments. In some embodiments, all capacitors of the multi-input threshold gate are placed in a staggered configuration of FIG. 19D on shared bottom electrode 1301 or shared metal 1401. In one such embodiment, the capacitors are not stacked and folded, but staggered with horizontal offsets in the x and y directions. In some embodiments, via 1922 is removed when all capacitors are placed in a staggered configuration of FIG. 19D on shared bottom electrode 1301 or shared metal 1401.

In some embodiments, the offset 1943x is 50% of $C_{pitch\_x}$ when there are two rows of capacitors on shared electrode 1301 or metal plane 1401. In some embodiments, the offset 1943x is substantially 50% of $C_{pitch\_x}$ when there are two rows of capacitors on shared electrode 1301 or metal plane 1401. In this example of FIG. 19D, two rows are shown. In some embodiments, the offset 1943x are substantially 33% of $C_{pitch\_x}$ when there are three rows of capacitors on shared electrode 1301 or metal plane 1401. In some embodiments, all capacitors are formed on shared electrode 1301 or metal plane 1401 in a staggered configuration. One such embodiment is illustrated by FIG. 19E.

Figure 19E:
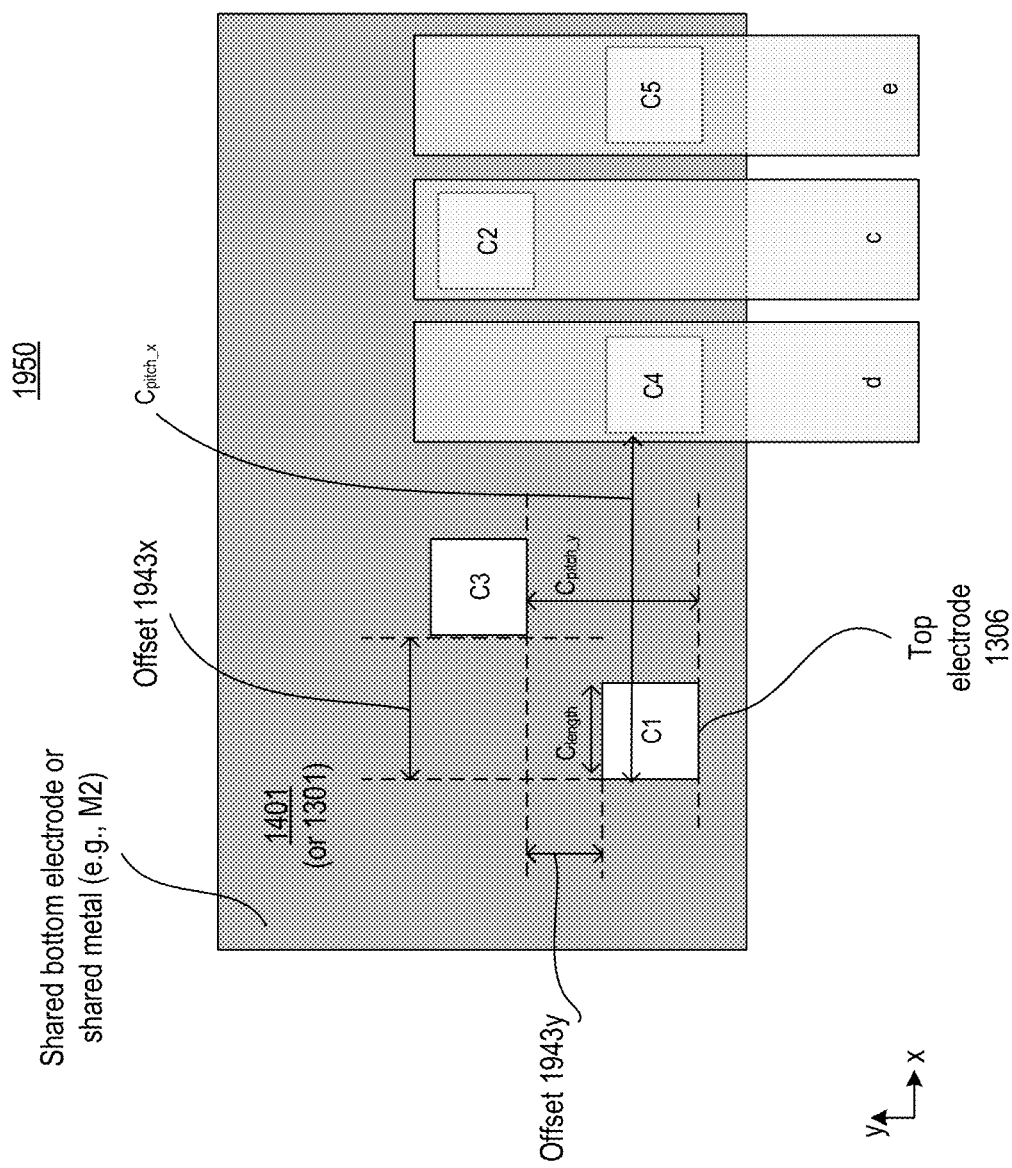
FIG. 19E illustrates a top view cross-section of a capacitor placement configuration where planar capacitors are staggered on a shared bottom electrode or shared metal, in accordance with some embodiments.

FIG. 19E illustrates a top view cross-section of a capacitor placement configuration 1950 where planar capacitors are staggered on a shared bottom electrode or shared metal, in accordance with some embodiments. Compared to FIG. 19D, here capacitors C1, C2, C3, C4, and C5 are not stacked and folded, but staggered with horizontal offsets in the x and y directions. All capacitors of 5-input configurable threshold gate 1900 share a same bottom electrode 1301 or shared metal plane 1401, in accordance with some embodiments.

Figure 19F:
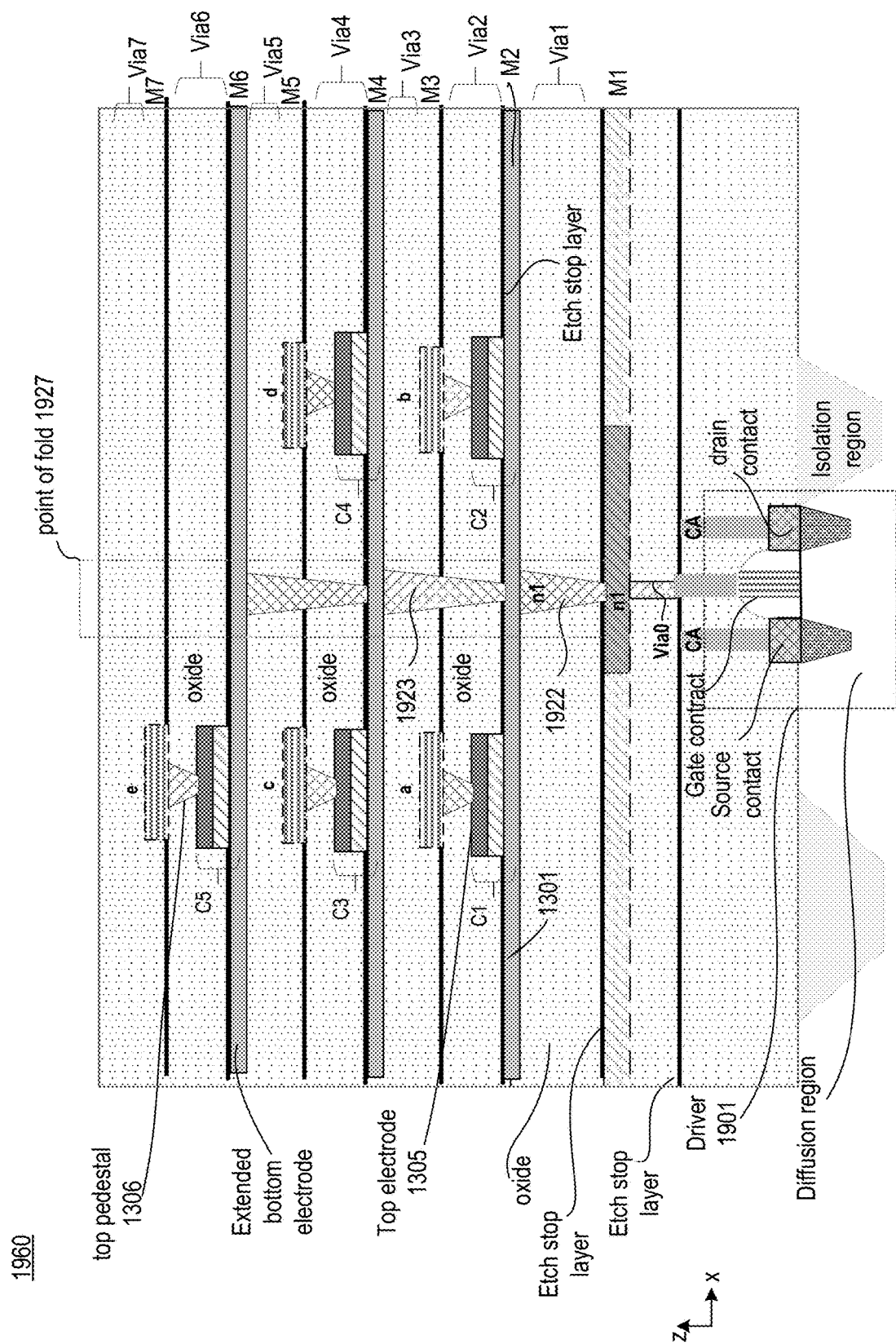
FIG. 19F illustrates a 5-input configurable threshold gate with driver circuitry and with ferroelectric capacitors that are arranged as stacked and folded planar capacitors, and with an aligned central pedestal and extended bottom electrode, in accordance with some embodiments.

FIG. 19F illustrates 5-input configurable threshold gate 1960 (e.g., 1900) with driver circuitry and with ferroelectric capacitors that are arranged as stacked and folded planar capacitors, and with an aligned central pedestal and extended bottom electrode, in accordance with some embodiments. Compared to FIG. 19B, pull-down device MN1 and pull-up device MP1 are not used. Instead, summing node n1 is directly coupled to the gate of driver 1901. The source and drain terminals of the transistor of driver 1901 can be connected to other devices or power rails.

The various embodiments illustrated here for ferroelectric material can replace ferroelectric material with anti-ferroelectric material. Examples of anti-ferroelectric (AFE) material include lead zirconate titanate (PZT) with high Zr doping, La-doped PZT with high Zr doping, HfSiO2 with high Si doping, HfZrO2 (HZO) with high Zr doping, ZrO2, PbZrO3 (Lead Zirconate), NH4H2PO4 (Ammonium dihydrogen phosphate (ADP)), NaNbO3 (Sodium Niobate), and K doped NaNbO3, etc. Table 9 also describes some bulk anti-ferroelectric materials, with various physical/chemical modifications for enhancing energy storage density.

TABLE 9

| Material name | Physical/Chemical Modifications | Energy Density (J/cm$^3$) | Electric Field (kV/cm) |
|---|---|---|---|
| (Pb0.97La0.02)(Zr0.97Ti0.03)O3 | 3 wt % glass (PbO—B2O3—SiO2—ZnO) | 3.1 | 581 |
| (Pb0.97La0.02)(Zr0.97Ti0.03)O3 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94—xLa0.04Bax)[(Zr0.60Sn0.40)0.841Ti0.16]O3 | x = 0 (0 MPa) | 0.35 | 30 |
| (Pb0.94—xLa0.04Bax)[(Zr0.60Sn0.40)0.841Ti0.16]O3 | x = 0.02 (20 MPa) | 0.38 | 30 |
| Pb0.99Nb0.02[(Zr0.60Sn0.40)0.95Ti0.05]O3 | — | 0.62 | 56 |
| Pb0.97La0.02(Zr0.56Sn0.35Ti0.09)O3 | 4 wt % glass (CdO—Bi2O3—PbO—ZnO—Al2O3—B2O3—SiO2) | 3.3 | 150 |
| Pb0.97La0.02(Zr0.56Sn0.35Ti0.09)O3 | Without glass | 1.9 | 110 |
| (Pb0:97La0:02)(Zr0:92Sn0:05Ti0:03)O3 | 3% glass (0.8PbO—0.2B2O3) | 7.4 | 475 |
| (Pb0:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03)(Zr0.74Sn0.22Ti0.04) | — | 1.2 | 100 |
| (Bi1/2Na1/2)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi1/2Na1/2TiO3—0.20Bi1/2K1/2TiO3)-0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008)(Zr0.65Sn0.3Ti0.05)O3-(Pb0.97La0.02)(Zr0.9Sn0.05Ti0.05)O3 | — | 4.65 | 200 |
| 0.89Bi0.5Na0.5TiO3—0.06BaTiO3—0.05K0.5Na0.5NbO3 | double stage sintering | 0.90 | 100 |
| (Pb0.858Ba0.1La0.02Y0.008)(Zr0.65Sn0.3Ti0.05)O3-(Pb0.97La0.02)(Zr0.9Sn0.05Ti0.05)O3 | spark plasma sintering | 6.40 | 275 |
| (Pb0.858Ba0.1La0.02Y0.008)(Zr0.65Sn0.3Ti0.05)O3-(Pb0.97La0.02)(Zr0.9Sn0.05Ti0.05)O3 | conventional sintering | 4.65 | 200 |
| (Na1 xCax)(Nb1 xZrx)O3 x = 0.04 | conventional sintering | 0.91 | 130 |
| (Pb0.92La0.04Ba0.02)[(Zr0.60Sn0.40)0.84Ti0.16]O3 | at 90 MPa | 0.91 | 60 |
| 0.91(Bi0.5Na0.5)TiO3—0.07BaTiO3—0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 20A:
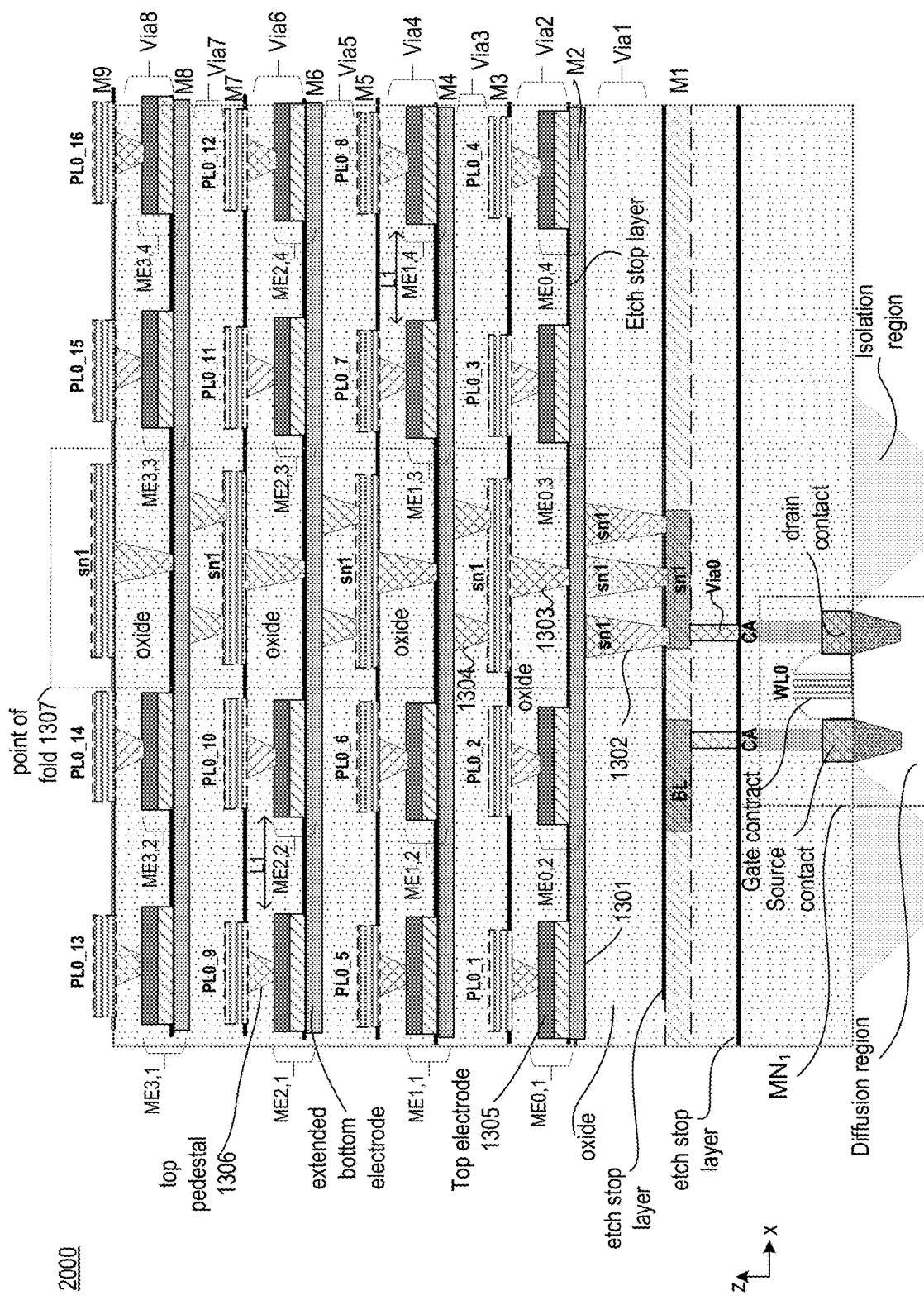
FIG. 20A illustrates a one transistor and multiple memory element (1Tn(ME)) bit-cell with stacked and folded memory elements that use extended bottom electrodes and misaligned central pedestals, in accordance with some embodiments.

FIG. 20A illustrates a one transistor and multiple memory element (1Tn(ME)) bit-cell 2000 with stacked and folded memory elements that use extended bottom electrodes and misaligned central pedestals, in accordance with some embodiments. In this example, the memory bit-cell comprises one transistor $MN_1$ having a gate terminal controllable by WL0. The source and drain terminals or contacts of the transistor are coupled to respective contacts (CA). Etch stop layer is used in the fabrication of vias (via0) to connect one of the source or drain contacts of the transistor to the storage node sn1 on metal-1 (M1) layer, and another one of the source or drain contacts of the transistor to BL on M1 layer. In some embodiments, another etch stop layer is formed over M1 layer to fabricate vias (via1) to couple to respective M1 layers.

In this example, the 1TnC memory bit-cell has 16 memory elements. However, any number of memory elements may be used for 1TnC memory bit-cell. An individual memory element has a bottom electrode 1301 which is coupled to storage node sn1 1302 (1303, 1304) and top electrode 1305 which is coupled to a respective plate-line. In some embodiments, top electrode 1305 is coupled to the plate-line via pedestal 1306. In the stack and fold configuration, memory elements N number of memory elements can be divided in L number of stack layers such that there are N/L memory elements in each memory element stack layer. In this example, 16 memory elements (ME0,1, ME0,2, ME0,3, ME0,4, ME1,1, ME1,2, ME1,3, ME1,4, ME2,1, ME2,2, ME2,3, ME2,4, ME3,1, ME3,2, ME3,3, and ME3,4) are divided in four number of stacked layers such that there are 16/4 memory elements in each stacked layer. Each memory element has a first terminal coupled to a common node sn1 1302, and a second terminal coupled to a respective plate-line. In various embodiments, common node sn1 1302 thus becomes a point of fold 1307.

In the various embodiments, the planar memory elements are illustrated with three layers—top electrode, dielectric, and bottom electrode. While memory elements can be formed like that, the illustrative memory element can include any of the memory element configurations discussed herein. For example, the planar memory elements can be any one of memory elements of FIG. 20E.

Referring to FIG. 20A, in some embodiments, the memory elements are positioned symmetrically relative to point of fold 1307, common node sn1. In one example, equal number of memory elements are positioned on either sides of the common node sn1 and in the stack. In some embodiments, the memory elements are not positioned symmetrically relative to the point of fold. For example, there may be more memory elements on one side of the storage node sn1 relative to another side. Further, each layer may also have a symmetric or non-symmetric arrangement of the memory elements. In some embodiments, the memory elements are spaced by substantially at equal lateral (horizontal x-plane) distance L1. In some embodiments, the memory elements are separated by non-equal lateral distance.

In a stacked only configuration, the memory elements would be vertically stacked resulting in a tall memory cell. In that case, depending on the process technology node, the number of memory elements may be limited by the number of metal layers available by the process technology node. In the stack and fold configuration, the memory elements are vertically stacked as well as horizontally placed by sharing a common electrode, which in turn couples to a shared node (e.g., storage node sn1). So, first terminals of the memory elements are coupled to the shared node sn1.

In some embodiments, in the first row, the second terminal of ME0,1 is coupled to plate-line PL0_1, the second terminal of ME0,2 is coupled to plate-line PL0_2, the second terminal of ME0,3 is coupled to plate-line PL0_3, and the second terminal of ME0,4 is coupled to plate-line PL0_4. In some embodiments, in the second row, the second terminal of ME1,1 is coupled to plate-line PL0_5, the second terminal of ME1,2 is coupled to plate-line PL0_6, the second terminal of ME1,3 is coupled to plate-line PL0_7, and the second terminal of ME1,4 is coupled to plate-line PL0_8. In some embodiments, in the third row, the second terminal of ME2,1 is coupled to plate-line PL0_9, the second terminal of ME2,2 is coupled to plate-line PL0_10, the second terminal of ME2,3 is coupled to plate-line PL0_11, and the second terminal of ME2,4 is coupled to plate-line PL0_12. In some embodiments, in the fourth row, the second terminal of ME3,1 is coupled to plate-line PL0_13, the second terminal of ME3,2 is coupled to plate-line PL0_14, the second terminal of ME3,3 is coupled to plate-line PL0_15, and the second terminal of ME3,4 is coupled to plate-line PL0_16.

In some embodiments, each memory element structure includes a shared bottom electrode 1301 which couples to the memory elements of that row and to the common node sn1 1302. In some embodiments, multiple vias are used for common node sn1 to connect the common node sn1 on M1 to shared bottom electrode 1301. In this example, three vias are shown. Fewer or more vias for storage node sn1 may be used. In some examples, multiple vias are used for storage node sn1 to couple to shared bottom electrode 1301 to reduce reliability issues like electromigration. In some embodiments, a vertical tower of vias and metal layers are used to extend the storage node sn1 to higher levels along the vertical direction. For example, via 1303 is connected to shared bottom electrode 1301 (on M2) and to storage node sn1 on M3. Via 1303 is connected to a top surface of shared bottom electrode 1301 and to the next metal layer M3. Multiple vias 1304 then couple storage node sn1 on M3 to the next shared bottom electrode on M4, and so on. Vias 1304 may be misaligned relative to via 1303. As such, a network of vias is used to connect storage node sn1 on M1 to shared bottom electrodes of each memory element structure on various metal layers.

In some embodiments, shared bottom electrode 1301 (or the extended bottom electrode) can be a metal electrode or a first conductive oxide, or a combination of a second conductive oxide and a barrier or insulative material, in accordance with some embodiments. The barrier material or insulative material can be according to any one of the insulative materials discussed herein. In some embodiments, shared bottom electrode 1301 comprises a reflective intermetallic material. By using a shared bottom electrode, fabrication steps for fabricating each memory element are reduced. Further, the vertical height is also reduced for the memory bit-cell.

In some embodiments, a metal layer is formed over top electrode of each memory element to connect to a respective input. In some embodiments, a pedestal is formed between the top electrode and the metal layer connected to the respective input. For example, metal layer over a pedestal which is adjacent to the top electrode of memory element ME0,1 is connected to plate-line PL0_1. Metal layer over a pedestal which is adjacent to the top electrode of memory elements ME1,1 is connected to plate-line PL0_5 and so on. In some embodiments, the pedestals have a barrier material on its sidewalls as discussed with reference to FIG. 4C.

Referring to FIG. 20A, the metal layers coupled to the bottom electrodes of the memory elements are coupled to storage node sn1 through respective vias. In some embodiments, multiple vias connect the bottom extended electrode of each memory element stack. These multiple vias are connected to the storage node sn1. The multiple vias, connected to the metal layer (e.g., M3) for sn1 as the storage node, connect to extended bottom electrode of higher memory elements in the stack. In this example, the vias for storage node sn1 are misaligned relative to the center storage node sn1 via. On each metal layer for sn1, at least two vias are formed to connect to the subsequent higher metal layer based extended bottom electrode. While the embodiment of FIG. 20A illustrates misaligned vias or pedestals, the vias or pedestals can also be aligned vias and pedestals.

In some embodiments, metal-2 (M2) is deposited over vias (via1). M2 layer is then polished. In some embodiments, memory elements can be moved further up in the stack, where the memory element level processing is done between different layers. In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar memory element. In some embodiments, the memory elements are formed in a backend of the die. In some embodiments, deposition of ILD is followed by surface polish.

In some embodiments, after polishing the surface, ILD is deposited, in accordance with some embodiments. Thereafter, holes are etched through the ILD to expose the top electrodes of the memory elements, in accordance with some embodiments. The holes are then filled with metal, in accordance with some embodiments. Followed by filling the holes, the top surface is polished, in accordance with some embodiments. As such, the memory elements are connected to plate-lines and storage node sn1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next memory elements of the stack, forming the memory elements, and then forming vias that contact the M3 layer are repeated. This process is repeated to form various memory elements in the stack.

In some embodiments, the top electrode of each memory element is allowed to directly contact the metal above. For example, the pedestals that connect to the top electrodes are removed. In this embodiment, the height of the stacked memory elements is lowered, and the fabrication process is simplified because the extra steps for forming the pedestals are removed.

Figure 20B:
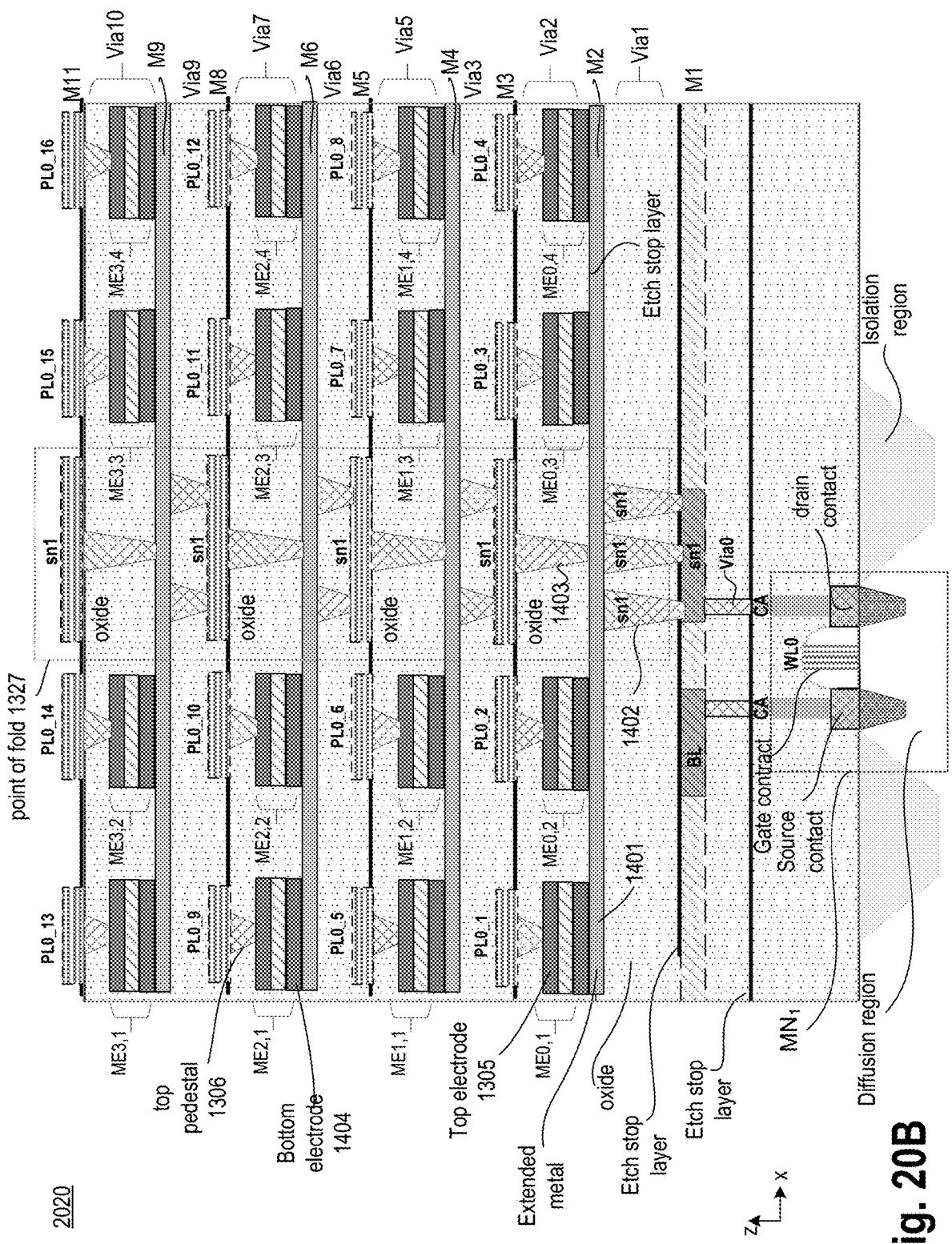
FIG. 20B illustrates 1Tn(ME) bit-cell with stacked and folded planar memory elements that use extended shared metal and misaligned central pedestals, in accordance with some embodiments.

FIG. 20B illustrates 1Tn(ME) bit-cell 2020 with stacked and folded planar memory elements that use extended shared metal, in accordance with some embodiments. 1Tn (ME) bit-cell 2020 is like 1Tn(ME) bit-cell 2000 but with extended shared metal 1401 instead of extended or shared bottom electrode 1301. While extended shared metal 1401 is coupled to the bottom electrodes of each memory element in the same horizontal region, each memory element includes its own bottom electrode 1404. In various embodiments, the vias or pedestals 1402 and 1403 for storage node sn1 are coupled or connected to extended shared metal 1401.

In some embodiments, pedestals or vias are formed for both the top and bottom electrodes of the planar memory elements. In this embodiment, the height of the stacked capacitors is raised, and the fabrication process adds an additional step of forming a top pedestal or via which contacts with respective plate-line electrodes.

Figure 20C:
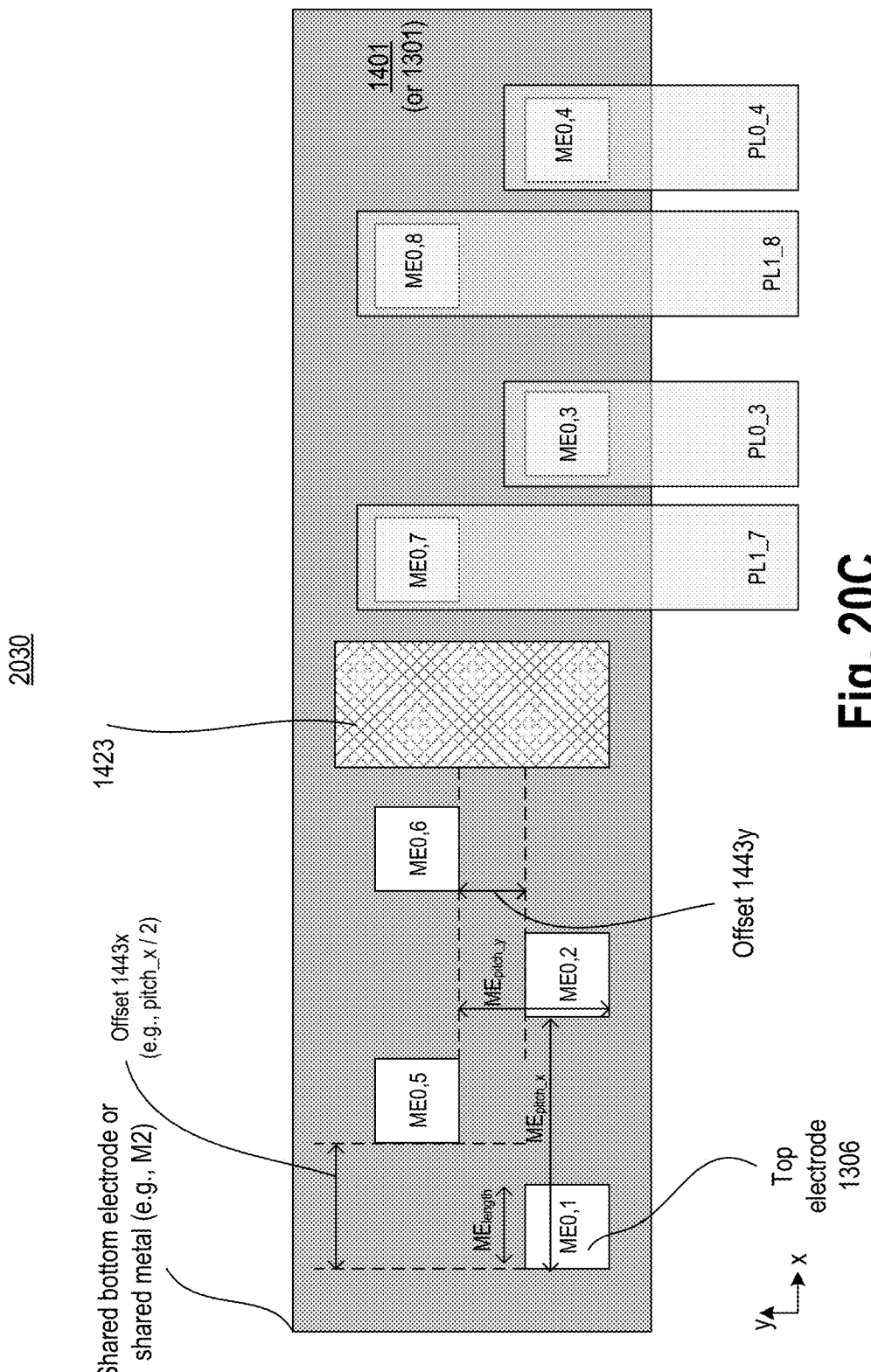
FIG. 20C illustrates a top view cross-section of a memory element placement configuration where planar memory elements are staggered on a shared bottom electrode or shared metal, in accordance with some embodiments.

FIG. 20C illustrates a top view cross-section of a memory element placement configuration 2030 where planar memory elements are staggered on a shared bottom electrode or shared metal, in accordance with some embodiments. In some embodiments, the memory elements are vertically stacked in a stacked and folded configuration with vertical offset as shown in FIG. 20C. In some embodiments, in addition to the placement of the memory elements with offset in the vertical z-plane, the memory elements can also be staggered with offset in the horizontal plane (x-y plane). Offset in the vertical z-plane are shown with reference to FIG. 13C and FIG. 14C. Those embodiments can be adapted for a generic memory element instead of just capacitors. In some embodiments, all memory elements are placed on shared bottom electrode 1301 or shared metal 1401 in a staggered configuration. This staggered configuration is a staggering of memory elements in the x-y plane (horizontal plane).

In this example, additional memory elements ME0,5, ME0,6, ME0,7, and ME0,8, are coupled to shared bottom electrode 1301 or shared extended metal 1401. In some embodiments, these additional memory elements are placed on either side of via 1423, which established the point of fold. In some embodiments, via 1423 does not exist because all memory elements are on shared bottom electrode 1301 or shared extended metal 1401. One purpose of staggering the memory elements is to allow for internal nodes or plate-lines to route in parallel.

In some embodiments, the memory elements on an individual metal layer (e.g., 1301 or 1401) may be symmetrically placed on either side of via 1423, in accordance with some embodiments. In some embodiments, memory elements on an individual metal layer (e.g., 1301 or 1401) may be asymmetrically placed on either side of via 1423, in accordance with some embodiments. In some embodiments, the memory elements on shared bottom electrode 1301 or shared metal 1401 are staggered with an x-offset 1443$x$ and/or a y-offset 1443$y$. In some embodiments, x-offset 1443$x$ and/or y-offset 1443$y$ can be a lateral distance which is function of $ME_{pitch\_x}$ or $ME_{pitch\_y}$ depending on the escape routing of lines coupled to the top electrodes of the memory elements, in accordance with some embodiments. Other offset distances may also be used.

In various embodiments, the staggered memory elements on shared bottom electrode 1301 or shared metal 1401 allow for metal route escapes for the plate-lines. For example, ME0,7 is coupled to plate-line PL1_7, ME0,3 is coupled to plate-line PL0_3, ME0,8 is coupled to plate-line PL1_8, ME0,4 is coupled to plate-line PL0_4. In some embodiments, these plate-lines are parallel to one another. The staggered configuration allows for the plate-line escapes on either side of shared bottom electrode 1301 or shared metal 1401, in accordance with some embodiments. In some embodiments, all memory elements of the 1TnME bit-cell are placed in a staggered configuration of FIG. 20C on shared bottom electrode 1301 or shared metal 1401. In one such embodiment, the memory elements are not stacked and folded, but staggered with horizontal offsets in the x and y directions. In some embodiments, via 1423 is removed when all memory elements are placed in a staggered configuration of FIG. 20C on shared bottom electrode 1301 or shared metal 1401.

In some embodiments, the offset 1443$x$ is 50% of $ME_{pitch\_x}$ when there are two rows of memory elements on shared electrode 1301 or metal plane 1401. In some embodiments, the offset 1443x is substantially 50% of $ME_{pitch\_x}$ when there are two rows of memory elements on shared electrode 1301 or metal plane 1401. In this example of FIG. 20C, two rows are shown. In some embodiments, the offset 1443x are substantially 33% of $ME_{pitch\_x}$ when there are three rows of memory elements on shared electrode 1301 or metal plane 1401. In some embodiments, all memory elements are formed on shared electrode 1301 or metal plane 1401 in a staggered configuration.

FIG. 20D illustrates 1Tn(ME) bit-cells 2040 and 2045 used for FIGS. 20A-C, in accordance with some embodiments. 1TnC bit-cell 2040 is the same as the 1TnC bit-cell described herein, but with 16 memory elements and 16 associated plate-lines. Any number of memory elements may be used. In this case, bit-line is parallel to plate-lines. This allows for efficient flow of current through the ME devices of the bit-cell. 1TnC bit-cell 2045 is the same as the 1TnC bit-cell described herein, but with 16 memory elements and 16 associated plate-lines. In this case, the plate-lines are parallel to the word-line. This may allow lower switching energy by the ME devices.

Figure 20E:
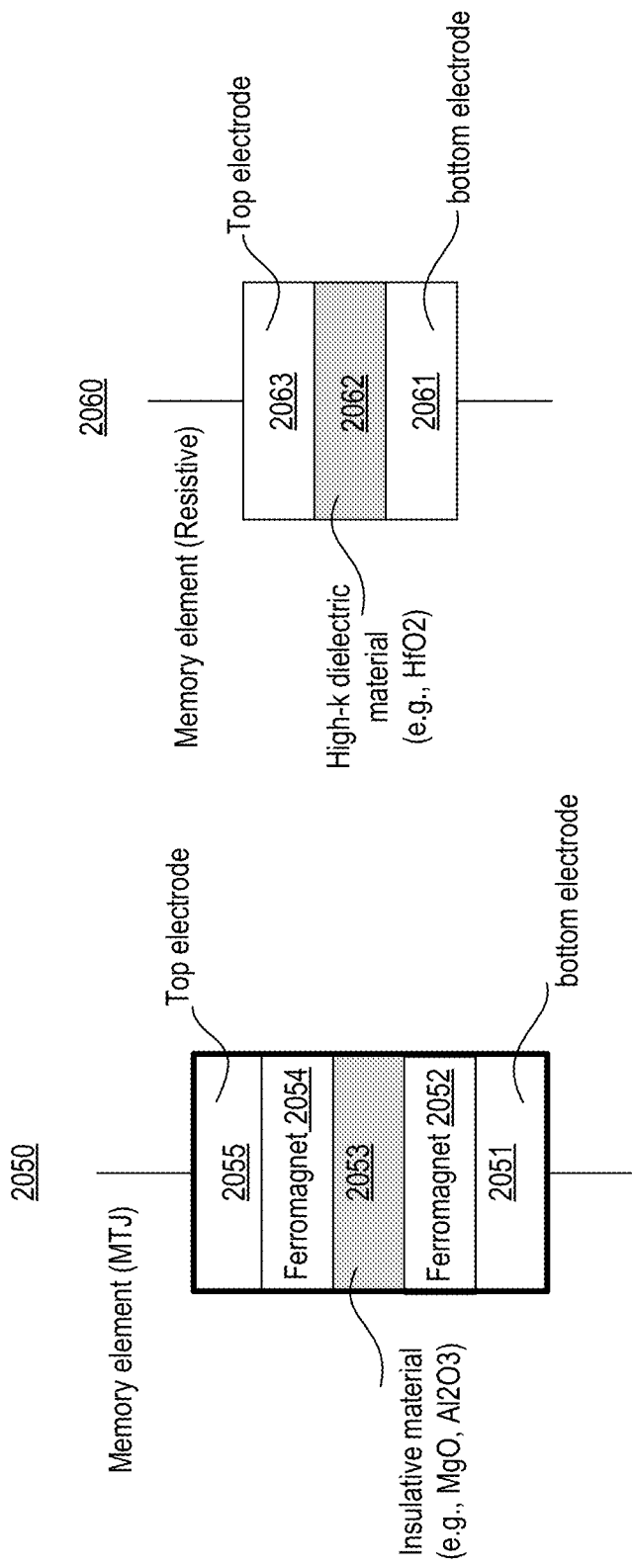
FIG. 20E illustrates planar memory element structures, in accordance with some embodiments.

FIG. 20E illustrates planar memory element structures 2050 and 2060, in accordance with some embodiments. In some embodiments, planar memory element structures are resistive elements. In some embodiments, planar memory element structures are magnetic tunnel junctions (MTJs). In some embodiments, planar memory element structures are phase change memory (PCM) memories.

In some embodiments, MTJ 2050 comprises a bottom electrode 2051, free ferromagnetic layer 2052, insulative material 2053 (e.g., tunnel barrier materials such as MgO, Al2O3, SrTiO3), fixed ferromagnetic layer 2054, and top electrode 2055. In some embodiments, free ferromagnetic layer 2052 comprises one or more of CrO2, Heusler alloys, Fe, or CoFeB. In some embodiments, insulative material 2053 (also referred to as tunnel barrier) includes one of: MgO, AlOx (where x is a number or fraction), or SrTiO3. In some embodiments, fixed ferromagnetic layer 2054 includes one of CrO2, Heusler alloys, FeCo(001), CoFeB. In some embodiments, an anti-ferromagnetic layer (not shown) is formed over fixed ferromagnetic layer 2054. In some embodiments, the anti-ferromagnetic (AFM) layer comprises Ru or Ir. In some embodiments, the AFM layer comprises a super lattice of Co and Pt coupled with Ru or Ir. In some embodiments, bottom electrode 2051 and top electrode 2055 includes one or ore more: Al, Ti, Cu, Ag, Pt, TiN, TaN, Al doped ZnO, Ga-doped ZnO, or Indium tin oxide (ITO). In some embodiments, bottom electrode 2051 and top electrode 2055 are symmetric. In some embodiments, bottom electrode 2051 and top electrode 2055 are asymmetric. In some embodiments, bottom electrode 2051 and top electrode 2055 may have the same materials as those discussed with reference to electrodes in FIG. 4B.

In some embodiments, resistive memory 2060 (ReRAM) comprises bottom electrode 2061, insulative material 2062, and top electrode 2063. In some embodiments, insulative material 2062 includes HfOx, TiOx, TaOx, NiO, ZnOx, Zn2TiO4, KnOx, MgO, AlOx, ZrOx, CuxOy, SnOz, GeOx, LaOx, YOx, MoOx, or CoOx (where x and y are a number or a fraction). In some embodiments, insulative material 2062 for the ReRAM includes oxides of Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In some embodiments, bottom electrode 2061 and top electrode 2063 includes one or ore more: Al, Ti, Cu, Ag, Pt, TiN, TaN, Al doped ZnO, Ga-doped ZnO, or Indium tin oxide (ITO). In some embodiments, bottom electrode 2061 and top electrode 2063 are symmetric. In some embodiments, bottom electrode 2061 and top electrode 2063 are asymmetric. In some embodiments, bottom electrode 2061 and top electrode 2063 may have the same materials as those discussed with reference to electrodes in FIG. 4B.

In ReRAM systems that use forming of filaments, an initial operation may begin by applying a voltage pulse with an increasing magnitude, between top electrode 2063 and bottom electrode 2061. The magnitude of the voltage pulse may be substantially greater than a voltage level utilized to cycle the ReRAM device during regular course of programming. A high voltage pulse may be utilized to perform an intentional one-time breakdown process, known as forming. The forming process creates one or more conductive filaments that provide pathways for electron transport during device operation.

In some embodiments, resistive memory 2060 is a phase-change memory (PC-RAM). In some embodiments, comprises bottom electrode 2061, insulative material 2062, and top electrode 2063. In this case, insulative material 2062 is a phase-change material. In some embodiments, the phase-change material comprises phase-change chalcogenides. In some embodiments, the phase-change material includes one of: (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, or PtSe2 (where m and n are numbers or fractions). Other examples of the phase-change material includes binary transition metal oxides such as NiO or TiO2, perovskites such as Sr(Zr)TiO3 or PCMO, solid-state electrolytes such as GeS, GeSe, SiOx, or Cu2S, organic materials such as AlDCN, or layered materials such as hexagonal boron nitride.

In various embodiments, when the ME structures are not capacitors (as those described with reference to various embodiments herein), current based pulsing scheme(s) are used to drive (e.g., write) and for sensing (e.g., read). For example, plate-lines flow current to configure or read the ME structures. In some embodiments, the ME structures may be a mix of various types of ME structures (e.g., ferroelectric based capacitors, paraelectric based capacitors, MTJ, ReRAM, or PC-RAM). In some embodiments, all ME structures for an array are of the same type.

Figure 21A:
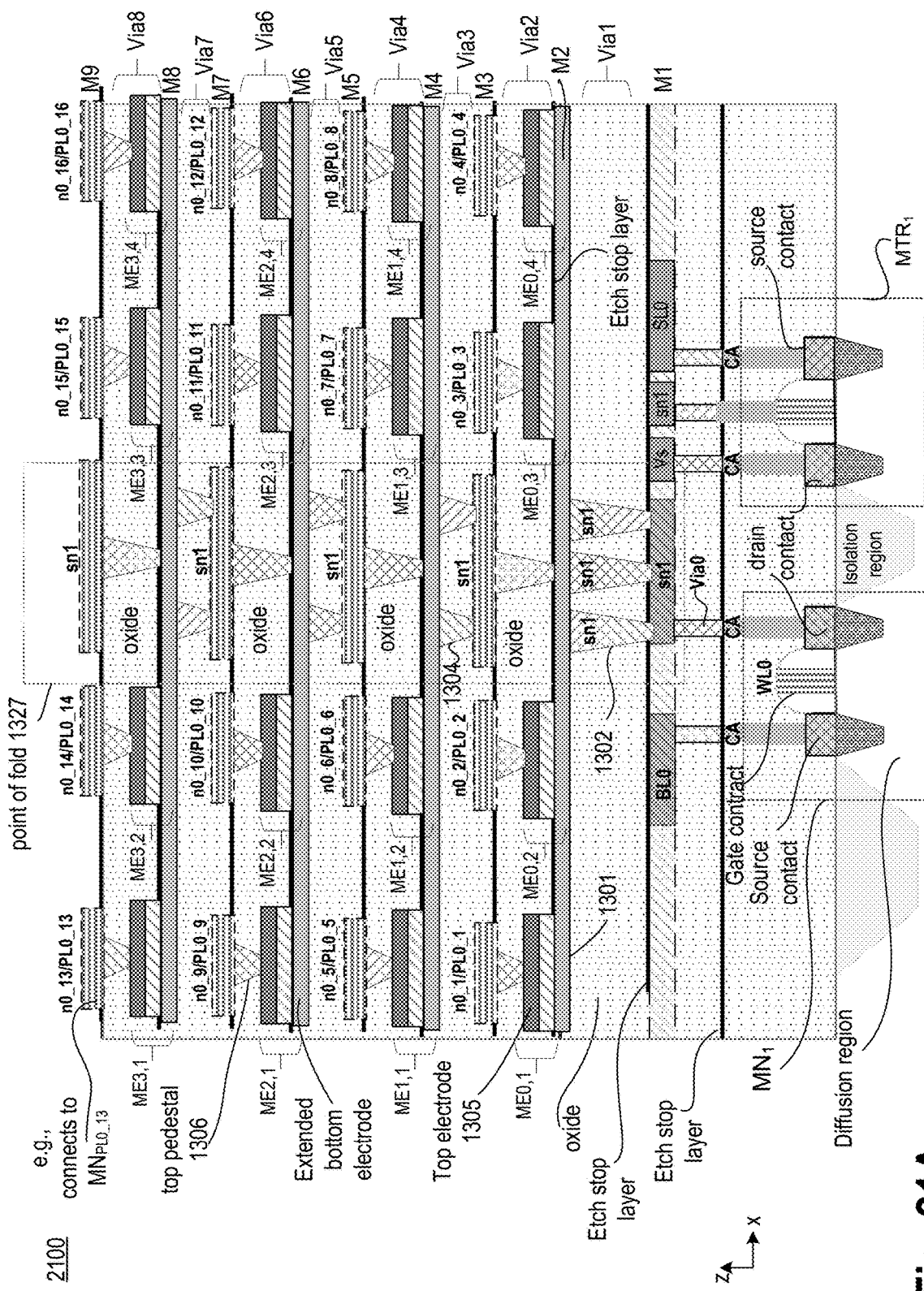
FIG. 21A illustrates multi-element gain bit-cell with stacked and folded planar memory elements that use extended bottom electrodes and misaligned central pedestals, in accordance with some embodiments.

FIG. 21A illustrates multi-element gain bit-cell 2100 with stacked and folded planar memory elements that use extended bottom electrodes and misaligned central pedestals, in accordance with some embodiments. The stacked and folded memory elements (e.g., such as those in FIG. 20E) here are organized the same as those in FIG. 16A but for using memory elements (MEs) instead of capacitors. These memory elements can be programmed by flowing current to the electrodes instead of setting voltages on the capacitor nodes or plate-lines, in accordance with some embodiments.

Figure 21B:
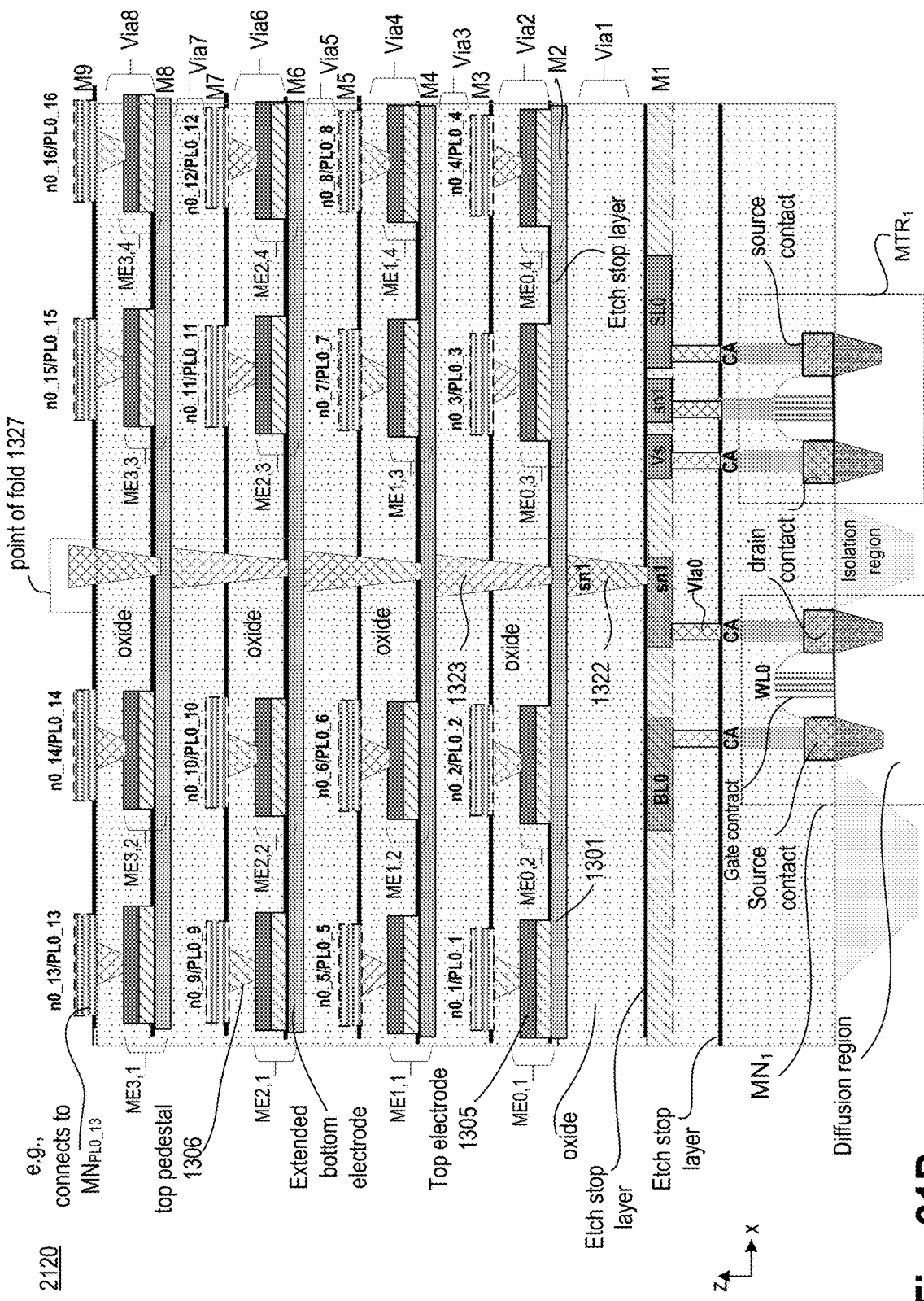
FIG. 21B illustrates multi-element gain bit-cell with stacked and folded planar memory elements that use extended bottom electrodes and aligned central pedestals, in accordance with some embodiments.

FIG. 21B illustrates multi-element gain bit-cell 2120 with stacked and folded planar memory elements that use extended bottom electrodes and aligned central pedestals, in accordance with some embodiments. Compared to FIG. 21A, here the through vias 1322 are used for storage node sn1 to connect to various extended bottom electrodes of different layers. The stacked and folded memory elements (e.g., such as those in FIG. 20E) here are organized the same as those in FIG. 16A but for using memory elements (MEs) instead of capacitors.

Figure 21C:
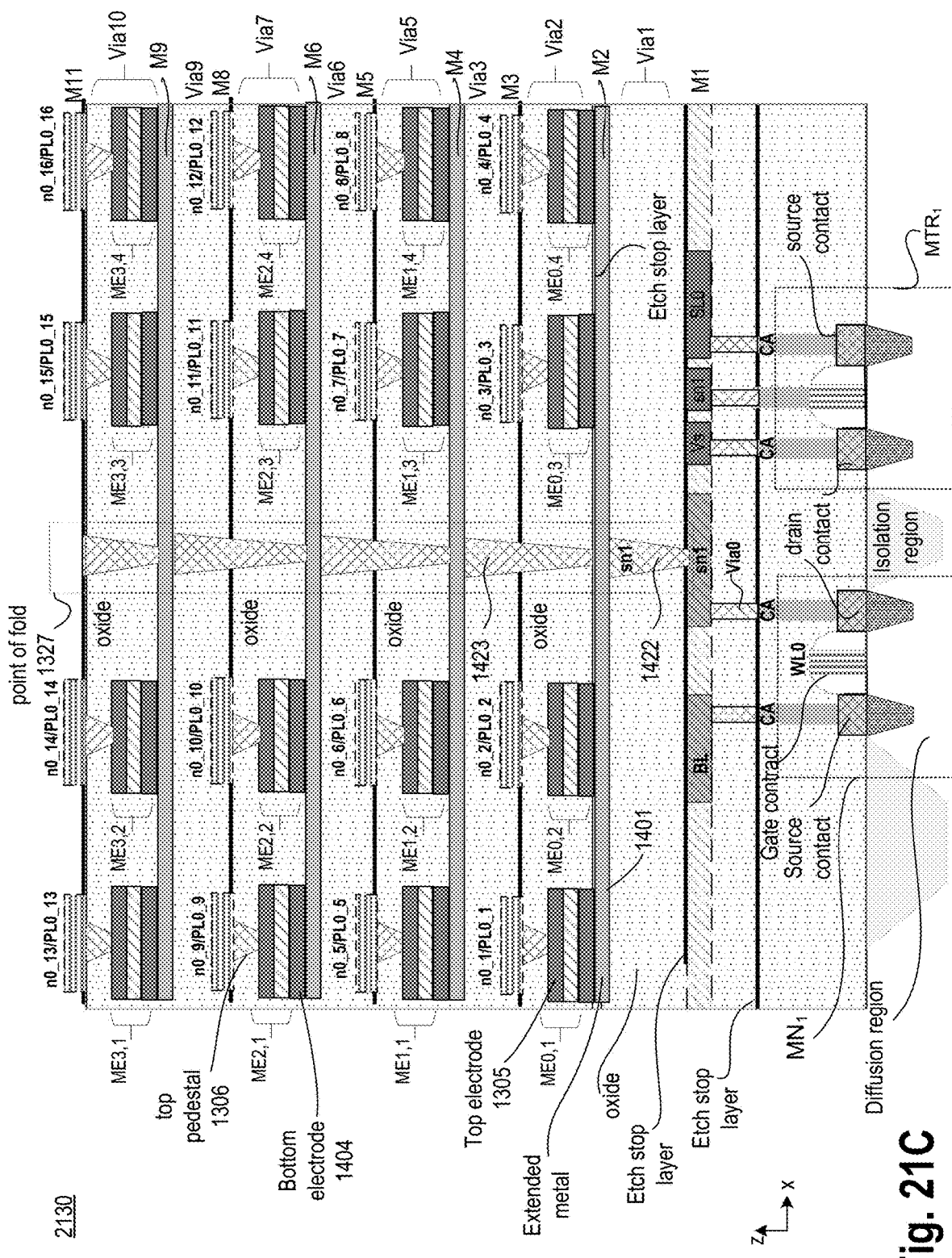
FIG. 21C illustrates a multi-element gain bit-cell with stacked and folded planar multi-elements that use extended shared metal and aligned central pedestals, in accordance with some embodiments.

FIG. 21C illustrates multi-element gain bit-cell 2130 with stacked and folded planar multi-elements that use extended shared metal and aligned central pedestals, in accordance with some embodiments. Compared to FIG. 21A, here the through vias 1422 are used for storage node sn1 to connect to various extended shared metal 1401 of different layers. Vias 1422 are also referred to as pedestals as they connect one metal layer to another metal layer (e.g., extended metal layer 1401 of M2 layer to extended shared metal 1401 of M4 layer). Via 1422 is connected to extended bottom electrode 1401 and to subsequent via 1423. In various embodiments, vias 1422 and 1423 are vertically aligned. This embodiment allows for simpler fabrication compared to multi-element gain bit-cell 2100 because fewer vias for storage node sn1 are used and those vias are aligned to form through vias. In some embodiments, vias 1422 and 1423 are formed using the same technology which is used to form through-silicon vias (TSVs).

In some embodiments, memory element placement configuration includes a configuration where planar memory elements are staggered on a shared bottom electrode 1301 or shared metal 1401, in accordance with some embodiments. The configuration would be like that discussed with reference to FIG. 20C but used for multi-element gain bit-cell.

FIG. 21D illustrates multi-element gain bit-cell 2140 used for FIGS. 21A-C, in accordance with some embodiments. Multi-element gain bit-cell 2140 is the same as the multi-element FE gain bit-cell described herein, but with 16 memory elements and 16 associated plate-lines. In this case, the plate-lines are parallel to the word-line. When ME devices are current-mode programmed (e.g., MTJ, ReRAM, PC-RAM), then having word-line parallel to the plate-line may use switches $MN_{PLO\_x}$ to enable column multiplexing from a memory programming and memory sensing perspective. In some embodiments, when plate-line is parallel to the word-line, the switches may be removed. In that case, the internal nodes n0_1 through n0_16 are directly connected to respective plate-lines.

In some embodiments, multi-element gain bit-cell 2140 does not have switches $MN_{PLO\_1}$ through $MN_{PLO\_16}$. In one such example, the internal nodes n0_1 through n0_16 are replaced with plate-lines. In multi-element gain bit-cell 2145 the plate-lines are parallel to the bit-line and switches $MN_{PLO\_1}$ through $MN_{PLO\_16}$ are removed. This allows for efficient flow of current through the ME devices of the bit-cell.

Figure 22:
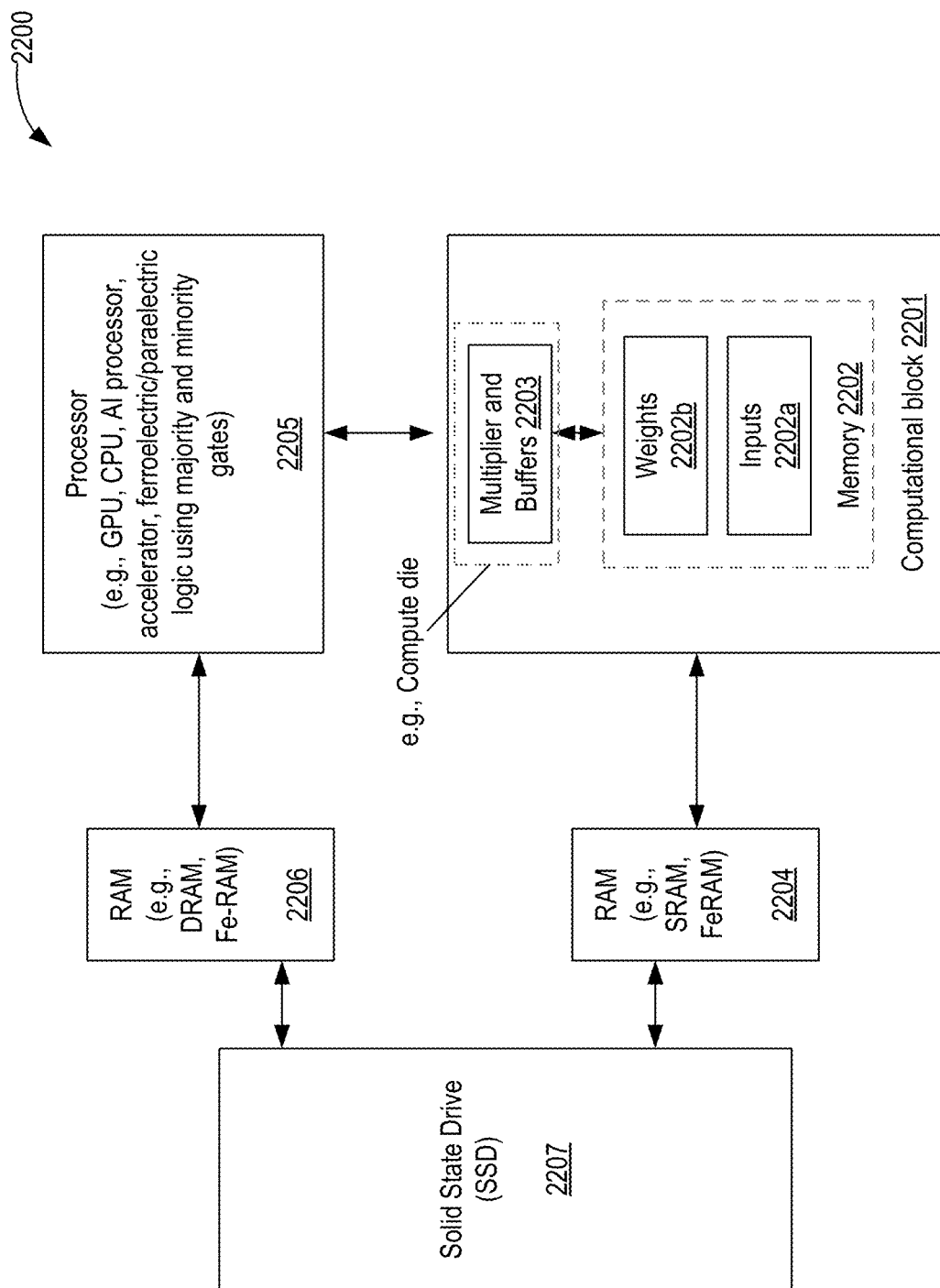
FIG. 22 illustrates a high-level architecture of an artificial intelligence (AI) machine comprising a compute die stacked with a memory die, wherein the compute die includes stacked and/or folded capacitors, in accordance with some embodiments.

FIG. 22 illustrates a high-level architecture of an artificial intelligence (AI) machine 2200 comprising a compute die stacked with a memory die, wherein the compute die includes stacked and/or folded capacitors or memory elements, in accordance with some embodiments.

AI machine 2200 comprises computational block 2201 or processor having random-access memory (RAM) 2202 and multiplier and buffers 2203; first random-access memory 2204 (e.g., static RAM (SRAM), ferroelectric or paraelectric RAM (FeRAM), ferroelectric or paraelectric static random-access memory (FeSRAM)), main processor 2205, second random-access memory 2206 (dynamic RAM (DRAM), FeRAM), and solid-state memory or drive (SSD) 2207. In some embodiments, some, or all components of AI machine 2200 are packaged in a single package forming a system-on-chip (SoC). The SoC can be configured as a logic-on-logic configuration, which can be in a 3D configuration or a 2.5D configuration.

In some embodiments, computational block 2201 is packaged in a single package and then coupled to processor 2205 and memories 2204, 2206, and 2207 on a printed circuit board (PCB). In some embodiments, computational block 2201 is configured as a logic-on-logic configuration, which can be in a 3D configuration or a 2.5D configuration. In some embodiments, computational block 2201 comprises a special purpose compute die 2203 or microprocessor. For example, compute die 2203 is a compute chiplet that performs a function of an accelerator or inference. In some embodiments, memory 2202 is DRAM which forms a special memory/cache for the special purpose compute die 2203. The DRAM can be embedded DRAM (eDRAM) such as 1T1C (one transistor and one capacitor) based memories. In some embodiments, RAM 2202 is ferroelectric or paraelectric RAM (FeRAM).

In some embodiments, compute die 2203 is specialized for applications such as Artificial Intelligence, graph processing, and algorithms for data processing. In some embodiments, compute die 2203 further has logic computational blocks, for example, for multipliers and buffers, a special data memory block (e.g., buffers) comprising DRAM, FeRAM, or a combination of them. In some embodiments, RAM 2202 has weights and inputs stored to improve the computational efficiency. The interconnects between processor 2205 (also referred to as special purpose processor), first RAM 2204 and compute die 2203 are optimized for high bandwidth and low latency. The architecture of FIG. 22 allows efficient packaging to lower the energy, power, or cost and provides for ultra-high bandwidth between RAM 2204 and compute chiplet 2203 of computational block 2201.

In some embodiments, RAM 2202 is partitioned to store input data (or data to be processed) 2202a and weight factors 2202b. In some embodiments, input data 2202a is stored in a separate memory (e.g., a separate memory die) and weight factors 2202b are stored in a separate memory (e.g., separate memory die).

In some embodiments, computational logic or compute chiplet 2203 comprises matrix multiplier, adder, concatenation logic, buffers, and combinational logic. In various embodiments, compute chiplet 2203 performs multiplication operation on inputs 2202a and weights 2202b. In some embodiments, weights 2202b are fixed weights. For example, processor 2205 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2202. In various embodiments, the input data that is to be analyzed using a trained model is processed by computational block 2201 with computed weights 2202b to generate an output (e.g., a classification result).

In some embodiments, first RAM 2204 is ferroelectric or paraelectric based SRAM. For example, a six transistor (6T) SRAM bit-cells having ferroelectric or paraelectric transistors are used to implement a non-volatile FeSRAM. In some embodiments, SSD 2207 comprises NAND flash cells. In some embodiments, SSD 2207 comprises NOR flash cells. In some embodiments, SSD 2207 comprises multi-threshold NAND flash cells.

In various embodiments, the non-volatility of FeRAM is used to introduce new features such as security, functional safety, and faster reboot time of AI machine 2200. The non-volatile FeRAM is a low power RAM that provides fast access to data and weights. FeRAM 2204 can also serve as a fast storage for computational block 2201 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 23:
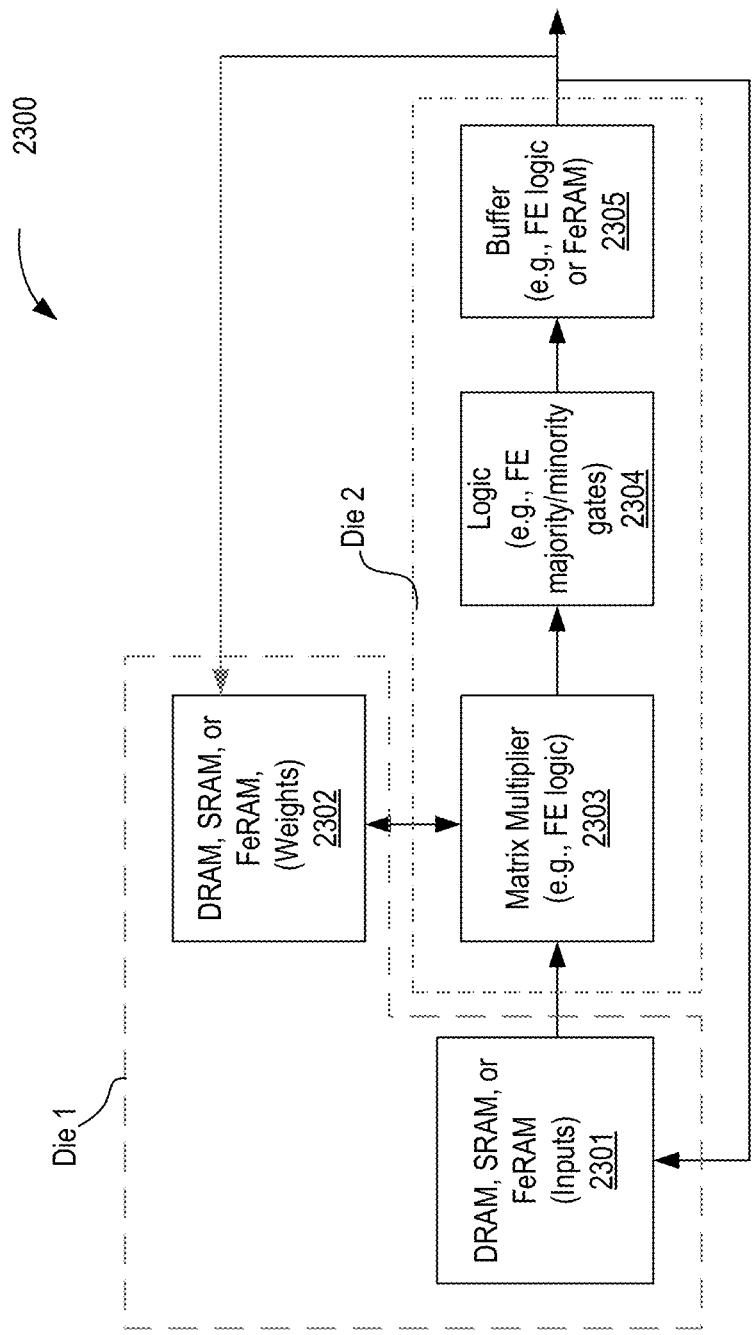
FIG. 23 illustrates an architecture of a computational block comprising a compute die stacked with a memory die, wherein the compute die includes stacked and/or folded capacitors, in accordance with some embodiments.

FIG. 23 illustrates an architecture of a computational block 2300 comprising a compute die stacked with a memory die, wherein the compute die includes stacked and/or folded capacitors or memory elements, in accordance with some embodiments. The architecture of FIG. 23 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 2301 to store input data and a second die 2302 to store weight factors. In some embodiments, the memory die is a single die that is partitioned such that first partition 2301 of the memory die is used to store input data and second partition 2302 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 2301 and 2302, or memory dies 2301 and 2302 include one or more of: DRAM, FE-SRAM, FE-DRAM, SRAM, and/or MRAM. In some embodiments, the input data stored in memory partition or die 2301 is the data to be analyzed by a trained model with fixed weights stored in memory partition or die 2302.

In some embodiments, the compute die comprises ferroelectric or paraelectric logic (e.g., majority, minority, and/or threshold gates) to implement matrix multiplier 2303, logic 2304, and temporary buffer 2305. Matrix multiplier 2303 performs multiplication operation on input data 'X' and weights 'W' to generate an output 'Y'. This output may be further processed by logic 2304. In some embodiments, logic 2304 performs a threshold operation, pooling and drop out operations, and/or concatenation operations to complete the AI logic primitive functions.

In some embodiments, the output of logic 2304 (e.g., processed output 'Y') is temporarily stored in buffer 2305. In some embodiments, buffer 2305 is memory such as one or more of: DRAM, Fe-SRAM, Fe-DRAM, MRAM, resistive RAM (Re-RAM) and/or SRAM. In some embodiments, buffer 2305 is part of the memory die (e.g., Die 1). In some embodiments, buffer 2305 performs the function of a re-timer. In some embodiments, the output of buffer 2305 (e.g., processed output 'Y') is used to modify the weights in memory partition or die 2302. In one such embodiment, computational block 2300 not only operates as an inference circuitry, but also as a training circuitry to train a model. In some embodiments, matrix multiplier 2303 includes an array of multiplier cells, wherein the DRAMs 2301 and 2302 include arrays of memory bit-cells, respectively, wherein each multiplier cell is coupled to a corresponding memory bit-cell of DRAM 2301 and/or DRAM 2302. In some embodiments, computational block 2300 comprises an interconnect fabric coupled to the array of multiplier cells such that each multiplier cell is coupled to the interconnect fabric.

Architecture 2300 provides reduced memory access for the compute die (e.g., die 2) by providing data locality for weights, inputs, and outputs. In one example, data from and to the AI computational blocks (e.g., matrix multiplier 2303) is locally processed within a same packaging unit. Architecture 2300 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 24:
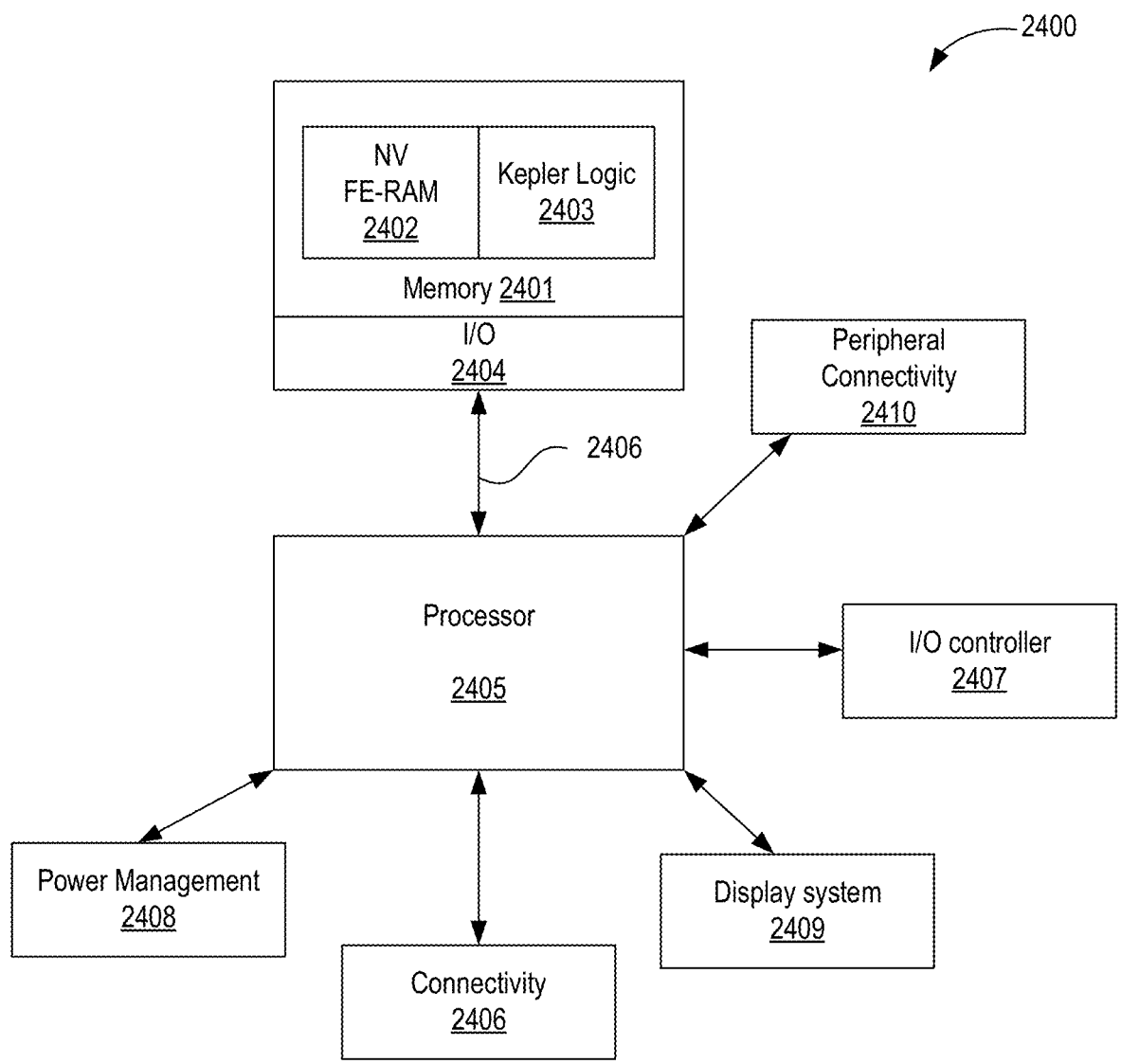
FIG. 24 illustrates a system-on-chip (SOC) that uses stacked and/or folded capacitors, in accordance with some embodiments.

FIG. 24 illustrates a system-on-chip (SOC) 2400 that uses stacked and/or folded capacitors or memory elements, in accordance with some embodiments. SoC 2400 comprises memory 2401 having static random-access memory (SRAM) or FE based random-access memory FE-RAM, or any other suitable memory. The memory can be non-volatile (NV) or volatile memory. Memory 2401 may also comprise logic 2403 to control memory 2402. For example, write and read drivers are part of logic 2403. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2404. The interface may be a double-data rate (DDR) compliant interface or any other suitable interface to communicate with a processor. Processor 2405 of SoC 2400 can be a single core or multiple core processor. Processor 2405 can be a general-purpose processor (CPU), a digital signal processor (DSP), or an Application Specific Integrated Circuit (ASIC) processor. In some embodiments, processor 2405 is an artificial intelligence (AI) processor (e.g., a dedicated AI processor, a graphics processor configured as an AI processor). In various embodiments, processor 2405 executes instructions that are stored in memory 2401.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 2405 may be coupled to a number of other chiplets that can be on the same die as SoC 2400 or on separate dies. These chiplets include connectivity circuitry 2406, I/O controller 2407, power management 2408, and display system 2409, and peripheral connectivity 2406.

Connectivity 2406 represents hardware devices and software components for communicating with other devices.

Connectivity 2406 may support various connectivity circuitries and standards. For example, connectivity 2406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2406 may support non-cellular standards such as WiFi.

I/O controller 2407 represents hardware devices and software components related to interaction with a user. I/O controller 2407 is operable to manage hardware that is part of an audio subsystem and/or display subsystem. For example, input through a microphone or other audio device can provide input or commands for one or more applications or functions of SoC 2400. In some embodiments, I/O controller 2407 illustrates a connection point for additional devices that connect to SoC 2400 through which a user might interact with the system. For example, devices that can be attached to the SoC 2400 might include microphone devices, speaker or stereo systems, video systems or other display devices, keyboard or keypad devices, or other I/O devices for use with specific applications such as card readers or other devices.

Power management 2408 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2408 may accordingly put such logic into low power state without the worry of losing data. Power management may select a power state according to Advanced Configuration and Power Interface (ACPI) specification for one or all components of SoC 2400.

Display system 2409 represents hardware (e.g., display devices) and software (e.g., drivers) components that provide a visual and/or tactile display for a user to interact with the processor 2405. In some embodiments, display system 2409 includes a touch screen (or touch pad) device that provides both output and input to a user. Display system 2409 may include a display interface, which includes the particular screen or hardware device used to provide a display to a user. In some embodiments, the display interface includes logic separate from processor 2405 to perform at least some processing related to the display.

Peripheral connectivity 2410 may represent hardware devices and/or software devices for connecting to peripheral devices such as printers, chargers, cameras, etc. In some embodiments, peripheral connectivity 2410 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2400 includes a coherent cache or memory-side buffer chiplet (not shown) which include ferroelectric or paraelectric memory. The coherent cache or memory-side buffer chiplet can be coupled to processor 2405 and/or memory 2401 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method(s) of forming those structures or apparatuses, and method(s) of operation of these structures or apparatuses. Following examples are provided that illustrate the various embodiments. The examples can be combined with other examples. As such, various embodiments can be combined with other embodiments without changing the scope of the invention.

Example 1: An apparatus comprising: a transistor having a gate terminal coupled to a word-line, a source terminal couple to a bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 2: The apparatus of example 1, wherein the storage node extends vertically using vias and metal layers, and wherein the storage node is a point of fold in the stacked and folded configuration.

Example 3: The apparatus of example 2, wherein the plurality of capacitors has N capacitors are divided in L number of stacked layers such that there are N/L capacitors in an individual stacked layer.

Example 4: The apparatus of example 3, wherein the N/L capacitors are shorted together with an electrode.

Example 5: The apparatus of example 4, wherein the electrode comprises metal, a first conducting oxide, or a combination of a second conducting oxide and an insulative material.

Example 6: The apparatus of example 4, wherein the electrode is a shared bottom electrode that extends on either side of the point of fold.

Example 7: The apparatus of example 6, wherein the individual capacitor includes a top electrode which is coupled to the individual plate-line.

Example 8: The apparatus of example 7, wherein the top electrode is coupled to the individual plate-line using a pedestal.

Example 9: The apparatus of example 7, wherein the individual capacitor includes: a first layer coupled to the shared bottom electrode which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer.

Example 10: The apparatus of example 9, wherein: the first refractive inter-metallic material and the second refractive inter-metallic material include one or more of Ta, Ti, Al, W, Ni, Ga, Mn, Fe, B, C, N or Co; and the first conductive oxide and the second conductive oxide include one or more of: Ir, In, Fe, Ru, Pd, Os, or Re, wherein the apparatus comprises a sixth layer extending along a z-plane, wherein the sixth layer is adjacent to side walls of the first layer, the second layer, the third layer, and the fourth layer, wherein the sixth layer includes one of: Ti—Al—O, Al2O3, or MgO.

Example 11: The apparatus of example 7, wherein the individual capacitor includes: a first layer coupled to the shared bottom electrode which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the individual plate-line is coupled to the third layer.

Example 12: The apparatus of example 1, wherein the individual plate-line is parallel to the bit-line.

Example 13: The apparatus of example 1, wherein the plurality of capacitors comprises non-linear polar material.

Example 14: The apparatus of example 13, wherein the non-linear polar material includes one of: Bismuth ferrite (BFO), BFO with a first doping material where in the first doping material is one of Lanthanum or elements from lanthanide series of periodic table; Lead zirconium titanate (PZT), or PZT with a second doping material, wherein the doping material is one of La or Nb; a relaxor ferroelectric which includes one of; lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as $Hf_{(1-x)}Ex\ Oy$, where x and y are fractions, where E can be Al, Ca, Ce, Dy, Er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, whre x and y are fractions, y doped HfO2, where y includes one of: Al, Ca, Ce, Dy, Er, Gd, Ge, La, Sc, Si, Sr, Sn, or Y; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO] n, where 'n' is between 1 and 100.

Example 15: An apparatus comprising: a transistor having a gate terminal coupled to a word-line, a source terminal couple to a bit-line, and a drain terminal coupled to a storage node; a vertical stack of vias which is coupled to the storage node; a plurality of metal layers coupled to the vertical stack of vias; and a plurality of capacitors having a first terminal coupled to the plurality of metal layers, wherein the plurality of capacitors includes capacitors on either side of the vertical stack of vias, wherein a second terminal of an individual capacitor of the plurality of capacitors is coupled to an individual plate-line, wherein the plurality of capacitors are planar capacitors.

Example 16: The apparatus of example 15, wherein the plurality of capacitors has N capacitors which are divided in L number of stacked layers such that there are N/L capacitors in an individual stacked layer.

Example 17: The apparatus of example 15, wherein the plurality of capacitors comprises non-linear polar material.

Example 18: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes: a transistor having a gate terminal coupled to a word-line, a source terminal couple to a bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 19: The system of example 18, wherein the storage node extends vertically using vias and metal layers, and wherein the storage node is a point of fold in the stacked and folded configuration.

Example 20: The system of example 19, wherein the plurality of capacitors has N capacitors which are divided in L number of stacked layers such that there are N/L capacitors in an individual stacked layer.

Example 1a: An apparatus comprising: a transistor having a gate terminal coupled to a word-line, a source terminal couple to a bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are non-planar capacitors that are arranged in a stacked and folded configuration.

Example 2a: The apparatus of example 1a comprising: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 3a: The apparatus of example 2a, wherein the plurality of capacitors includes: a first set of capacitors adjacent to the first conductive electrode; and a second set of capacitors adjacent to the second conductive electrode.

Example 4a: The apparatus of example 3a, wherein the first set of capacitors includes a first capacitor which includes: a first layer coupled to the first conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first plate-line is adjacent to part of the fifth layer.

Example 5a: The apparatus of example 4a, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 6a: The apparatus of example 3a, wherein the second set of capacitors includes a second capacitor which includes: a first layer coupled to the second conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a second plate-line is adjacent to part of the fifth layer.

Example 7a: The apparatus of example 6a, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 8a: The apparatus of example 4a, wherein the plurality of capacitors has N capacitors are divided in L number of conductive electrodes such that there are N/L capacitors in an individual conductive electrode.

Example 9a: The apparatus of example 8a, wherein the N/L capacitors are shorted together through the individual conductive electrode.

Example 10a: The apparatus of example 3a, wherein the first conductive electrode or the second conductive electrode comprises metal, a first conducting oxide, or a combination of a second conducting oxide and an insulative material.

Example 11a: The apparatus of example 3a, wherein the first conductive electrode is a first shared bottom electrode for the first set of capacitors, wherein the second conductive electrode is a second shared bottom electrode for the second set of capacitors.

Example 12a: The apparatus of example 1a, wherein the individual capacitor includes a top electrode which is partially coupled to the individual plate-line.

Example 13a: The apparatus of example 1a, wherein the individual plate-line is parallel to the bit-line.

Example 14a: The apparatus of example 1a, wherein the plurality of capacitors comprises non-linear polar material.

Example 15a: An apparatus comprising: a transistor having a gate terminal coupled to a word-line, a source terminal couple to a bit-line, and a drain terminal coupled to a storage node; a plurality of bottom electrodes extending vertically compared to a lateral side of the transistor, wherein the plurality of bottom electrodes is coupled to the storage node; and a plurality of capacitors having a first terminal coupled to the plurality of bottom electrodes, wherein a second terminal of an individual capacitor of the plurality of capacitors is partially coupled to an individual plate-line, wherein the plurality of capacitors are non-planar capacitors.

Example 16a: The apparatus of example 15a, wherein the plurality of bottom electrodes comprises: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 17a: The apparatus of example 16a, wherein the plurality of capacitors include: a first set of capacitors having a first layer adjacent to the first conductive electrode; and a second set of capacitors having a second layer adjacent to the second conductive electrode.

Example 18a: The apparatus of example 17a, wherein the first set of capacitors includes a first capacitor which includes: a first layer coupled to the first conductive electrode, wherein the first layer comprises first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first plate-line is adjacent to part of the fifth layer.

Example 19a: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes: a transistor having a gate terminal coupled to a word-line, a source terminal couple to a bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are non-planar capacitors that are arranged in a stacked and folded configuration.

Example 1b: An apparatus comprising: a transistor having a gate terminal coupled to a word-line, a source terminal couple to a bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are non-planar capacitors that are arranged in a stacked and folded configuration.

Example 2b: The apparatus of example 1b comprising: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 3b: The apparatus of example 2b, wherein the plurality of capacitors includes: a first set of capacitors adjacent to the first conductive electrode; and a second set of capacitors adjacent to the second conductive electrode.

Example 4b: The apparatus of example 3b, wherein the first set of capacitors includes a first capacitor which includes: a first layer coupled to the first conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first plate-line is adjacent to part of the fifth layer.

Example 5b: The apparatus of example 4b, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 6b: The apparatus of example 3b, wherein the second set of capacitors includes a second capacitor which includes: a first layer coupled to the second conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a second plate-line is adjacent to part of the fifth layer.

Example 7b: The apparatus of example 6b, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 8b: The apparatus of example 4b, wherein the plurality of capacitors has N capacitors are divided in L number of conductive electrodes such that there are N/L capacitors in an individual conductive electrode.

Example 9b: The apparatus of example 8b, wherein the N/L capacitors are shorted together through the individual conductive electrode.

Example 10b: The apparatus of example 3b, wherein the first conductive electrode or the second conductive electrode comprises metal, a first conducting oxide, or a combination of a second conducting oxide and an insulative material.

Example 11b: The apparatus of example 3b, wherein the first conductive electrode is a first shared bottom electrode for the first set of capacitors, wherein the second conductive electrode is a second shared bottom electrode for the second set of capacitors.

Example 12b: The apparatus of example 1b, wherein the individual capacitor includes a top electrode which is partially coupled to the individual plate-line.

Example 13b: The apparatus of example 1b, wherein the individual plate-line is parallel to the bit-line.

Example 14b: The apparatus of example 1b, wherein the plurality of capacitors comprises non-linear polar material.

Example 15b: An apparatus comprising: a transistor having a gate terminal coupled to a word-line, a source terminal couple to a bit-line, and a drain terminal coupled to a storage node; a plurality of bottom electrodes extending vertically compared to a lateral side of the transistor, wherein the plurality of bottom electrodes is coupled to the storage node; and a plurality of capacitors having a first terminal coupled to the plurality of bottom electrodes, wherein a second terminal of an individual capacitor of the plurality of capacitors is partially coupled to an individual plate-line, wherein the plurality of capacitors are non-planar capacitors.

Example 16b: The apparatus of example 15b, wherein the plurality of bottom electrodes comprises: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 17b: The apparatus of example 16b, wherein the plurality of capacitors include: a first set of capacitors having a first layer adjacent to the first conductive electrode; and a second set of capacitors having a second layer adjacent to the second conductive electrode.

Example 18b: The apparatus of example 17b, wherein the first set of capacitors includes a first capacitor which includes: a first layer coupled to the first conductive electrode, wherein the first layer comprises first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first plate-line is adjacent to part of the fifth layer.

Example 19b: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes according to any one of examples 1b to 14b.

Example 20b: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes according to any one of examples 15b to 18b.

Example 1c: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 2c: The apparatus of example 1c, wherein the second terminal of the individual capacitor of the plurality of capacitors is coupled to the individual plate-line via an individual switch.

Example 3c: The apparatus of example 1c comprises a plurality of switches connected to the plurality of capacitors, wherein the plurality of switches is connected to a plurality of plate-lines, wherein the individual plate-line is among the plurality of plate-lines.

Example 4c: The apparatus of example 1c, wherein the storage node extends vertically using vias and metal layers, and wherein the storage node is a point of fold in the stacked and folded configuration.

Example 5c: The apparatus of example 4c, wherein the plurality of capacitors has N capacitors are divided in L number of stacked layers such that there are N/L capacitors in an individual stacked layer.

Example 6c: The apparatus of example 4c, wherein the N/L capacitors are shorted together with an electrode.

Example 7c: The apparatus of example 6c, wherein the electrode comprises metal, a first conducting oxide, or a combination of a second conducting oxide and an insulative material.

Example 8c: The apparatus of example 6c, wherein the electrode is a shared bottom electrode that extends on either side of the point of fold.

Example 9c: The apparatus of example 8c, wherein the individual capacitor includes a top electrode which is coupled to the individual plate-line.

Example 10c: The apparatus of example 9c, wherein the top electrode is coupled to the individual plate-line using a pedestal.

Example 11c: The apparatus of example 9c, wherein the individual capacitor includes: a first layer coupled to the shared bottom electrode which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer through a switch.

Example 13c: The apparatus of example 11c, wherein the individual capacitor includes: a first layer coupled to the shared bottom electrode which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the individual plate-line is coupled to the third layer.

Example 14c: The apparatus of example 1c, wherein the individual plate-line is parallel to the bit-line.

Example 15c: The apparatus of example 1c, wherein the plurality of capacitors comprises non-linear polar material.

Example 16c: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a stack of vertical vias which is coupled to the storage node; a plurality of metal layers coupled to the stack of vertical vias; and a plurality of capacitors having a first terminal coupled to the plurality of metal layers, wherein the plurality of capacitors includes capacitors on either side of the stack of vertical vias, wherein a second terminal of an individual capacitor of the plurality of capacitors is coupled to an individual plate-line, wherein the plurality of capacitors are planar capacitors.

Example 17c: The apparatus of example 16c, wherein the plurality of capacitors has N capacitors which are divided in L number of stacked layers such that there are N/L capacitors in an individual stacked layer.

Example 18c: The apparatus of example 16c, wherein the plurality of capacitors comprises non-linear polar material.

Example 19c: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells accordingly any one of examples 1c to 15c.

Example 20c: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells accordingly any one of examples 16c to 18c.

Example 1d: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration, wherein the plurality of capacitors include a first capacitor and a second capacitor, wherein the first capacitor occupies a first region, wherein the second capacitor occupies a second region, and wherein there is an offset between the first region and the second region such that the first region is laterally offset from the second region.

Example 2d: The apparatus of example 1d, wherein the second terminal of the individual capacitor of the plurality of capacitors is coupled to the individual plate-line via an individual switch.

Example 3d: The apparatus of example 1d comprises a plurality of switches connected to the plurality of capacitors, wherein the plurality of switches is connected to a plurality of plate-lines, wherein the individual plate-line is among the plurality of plate-lines.

Example 4d: The apparatus of example 1d, wherein the offset is substantially equal to a lateral length of the first capacitor.

Example 5d: The apparatus of example 1d, wherein the offset is less than a lateral length of the first capacitor such that the first region overlaps with the second region.

Example 6d: The apparatus of example 1d, wherein the storage node extends vertically using vias and metal layers, and wherein the storage node is a point of fold in the stacked and folded configuration, wherein the first region is below the second region.

Example 7d: The apparatus of example 6d, wherein the plurality of capacitors has N capacitors are divided in L number of stacked layers such that there are N/L capacitors in an individual stacked layer.

Example 8d: The apparatus of example 7d, wherein the N/L capacitors are shorted together with an electrode.

Example 9d: The apparatus of example 8d, wherein the electrode comprises metal, a first conducting oxide, or a combination of a second conducting oxide and an insulative material.

Example 10d: The apparatus of example 8d, wherein the electrode is a shared bottom electrode that extends on either side of the point of fold.

Example 11d: The apparatus of example 8d, wherein the individual capacitor includes a top electrode which is coupled to the individual plate-line.

Example 12d: The apparatus of example 11d, wherein the top electrode is coupled to the individual plate-line using a pedestal.

Example 13d: The apparatus of example 11d, wherein the individual capacitor includes: a first layer coupled to the electrode which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer.

Example 15d: The apparatus of example 11d, wherein the individual capacitor includes: a first layer coupled to the electrode which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the individual plate-line is coupled to the third layer.

Example 16d: The apparatus of example 1d, wherein the individual plate-line is parallel to the bit-line.

Example 17d: The apparatus of example 1d, wherein the plurality of capacitors comprises non-linear polar material.

Example 18d: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a stack of vertical vias which is coupled to the storage node; a plurality of metal layers coupled to the through-silicon via; and a plurality of capacitors having a first terminal coupled to the plurality of metal layers, wherein the plurality of capacitors includes capacitors on either side of the stack of vertical vias, wherein a second terminal of an individual capacitor of the plurality of capacitors is coupled to an individual plate-line, wherein the plurality of capacitors are planar capacitors, wherein the plurality of capacitors include a first capacitor and a second capacitor, wherein the first capacitor occupies a first region, wherein the second capacitor occupies a second region, and wherein the first region has an offset relative to the second region such that the first region is laterally offset from the second region.

Example 19d: The apparatus of example 18d, wherein the first region is below the second region.

Example 20d: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1d to 17d.

Example 1e: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are non-planar capacitors that are arranged in a stacked and folded configuration.

Example 2e: The apparatus of example 1e comprising: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 3e: The apparatus of example 2e, wherein the plurality of capacitors includes: a first set of capacitors adjacent to the first conductive electrode; and a second set of capacitors adjacent to the second conductive electrode.

Example 4e: The apparatus of example 3e, wherein the first set of capacitors includes a first capacitor which includes: a first layer coupled to the first conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first node is adjacent to part of the fifth layer, wherein the first node is coupled to a first switch.

Example 5e: The apparatus of example 4e, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 6e: The apparatus of example 3e, wherein the second set of capacitors includes a second capacitor which includes: a first layer coupled to the second conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a second node is adjacent to part of the fifth layer, wherein the second node is coupled to a second switch.

Example 7e: The apparatus of example 6e, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 8e: The apparatus of example 4e, wherein the plurality of capacitors has N capacitors are divided in L number of conductive electrodes such that there are N/L capacitors in an individual conductive electrode.

Example 9e: The apparatus of example 8e, wherein the N/L capacitors are shorted together through the individual conductive electrode.

Example 10e: The apparatus of example 3e, wherein the first conductive electrode or the second conductive electrode comprises metal, a first conducting oxide, or a combination of a second conducting oxide and an insulative material.

Example 11e: The apparatus of example 3e, wherein the first conductive electrode is a first shared bottom electrode for the first set of capacitors, wherein the second conductive electrode is a second shared bottom electrode for the second set of capacitors.

Example 12e: The apparatus of example 1e, wherein the individual capacitor includes a top electrode which is partially coupled to an individual node, wherein the individual node is coupled to the individual plate-line via an individual switch.

Example 13e: The apparatus of example 1e, wherein the individual plate-line is parallel to the bit-line.

Example 14e: The apparatus of example 1e, wherein the plurality of capacitors comprises non-linear polar material.

Example 15e: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a plurality of bottom electrodes extending vertically compared to lateral side of the first transistor, wherein the plurality of bottom electrodes is coupled to the storage node; and a plurality of capacitors having a first terminal coupled to the plurality of bottom electrodes, wherein a second terminal of an individual capacitor of the plurality of capacitors is partially coupled to an individual plate-line, wherein the plurality of capacitors are non-planar capacitors.

Example 16e: The apparatus of example 15e, wherein the plurality of bottom electrodes comprises: a first conductive electrode directly connected to the storage node, wherein the first conductive electrode extends vertically away from the storage node; and a second conductive electrode directly connected to the storage node, wherein the second conductive electrode extends vertically away from the storage node, wherein the first conductive electrode and the second conductive electrode are substantially parallel.

Example 17e: The apparatus of example 16e, wherein the plurality of capacitors include: a first set of capacitors having a first layer adjacent to the first conductive electrode; and a second set of capacitors having a second layer adjacent to the second conductive electrode.

Example 18e: The apparatus of example 17e, wherein the first set of capacitors includes a first capacitor which includes: a first layer coupled to the first conductive electrode, wherein the first layer comprises first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first node is adjacent to part of the fifth layer, wherein the first node is coupled to a first switch.

Example 19e: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1e to 14e.

Example 20e: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 15e to 18e.

Example 1f: An apparatus comprising: a first capacitor, wherein the first capacitor has a first terminal to receive a first input, and a second terminal coupled to a node; a second capacitor, wherein the second capacitor has a first terminal to receive a second input, and a second terminal coupled to the node; and a third capacitor, wherein the third capacitor has a first terminal to receive a third input, and a second terminal coupled to the node, wherein the first capacitor, the second capacitor, and the third capacitor are planar capacitors that are arranged in a stacked and folded configuration.

Example 2f: The apparatus of example 1f, comprises a transistor coupled to the node and a supply rail, wherein the transistor is controllable by a control, wherein the first input, the second input, and the control are set in a first operation mode to adjust a threshold of the apparatus.

Example 3f: The apparatus of example 1f, wherein the second terminal of the first capacitor, the second terminal of the second capacitor, and the second terminal of the third capacitor comprise a shared electrode.

Example 4f: The apparatus of example 2f, wherein the supply rail is a ground supply rail, wherein the transistor is a pull-down device coupled to the node and the ground supply rail, wherein the pull-down device is controlled by the control, wherein the first input, the second input, and the control are set in the first operation mode to adjust the threshold of the apparatus, wherein the control is to cause the pull-down device to be off in a second operation mode, and wherein the second operation mode occurs after the first operation mode.

Example 5f: The apparatus of example 2f, wherein the supply rail is a power supply rail, wherein the transistor is a pull-up device coupled to the node and the power supply rail, wherein the pull-up device is controlled by the control, wherein the control is to cause the pull-up device to be off in a second operation mode, wherein the second operation mode occurs after the first operation mode.

Example 6f: The apparatus of example 1f, wherein the node extends vertically using vias and metal layers, and wherein the node is a point of fold in the stacked and folded configuration.

Example 7f: The apparatus of example 6f, wherein the first capacitor, the second capacitor, and the third capacitor are part of N capacitors that are divided in L number of stacked layers such that there are N/L capacitors in an individual stacked layer.

Example 8f: The apparatus of example 7f, wherein the N/L capacitors are shorted together with an electrode.

Example 9f: The apparatus of example 7f, wherein L is equal to one.

Example 10f: The apparatus of example 8f, wherein the electrode comprises metal, a first conducting oxide, or a combination of a second conducting oxide and an insulative material.

Example 11f: The apparatus of example 8f, wherein the electrode is a shared bottom electrode that extends on either side of the point of fold.

Example 12f: The apparatus of example 8f, wherein the first capacitor includes a first top electrode which is coupled to the first input, wherein the second capacitor includes a second top electrode which is coupled to the second input, and wherein the third capacitor includes a third top electrode which is coupled to the third input.

Example 13f: The apparatus of example 12f, wherein the first top electrode is coupled to the first input using a pedestal.

Example 14f: The apparatus of example 8f, wherein the electrode is a shared bottom electrode, wherein the first capacitor includes: a first layer coupled to the shared bottom electrode which is coupled to the node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the first input is coupled to the fifth layer.

Example 15f: The apparatus of example 8f, wherein the electrode is a shared bottom electrode, wherein the first capacitor includes: a first layer coupled to the shared bottom electrode which is coupled to the node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the first input is coupled to the third layer.

Example 16f: The apparatus of example 1f, wherein the first capacitor, the second capacitor, and the third capacitor comprise one of non-linear polar material, a linear dielectric, or a non-linear dielectric.

Example 18f: An apparatus comprising: a first capacitor, wherein the first capacitor has a first terminal to receive a first input, and a second terminal coupled to a node; a second capacitor, wherein the second capacitor has a first terminal to receive a second input, and a second terminal coupled to the node; a third capacitor, wherein the third capacitor has a first terminal to receive a third input, and a second terminal coupled to the node; a stack of vertical vias which is coupled to the node; a transistor coupled to the node such that a gate of the transistor is controllable by the node; and a plurality of metal layers which is coupled to the through silicon via, wherein the plurality of metal layers includes a first shared electrode, wherein the first shared electrode is coupled to the node, wherein the first capacitor is on the first shared electrode and positioned on one side of the stack of vertical vias, and wherein the second capacitor is on the first shared electrode and positioned on another side of the stack of vertical vias.

Example 19f: The apparatus of example 18f, wherein the plurality of metal layers includes a second electrode, wherein the second electrode is above the first shared electrode, wherein the third capacitor is on the second electrode.

Example 20f: A system comprising: a processor circuitry to execute one or more instructions; a memory circuitry to store the one or more instructions; and a communication interface to allow the processor circuitry to communicate with another device, wherein the processor circuitry includes an adjustable threshold gate which includes an apparatus according to any one of examples 1f to 16f or examples 17f to 19f.

Example 1g: An apparatus comprising: a first capacitor, wherein the first capacitor has a first terminal to receive a first input, and a second terminal coupled to a node; a second capacitor, wherein the second capacitor has a first terminal to receive a second input, and a second terminal coupled to the node; and a third capacitor, wherein the third capacitor has a first terminal to receive a third input, and a second terminal coupled to the node, wherein the first capacitor, the second capacitor, and the third capacitor are non-planar capacitors that are arranged in a stacked and folded configuration.

Example 2g: The apparatus of example 1g, comprises a transistor coupled to the node and a supply rail, wherein the transistor is controllable by a control, wherein the first input, the second input, and the control are set in a first operation mode to adjust a threshold of the apparatus.

Example 3g: The apparatus of example 1g comprising: a first conductive electrode directly connected to the node, wherein the first conductive electrode extends vertically away from the node; and a second conductive electrode directly connected to the node, wherein the second conductive electrode extends vertically away from the node, wherein the first conductive electrode and the second conductive electrode are substantially parallel.

Example 4g: The apparatus of example 3g, wherein the first capacitor and the second capacitor are adjacent to the first conductive electrode such that the second capacitor is above the first capacitor and share the first conductive electrode, and wherein the third capacitor is adjacent to the second conductive electrode.

Example 5g: The apparatus of example 4g, wherein the first capacitor includes: a first layer coupled to the first conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a first node is adjacent to part of the fifth layer, wherein the first node is coupled to the first input.

Example 6g: The apparatus of example 5g, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 7g: The apparatus of example 4g, wherein the third capacitor includes: a first layer coupled to the second conductive electrode, wherein the first layer comprises a first metal; a second layer around the first layer, wherein the second layer comprises a first conductive oxide; a third layer comprising a ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises a second metal, wherein a second node is adjacent to part of the fifth layer, wherein the second node is coupled to the third input.

Example 8g: The apparatus of example 7g, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 9g: The apparatus of example 3g, wherein the first conductive electrode or the second conductive electrode comprises metal, a first conducting oxide, or a combination of a second conducting oxide and an insulative material.

Example 10g: The apparatus of example 3g, wherein the first conductive electrode is a first shared bottom electrode for the first capacitor and the second capacitor, wherein the second conductive electrode is a second shared bottom electrode for the third capacitor.

Example 11g: The apparatus of example 2g, wherein the supply rail is a ground supply rail, wherein the transistor is a pull-down device coupled to the node and the ground supply rail, wherein the pull-down device is controlled by the control, wherein the first input, the second input, and the control are set in the first operation mode to adjust the threshold of the apparatus, wherein the control is to cause the pull-down device to be off in a second operation mode, and wherein the second operation mode occurs after the first operation mode.

Example 12g: The apparatus of example 2g, wherein the supply rail is a power supply rail, wherein the transistor is a pull-up device coupled to the node and the power supply rail, wherein the pull-up device is controlled by the control, wherein the control is to cause the pull-up device to be off in a second operation mode, wherein the second operation mode occurs after the first operation mode.

Example 13g: The apparatus of example 1g, wherein the first capacitor, the second capacitor, and the third capacitor comprise one of non-linear polar material, a linear dielectric, or a non-linear dielectric.

Example 14g: An apparatus comprising: a first capacitor, wherein the first capacitor has a first terminal to receive a first input, and a second terminal coupled to a node; a second capacitor, wherein the second capacitor has a first terminal to receive a second input, and a second terminal coupled to the node; a third capacitor, wherein the third capacitor has a first terminal to receive a third input, and a second terminal coupled to the node; a transistor coupled to a supply rail and the node, wherein the transistor is controllable by a control, wherein the first input, the second input, and the control are set in a first operation mode to adjust a threshold of the apparatus; and a plurality of bottom electrodes extending vertically compared to a lateral side of the transistor, wherein the plurality of bottom electrodes is coupled to the node, wherein the first capacitor, the second capacitor, and the third capacitor are coupled to the plurality of bottom electrodes.

Example 15g: The apparatus of example 14g, wherein the plurality of bottom electrodes comprises: a first conductive electrode directly connected to the node, wherein the first conductive electrode extends vertically away from the node; and a second conductive electrode directly connected to the node, wherein the second conductive electrode extends vertically away from the node, wherein the first conductive electrode and the second conductive electrode are substantially parallel.

Example 16g: The apparatus of example 15g, wherein the first capacitor and the second capacitor are adjacent to the first conductive electrode such that the second capacitor is above the first capacitor and share the first conductive electrode, and wherein the third capacitor is adjacent to the second conductive electrode.

Example 17g: A system comprising: a processor circuitry to execute one or more instructions; a memory circuitry to store the one or more instructions; and a communication interface to allow the processor circuitry to communicate with another device, wherein the processor circuitry includes an adjustable threshold gate which includes an apparatus according to any one of examples 1g to 13g, or examples 14g to 16g.

Example 1h: An apparatus comprising: a transistor having a gate terminal coupled to a word-line, a source terminal couple to a bit-line, and a drain terminal coupled to a storage node; and a plurality of capacitors having a first terminal coupled to the storage node via a metal layer, wherein a second terminal of an individual capacitor of the plurality of capacitors is coupled to an individual plate-line, wherein the plurality of capacitors are planar capacitors that are arranged in a staggered configuration on the metal layer such that a first capacitor of the plurality of capacitors is offset along a horizontal plane diagonally from a second capacitor of the plurality of capacitors.

Example 2h: The apparatus of example 1h, wherein the metal layer is a shared bottom electrode for the plurality of capacitors.

Example 3h: The apparatus of example 1h, wherein the plurality of capacitors is staggered in rows.

Example 4h: The apparatus of example 1h, wherein the metal layer comprises metal, a first conducting oxide, or a combination of a second conducting oxide and an insulative material.

Example 5h: The apparatus of example 1h, wherein the individual capacitor includes a top electrode which is coupled to the individual plate-line.

Example 6h: The apparatus of example 5h, wherein the top electrode is coupled to the individual plate-line via a pedestal.

Example 7h: The apparatus of example 6h, wherein the metal layer is a shared bottom electrode for the plurality of capacitors, wherein the individual capacitor includes: a first layer coupled to the shared bottom electrode which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer.

Example 9h: The apparatus of example 6h, wherein the metal layer is a shared bottom electrode for the plurality of capacitors, wherein the individual capacitor includes: a first layer coupled to the shared bottom electrode which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the individual plate-line is coupled to the third layer.

Example 10h: The apparatus of example 1h, wherein the individual plate-line is parallel to the bit-line.

Example 11h: The apparatus of example 1h, wherein the plurality of capacitors comprises non-linear polar material.

Example 13h: An apparatus comprising: a transistor having a gate terminal coupled to a word-line, a source terminal couple to a bit-line, and a drain terminal coupled to a storage node; a metal plane coupled to the storage node through a via; and a plurality of capacitors having bottom electrodes coupled to the metal plane, wherein an individual capacitor of the plurality of capacitors has a top electrode which is coupled to an individual plate-line, wherein the plurality of capacitors are planar capacitors that are arranged in a staggered configuration on the metal plane such that a first capacitor of the plurality of capacitors is offset along the metal plane diagonally from a second capacitor of the plurality of capacitors, wherein the first capacitor and the second capacitor are on the metal plane.

Example 14h: The apparatus of example 13h, wherein the top electrode is coupled to the individual plate-line via a pedestal.

Example 15h: The apparatus of example 13h, wherein the individual capacitor includes: a first layer coupled to the metal plane which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer.

Example 17h: The apparatus of example 13h, wherein the individual capacitor includes: a first layer coupled to the metal plane which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the individual plate-line is coupled to the fourth layer.

Example 18h: The apparatus of example 13h, wherein the individual plate-line is parallel to the bit-line.

Example 19h: The apparatus of example 13h, wherein the plurality of capacitors comprises non-linear polar material.

Example 20h: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1h to 11h, or examples 13h to 19h.

Example 1i: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node via a metal layer, wherein a second terminal of an individual capacitor of the plurality of capacitors is coupled to an individual plate-line, wherein the plurality of capacitors are planar capacitors that are arranged in a staggered configuration on the metal layer such that a first capacitor of the plurality of capacitors is offset along a horizontal plane diagonally from a second capacitor of the plurality of capacitors.

Example 2i: The apparatus of example 1i, wherein the metal layer is a shared bottom electrode for the plurality of capacitors.

Example 3i: The apparatus of example 1i, wherein the plurality of capacitors is staggered in rows.

Example 4i: The apparatus of example 1i, wherein the second terminal of the individual capacitor of the plurality of capacitors is coupled to the individual plate-line via an individual switch.

Example 5i: The apparatus of example 1i comprises a plurality of switches connected to the plurality of capacitors, wherein the plurality of switches is connected to a plurality of plate-lines, wherein the individual plate-line is among the plurality of plate-lines.

Example 6i: The apparatus of example 1i, wherein the metal layer comprises metal, a first conducting oxide, or a combination of a second conducting oxide and an insulative material.

Example 7i: The apparatus of example 1i, wherein the metal layer comprises metal, a first conducting oxide, or a combination of a second conducting oxide and an insulative material.

Example 8i: The apparatus of example 1i, wherein the individual capacitor includes a top electrode which is coupled to the individual plate-line.

Example 9i: The apparatus of example 8i, wherein the top electrode is coupled to the individual plate-line via a pedestal.

Example 10i: The apparatus of example 9i, wherein the metal layer is a shared bottom electrode for the plurality of capacitors, wherein the individual capacitor includes: a first layer coupled to the shared bottom electrode which is coupled to the storage node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the individual plate-line is coupled to the fifth layer through a switch.

Example 12i: The apparatus of example 9i, wherein the metal layer is a shared bottom electrode for the plurality of capacitors, wherein the individual capacitor includes: a first layer coupled to the shared bottom electrode which is coupled to the storage node, wherein the first layer comprises a first conductive oxide, wherein the first layer extends along an x-plane; a second layer comprising non-linear polar material, wherein the second layer is on the first layer, wherein the second layer extends along the x-plane; a third layer on the second layer, wherein the third layer comprises a second conductive oxide, wherein the third layer extends along the x-plane, wherein the individual plate-line is coupled to the third layer.

Example 13i: The apparatus of example 1i, wherein the individual plate-line is parallel to the bit-line.

Example 14i: The apparatus of example 1i, wherein the plurality of capacitors comprises non-linear polar material.

Example 16i: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a metal plane coupled to the storage node through a via; and a plurality of capacitors having bottom electrodes coupled to the metal plane, wherein an individual capacitor of the plurality of capacitors has a top electrode which is coupled to an individual plate-line via an individual switch, wherein the plurality of capacitors are planar capacitors that are arranged in a staggered configuration on the metal plane such that a first capacitor of the plurality of capacitors is offset along a horizontal plane diagonally from a second capacitor of the plurality of capacitors, wherein the first capacitor and the second capacitor are on the horizontal plane.

Example 17i: The apparatus of example 16i, wherein the top electrode is coupled to the individual plate-line via a pedestal.

Example 18i: The apparatus of example 16i, wherein the plurality of capacitors is staggered in rows.

Example 19i: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1i to 14i, or examples 16i to 18i.

Example 1j: An apparatus comprising: a node; a plurality of capacitors, wherein an individual capacitor of the plurality of capacitors has a first terminal to receive an input and a second terminal connected to the node via a metal layer; a pull-up transistor coupled to the node and controllable by a first control, wherein the pull-up transistor is connected to a power supply rail; and a circuitry to adjust a threshold of the apparatus in a first operation mode by setting the input and the first control, and to disable the pull-up transistor in a second operation mode, wherein the plurality of capacitors is arranged in a staggered configuration on the metal layer such that a first capacitor of the plurality of capacitors is offset along a horizontal plane of the metal layer diagonally from a second capacitor of the plurality of capacitors.

Example 2j: The apparatus of example 1j comprising a pull-down transistor coupled to the node and controllable by a second control.

Example 3j: The apparatus of example 1j, wherein the metal layer is a shared bottom electrode for the plurality of capacitors.

Example 4j: The apparatus of example 1j, wherein the plurality of capacitors is staggered in rows.

Example 5j: The apparatus of example 1j, wherein the metal layer comprises metal, a first conducting oxide, or a combination of a second conducting oxide and an insulative material.

Example 6j: The apparatus of example 1j, wherein the individual capacitor includes a top electrode which is coupled to the first terminal.

Example 7j: The apparatus of example 6j, wherein the top electrode is coupled to the first terminal via a pedestal.

Example 8j: The apparatus of example 6j, wherein the metal layer is a shared bottom electrode for the plurality of capacitors, wherein the individual capacitor includes: a first layer coupled to the shared bottom electrode, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the input is coupled to the fifth layer.

Example 10j: The apparatus of example 6, wherein the metal layer is a shared bottom electrode for the plurality of capacitors, wherein the individual capacitor includes: a first layer coupled to the shared bottom electrode, wherein the first layer comprises a first conductive oxide, wherein the first layer extends along an x-plane; a second layer comprising non-linear polar material, wherein the second layer is on the first layer, wherein the second layer extends along the x-plane; a third layer on the second layer, wherein the third layer comprises a second conductive oxide, wherein the third layer extends along the x-plane, wherein the input is coupled to the third layer.

Example 11j: The apparatus of example 1j, wherein the individual capacitor comprises one of non-linear polar material, a linear dielectric, or a non-linear dielectric.

Example 12j: An apparatus comprising: a metal plane; a first capacitor, wherein the first capacitor has a first terminal to receive a first input, and a second terminal coupled to a node via the metal plane; a second capacitor, wherein the second capacitor has a first terminal to receive a second input, and a second terminal coupled to the node via the metal plane; a third capacitor, wherein the third capacitor has a first terminal to receive a third input, and a second terminal coupled to the node via the metal plane; a fourth capacitor, wherein the fourth capacitor has a first terminal to receive a fourth input, and a second terminal coupled to the node via the metal plane; a fifth capacitor, wherein the fifth capacitor has a first terminal to receive a fifth input, and a second terminal coupled to the node via the metal plane; and a transistor controllable by the node coupled to a gate of the transistor, wherein the first capacitor, the second capacitor, the third capacitor, the fourth capacitor, and the fifth capacitor are planar capacitors that are arranged in a staggered configuration on the metal plane such that the first capacitor is offset along the metal plane diagonally from the second capacitor.

Example 13j: The apparatus of example 12j, wherein the first capacitor and the third capacitor are in a same row and are not diagonally offset from one another.

Example 14j: The apparatus of example 12j, wherein the transistor is part of a driver circuitry.

Example 15j: The apparatus of example 12j, wherein the metal plane is a shared bottom electrode for the first capacitor, the second capacitor, the third capacitor, the fourth capacitor, and the fifth capacitor.

Example 16j: The apparatus of example 12j, wherein the metal plane is coupled to individual bottom electrodes of the first capacitor, the second capacitor, the third capacitor, the fourth capacitor, and the fifth capacitor.

Example 17j: The apparatus of example 12j, wherein the first capacitor, the second capacitor, the third capacitor, the fourth capacitor, and the fifth capacitor are staggered in rows.

Example 18j: The apparatus of example 12j, wherein the metal plane comprises metal, a first conducting oxide, or a combination of a second conducting oxide and an insulative material.

Example 19j: A system comprising: a processor circuitry to execute one or more instructions; a memory circuitry to store the one or more instructions; and a communication interface to allow the processor circuitry to communicate with another device, wherein the processor circuitry includes an adjustable threshold gate which includes an apparatus according to any one of examples 1j to 11j.

Example 20j: A system comprising: a processor circuitry to execute one or more instructions; a memory circuitry to store the one or more instructions; and a communication interface to allow the processor circuitry to communicate with another device, wherein the processor circuitry includes an adjustable threshold gate which includes an apparatus according to any one of examples 12j to 18j.

Example 1k: An apparatus comprising: a shared bottom electrode; and a plurality of capacitors, wherein an individual capacitor of the plurality of capacitors has a first terminal to receive an input and a second terminal connected to the shared bottom electrode, wherein the plurality of capacitors is arranged in a staggered configuration on the shared bottom electrode such that a first capacitor of the plurality of capacitors is offset along a horizontal plane of the shared bottom electrode diagonally from a second capacitor of the plurality of capacitors.

Example 2k: The apparatus of example 1k, wherein an individual capacitor comprises non-linear polar material.

Example 3k: The apparatus of example 2k, wherein the individual capacitor includes a top electrode which is coupled to the first terminal, wherein the non-linear polar material is between the top electrode and the shared bottom electrode.

Example 4k: The apparatus of example 3k, wherein the top electrode is coupled to the first terminal via a pedestal.

Example 5k: The apparatus of example 4k, wherein the individual capacitor includes: a first layer connected to the shared bottom electrode, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the input is coupled to the fifth layer.

Example 7k: The apparatus of example 4k, wherein the individual capacitor includes: a first layer connected to the shared bottom electrode, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the input is coupled to the fourth layer.

Example 9k: The apparatus of example 1k, wherein the plurality of capacitors is staggered in rows.

Example 10k: The apparatus of example 1k, wherein the shared bottom electrode comprises metal, a first conducting oxide, or a combination of a second conducting oxide and an insulative material.

Example 11k: An apparatus comprising: a metal plane; a first capacitor, wherein the first capacitor has a first terminal to receive a first input, and a second terminal coupled to a node via the metal plane; a second capacitor, wherein the second capacitor has a first terminal to receive a second input, and a second terminal coupled to the node via the metal plane; a third capacitor, wherein the third capacitor has a first terminal to receive a third input, and a second terminal coupled to the node via the metal plane; a fourth capacitor, wherein the fourth capacitor has a first terminal to receive a fourth input, and a second terminal coupled to the node via the metal plane; and a fifth capacitor, wherein the fifth capacitor has a first terminal to receive a fifth input, and a second terminal coupled to the node via the metal plane; wherein the first capacitor, the second capacitor, the third capacitor, the fourth capacitor, and the fifth capacitor are arranged in a staggered configuration on the metal plane such that the first capacitor is offset along a horizontal plane of the metal plane diagonally from the second capacitor.

Example 12k: The apparatus of example 11k, wherein the first capacitor and the third capacitor are in a same row and are not diagonally offset from one another.

Example 13k: The apparatus of example 11k, wherein the metal plane is a shared bottom electrode for the first capacitor, the second capacitor, the third capacitor, the fourth capacitor, and the fifth capacitor.

Example 14k: The apparatus of example 11k, wherein the metal plane is coupled to individual bottom electrodes of the first capacitor, the second capacitor, the third capacitor, the fourth capacitor, and the fifth capacitor.

Example 15k: The apparatus of example 11k, wherein the first capacitor, the second capacitor, the third capacitor, the fourth capacitor, and the fifth capacitor are staggered in rows.

Example 16k: The apparatus of example 11k, wherein the metal plane comprises metal, a first conducting oxide, or a combination of a second conducting oxide and an insulative material.

Example 17k: A system comprising: a processor circuitry to execute one or more instructions; a memory circuitry to store the one or more instructions; and a communication interface to allow the processor circuitry to communicate with another device, wherein the processor circuitry includes an apparatus which comprises an apparatus according to any one of examples 1k to 10k, or examples 11k to 16k.

Example 1l: An apparatus comprising: a transistor having a gate terminal coupled to a word-line, a source terminal couple to a bit-line, and a drain terminal coupled to a storage node; and a plurality of memory elements having a first terminal coupled to the storage node, wherein a second terminal of an individual memory element of the plurality of memory elements is coupled to an individual plate-line, wherein the plurality of memory elements are planar memory elements that are arranged in a stacked and folded configuration.

Example 2l: The apparatus of example 1l, wherein the storage node extends vertically using vias and metal layers, and wherein the storage node is a point of fold in the stacked and folded configuration.

Example 3l: The apparatus of example 2l, wherein the plurality of memory elements has N memory elements are divided in L number of stacked layers such that there are N/L memory elements in an individual stacked layer.

Example 4l: The apparatus of example 3l, wherein the N/L memory elements are shorted together with an electrode.

Example 5l: The apparatus of example 4l, wherein the electrode comprises metal.

Example 6l: The apparatus of example 4l, wherein the electrode is a shared bottom electrode that extends on either side of the point of fold.

Example 7l: The apparatus of example 6l, wherein the individual memory element includes a top electrode which is coupled to the individual plate-line.

Example 8l: The apparatus of example 7l, wherein the top electrode is coupled to the individual plate-line using a pedestal.

Example 9l: The apparatus of example 7l, wherein the individual memory element includes a magnetic tunneling junction, which comprises: a first magnet on the shared bottom electrode, the first magnet comprising one of CrO2, Heusler alloys, Fe, or CoFeB, the first magnet being a free magnet; a barrier material on the first magnet, the barrier material comprising one of: MgO, AlOx, or SrTiO3; a second magnet on the barrier material, the second magnet comprising one of CrO2, Heusler alloys, Fe, or CoFeB, the second magnet being a fixed magnet; and an anti-ferroelectric material on the second magnet, the anti-ferroelectric material comprising one of: Ru or Ir, or a super lattice of Co and Pt coupled with Ru and Ir, wherein the top electrode is coupled to the anti-ferroelectric material, wherein the shared bottom electrode and the top electrode include one of: Al, Ti, Cu, Ag, Pt, TiN, TaN, Al doped ZnO, Ga-doped ZnO, or Indium tin oxide (ITO).

Example 10l: The apparatus of example 7l, wherein the individual memory element comprises a resistive based memory element, which comprises: an insulative material on the shared bottom electrode, the insulative material comprising HfOx, TiOx, TaOx, NiO, ZnOx, Zn2TiO4, KnOx, MgO, AlOx, ZrOx, CuxOy, SnOz, GeOx, LaOx, YOx, MoOx, or CoOx, where x and y are a number or a fraction, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 11l: The apparatus of example 7l, wherein the individual memory element comprises a phase-change based memory element, which comprises: an insulative material on the shared bottom electrode, the insulative material comprising (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, PtSe2, binary transition metal oxides including one of NiO or TiO2, perovskites including one of Sr(Zr)TiO3 or PCMO, solid-state electrolytes including one of GeS, GeSe, SiOx, or Cu2S, organic materials including AlDCN, or layered materials including hexagonal boron nitride, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 12l: The apparatus of example 1l, wherein the individual plate-line is parallel to the bit-line.

Example 13l: An apparatus comprising: a transistor having a gate terminal coupled to a word-line, a source terminal couple to a bit-line, and a drain terminal coupled to a storage node; a vertical stack of vias which is coupled to the storage node; a plurality of metal layers coupled to the vertical stack of vias; and a plurality of memory elements having a first terminal coupled to the plurality of metal layers, wherein the plurality of memory elements includes memory elements on either side of the vertical stack of vias, wherein a second terminal of an individual memory element of the plurality of memory elements is coupled to an individual plate-line, wherein the plurality of memory elements are planar memory elements.

Example 14l: The apparatus of example 13l, wherein the plurality of memory elements has N memory elements which are divided in L number of stacked layers such that there are N/L memory elements in an individual stacked layer.

Example 15l: The apparatus of example 13l, wherein the individual memory element includes a magnetic tunneling junction, a resistive based memory element, or a phase-change based memory element.

Example 16l: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1l to 12l, or examples 13l to 15l.

Example 1m: An apparatus comprising: a transistor having a gate terminal coupled to a word-line, a source terminal couple to a bit-line, and a drain terminal coupled to a storage node; and a plurality of memory elements having a first terminal coupled to the storage node via a metal layer, wherein a second terminal of an individual memory element of the plurality of memory elements is coupled to an individual plate-line, wherein the plurality of memory elements are planar memory elements that are arranged in a staggered configuration on the metal layer such that a first memory element of the plurality of memory elements is offset along a horizontal plane diagonally from a second memory element of the plurality of memory elements.

Example 2m: The apparatus of example 1m, wherein the metal layer is a shared bottom electrode for the plurality of memory elements.

Example 3m: The apparatus of example 1m, wherein the plurality of memory elements is staggered in rows.

Example 4m: The apparatus of example 1m, wherein the metal layer comprises metal.

Example 5m: The apparatus of example 1m, wherein the individual memory element includes a top electrode which is coupled to the individual plate-line.

Example 6m: The apparatus of example 5m, wherein the top electrode is coupled to the individual plate-line via a pedestal.

Example 7m: The apparatus of example 6m, wherein the metal layer is a shared bottom electrode for the plurality of memory elements, wherein the individual memory element includes a magnetic tunnelling junction, which comprises: a first magnet on the shared bottom electrode, the first magnet comprising one of CrO2, Heusler alloys, Fe, or CoFeB, the first magnet being a free magnet; a barrier material on the first magnet, the barrier material comprising one of: MgO, AlOx, or SrTiO3; a second magnet on the barrier material, the second magnet comprising one of CrO2, Heusler alloys, Fe, or CoFeB, the second magnet being a fixed magnet; and an anti-ferroelectric material on the second magnet, the anti-ferroelectric material comprising one of: Ru or Ir, or a super lattice of Co and Pt coupled with Ru and Ir, wherein the top electrode is coupled to the anti-ferroelectric material, wherein the shared bottom electrode and the top electrode include one of: Al, Ti, Cu, Ag, Pt, TiN, TaN, Al doped ZnO, Ga-doped ZnO, or Indium tin oxide (ITO).

Example 8m: The apparatus of example 6m, wherein the metal layer is a shared bottom electrode for the plurality of memory elements, wherein the individual memory element includes a resistive memory element, which comprises: an insulative material on the shared bottom electrode, the insulative material comprising HfOx, TiOx, TaOx, NiO, ZnOx, Zn2TiO4, KnOx, MgO, AlOx, ZrOx, CuxOy, SnOz, GeOx, LaOx, YOx, MoOx, or CoOx, where x and y are a number or a fraction, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 9m: The apparatus of example 6m, wherein the metal layer is a shared bottom electrode for the plurality of memory elements, wherein the individual memory element includes a phase-change based memory element, which comprises: an insulative material on the shared bottom electrode, the insulative material comprising (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, PtSe2, binary transition metal oxides including one of NiO or TiO2, perovskites including one of Sr(Zr)TiO3 or PCMO, solid-state electrolytes including one of GeS, GeSe, SiOx, or Cu2S, organic materials including AlDCN, or layered materials including hexagonal boron nitride, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 10m: The apparatus of example 1m, wherein the individual plate-line is parallel to the bit-line.

Example 11m: An apparatus comprising: a transistor having a gate terminal coupled to a word-line, a source terminal couple to a bit-line, and a drain terminal coupled to a storage node; a metal plane coupled to the storage node through a via; and a plurality of memory elements having bottom electrodes coupled to the metal plane, wherein an individual memory element of the plurality of memory elements has a top electrode which is coupled to an individual plate-line, wherein the plurality of memory elements are planar memory elements that are arranged in a staggered configuration on the metal plane such that a first memory element of the plurality of memory elements is offset along the metal plane diagonally from a second memory element of the plurality of memory elements, wherein the first memory element and the second memory element are on the metal plane.

Example 12m: The apparatus of example 11m, wherein the top electrode is coupled to the individual plate-line via a pedestal.

Example 13m: The apparatus of example 11m, wherein the individual memory element includes a magnetic tunneling junction, a resistive based memory element, or a phase-change based memory element.

Example 14m: The apparatus of example 11m, wherein the individual plate-line is parallel to the bit-line.

Example 15m: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1m to 10m, or examples 11m to 14m.

Example 1n: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of memory elements having a first terminal coupled to the storage node, wherein a second terminal of an individual memory element of the plurality of memory elements is coupled to an individual plate-line, wherein the plurality of memory elements are planar memory elements that are arranged in a stacked and folded configuration.

Example 2n: The apparatus of example 1n, wherein the second terminal of the individual memory element of the plurality of memory elements is coupled to the individual plate-line via an individual switch.

Example 3n: The apparatus of example 1n comprises a plurality of switches connected to the plurality of memory elements, wherein the plurality of switches is connected to a plurality of plate-lines, wherein the individual plate-line is among the plurality of plate-lines.

Example 4n: The apparatus of example 1n, wherein the storage node extends vertically using vias and metal layers, and wherein the storage node is a point of fold in the stacked and folded configuration.

Example 5n: The apparatus of example 4n, wherein the plurality of memory elements has N memory elements are divided in L number of stacked layers such that there are N/L memory elements in an individual stacked layer.

Example 6n: The apparatus of example 5n, wherein the N/L memory elements are shorted together with an electrode.

Example 7n: The apparatus of example 6n, wherein the electrode comprises metal.

Example 8n: The apparatus of example 6n, wherein the electrode is a shared bottom electrode that extends on either side of the point of fold.

Example 9n: The apparatus of example 8n, wherein the individual memory element includes a top electrode which is coupled to the individual plate-line.

Example 10n: The apparatus of example 9n, wherein the top electrode is coupled to the individual plate-line using a pedestal.

Example 11n: The apparatus of example 9n, wherein the individual memory element includes a magnetic tunnelling junction, which comprises: a first magnet on the shared bottom electrode, the first magnet comprising one of CrO2, Heusler alloys, Fe, or CoFeB, the first magnet being a free magnet; a barrier material on the first magnet, the barrier material comprising one of: MgO, AlOx, or SrTiO3; a second magnet on the barrier material, the second magnet comprising one of CrO2, Heusler alloys, Fe, or CoFeB, the second magnet being a fixed magnet; and an anti-ferroelectric material on the second magnet, the anti-ferroelectric material comprising one of: Ru or Ir, or a super lattice of Co and Pt coupled with Ru and Ir, wherein the top electrode is coupled to the anti-ferroelectric material, wherein the shared bottom electrode and the top electrode include one of: Al, Ti, Cu, Ag, Pt, TiN, TaN, Al doped ZnO, Ga-doped ZnO, or Indium tin oxide (ITO).

Example 12n: The apparatus of example 9n, wherein the individual memory element includes a resistive memory device, which comprises: an insulative material on the shared bottom electrode, the insulative material comprising HfOx, TiOx, TaOx, NiO, ZnOx, Zn2TiO4, KnOx, MgO, AlOx, ZrOx, CuxOy, SnOz, GeOx, LaOx, YOx, MoOx, or CoOx, where x and y are a number or a fraction, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 13n: The apparatus of example 9n, wherein the individual memory element comprises a phase-change based memory element, which comprises: an insulative material on the shared bottom electrode, the insulative material comprising (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, PtSe2, binary transition metal oxides including one of NiO or TiO2, perovskites including one of Sr(Zr)TiO3 or PCMO, solid-state electrolytes including one of GeS, GeSe, SiOx, or Cu2S, organic materials including AlDCN, or layered materials including hexagonal boron nitride, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 14n: The apparatus of example 1n, wherein the individual plate-line is parallel to the bit-line.

Example 15n: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a stack of vertical vias which is coupled to the storage node; a plurality of metal layers coupled to the stack of vertical vias; and a plurality of memory elements having a first terminal coupled to the plurality of metal layers, wherein the plurality of memory elements includes memory elements on either side of the stack of vertical vias, wherein a second terminal of an individual memory element of the plurality of memory elements is coupled to an individual plate-line, wherein the plurality of memory elements are planar memory elements.

Example 16n: The apparatus of example 15n, wherein the plurality of memory elements has N memory elements which are divided in L number of stacked layers such that there are N/L memory elements in an individual stacked layer.

Example 17n: The apparatus of example 15n, wherein the individual memory element includes a magnetic tunneling junction, a resistive based memory element, or a phase-change based memory element.

Example 18n: The apparatus of example 15n, wherein the individual plate-line is parallel to the bit-line.

Example 19n: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes an apparatus according to any one of examples 1n to 14n, or examples 15n to 18n.

Example 1o: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of memory elements having a first terminal coupled to the storage node via a metal layer, wherein a second terminal of an individual memory element of the plurality of memory elements is coupled to an individual plate-line, wherein the plurality of memory elements are planar memory elements that are arranged in a staggered configuration on the metal layer such that a first memory element of the plurality of memory elements is offset along a horizontal plane diagonally from a second memory element of the plurality of memory elements.

Example 2o: The apparatus of example 1o, wherein the metal layer is a shared bottom electrode for the plurality of memory elements.

Example 3o: The apparatus of example 1o, wherein the plurality of memory elements is staggered in rows.

Example 4o: The apparatus of example 1o, wherein the second terminal of the individual memory element of the plurality of memory elements is coupled to the individual plate-line via an individual switch.

Example 5o: The apparatus of example 1o comprises a plurality of switches connected to the plurality of memory elements, wherein the plurality of switches is connected to a plurality of plate-lines, wherein the individual plate-line is among the plurality of plate-lines.

Example 6o: The apparatus of example 1o, wherein the metal layer comprises metal, a first conducting oxide, or a combination of a second conducting oxide and an insulative material.

Example 7o: The apparatus of example 1o, wherein the metal layer comprises metal.

Example 8o: The apparatus of example 1o, wherein the individual memory element includes a top electrode which is coupled to the individual plate-line.

Example 9o: The apparatus of example 8o, wherein the top electrode is coupled to the individual plate-line via a pedestal.

Example 10o: The apparatus of example 9o, wherein the metal layer is a shared bottom electrode for the plurality of memory elements, wherein the individual memory element includes a magnetic tunnelling junction, which comprises: a first magnet on the shared bottom electrode, the first magnet comprising one of $CrO_2$, Heusler alloys, Fe, or CoFeB, the first magnet being a free magnet; a barrier material on the first magnet, the barrier material comprising one of: MgO, AlOx, or $SrTiO_3$; a second magnet on the barrier material, the second magnet comprising one of $CrO_2$, Heusler alloys, Fe, or CoFeB, the second magnet being a fixed magnet; and an anti-ferroelectric material on the second magnet, the anti-ferroelectric material comprising one of: Ru or Ir, or a super lattice of Co and Pt coupled with Ru and Ir, wherein the top electrode is coupled to the anti-ferroelectric material, wherein the shared bottom electrode and the top electrode include one of: Al, Ti, Cu, Ag, Pt, TiN, TaN, Al doped ZnO, Ga-doped ZnO, or Indium tin oxide (ITO).

Example 11o: The apparatus of example 9o, wherein the metal layer is a shared bottom electrode for the plurality of memory elements, wherein the individual memory element includes a resistive memory device, which comprises: an insulative material on the shared bottom electrode, the insulative material comprising HfOx, TiOx, TaOx, NiO, ZnOx, $Zn_2TiO_4$, KnOx, MgO, AlOx, ZrOx, CuxOy, SnOz, GeOx, LaOx, YOx, MoOx, or CoOx, where x and y are a number or a fraction, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 12o: The apparatus of example 9o, wherein the metal layer is a shared bottom electrode for the plurality of memory elements, wherein the individual memory element comprises a phase-change based memory element, which comprises: an insulative material on the shared bottom electrode, the insulative material comprising $(GeTe)_m$ $(Sb_2Te_3)_n$, $Ge_2Sb_2Te_5$, $Ge_2Sb_2Te_4$, AgInSbTe, super lattices of GeTe, $Sb_2Te_3$, super lattices of $TiTe_2$ and $Sb_2Te_3$, $WSe_2$, $WS_2$, $PtSe_2$, binary transition metal oxides including one of NiO or $TiO_2$, perovskites including one of Sr(Zr)$TiO_3$ or PCMO, solid-state electrolytes including one of GeS, GeSe, SiOx, or $Cu_2S$, organic materials including AlDCN, or layered materials including hexagonal boron nitride, wherein the top electrode is on the insulative material, wherein the shared bottom electrode and the top electrode include one of: Al, Ti, Cu, Ag, Pt, TiN, TaN, Al doped ZnO, Ga-doped ZnO, or Indium tin oxide (ITO).

Example 13o: The apparatus of example 1o, wherein the individual plate-line is parallel to the bit-line.

Example 14o: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a metal plane coupled to the storage node through a via; and a plurality of memory elements having bottom electrodes coupled to the metal plane, wherein an individual memory element of the plurality of memory elements has a top electrode which is coupled to an individual plate-line via an individual switch, wherein the plurality of memory elements are planar memory elements that are arranged in a staggered configuration on the metal plane such that a first memory element of the plurality of memory elements is offset along a horizontal plane diagonally from a second memory element of the plurality of memory elements, wherein the first memory element and the second memory element are on the horizontal plane.

Example 15o: The apparatus of example 14o, wherein the top electrode is coupled to the individual plate-line via a pedestal.

Example 16o: The apparatus of example 14o, wherein the plurality of memory elements is staggered in rows.

Example 17o: The apparatus of example 14o, wherein the individual memory element includes a magnetic tunneling junction, a resistive based memory element, or a phase-change based memory element.

Example 18o: The apparatus of example 14o, wherein the individual plate-line is parallel to the word-line.

Example 19o: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells an apparatus according to any one of examples 1o to 13o, or examples 14o to 18o.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first transistor having a first gate terminal coupled to a word-line, a first source terminal coupled to a bit-line, and a first drain terminal coupled to a storage node;
   a second transistor coupled to the first transistor, wherein the second transistor includes a second gate terminal coupled to the storage node, a second source terminal coupled to a sense line, and a second drain terminal coupled to a bias; and
   a plurality of capacitors having a first terminal coupled to the storage node, wherein a second terminal of an individual capacitor of the plurality of capacitors is coupled to an individual plate-line, and wherein the plurality of capacitors are non-planar capacitors that are arranged in a stacked and folded configuration.

2. The apparatus of claim 1 comprising:
   a first conductive electrode directly connected to the storage node, wherein the first conductive electrode extends vertically away from the storage node; and
   a second conductive electrode directly connected to the storage node, wherein the second conductive electrode extends vertically away from the storage node, and wherein the first conductive electrode and the second conductive electrode are substantially parallel.

3. The apparatus of claim 2, wherein the plurality of capacitors includes:
   a first set of capacitors adjacent to the first conductive electrode; and
   a second set of capacitors adjacent to the second conductive electrode.

4. The apparatus of claim 3, wherein the first set of capacitors includes a first capacitor which includes:
   a first layer coupled to the first conductive electrode, wherein the first layer comprises a first metal;
   a second layer around the first layer, wherein the second layer comprises a first conductive oxide;
   a third layer comprising a ferroelectric dielectric material, wherein the third layer is around the second layer;
   a fourth layer around the third layer, wherein the fourth layer comprises a second conductive oxide, and wherein the fourth layer is around the third layer; and
   a fifth layer around the fourth layer, wherein the fifth layer comprises a second metal, wherein a first node is adjacent to part of the fifth layer, and wherein the first node is coupled to a first switch.

5. The apparatus of claim 4, wherein:
   the first layer has a first circumference;
   the second layer has a second circumference;
   the third layer has a third circumference;
   the fourth layer has a fourth circumference; and
   the fifth layer has a fifth circumference, wherein the fifth circumference is larger than the fourth circumference, wherein the fourth circumference is larger than the third circumference, wherein the third circumference is larger than the second circumference, and wherein the second circumference is larger than the first circumference.

6. The apparatus of claim 3, wherein the second set of capacitors includes a second capacitor which includes:
   a first layer coupled to the second conductive electrode, wherein the first layer comprises a first metal;
   a second layer around the first layer, wherein the second layer comprises a first conductive oxide;
   a third layer comprising a ferroelectric dielectric material, wherein the third layer is around the second layer;
   a fourth layer around the third layer, wherein the fourth layer comprises a second conductive oxide, and wherein the fourth layer is around the third layer; and
   a fifth layer around the fourth layer, wherein the fifth layer comprises a second metal, wherein a second node is adjacent to part of the fifth layer, and wherein the second node is coupled to a second switch.

7. The apparatus of claim 6, wherein:
   the first layer has a first circumference;
   the second layer has a second circumference;
   the third layer has a third circumference;
   the fourth layer has a fourth circumference; and
   the fifth layer has a fifth circumference, wherein the fifth circumference is larger than the fourth circumference, wherein the fourth circumference is larger than the third circumference, wherein the third circumference is larger than the second circumference, and wherein the second circumference is larger than the first circumference.

8. The apparatus of claim 4, wherein the plurality of capacitors has N capacitors divided in L number of conductive electrodes such that there are N/L capacitors in an individual conductive electrode.

9. The apparatus of claim 8, wherein the N/L capacitors are shorted together through the individual conductive electrode.

10. The apparatus of claim 3, wherein the first conductive electrode or the second conductive electrode comprises metal, a first conducting oxide, or a combination of a second conducting oxide and an insulative material.

11. The apparatus of claim 3, wherein the first conductive electrode is a first shared bottom electrode for the first set of capacitors, and wherein the second conductive electrode is a second shared bottom electrode for the second set of capacitors.

12. The apparatus of claim 1, wherein the individual capacitor includes a top electrode which is partially coupled to an individual node, and wherein the individual node is coupled to the individual plate-line via an individual switch.

13. The apparatus of claim 1, wherein the individual plate-line is parallel to the bit-line.

14. The apparatus of claim 1, wherein the plurality of capacitors comprises non-linear polar material.

15. An apparatus comprising:
 a first transistor having a first gate terminal coupled to a word-line, a first source terminal coupled to a bit-line, and a first drain terminal coupled to a storage node;
 a second transistor coupled to the first transistor, wherein the second transistor includes a second gate terminal coupled to the storage node, a second source terminal couple to a sense line, and a second drain terminal coupled to a bias;
 a plurality of bottom electrodes extending vertically compared to lateral side of the first transistor, wherein the plurality of bottom electrodes is coupled to the storage node; and
 a plurality of capacitors having a first terminal coupled to the plurality of bottom electrodes, wherein a second terminal of an individual capacitor of the plurality of capacitors is partially coupled to an individual plate-line, and wherein the plurality of capacitors are non-planar capacitors.

16. The apparatus of claim 15, wherein the plurality of bottom electrodes comprises:
 a first conductive electrode directly connected to the storage node, wherein the first conductive electrode extends vertically away from the storage node; and
 a second conductive electrode directly connected to the storage node, wherein the second conductive electrode extends vertically away from the storage node, and wherein the first conductive electrode and the second conductive electrode are substantially parallel.

17. The apparatus of claim 16, wherein the plurality of capacitors include:
 a first set of capacitors having a first layer adjacent to the first conductive electrode; and
 a second set of capacitors having a second layer adjacent to the second conductive electrode.

18. The apparatus of claim 17, wherein the first set of capacitors includes a first capacitor which includes:
 a first layer coupled to the first conductive electrode, wherein the first layer comprises a first metal;
 a second layer around the first layer, wherein the second layer comprises a first conductive oxide;
 a third layer comprising a ferroelectric dielectric material, wherein the third layer is around the second layer;
 a fourth layer around the third layer, wherein the fourth layer comprises a second conductive oxide, wherein the fourth layer is around the third layer; and
 a fifth layer around the fourth layer, wherein the fifth layer comprises a second metal, wherein a first node is adjacent to part of the fifth layer, and wherein the first node is coupled to a first switch.

19. A system comprising:
 a processor circuitry to execute one or more instructions;
 a memory circuitry to store the one or more instructions; and
 a communication interface to allow the processor circuitry to communicate with another device, wherein the memory circuitry includes a plurality of bit-cells organized in a memory array, and wherein an individual bit-cell of the plurality of bit-cells includes:
 a first transistor having a first gate terminal coupled to a word-line, a first source terminal coupled to a bit-line, and a first drain terminal coupled to a storage node;
 a second transistor coupled to the first transistor, wherein the second transistor includes a second gate terminal coupled to the storage node, a second source terminal coupled to a sense line, and a second drain terminal coupled to a bias; and
 a plurality of capacitors having a first terminal coupled to the storage node, wherein a second terminal of an individual capacitor of the plurality of capacitors is coupled to an individual plate-line, and wherein the plurality of capacitors are non-planar capacitors that are arranged in a stacked and folded configuration.

20. The system of claim 19, wherein the individual bit-cell includes:
 a first conductive electrode directly connected to the storage node, wherein the first conductive electrode extends vertically away from the storage node; and
 a second conductive electrode directly connected to the storage node, wherein the second conductive electrode extends vertically away from the storage node, and wherein the first conductive electrode and the second conductive electrode are substantially parallel.

* * * * *